(12) United States Patent
Liao et al.

(10) Patent No.: US 10,591,816 B2
(45) Date of Patent: Mar. 17, 2020

(54) PHOTOSENSITIVE RESIN COMPOSITION, COLOR FILTER, AND LIQUID CRYSTAL DISPLAY ELEMENT THEREOF

(71) Applicant: Chi Mei Corporation, Tainan (TW)

(72) Inventors: Hao-Wei Liao, Kaohsiung (TW); Yu-Jie Tsai, Tainan (TW); Hung-Chia Chou, Kaohsiung (TW)

(73) Assignee: Chi Mei Corporation, Tainan (TW)

( * ) Notice: Subject to any disclaimer, the term of this patent is extended or adjusted under 35 U.S.C. 154(b) by 163 days.

(21) Appl. No.: 15/518,767

(22) PCT Filed: Oct. 15, 2015

(86) PCT No.: PCT/CN2015/092009
§ 371 (c)(1),
(2) Date: Apr. 13, 2017

(87) PCT Pub. No.: WO2016/058545
PCT Pub. Date: Apr. 21, 2016

(65) Prior Publication Data
US 2017/0235224 A1  Aug. 17, 2017

Related U.S. Application Data

(60) Provisional application No. 62/063,964, filed on Oct. 15, 2014.

(51) Int. Cl.
| | | |
|---|---|---|
| *G03F 7/031* | (2006.01) | |
| *G02F 1/1335* | (2006.01) | |
| *G03F 7/00* | (2006.01) | |
| *G03F 7/027* | (2006.01) | |
| *G03F 7/032* | (2006.01) | |
| *G03F 7/029* | (2006.01) | |
| *G02B 5/22* | (2006.01) | |
| *G03F 7/038* | (2006.01) | |
| *G03F 7/075* | (2006.01) | |
| *G03F 7/004* | (2006.01) | |
| *G03F 7/039* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |

(52) U.S. Cl.
CPC .......... *G03F 7/0007* (2013.01); *G02B 5/223* (2013.01); *G02F 1/133512* (2013.01); *G02F 1/133514* (2013.01); *G03F 7/0046* (2013.01); *G03F 7/0048* (2013.01); *G03F 7/027* (2013.01); *G03F 7/029* (2013.01); *G03F 7/031* (2013.01); *G03F 7/032* (2013.01); *G03F 7/039* (2013.01); *G03F 7/0388* (2013.01); *G03F 7/0755* (2013.01); *G03F 7/0757* (2013.01); *G03F 7/162* (2013.01); *G03F 7/168* (2013.01); *G03F 7/2004* (2013.01); *G03F 7/322* (2013.01); *G03F 7/40* (2013.01)

(58) Field of Classification Search
CPC ........ G03F 7/0007; G03F 7/027; G03F 7/031; G03F 7/033; G02B 5/201; G02B 5/223; G02F 1/133512; G02F 1/133514; G02F 1/133515; G02F 1/133516
USPC ...................... 430/7; 349/106, 110
See application file for complete search history.

(56) References Cited

U.S. PATENT DOCUMENTS

| | | | |
|---|---|---|---|
| 2007/0154820 A1* | 7/2007 | Kang ................. | G03F 7/0007 430/7 |
| 2013/0135763 A1* | 5/2013 | Liao ..................... | G03F 7/0757 359/891 |
| 2013/0188270 A1* | 7/2013 | Nishimae ............. | C08F 2/50 359/885 |

FOREIGN PATENT DOCUMENTS

| | | |
|---|---|---|
| CN | 1570764 | 1/2005 |
| CN | 101634807 | 1/2010 |
| CN | 102314086 | 1/2012 |
| CN | 103135344 | 6/2013 |
| CN | 103153952 | 6/2013 |
| CN | 103838083 | 6/2014 |
| CN | 103885289 | 6/2014 |
| JP | H11-194492 | 7/1999 |
| JP | 2006-259716 | 9/2006 |
| JP | 2008-268854 | 11/2008 |

(Continued)

OTHER PUBLICATIONS

"International Search Report (Form PCT/ISA/210)", dated Jan. 22, 2016, pp. 1-4, in which the listed references were cited.
(Continued)

Primary Examiner — John A McPherson
(74) Attorney, Agent, or Firm — JCIPRNET

(57) ABSTRACT

The invention provides a photosensitive resin composition, a color filter, and a liquid crystal display element thereof. The photosensitive resin composition includes an alkali-soluble resin (A), a compound (B) having an ethylenically unsaturated group, a photoinitiator (C), a solvent (D), and a black pigment (E). The compound (B) having an ethylenically unsaturated group contains a compound (B-1) having an acidic group and at least three ethylenically unsaturated groups. The photoinitiator (C) includes a photoinitiator (C-1) represented by formula (1).

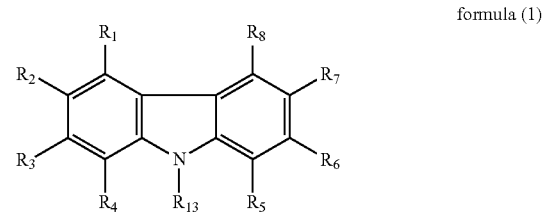

formula (1)

17 Claims, No Drawings

(56) References Cited

FOREIGN PATENT DOCUMENTS

| | | |
|---|---|---|
| JP | 2012053381 | 3/2012 |
| JP | 2012185408 | 9/2012 |
| TW | 201226393 | 7/2012 |
| TW | 201321892 | 6/2013 |

OTHER PUBLICATIONS

"Office Action of Taiwan Counterpart Application," dated Mar. 11, 2019, p. 1-p. 6.
"Office Action of China Counterpart Application," dated Aug. 29, 2019, p. 1-p. 10.

* cited by examiner

PHOTOSENSITIVE RESIN COMPOSITION, COLOR FILTER, AND LIQUID CRYSTAL DISPLAY ELEMENT THEREOF

CROSS-REFERENCE TO RELATED APPLICATION

This application is a 371 application of International PCT application serial no. PCT/CN2015/092009, filed on Oct. 15, 2015, which claims the priority benefit of U.S. application No. 62/063,964, filed on Oct. 15, 2014. The entirety of each of the above-mentioned patent applications is hereby incorporated by reference herein and made a part of this specification.

BACKGROUND OF THE INVENTION

Field of the Invention

The invention relates to a photosensitive resin composition, a color filter, and a liquid crystal display element thereof. In particular, the invention relates to a photosensitive resin composition for a black matrix, a color filter, and a liquid crystal display element thereof having good resolution, good heat resistance, and good reliability under high temperature and high humidity.

Description of Related Art

Recently, with the development of various liquid crystal display (LCD) technologies, to increase the contrast and the display quality of the current LCD, a black matrix is generally disposed in the gap of the stripes and the dots of the color filter in the LCD. The black matrix can prevent issues such as decrease in contract ratio and decrease in color purity caused by light leakage between pixels.

The material used by the black matrix is generally an evaporated film containing chromium or chromium oxide. However, when using the evaporated film as the material of the black matrix, disadvantages exist such that the process is complicated and the material is expensive. To solve these issues, a method of forming a black matrix by using a photosensitive resin composition through photolithography has previously been proposed.

With the rising demand for the shading of the black matrix, one of the solutions has been to increase the usage amount of the black pigment to increase the shading of the black matrix. For instance, JP 2006-259716 discloses a photosensitive resin composition for a black matrix containing a high usage amount of each of a black pigment, an alkali-soluble resin, a photopolymerization initiator, a reactive monomer having a difunctional group, and an organic solvent. It should be mentioned that, the reactive monomer having a difunctional group can improve the reaction between compounds to form a fine pattern. As a result, when increasing the light-shielding property in the photosensitive resin composition by increasing the usage amount of the black pigment, the sensitivity of the photosensitive resin composition can still be maintained.

Moreover, JP 2008-268854 discloses a photosensitive resin composition for a black matrix. The photosensitive resin composition contains an alkali-soluble resin having a carboxylic acid group and an unsaturated group, a photopolymerizable monomer having an ethylenically unsaturated group, a photopolymerization initiator, and a black pigment with a high usage amount. In the photosensitive resin composition for a black matrix, a specific alkali-soluble resin is used to improve the resolution of the photosensitive resin composition having a high usage amount of black pigment.

Although in the current technique, light-shielding can be increased by increasing the usage amount of the black pigment in the photosensitive resin composition, the current photosensitive resin composition still has issues such as poor resolution, poor heat resistance, and poor reliability under high temperature and high humidity. Accordingly, the development of a photosensitive resin composition for a black matrix having good resolution, good heat resistance, and good reliability under high temperature, and high humidity is still needed.

SUMMARY OF THE INVENTION

Accordingly, the invention provides a photosensitive resin composition, a color filter, and a liquid crystal display element thereof, and the resolution, heat resistance, and reliability under high temperature and high humidity of the photosensitive resin composition are good.

The invention provides a photosensitive resin composition including: an alkali-soluble resin (A), a compound (B) having an ethylenically unsaturated group, a photoinitiator (C), a solvent (D), and a black pigment(E). In particular, the compound (B) having an ethylenically unsaturated group contains a compound (B-1) having an acidic group and at least three ethylenically unsaturated groups. The photoinitiator (C) includes a photoinitiator (C-1) represented by formula (1).

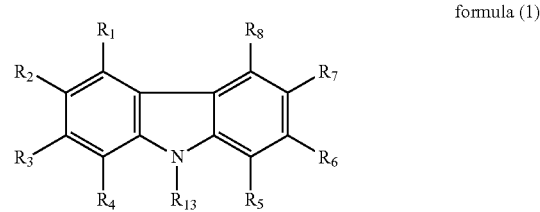

formula (1)

wherein $R_1$, $R_2$, $R_3$, $R_4$, $R_5$, $R_6$, $R_7$, and $R_8$ are each independently hydrogen, a $C_1$ to $C_{20}$ alkyl group, $COR_{16}$, $OR_{17}$, halogen, $NO_2$, the group represented by formula (2), or the group represented by formula (3),

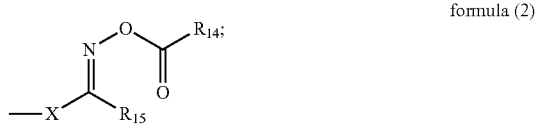

formula (2)

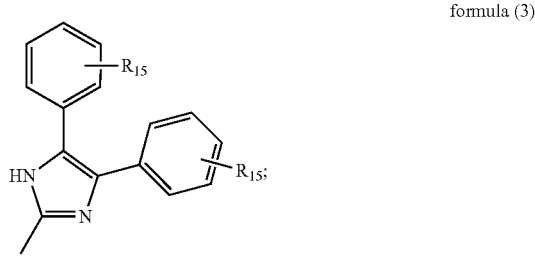

formula (3)

or $R_1$ and $R_2$, $R_2$ and $R_3$, $R_3$ and $R_4$, $R_5$ and $R_6$, $R_6$ and $R_7$, or $R_7$ and $R_8$ are each independently $C_2$ to $C_{10}$ alkenyl groups substituted by the group represented by formula (4),

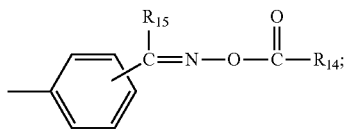

formula (4)

or R$_1$ and R$_2$, R$_2$ and R$_3$, R$_3$ and R$_4$, R$_5$ and R$_6$, R$_6$ and R$_7$, or R$_7$ and R$_8$ are each independently —(CH$_2$)$_p$—Y—(CH$_2$)$_q$— at the same time;

or R$_1$ and R$_2$, R$_2$ and R$_3$, R$_3$ and R$_4$, R$_5$ and R$_6$, R$_6$ and R$_7$, or R$_7$ and R$_8$ are each independently the group represented by formula (5) at the same time,

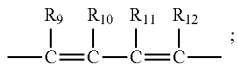

formula (5)

however, the condition is that at least one pair in R$_1$ and R$_2$, R$_2$ and R$_3$, R$_3$ and R$_4$, R$_5$ and R$_6$, R$_6$ and R$_7$, or R$_7$ and R$_8$ is the group represented by formula (5), R$_9$, R$_{10}$, R$_{11}$, and R$_{12}$ are each independently hydrogen or a C$_1$ to C$_{20}$ alkyl group, and the C$_1$ to C$_{20}$ alkyl group is unsubstituted or substituted by one or a plurality of the following groups: halogen, a phenyl group, CN, OH, SH, C$_1$ to C$_4$-alkoxy, —(CO)OH, or —(CO)O—(C$_1$ to C$_4$ alkyl);

or R$_9$, R$_{10}$, R$_{11}$, and R$_{12}$ are each independently an unsubstituted phenyl group or a phenyl group substituted by one or a plurality of the following groups: a C$_1$ to C$_6$ alkyl group, halogen, CN, OR$_{17}$, SR$_{18}$, or NR$_{19}$R$_{20}$;

or R$_9$, R$_{10}$, R$_{11}$, and R$_{12}$ are each independently halogen, CN, OR$_{17}$, SR$_{18}$, SOR$_{18}$, SO$_2$R$_{18}$, or NR$_{19}$R$_{20}$, wherein the substituent OR$_{17}$, SR$_{18}$, or NR$_{19}$R$_{20}$ forms a 5-membered or 6-membered ring with one carbon atom in a naphthyl ring via the groups R$_{17}$, R$_{18}$, R$_{19}$, and/or R$_{20}$ as needed;

or R$_9$, R$_{10}$, R$_{11}$, and R$_{12}$ are each independently COR$_{16}$, NO$_2$, or the group represented by formula (2),

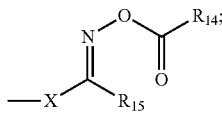

formula (2)

Y represents O, S, NR$_{26}$, or a direct bond;
p represents an integer of 0, 1, 2, or 3;
q represents an integer of 1, 2, or 3;
X represents CO or a direct bond;
R$_{13}$ represents a C$_1$ to C$_{20}$ alkyl group that is unsubstituted or substituted by one or a plurality of the following groups: halogen, R$_{17}$, COOR$_{17}$, OR$_{17}$, SR$_{18}$, CONR$_{19}$R$_{20}$, NR$_{19}$R$_{20}$, PO(OC$_k$H$_{2k+1}$)$_2$, or the group represented by formula (6)

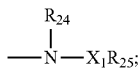

formula (6)

or R$_{13}$ represents a C$_2$ to C$_{20}$ alkyl group interrupted with one or a plurality of O, S, SO, SO$_2$, NR$_{26}$, or CO, or a C$_2$ to C$_{12}$ alkenyl group uninterrupted or is interrupted with one or a plurality of O, CO, or NR$_{26}$, wherein the interrupted C$_2$ to C$_{20}$ alkyl group and the uninterrupted or is interrupted C$_2$ to C$_{12}$ alkenyl group is unsubstituted or substituted by one or a plurality of halogens;

or R$_{13}$ represents a C$_4$ to C$_8$ cycloalkenyl group, a C$_2$ to C$_{12}$ alkynyl group, or a C$_3$ to C$_{10}$ cycloalkyl group uninterrupted or is interrupted with one or a plurality of O, S, CO, or NR$_{26}$;

or R$_{13}$ represents a phenyl group or a naphthyl group that is unsubstituted or substituted by one or a plurality of the following groups: OR$_{17}$, SR$_{18}$, NR$_{19}$R$_{20}$, COR$_{16}$, CN, NO$_2$, halogen, a C$_1$ to C$_{20}$ alkyl group, a C$_1$ to C$_4$ haloalkyl group, a C$_2$ to C$_{20}$ alkyl group interrupted with one or a plurality of O, S, CO, or NR$_{26}$, or the group represented by formula (7),

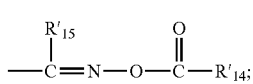

formula (7)

or the phenyl group or naphthyl group is substituted by a C$_3$ to C$_{10}$ cycloalkyl group or a C$_3$ to C$_{10}$ cycloalkyl group interrupted with one or a plurality of O, S, CO, or NR$_{26}$;

k represents an integer of 1 to 10;

R$_{14}$ represents hydrogen, a C$_3$ to C$_8$ cycloalkyl group, a C$_2$ to C$_5$ alkenyl group, a C$_1$ to C$_{20}$ alkoxy group, or a C$_1$ to C$_{20}$ alkyl group that is unsubstituted or substituted by one or a plurality of the following groups: halogen, a phenyl group, a C$_1$ to C$_{20}$ alkylphenyl group, or CN;

or R$_{14}$ represents a phenyl group or a naphthyl group that is unsubstituted or substituted by one or a plurality of the following groups: a C$_1$ to C$_6$ alkyl group, a C$_1$ to C$_4$ haloalkyl group, halogen, CN, OR$_{17}$, SR$_{18}$, and/or NR$_{19}$R$_{20}$;

or R$_{14}$ represents a C$_3$ to C$_{20}$ heteroaryl group, a C$_1$ to C$_8$ alkoxy group, a benzyloxy group, or a phenoxy group, and the benzyloxy group and the phenoxy group are unsubstituted or substituted by one or a plurality of the following groups: a C$_1$ to C$_6$ alkyl group, a C$_1$ to C$_4$ haloalkyl group and/or halogen; R$_{15}$ represents a C$_6$ to C$_{20}$ aryl group or a C$_3$ to C$_{20}$ heteroaryl group that is unsubstituted or substituted by one or a plurality of the following groups: a phenyl group, halogen, a C$_1$ to C$_4$ haloalkyl group, CN, NO$_2$, OR$_{17}$, SR$_{18}$, NR$_{19}$R$_{20}$, PO(OC$_k$H$_{2k+1}$)$_2$, SO—C$_1$ to C$_{10}$ alkyl, SO$_2$—C$_1$ to C$_{10}$ alkyl, or a C$_2$ to C$_{20}$ alkyl group interrupted with one or a plurality of O, S, or NR$_{26}$; or the C$_6$ to C$_{20}$ aryl group or C$_3$ to C$_{20}$ heteroaryl group is substituted by a C$_1$ to C$_{20}$ alkyl group, and the C$_1$ to C$_{20}$ alkyl group is unsubstituted or substituted by one or a plurality of the following groups: halogen, COOR$_{17}$, CONR$_{19}$R$_{20}$, a phenyl group, a C$_3$ to C$_8$ cycloalkyl group, a C$_3$ to C$_{20}$ heteroaryl group, a C$_6$ to C$_{20}$ aryloxycarbonyl group, a C$_3$ to C$_{20}$ heteroaryloxycarbonyl group, OR$_{17}$, SR$_{18}$, or NR$_{19}$R$_{20}$;

or R$_{15}$ represents hydrogen, a C$_2$ to C$_{12}$ alkenyl group, a C$_3$ to C$_8$ cycloalkyl group uninterrupted or is interrupted with one or a plurality of O, CO, or NR$_{26}$; or R$_{15}$ represents a C$_1$ to C$_{20}$ alkyl group that is unsubstituted or substituted by one or a plurality of the following groups: halogen, OR$_{17}$, SR$_{18}$, a C$_3$ to C$_8$ cycloalkyl group, a C$_3$ to C$_{20}$ heteroaryl group, a C$_6$ to C$_{20}$ aryloxycarbonyl group, a C$_3$ to C$_{20}$ heteroaryloxycarbonyl group, NR$_{19}$R$_{20}$, COOR$_{17}$, CONR$_{19}$R$_{20}$, PO(OC$_k$H$_{2k+1}$)$_2$, a phenyl group, the group represented by formula (6), or the group represented by formula (8),

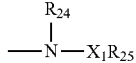

formula (6)

formula (8)

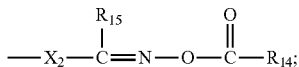

or the $C_1$ to $C_{20}$ alkyl group is substituted by a phenyl group, and the phenyl group is substituted by halogen, a $C_1$ to $C_{20}$ alkyl group, a $C_1$ to $C_4$ haloalkyl group, $OR_{17}$, $SR_{18}$, or $NR_{19}R_{20}$;

or $R_{15}$ represents a $C_2$ to $C_{20}$ alkyl group interrupted with one or a plurality of O, SO, or $SO_2$, and the interrupted $C_2$ to $C_{20}$ alkyl group is unsubstituted or substituted by one or a plurality of the following groups: halogen, $OR_{17}$, $COOR_{17}$, $CONR_{19}R_{20}$, a phenyl group, or a phenyl group substituted by $OR_{17}$, $SR_{18}$, or $NR_{19}R_{20}$;

or $R_{15}$ represents a $C_2$ to $C_{20}$ alkanoyl group or a benzoyl group that is unsubstituted or substituted by one or a plurality of the following groups: a $C_1$ to $C_6$ alkyl group, halogen, a phenyl group, $OR_{17}$, $SR_{18}$, or $NR_{19}R_{20}$; or $R_{15}$ represents a naphthoyl group that is unsubstituted or substituted by one or a plurality of $OR_{17}$ or a $C_3$ to $C_{14}$ heteroarylcarbonyl group;

or $R_{15}$ represents a $C_2$ to $C_{12}$ alkoxy group that is uninterrupted or is interrupted with one or a plurality of O and the interrupted or uninterrupted $C_2$ to $C_{12}$ alkoxycarbonyl group is unsubstituted or substituted by one or a plurality of hydroxyl groups;

or $R_{15}$ represents a phenoxycarbonyl group that is unsubstituted or substituted by one or a plurality of the following groups: a $C_1$ to $C_6$ alkyl group, halogen, a $C_1$ to $C_4$ haloalkyl group, a phenyl group, $OR_{17}$, $SR_{18}$, or $NR_{19}R_{20}$;

or $R_{15}$ represents CN, $CONR_{19}R_{20}$, $NO_2$, a $C_1$ to $C_4$ haloalkyl group, $S(O)_m$—$C_1$ to $C_6$ alkyl, or $S(O)_m$-phenyl that is unsubstituted or substituted by a $C_1$ to $C_{12}$ alkyl group or $SO_2$—$C_1$ to $C_6$ alkyl;

or $R_{15}$ represents $SO_2O$-phenyl that is unsubstituted or substituted by a $C_1$ to $C_{12}$ alkyl group; or $R_{15}$ represents a diphenylphosphinoyl group or di-($C_1$ to $C_4$ alkoxy)-phosphinoyl;

m represents 1 or 2;

$R'_{14}$ is defined the same as one of the $R_{14}$'s;

$R'_{15}$ is defined the same as one of the $R_{15}$'s;

$X_1$ represents O, S, SO, or $SO_2$;

$X_2$ represents O, CO, S, or a direct bond;

$R_{16}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by one or a plurality of $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{16}$ represents hydrogen or a $C_1$ to $C_{20}$ alkyl group, and the $C_1$ to $C_{20}$ alkyl group is unsubstituted or substituted by one or a plurality of the following groups: halogen, a phenyl group, OH, SH, CN, a $C_3$ to $C_6$ alkenyloxy group, $OCH_2CH_2CN$, $OCH_2CH_2(CO)O(C_1$ to $C_4$ alkyl), $O(CO)$—$(C_1$ to $C_4$ alkyl), $O(CO)$-phenyl, $(CO)OH$, or $(CO)O(C_1$ to $C_4$ alkyl);

or $R_{16}$ represents a $C_2$ to $C_{12}$ alkyl group interrupted with one or a plurality of O, S, or $NR_{26}$; or $R_{16}$ represents $(CH_2CH_2O)_{n+1}H$, $(CH_2CH_2O)_n(CO)$—($C_1$ to $C_8$ alkyl), a $C_2$ to $C_{12}$ alkenyl group, or a $C_3$ to $C_8$ cycloalkyl group;

or $R_{16}$ represents a phenyl group substituted by $SR_{18}$, wherein the group $R_{18}$ represents direct bond bonded to the phenyl group or a naphthyl ring of the carbazole portion to which the $COR_{16}$ group is attached;

n represents 1 to 20;

$R_{17}$ represents hydrogen, phenyl-$C_1$ to $C_3$ alkyl, or a $C_1$ to $C_{20}$ alkyl group that is unsubstituted or substituted by one or a plurality of the following groups: halogen, OH, SH, CN, a $C_3$ to $C_6$ alkenyloxy group, $OCH_2CH_2CN$, $OCH_2CH_2(CO)O(C_1$ to $C_4$ alkyl), $O(CO)$—($C_1$ to $C_4$ alkyl), $O(CO)$—($C_2$ to $C_4$)alkenyl, $O(CO)$-phenyl, $(CO)OH$, $(CO)O(C_1$ to $C_4$ alkyl), a $C_3$ to $C_{20}$ cycloalkyl group, $SO_2$—($C_1$ to $C_4$ haloalkyl), $O(C_1$ to $C_4$ haloalkyl), or a $C_3$ to $C_{20}$ cycloalkyl group interrupted with one or a plurality of O; or $R_{17}$ represents a $C_2$ to $C_{20}$ alkyl group interrupted with one or a plurality of O, S, or $NR_{26}$;

or $R_{17}$ represents $(CH_2CH_2O)_{n+1}H$, $(CH_2CH_2O)_n(CO)$—($C_1$ to $C_8$ alkyl), a $C_1$ to $C_8$ alkanoyl group, a $C_2$ to $C_{12}$ alkenyl group, a $C_3$ to $C_6$ alkenoyl group, or a $C_3$ to $C_{20}$ cycloalkyl group uninterrupted or is interrupted with one or a plurality of O, S, CO, or $NR_{26}$;

or $R_{17}$ represents $C_1$ to $C_8$ alkyl-$C_3$ to $C_{10}$ cycloalkyl that is uninterrupted or is interrupted with one or a plurality of O;

or $R_{17}$ represents a benzoyl group that is unsubstituted or substituted by one or a plurality of a $C_1$ to $C_6$ alkyl group, halogen, OH, or a $C_1$ to $C_3$ alkoxy group;

or $R_{17}$ represents a phenyl group, a naphthyl group, or a $C_3$ to $C_{20}$ heteroaryl group that is unsubstituted or substituted by one or a plurality of the following groups: halogen, OH, a $C_1$ to $C_{12}$ alkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, diphenyl-amine, or the group represented by formula (7),

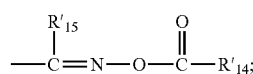

formula (7)

or $R_{17}$ forms a direct bond bonded to one of the carbon atoms of the phenyl group or naphthyl ring having the group represented by formula (2) or the group represented by formula (7),

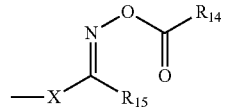

formula (2)

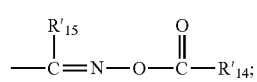

formula (7)

$R_{18}$ represents hydrogen, a $C_2$ to $C_{12}$ alkenyl group, a $C_3$ to $C_{20}$ cycloalkyl group, or phenyl-$C_1$ to $C_3$ alkyl, wherein the $C_2$ to $C_{12}$ alkenyl group, $C_3$ to $C_{20}$ cycloalkyl group, or phenyl-$C_1$ to $C_3$ alkyl is uninterrupted or is interrupted with one or a plurality of O, S, CO, $NR_{26}$, or $COOR_{17}$; or $R_{18}$ is a $C_1$ to $C_{20}$ alkyl group that is unsubstituted or substituted by one or a plurality of the following groups: OH, SH, CN, $C_3$ to $C_6$ alkenyloxy, $OCH_2CH_2CN$, $OCH_2CH_2(CO)O(C$ to $C_4$ alkyl), O(CO)—(C$_2$ to C$_4$)alkenyl, O(CO)—(C$_1$ to C$_4$ alkyl), O(CO)-phenyl, or (CO)OR$_{17}$;

or R$_{18}$ represents a C$_2$ to C$_{20}$ alkyl group interrupted with one or a plurality of O, S, CO, NR$_{26}$, or COOR$_{17}$;

or R$_{18}$ represents (CH$_2$CH$_2$O)$_n$H, (CH$_2$CH$_2$O)$_n$(CO)—(C$_1$ to C$_8$ alkyl), a C$_2$ to C$_8$ alkanoyl group, or a C$_3$ to C$_6$ alkenoyl group;

or R$_{18}$ represents a benzoyl group that is unsubstituted or substituted by one or a plurality of the following groups: a C$_1$ to C$_6$ alkyl group, halogen, OH, a C$_1$ to C$_4$ alkoxy group, or a C$_1$ to C$_4$ alkylthio group;

or R$_{18}$ represents a phenyl group, a naphthyl group, or a C$_3$ to C$_{20}$ heteroaryl group that is unsubstituted or substituted by one or a plurality of the following groups: halogen, a C$_1$ to C$_{12}$ alkyl group, a C$_1$ to C$_4$ haloalkyl group, a C$_1$ to C$_{12}$ alkoxy group, CN, NO$_2$, phenyl-C$_1$ to C$_3$ alkoxy, a phenoxy group, a C$_1$ to C$_{12}$ alkylthio group, a phenylthio group, N(C$_1$ to C$_{12}$ alkyl)$_2$, a diphenylamino group, (CO)O(C$_1$ to C$_8$ alkyl), (CO)—C$_1$ to C$_8$ alkyl, (CO)N(C$_1$ to C$_8$ alkyl)$_2$, or the group represented by formula (7),

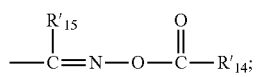

formula (7)

R$_{19}$ and R$_{20}$ are each independently hydrogen, a C$_1$ to C$_{20}$ alkyl group, a C$_2$ to C$_4$ hydroxyalkyl group, a C$_2$ to C$_{10}$ alkoxyalkyl group, a C$_2$ to C$_5$ alkenyl group, a C$_3$ to C$_{20}$ cycloalkyl group, phenyl-C$_1$ to C$_3$ alkyl, a C$_1$ to C$_8$ alkanoyl group, a C$_1$ to C$_8$ alkanoyloxy group, a C$_3$ to C$_{12}$ alkenoyl group, SO$_2$—(C$_1$ to C$_4$ haloalkyl), or a benzoyl group;

or R$_{19}$ and R$_{20}$ each independently represent a phenyl group, a naphthyl group, or a C$_3$ to C$_{20}$ heteroaryl group that is unsubstituted or substituted by one or a plurality of the following groups: halogen, a C$_1$ to C$_4$ haloalkyl group, a C$_1$ to C$_{20}$ alkoxy group, a C$_1$ to C$_{12}$ alkyl group, a benzoyl group, or a C$_1$ to C$_{12}$ alkoxy group;

or R$_{19}$ and R$_{20}$ form a 5-membered or 6-membered saturated or unsaturated ring that is uninterrupted or is interrupted with O, S, or NR$_{17}$ with a nitrogen atom attached thereto, and the 5-membered or 6-membered saturated or unsaturated ring is unsubstituted or substituted by one or a plurality of the following groups: a C$_1$ to C$_{20}$ alkyl group, a C$_1$ to C$_{20}$ alkoxy group, =O, OR$_{17}$, SR$_{18}$, NR$_{21}$R$_{22}$, (CO)R$_{23}$, NO$_2$, halogen, C$_1$ to C$_4$-haloalkyl, CN, a phenyl group, a C$_3$ to C$_{20}$ cycloalkyl group that is uninterrupted or is interrupted with one or a plurality of O, S, CO, or NR$_{17}$, or the group represented by formula (7),

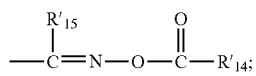

formula (7)

or R$_{19}$ and R$_{20}$ form a heteroaromatic ring system with a nitrogen atom attached thereto, and the ring system is unsubstituted or substituted by one or a plurality of the following groups: a C$_1$ to C$_{20}$ alkyl group, a C$_1$ to C$_4$ haloalkyl group, a C$_1$ to C$_{20}$ alkoxy group, =O, OR$_{17}$, SR$_{18}$, NR$_{21}$R$_{22}$, (CO)R$_{23}$, halogen, NO$_2$, CN, a phenyl group, or a C$_3$ to C$_{20}$ cycloalkyl group that is uninterrupted or is interrupted with one or a plurality of O, S, CO, or NR$_{17}$, or the group represented by formula (7),

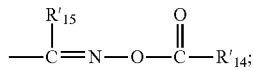

formula (7)

R$_{21}$ and R$_{22}$ are each independently hydrogen, a C$_1$ to C$_{20}$ alkyl group, a C$_1$ to C$_4$ haloalkyl group, a C$_3$ to C$_{10}$ cycloalkyl group, or a phenyl group;

or R$_{21}$ and R$_{22}$ form a 5-membered or 6-membered saturated or unsaturated ring that is uninterrupted or is interrupted with O, S, or NR$_{26}$ with a nitrogen atom attached thereto, and the 5-membered or 6-membered saturated or unsaturated ring is not fused or the 5-membered or 6-membered saturated or unsaturated ring is fused with a benzene ring;

R$_{23}$ represents hydrogen, OH, a C$_1$ to C$_{20}$ alkyl group, a C$_1$ to C$_4$ haloalkyl group, a C$_2$ to C$_{20}$ alkyl group interrupted with one or a plurality of O, CO, or NR$_{26}$, a C$_3$ to C$_{20}$ cycloalkyl group that is uninterrupted or is interrupted with O, S, CO, or NR$_{26}$, or R$_{23}$ represents a phenyl group, a naphthyl group, phenyl-C$_1$ to C$_4$ alkyl, OR$_{17}$, SR$_{18}$, or NR$_{21}$R$_{22}$;

R$_{24}$ represents (CO)OR$_{17}$, CONR$_{19}$R$_{20}$, (CO)R$_{17}$; or R$_{24}$ is defined the same as one of the R$_{19}$'s and R$_{20}$'s;

R$_{25}$ represents COOR$_{17}$, CONR$_{19}$R$_{20}$, or (CO)R$_{17}$; or R$_{25}$ is defined the same as one of the R$_{17}$'s;

R$_{26}$ represents hydrogen, a C$_1$ to C$_{20}$ alkyl group, a C$_1$ to C$_4$ haloalkyl group, or a C$_2$ to C$_{20}$ alkyl group interrupted with one or a plurality of O or CO; or phenyl-C$_1$ to C$_4$ alkyl or a C$_3$ to C$_8$ cycloalkyl group that is uninterrupted or is interrupted with one or a plurality of O or CO; or (CO)R$_{19}$; or a phenyl group that is unsubstituted or substituted by one or a plurality of the following groups: a C$_1$ to C$_{20}$ alkyl group, halogen, a C$_1$ to C$_4$ haloalkyl group, OR$_{17}$, SR$_{18}$, NR$_{19}$R$_{20}$, or the group represented by formula (7);

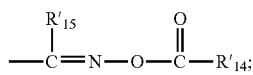

formula (7)

however, the condition is that, at least one group represented by formula (2) or formula (7) is present in the molecule

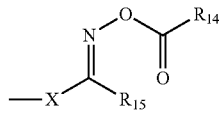

formula (2)

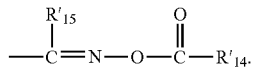

formula (7)

In an example of the invention, R$_1$, R$_2$, R$_3$, R$_4$, R$_5$, R$_6$, R$_7$, and R$_8$ are each independently hydrogen, a C$_1$ to C$_{20}$ alkyl group, COR$_{16}$, NO$_2$, or the group represented by formula (2);

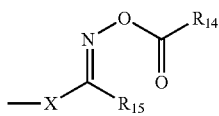

formula (2)

or $R_1$ and $R_2$, $R_2$ and $R_3$, $R_3$ and $R_4$, $R_5$ and $R_6$, $R_6$ and $R_7$, or $R_7$ and $R_8$ are each independently the group represented by formula (5) at the same time;

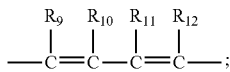

formula (5)

however, the condition is that at least one pair in $R_1$ and $R_2$, $R_2$ and $R_3$, $R_3$ and $R_4$, $R_5$ and $R_6$, $R_6$ and $R_7$, and $R_7$ and $R_8$ is the group represented by formula (5);

X represents CO or a direct bond;

$R_{13}$ represents a $C_1$ to $C_{20}$ alkyl group that is unsubstituted or substituted by one or a plurality of the following groups: halogen, $OR_{17}$, $SR_{18}$, $COOR_{17}$, $CONR_{19}R_{20}$, or $PO(OC_kH_{2k+1})_2$;

or $R_{13}$ represents a $C_2$ to $C_{20}$ alkyl group interrupted with one or a plurality of O, S, $NR_{26}$, or CO;

or $R_{13}$ represents a phenyl group or a naphthyl group that is unsubstituted or substituted by $COR_{16}$ or one or a plurality of the group represented by formula (7);

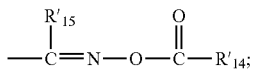

formula (7)

$R_{14}$ represents a $C_1$ to $C_{20}$ alkyl group, a phenyl group, or a $C_1$ to $C_8$ alkoxy group;

$R_{15}$ represents a phenyl group, a naphthyl group, or a $C_3$ to $C_{20}$ heteroaryl group that is unsubstituted or substituted by one or a plurality of the following groups: a phenyl group, halogen, a $C_1$ to $C_4$ haloalkyl group, $OR_{17}$, $SR_{18}$, or a $C_2$ to $C_{20}$ alkyl group interrupted with one or a plurality of O or S; or the phenyl group, naphthyl group, or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, $NR_{19}R_{20}$, or $PO(OC_kH_{2k+1})_2$;

or $R_{15}$ represents a $C_1$ to $C_{20}$ alkyl group that is unsubstituted or substituted by one or a plurality of the following groups: $OR_{17}$, $SR_{18}$, a $C_3$ to $C_8$ cycloalkyl group, a $C_3$ to $C_{20}$ heteroaryl group, $NR_{19}R_{20}$, $COOR_{17}$, $CONR_{19}R_{20}$, or $PO(OC_kH_{2k+1})_2$;

$R'_{14}$ is defined the same as one of the $R_{14}$'s;

$R'_{15}$ is defined the same as one of the $R_{15}$'s;

$R_{16}$ represents a phenyl group that is unsubstituted or substituted by one or a plurality of the following groups: $OR_{17}$, $SR_{18}$, $NR_{19}R_{20}$, or a $C_2$ to $C_{20}$ alkyl group interrupted with one or a plurality of O, S, or $NR_{26}$;

or $R_{16}$ represents a phenyl group substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, or $NR_{19}R_{20}$;

or $R_{16}$ represents a $C_1$ to $C_{20}$ alkyl group that is unsubstituted or substituted by the following groups: halogen, a phenyl group, OH, SH, CN, a $C_3$ to $C_6$ alkenyloxy group, $OCH_2CH_2(CO)O(C_1$ to $C_4$ alkyl), $O(CO)$—$(C_1$ to $C_4$ alkyl), or $(CO)O(C_1$ to $C_4$ alkyl);

$R_{17}$ represents a $C_1$ to $C_{20}$ alkyl group that is unsubstituted or substituted by one or a plurality of the following groups: halogen, $OCH_2CH_2(CO)O(C_1$ to $C_4$ alkyl), $O(C_1$ to $C_4$ alkyl), $(CO)O(C_1$ to $C_4$ alkyl), a $C_3$ to $C_{20}$ cycloalkyl group, or a $C_3$ to $C_{20}$ cycloalkyl group interrupted with one or a plurality of O;

or $R_{17}$ represents a $C_2$ to $C_{20}$ alkyl group interrupted with one or a plurality of O;

$R_{18}$ represents a methyl group substituted by $COOR_{17}$;

$R_{19}$ and $R_{20}$ are each independently hydrogen, a phenyl group, a $C_1$ to $C_{20}$ alkyl group, a $C_1$ to $C_8$ alkanoyl group, or a $C_1$ to $C_8$ alkanoyloxy group;

or $R_{19}$ and $R_{20}$ form a heteroaromatic ring system with a nitrogen atom attached thereto, and the ring system is unsubstituted or substituted by the group represented by formula (7);

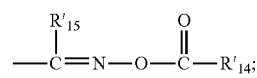

formula (7)

however, the condition is that, at least one group represented by formula (2) or formula (7) is present in the molecule;

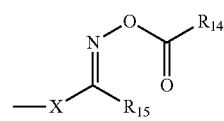

formula (2)

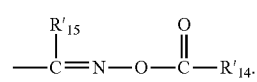

formula (7)

In an example of the invention, $R_1$, $R_2$, $R_3$, $R_4$, $R_5$, $R_6$, $R_7$, and $R_8$ are each independently hydrogen, or $R_1$ and $R_2$, $R_3$ and $R_4$, or $R_5$ and $R_6$ are each independently the group represented by formula (5) at the same time;

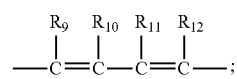

formula (5)

however, the condition is that at least one pair in $R_1$ and $R_2$, $R_3$ and $R_4$, and $R_5$ and $R_6$ is the group represented by formula (5);

or $R_2$ represents $COR_{16}$, $NO_2$, or the group represented by formula (2) or the group represented by formula (3);

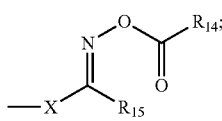

formula (2)

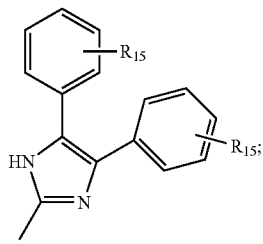

formula (3)

or $R_7$ represents $COR_{16}$ or the group represented by formula (2);

$R_9$, $R_{11}$, and $R_{12}$ represent hydrogen;

$R_{10}$ represents hydrogen, $OR_{17}$, or $COR_{16}$;

X represents CO or a direct bond;

$R_{13}$ represents a $C_1$ to $C_{20}$ alkyl group that is unsubstituted or substituted by one or a plurality of the following groups: halogen, $R_{17}$, $OR_{17}$, $SR_{18}$, or $PO(OC_kH_{2k+1})_2$;

or $R_{13}$ represents a $C_2$ to $C_{20}$ alkyl group interrupted with one or a plurality of O;

or $R_{13}$ represents a phenyl group;

k represents the integer 2;

$R_{14}$ represents a $C_1$ to $C_{20}$ alkyl group or a thienyl group;

$R_{15}$ represents a phenyl group or a naphthyl group that is unsubstituted or substituted by one or a plurality of $OR_{17}$ or a $C_1$ to $C_{20}$ alkyl group;

or $R_{15}$ represents a thienyl group, hydrogen, or a $C_1$ to $C_{20}$ alkyl group, and the $C_1$ to $C_{20}$ alkyl group is unsubstituted or substituted by one or a plurality of the following groups: $OR_{17}$, $SR_{18}$, a $C_3$ to $C_8$ cycloalkyl group, $NR_{19}R_{20}$, or $COOR_{17}$;

or $R_{15}$ represents a $C_2$ to $C_{20}$ alkyl group interrupted with $SO_2$;

$R_{16}$ represents a phenyl group or a naphthyl group that is unsubstituted or substituted by one or a plurality of the following groups: $OR_{17}$, $SR_{18}$, $NR_{19}R_{20}$, or a $C_1$ to $C_{20}$ alkyl group;

or $R_{16}$ represents a thienyl group;

$R_{17}$ represents hydrogen, a $C_1$ to $C_8$ alkanoyl group, or a $C_1$ to $C_{20}$ alkyl group, and the $C_1$ to $C_{20}$ alkyl group is unsubstituted or substituted by one or a plurality of the following groups: halogen, $O(CO)$—($C_1$ to $C_4$ alkyl), $O(CO)$—($C_2$ to $C_4$ alkenyl), or a $C_3$ to $C_{20}$ cycloalkyl group interrupted with one or a plurality of O;

or $R_{17}$ represents a $C_2$ to $C_{20}$ alkyl group interrupted with one or a plurality of O;

$R_{18}$ represents a $C_3$ to $C_{20}$ cycloalkyl group or a $C_1$ to $C_{20}$ alkyl group that is unsubstituted or substituted by one or a plurality of OH, $O(CO)$—($C_2$ to $C_4$ alkenyl), or $(CO)OR_{17}$;

or $R_{18}$ represents a phenyl group that is unsubstituted or substituted by one or a plurality of halogens;

$R_{19}$ and $R_{20}$ are each independently a $C_1$ to $C_8$ alkanoyl group or a $C_1$ to $C_8$ alkanoyloxy group;

or $R_{19}$ and $R_{20}$ form a 5-membered or 6-membered saturated ring interrupted with O with a nitrogen atom attached thereto;

however, the condition is that, at least one group represented by formula (2) is present in the molecule;

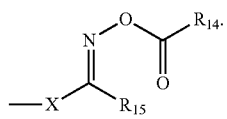

formula (2)

In an example of the invention, the alkali-soluble resin (A) includes an alkali-soluble resin (A-1), wherein the alkali-soluble resin (A-1) is obtained by the polymerization of a mixture, and the mixture includes: a diol compound (a-1-1) containing a polymerizable unsaturated group; a tetracarboxylic acid or an acid dianhydride thereof (a-1-2); and a dicarboxylic acid or an acid anhydride thereof (a-1-3). The diol compound (a-1-1) containing a polymerizable unsaturated group is obtained by the reaction of an epoxy compound having at least two epoxy groups and a compound having at least one carboxylic acid group and at least one ethylenically unsaturated group, and the epoxy compound having at least two epoxy groups includes the structure shown in formula (a-1), the structure shown in formula (a-2), or both structures.

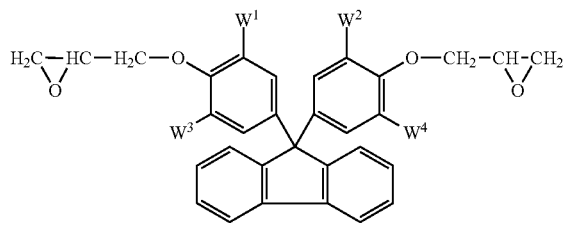

formula (a-1)

In formula (a-1), $W^1$, $W^2$, $W^3$, and $W^4$ each independently represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group.

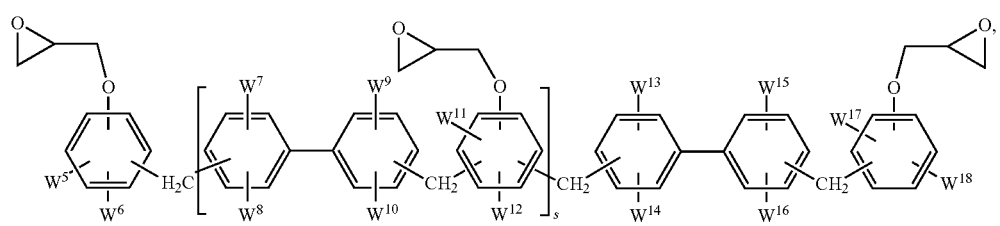

formula (a-2)

in formula (a-2), $W^5$ to $W^{18}$ each independently represent a hydrogen atom, a halogen atom, a $C_1$ to $C_8$ alkyl group, or a $C_6$ to $C_{15}$ aryl group, and s represents an integer of 0 to 10. Moreover, the number-average molecular weight of the alkali-soluble resin (A-1) is 1000 to 8000.

In an example of the invention, at least one of the tetracarboxylic acid or an acid dianhydride thereof (a-1-2) and the dicarboxylic acid or an acid anhydride thereof (a-1-3) contains a fluorine atom.

In an example of the invention, the alkali-soluble resin (A) includes an alkali-soluble resin (A-2), and the alkali-soluble resin (A-2) is synthesized by the polycondensation of a silane monomer, or formed by polycondensation using a silane monomer and other polymerizable compounds.

In an example of the invention, the photosensitive resin composition further includes a hyperbranched polymer (F). The hyperbranched polymer (F) is formed by reacting a multi-mercapto compound represented by formula (F2) and a polyfunctional (meth)acrylate represented by formula (F1).

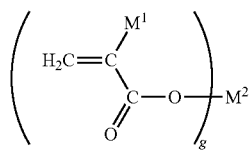

formula (F1)

In formula (F1), $M^1$ represents a hydrogen atom or a $C_1$ to $C_4$ alkyl group. $M^2$ represents a residual group after the esterification of a g number of hydroxyl groups in a compound containing a hydroxyl group having an h number of hydroxyl groups, wherein h≥g, and g represents an integer of 2 to 20. The compound containing a hydroxyl group is $M^3(OH)_h$ or a modified compound of the $M^3(OH)_h$ by propylene oxide, epichlorohydrin, an alkyl group, an alkoxy group, or hydroxypropyl acrylate. $M^3(OH)_h$ is a $C_2$ to $C_{18}$ polyalcohol, polyhydric alcohol ether formed by the polyalcohol, an ester formed by reacting the polyalcohol and an acid, or silicone.

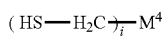

formula (F2)

In formula (F2), $M^4$ represents a single bond, a $C_1$ hydrocarbon group, or a $C_2$ to $C_{22}$ straight chain or branched hydrocarbon group. The skeleton of $M^4$ can further include sulfur atoms or oxygen atoms in an ester group. i represents an integer of 2 to 6, wherein when $M^4$ represents a single bond, i represents 2; when $M^4$ represents a $C_1$ hydrocarbon group, i represents an integer of 2 to 4; and when $M^4$ represents a $C_2$ to $C_{22}$ straight-chain or branched hydrocarbon group, i represents an integer of 2 to 6.

In an example of the invention, the photosensitive resin composition further includes a compound (H) represented by formula (10).

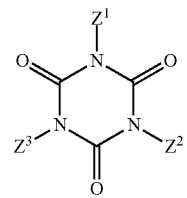

formula (10)

In formula (10), $Z^1$, $Z^2$, and $Z^3$ each independently represent a trialkoxysilane group bonded by an alkylene group or an arylene group.

In an example of the invention, based on 100 parts by weight of the alkali-soluble resin (A), the usage amount of the compound (B) having an ethylenically unsaturated group is 15 parts by weight to 200 parts by weight, the usage amount of the compound (B-1) having an acid group and at least three ethylenically unsaturated groups is 15 parts by weight to 150 parts by weight, the usage amount of the photoinitiator (C) is 10 parts by weight to 80 parts by weight, the usage amount of the photoinitiator (C-1) represented by formula (1) is 10 parts by weight to 70 parts by weight, the usage amount of the solvent of the solvent (D) is 1000 parts by weight to 8000 parts by weight, and the usage amount of the black pigment (E) is 150 parts by weight to 1200 parts by weight.

In an example of the invention, based on 100 parts by weight of the alkali-soluble resin (A), the usage amount of the alkali-soluble resin (A-1) is 50 parts by weight to 100 parts by weight.

In an example of the invention, based on 100 parts by weight of the alkali-soluble resin (A), the usage amount of the alkali-soluble resin (A-2) is 0 parts by weight to 50 parts by weight.

In an example of the invention, based on 100 parts by weight of the alkali-soluble resin (A), the usage amount of the hyperbranched polymer (F) is 3 parts by weight to 35 parts by weight.

In an example of the invention, based on 100 parts by weight of the alkali-soluble resin (A), the usage amount of the thermal initiator (G) is 4 parts by weight to 40 parts by weight.

In an example of the invention, based on 100 parts by weight of the alkali-soluble resin (A), the usage amount of the compound represented by formula (10) is 1 part by weight to 10 parts by weight.

The invention further provides a black matrix. The black matrix is formed by using the photosensitive resin composition.

The invention also provides a color filter. The color filter includes the black matrix.

The invention further provides a liquid crystal display. The liquid crystal display includes the color filter.

Based on the above, the photosensitive resin composition of the invention includes the compound (B) having an ethylenically unsaturated group and the photoinitiator (C) having a specific structure, and therefore the issues of poor resolution, poor heat resistance, and poor reliability under high temperature and high humidity of the black matrix can be alleviated, such that the photosensitive resin composition of the invention is suitable for a color filter and a liquid crystal display element.

In order to make the aforementioned features and advantages of the invention more comprehensible, examples are described in detail below.

DESCRIPTION OF THE EXAMPLES

Photosensitive Resin Composition

The invention provides a photosensitive resin composition including an alkali-soluble resin (A), a compound (B) having an ethylenically unsaturated group, a photoinitiator (C), a solvent (D), and a black pigment(E). Moreover, the photosensitive resin composition can further include a hyperbranched polymer (F), a thermal initiator (G), and a compound (H) represented by formula (10). In the following, the individual components used in the photosensitive resin composition of the invention are described in detail:

It should be mentioned that, in the following, (meth) acrylic acid represents acrylic acid and/or methacrylic acid, and (meth)acrylate represents acrylate and/or methacrylate. Similarly, (meth)acryloyl group represents acryloyl group and/or methacryloyl group.

Alkali-Soluble Resin (A)

The alkali-soluble resin (A) includes an alkali-soluble resin (A-1), an alkali-soluble resin (A-2), and other alkali-soluble resins (A-3).

Alkali-Soluble Resin (A-1)

The alkali-soluble resin (A-1) is obtained by the polymerization of a mixture. The mixture includes a diol compound (a-1-1) containing a polymeric unsaturated group, a tetracarboxylic acid or an acid dianhydride thereof (a-1-2), and a dicarboxylic acid or an acid anhydride thereof (a-1-3).

Diol Compound (a-1-1) Containing Polymeric Unsaturated Group

The diol compound (a-1-1) containing a polymeric unsaturated group is obtained by the reaction of an epoxy compound having at least two epoxy groups and a compound having at least one carboxylic acid group and at least one ethylenically unsaturated group.

The epoxy compound having at least two epoxy groups includes the structure shown in formula (a-1), the structure shown in formula (a-2), or the structure shown in formula (a-3), or all three of the structures. The structure shown in formula (a-1), the structure shown in formula (a-2), and the structure shown in formula (a-3) are respectively described below.

Specifically, the structure represented by formula (a-1) is as follows:

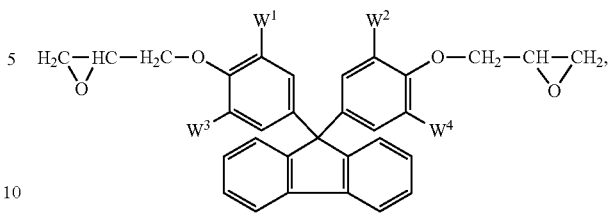

formula (a-1)

in formula (a-1), $W^1$, $W^2$, $W^3$, and $W^4$ each independently represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group.

The epoxy compound having at least two epoxy groups and containing the structure represented by formula (a-1) can include a bisphenol fluorene-type compound having an epoxy group obtained from the reaction between a bisphenol fluorene-type compound and epihalohydrin.

In detail, specific examples of the bisphenol fluorene-type compound include 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, a similar compound thereof, or a combination of the compounds.

Specific examples of the epihalohydrin include epichlorohydrin, epibromohydrin, a similar compound thereof, or a combination of the compounds.

Specific examples of the bisphenol fluorene-type compound having an epoxy group include (1) a product made by Nippon Steel Chemical such as ESF-300 or a similar compound thereof; (2) a product made by Osaka Gas such as PG-100, EG-210, or a similar compound thereof; and (3) a product made by S.M.S. Technology Co. such as SMS-F9PhPG, SMS-F9CrG, SMS-F914PG, or a similar compound thereof.

Moreover, specifically, the structure represented by formula (a-2) is as follows:

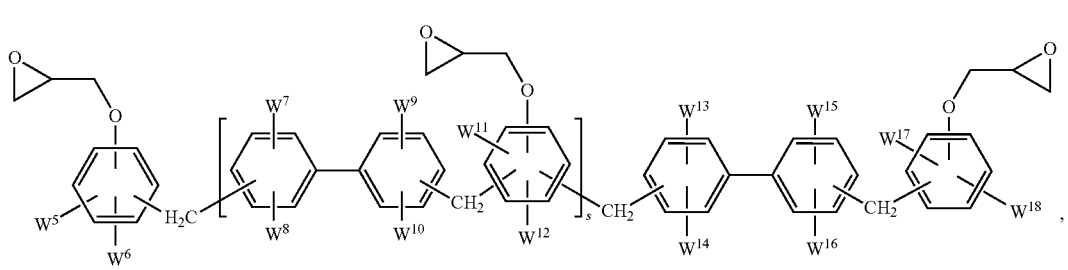

formula (a-2)

in formula (a-2), $W^5$ to $W^{18}$ each independently represent a hydrogen atom, a halogen atom, a $C_1$ to $C_8$ alkyl group, or a $C_6$ to $C_{15}$ aryl group, and s represents an integer of 0 to 10.

The epoxy compound having at least two epoxy groups and containing the structure represented by formula (a-2) can be obtained from the reaction between a compound having the structure of formula (a-2-I) and epihalohydrin in the presence of alkali metal hydroxide.

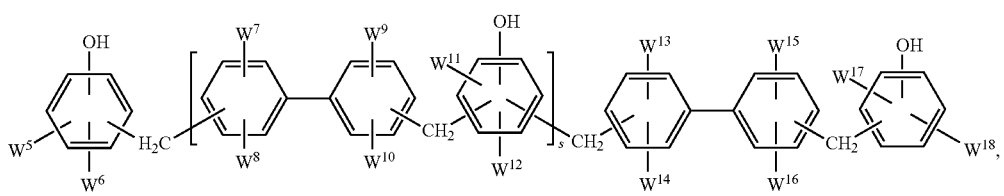

formula (a-2-I)

in formula (a-2-I), the definitions of $W^5$ to $W^{18}$ and s are respectively the same as the definitions of $W^5$ to $W^{18}$ and s in formula (a-2), and are not repeated herein.

The synthesis method of the epoxy compound having at least two epoxy groups and containing the structure represented by formula (a-2) is as described in the patent of TW201508418.

Specific examples of the epoxy compound having at least two epoxy groups and containing the structure represented by formula (a-2) include products such as NC-3000, NC-3000H, NC-3000S, and NC-3000P made by Nippon Kayaku Co., Ltd.

Moreover, specifically, the structure represented by formula (a-3) is as follows:

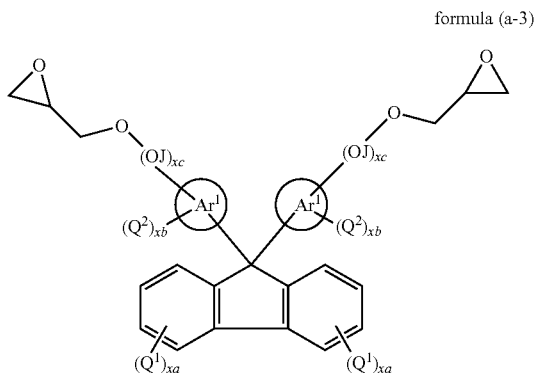

formula (a-3)

In formula (a-3), $Ar^1$ represents a naphthalene ring, $Q^1$ represents a cyano group, halogen, or a hydrocarbon group, $Q^2$ represents a hydrocarbon group, an alkoxy group, a cycloalkoxy group, an aryloxy group, an aralkyloxy group, an alkylthio group, a cycloalkylthio group, an arylthio group, an aralkylthio group, an acyl group, halogen, a nitro group, a cyano group, or a substituted amino group, J represents an alkylene group, xa represents an integer of 0 to 4, and xb and xc represent integers of 0 or more.

Specific examples of the epoxy compound having at least two epoxy groups and containing the structure represented by formula (a-3) include: 9,9-bis(glycidyloxynaphthyl)fluorene, and is, for instance, a similar compound such as 9,9-bis(6-glycidyloxy-2-naphthyl)fluorene or 9,9-bis(5-glycidoxy-1-naphthyl)fluorene.

The compound having at least one carboxylic acid group and at least one ethylenically unsaturated group is selected from the group consisting of (1) to (3) below:

(1) acrylate, methacrylate, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphthalic acid, 2-methacryloyloxybutylhydrophthalic acid, or a similar compound thereof;

(2) a compound obtained from the reaction between (meth)acrylate having a hydroxyl group and a dicarboxylic acid compound, wherein specific examples of the dicarboxylic acid compound include hexanedioic acid, butanedioic acid, maleic acid, phthalic acid, or a similar compound thereof; and (3) a half ester compound obtained from the reaction between (meth)acrylate having a hydroxyl group and a carboxylic acid anhydride compound, wherein specific examples of the (meth)acrylate having a hydroxyl group include (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, pentaerythritol trimethacrylate, or a similar compound thereof.

Moreover, the carboxylic acid anhydride compound is the same as the tetracarboxylic dianhydride or dicarboxylic anhydride below and is not repeated herein.

Tetracarboxylic Acid or Acid Dianhydride Thereof
(a-1-2)

The tetracarboxylic acid or an acid dianhydride thereof (a-1-2) includes a tetracarboxylic acid or an acid dianhydride thereof containing a fluorine atom, other tetracarboxylic acids or an acid dianhydride thereof other than the tetracarboxylic acid or an acid dianhydride thereof containing a fluorine atom, or a combination of the two.

The tetracarboxylic acid or an acid dianhydride thereof containing a fluorine atom is selected from the group consisting of a tetracarboxylic acid compound containing a fluorine atom represented by formula (K-1) and a tetracarboxylic acid dianhydride compound containing a fluorine atom represented by formula (K-2). Specifically, the tetracarboxylic acid compound containing a fluorine atom represented by formula (K-1) and the tetracarboxylic acid dianhydride compound containing a fluorine atom represented by formula (K-2) are as shown below.

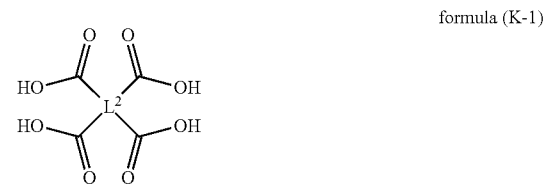

formula (K-1)

-continued

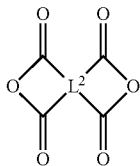

formula (K-2)

In formula (K-1) and formula (K-2), $L^2$ is a tetravalent aromatic group having fluorine and preferably has a benzene ring. Specifically, one of the groups represented by formula (L-1) to (L-6) is preferred.

formula (L-1)

formula (L-2)

formula (L-3)

formula (L-4)

formula (L-5)

formula (L-6)

In formula (L-1) to formula (L-6), each E independently represents a fluorine atom or a trifluoromethyl group, and * represents the location of bonding with a carbon atom.

In detail, specific examples of the tetracarboxylic acid or an acid dianhydride thereof containing a fluorine atom include an aromatic tetracarboxylic acid containing fluorine such as 4,4'-hexafluoro isopropylidene diphthalic acid, 1,4-difluoropyromellitic acid, 1-monofluoropyromellitic acid, or 1,4-ditrifluoromethylpyromellitic acid, a dianhydride compound of the tetracarboxylic acids, or a combination of the compounds.

Specific examples of the tetracarboxylic acid containing a fluorine atom or an acid dianhydride thereof further include a tetracarboxylic acid containing fluorine such as 3,3'-(hexafluoro isopropylidene)diphthalic acid, 5,5'-[2,2,2-trifluoro-1-[3-(trifluoromethyl)phenyl]ethylidene]diphthalic acid, 5,5'-[2,2,3,3,3-pentafluoro-1-(trifluoromethyl)propylidene]diphthalic acid, 5,5'-oxybis[4,6,7-trifluoro-pyromellitic acid], 3,6-bis(trifluoromethyl)pyromellitic acid, 4-(trifluoromethyl)pyromellitic acid, or 1,4-bis(3,4-dicarboxylic acid trifluorophenoxy)tetrafluoro benzene, a dianhydride compound of the tetracarboxylic acids, or a combination of the compounds.

The other tetracarboxylic acids or an acid dianhydride thereof include a saturated straight-chain hydrocarbon tetracarboxylic acid, an alicyclic tetracarboxylic acid, an aromatic tetracarboxylic acid, a dianhydride compound of the tetracarboxylic acids, or a combination thereof.

Specific examples of the saturated straight-chain hydrocarbon tetracarboxylic acid include butanetetracarboxylic acid, pentanetetracarboxylic acid, hexanetetracarboxylic acid, or a combination of the compounds. The saturated straight-chain hydrocarbon tetracarboxylic acid can also have a substituent.

Specific examples of the alicyclic tetracarboxylic acid include cyclobutanetetracarboxylic acid, cyclopentanetetracarboxylic acid, cyclohexanetetracarboxylic acid, norbornane tetracarboxylic acid, or a combination of the compounds. The alicyclic tetracarboxylic acid can also have a substituent.

Specific examples of the aromatic tetracarboxylic acid include pyromellitic acid, benzophenone tetracarboxylic acid, biphenyltetracarboxylic acid, biphenylether tetracarboxylic acid, diphenylsulfonetetracarboxylic acid, 1,2,3,6-tetrahydrophthalic acid, or a combination of the compounds. The aromatic tetracarboxylic acid can also have a substituent.

Dicarboxylic Acid or Acid Anhydride Thereof
(a-1-3)

The dicarboxylic acid or an acid anhydride thereof (a-1-3) includes a dicarboxylic acid or an acid anhydride thereof containing a fluorine atom, other dicarboxylic acids or an acid anhydride thereof other than the dicarboxylic acid or an acid anhydride thereof containing a fluorine atom, or a combination of the two.

The dicarboxylic acid or an acid anhydride thereof containing a fluorine atom is selected from the group consisting of a dicarboxylic acid compound containing a fluorine atom represented by formula (G-1) and a dicarboxylic acid anhydride compound containing a fluorine atom represented by formula (G-2). Specifically, the dicarboxylic acid compound containing a fluorine atom represented by formula (G-1) and the dicarboxylic acid anhydride compound containing a fluorine atom represented by formula (G-2) are as shown below.

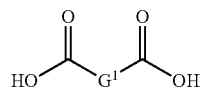

formula (G-1)

-continued

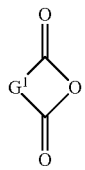

formula (G-2)

In formula (G-1) and formula (G-2), $G^1$ represents a $C_1$ to $C_{100}$ organic group containing a fluorine atom.

Specific examples of the dicarboxylic acid or an acid anhydride thereof containing a fluorine atom include 3-fluorophthalic acid, 4-fluorophthalic acid, tetrafluorophthalic acid, 3,6-difluorophthalic acid, tetrafluoro succinic acid, an acid anhydride compound of the dicarboxylic acids, or a combination of the compounds.

Specific examples of the other dicarboxylic acids or an acid anhydride thereof include a saturated straight-chain hydrocarbon dicarboxylic acid, a saturated cyclic hydrocarbon dicarboxylic acid, an unsaturated dicarboxylic acid, an acid anhydride of the dicarboxylic acid compounds, or a combination of the compounds.

Specific examples of the saturated straight-chain hydrocarbon dicarboxylic acid include succinic acid, acetyl succinic acid, adipic acid, azelaic acid, citramalic acid, malonic acid, glutaric acid, citric acid, tataric acid, ketogluconic acid, pimelic acid, sebacic acid, suberic acid, diglycolic acid, or a combination of the compounds. The hydrocarbon group in the saturated straight-chain hydrocarbon dicarboxylic acid can also be substituted.

Specific examples of the saturated cyclic hydrocarbon dicarboxylic acid include hexahydrophthalic acid, cyclobutanedicarboxylic acid, cyclopentanedicarboxylic acid, norbornanedicarboxylic acid, hexahydrotrimellitic acid, or a combination of the compounds. The saturated cyclic hydrocarbon dicarboxylic acid can also be an alicyclic dicarboxylic acid in which a saturated hydrocarbon is substituted.

Specific examples of the unsaturated dicarboxylic acid include maleic acid, itaconic acid, phthalic acid, tetrahydrophthalic acid, methyl endo-methylene tetrahydro phthalic acid, chlorendic acid, trimellitic acid, or a combination of the compounds.

Specific examples of the other dicarboxylic acids or an acid anhydride thereof include a dicarboxylic acid anhydride such as trimethoxysilylpropyl succinic anhydride, triethoxysilylpropyl succinic anhydride, methyldimethoxysilylpropyl succinic anhydride, methyldiethoxysilylpropyl succinic anhydride, trimethoxysilylbutyl succinic anhydride, triethoxysilylbutyl succinic anhydride, methyldiethoxysilylbutyl succinic anhydride, para-(trimethoxysilyl)phenyl succinic anhydride, para-(triethoxysilyl)phenyl succinic anhydride, para-(methyldimethoxysilyl)phenyl succinic anhydride, para-(methyldiethoxysilyl)phenyl succinic anhydride, meta-(trimethoxysilyl)phenyl succinic anhydride, meta-(triethoxysilyl)phenyl succinic anhydride, or meta-(methyldiethoxysilyl)phenyl succinic anhydride, a dicarboxylic acid compound of the dicarboxylic acid anhydrides, or a combination of the compounds.

The synthesis method of the alkali-soluble resin (A-1) is not particularly limited, and the alkali-soluble resin (A-1) can be obtained as long as the diol compound (a-1-1) containing a polymeric unsaturated group, the tetracarboxylic acid dianhydride or a tetracarboxylic acid thereof (a-1-2), and the dicarboxylic acid anhydride or a dicarboxylic acid thereof (a-1-3) are reacted. Synthesis can be performed with reference to the patent of TW201508418.

The number-average molecular weight of the alkali-soluble resin (A-1) is 1000 to 8000.

Based on 100 parts by weight of the alkali-soluble resin (A), the usage amount of the alkali-soluble resin (A-1) is 50 parts by weight to 100 parts by weight, preferably 60 parts by weight to 100 parts by weight, and more preferably 70 parts by weight to 100 parts by weight. When the alkali-soluble resin (A-1) contains a fluorine atom, the reliability of the resulting photosensitive resin composition under high temperature and high humidity can be further improved.

Alkali-Soluble Resin (A-2)

The alkali-soluble resin (A-2) is synthesized by the polycondensation of a silane monomer, or synthesized by polycondensation using a silane monomer and other polymerizable compounds. The type of the alkali-soluble resin (A-2) is not particularly limited, and any type thereof capable of achieving the object of the invention can be used.

The silane monomer includes, but is not limited to, a silane monomer (a-S1) and a silane monomer (a-S2); and the other polymerizable compounds contain a siloxane prepolymer (a-S3), a silica particle (a-S4), or a combination thereof. Each component and the reaction steps and conditions of the polycondensation are further described below.

Silane Monomer (a-S1)

The silane monomer (a-S1) is a compound represented by formula (9-1).

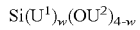

formula (9-1)

In formula (9-1), each $U^1$ independently represents a hydrogen atom, a $C_1$ to $C_{10}$ alkyl group, a $C_2$ to $C_{10}$ alkenyl group, a $C_6$ to $C_{15}$ aromatic group, an alkyl group containing an acid anhydride group, an alkyl group containing an epoxy group, or an alkoxy group containing an epoxy group, at least one $U^1$ is an alkyl group containing an acid anhydride group, an alkyl group containing an epoxy group, or an alkoxy group containing an epoxy group; each $U^2$ represents a hydrogen atom, a $C_1$ to $C_6$ alkyl group, a $C_1$ to $C_6$ acyl group, or a $C_6$ to $C_{15}$ aromatic group; and w represents an integer of 1 to 3.

More specifically, when $U^1$ in formula (9-1) represents a $C_1$ to $C_{10}$ alkyl group, specifically, $U^1$ is, for instance, a methyl group, an ethyl group, an n-propyl group, an isopropyl group, an n-butyl group, a t-butyl group, an n-hexyl group, or an n-decyl group. Moreover, $U^1$ can also be an alkyl group having other substituents. Specifically, $U^1$ is, for instance, trifluoromethyl, 3,3,3-trifluoropropyl, 3-aminopropyl, 3-mercaptopropyl, or 3-isocyanatepropyl.

When $U^1$ in formula (9-1) represents a $C_2$ to $C_{10}$ alkenyl group, specifically, $U^1$ is, for instance, a vinyl group. Moreover, $U^1$ can also be an alkenyl group having other substituents. Specifically, $U^1$ is, for instance, 3-acryoyloxypropyl or 3-methylacryloyloxypropyl.

When $U^1$ in formula (9-1) represents a $C_6$ to $C_{15}$ aromatic group, specifically, $U^1$ is, for instance, a phenyl group, a tolyl group, or a naphthyl group. Moreover, $U^1$ can also be an aromatic group having other substituents. Specifically, $U^1$ is, for instance, p-hydroxyphenyl, 1-(p-hydroxyphenyl)ethyl, 2-(p-hydroxyphenyl)ethyl, or 4-hydroxy-5-(p-hydroxyphenylcarbonyloxy)pentyl.

Moreover, $U^1$ in formula (9) represents an alkyl group containing an acid anhydride group, wherein the alkyl group is preferably a $C_1$ to $C_{10}$ alkyl group. Specifically, the alkyl group containing an acid anhydride group is, for instance, ethyl succinic anhydride shown in formula (9-1-1), propyl succinic anhydride shown in formula (9-1-2), or propyl glutaric anhydride shown in formula (9-1-3). It should be mentioned that, the acid anhydride group is a group formed by intramolecular dehydration of a dicarboxylic acid, wherein the dicarboxylic acid is, for instance, succinic acid or glutaric acid.

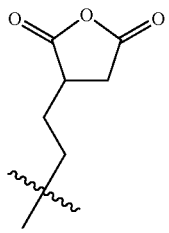

formula (9-1-1)

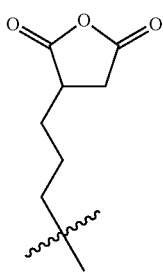

formula (9-1-2)

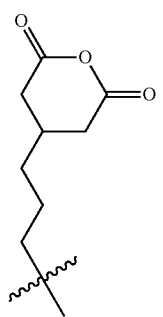

(9-1-3)

Moreover, $U^1$ in formula (9) represents an alkyl group containing an epoxy group, wherein the alkyl group is preferably a $C_1$ to $C_{10}$ alkyl group. Specifically, the alkyl group containing an epoxy group is, for instance, oxetanylpentyl or 2-(3,4-epoxycyclohexyl)ethyl. It should be mentioned that, the epoxy group is a group formed by intramolecular dehydration of diol, wherein the diol is, for instance, propanediol, butanediol, or pentanediol.

$U^1$ in formula (9-1) represents an alkoxy group containing an epoxy group, wherein the alkoxy group is preferably a $C_1$ to $C_{10}$ alkoxy group. Specifically, the alkoxy group containing an epoxy group is, for instance, glycidoxypropyl or 2-oxetanylbutoxy.

Moreover, when $U^2$ in formula (9-1) represents a $C_1$ to $C_6$ alkyl group, specifically, $U^2$ is, for instance, a methyl group, an ethyl group, an n-propyl group, an isopropyl group, or an n-butyl group. When $U^2$ in formula (9-1) represents a $C_1$ to $C_6$ acyl group, specifically, $U^2$ is, for instance, an acetyl group. When $U^2$ in formula (9-1) represents a $C_6$ to $C_{15}$ aromatic group, specifically, $U^2$ is, for instance, a phenyl group.

In formula (9-1), w represents an integer of 1 to 3. When w represents 2 or 3, a plurality of $U^1$ can be the same or different; and when w represents 1 or 2, a plurality of $U^2$ can be the same or different.

Specific examples of the silane monomer (a-S1) include: 3-glycidoxypropyltrimethoxysilane, 3-glycidoxypropyltriethoxysilane, 2-(3,4-epoxycyclohexyl)ethyl trimethoxy silane, 2-oxetanylbutoxypropyl triphenoxysilane, a commercial product made by Toagosei: 2-oxetanylbutoxypropyltrimethoxysilane, 2-oxetanylbutoxypropyltriethoxysilane, 3-(triphenoxysilyl)propyl succinic anhydride, a commercial product made by Shin-Etsu Chemical: 3-(trimethoxysilyl)propyl succinic anhydride (product name: X-12-967), a commercial product made by WACKER Corporation: 3-(triethoxysilyl)propyl succinic anhydride (product name: GF-20), 3-(trimethoxysilyl)propyl glutaric anhydride (TMSG), 3-(triethoxysilyl)propyl glutaric anhydride, 3-(triphenoxysilyl)propyl glutaric anhydride, diisopropoxy-di(2-oxetanylbutoxy propyl)silane, di(3-oxetanylpentyl)dimethoxy silane, (di-n-butoxysilyl) di(propyl succinic anhydride), (dimethoxysilyl) di(ethyl succinic anhydride), 3-glycidoxypropyldimethylmethoxysilane, 3-glycidoxypropyl dimethylethoxysilane, di(2-oxetanylbutoxypentyl)-2-oxetanyl pentylethoxy silane, tri(2-oxetanylpentyl)methoxy silane, (phenoxysilyl) tri(propyl succinic anhydride), (methyl methoxysilyl) di(ethyl succinic anhydride), or a combination of the compounds.

The silane monomer (a-S1) can be used alone or in multiple combinations.

Silane Monomer (a-S2)

The silane monomer (a-S2) is a compound represented by formula (9-2).

$$Si(U^3)_u(OU^4)_{4-u} \qquad \text{formula (9-2)}$$

In formula (9-2), each $U^3$ represents a hydrogen atom, a $C_1$ to $C_{10}$ alkyl group, a $C_2$ to $C_{10}$ alkenyl group, or a $C_6$ to $C_{15}$ aromatic group; each $U^4$ represents a hydrogen atom, a $C_1$ to $C_6$ alkyl group, a $C_1$ to $C_6$ acyl group, or a $C_6$ to $C_{15}$ aromatic group; and u represents an integer of 0 to 3.

More specifically, when $U^3$ in formula (9-2) represents a $C_1$ to $C_{10}$ alkyl group, specifically, $U^3$ is, for instance, a methyl group, an ethyl group, an n-propyl group, an isopropyl group, an n-butyl group, a t-butyl group, an n-hexyl group, or an n-decyl group. Moreover, $U^3$ can also be an alkyl group having other substituents. Specifically, $U^3$ is, for instance, trifluoromethyl, 3,3,3-trifluoropropyl, 3-aminopropyl, 3-mercaptopropyl, or 3-isocyanatepropyl.

When $U^3$ in formula (9-2) represents a $C_2$ to $C_{10}$ alkenyl group, specifically, $U^3$ is, for instance, a vinyl group. Moreover, $U^3$ can also be an alkenyl group having other substituents. Specifically, $U^3$ is, for instance, 3-acryoyloxypropyl or 3-methylacryloyloxypropyl.

When $U^3$ in formula (9-2) represents a $C_6$ to $C_{15}$ aromatic group, specifically, $U^3$ is, for instance, a phenyl group, a tolyl group, or a naphthyl group. Moreover, $U^3$ can also be an aromatic group having other substituents. Specifically, $U^3$ is, for instance, p-hydroxyphenyl, 1-(p-hydroxyphenyl)ethyl, 2-(p-hydroxyphenyl)ethyl, or 4-hydroxy-5-(p-hydroxyphenylcarbonyloxy)pentyl.

Moreover, when $U^4$ in formula (9-2) represents a $C_1$ to $C_6$ alkyl group, specifically, $U^4$ is, for instance, a methyl group, an ethyl group, an n-propyl group, an isopropyl group, or an n-butyl group. When $U^4$ in formula (9-2) represents a $C_1$ to $C_6$ acyl group, specifically, $U^4$ is, for instance, an acetyl group. When $U^4$ in formula (9-2) represents a $C_6$ to $C_{15}$ aromatic group, specifically, $U^4$ is, for instance, a phenyl group.

In formula (9-2), u is an integer of 0 to 3. When u represents 2 or 3, a plurality of $U^3$ can be the same or different; and when u represents 0, 1, or 2, a plurality of $U^4$ can be the same or different.

In formula (9-2), when u=0, the silane monomer is a tetrafunctional silane monomer (i.e., a silane monomer having four hydrolyzable groups); when u=1, the silane monomer is a trifunctional silane monomer (i.e., a silane monomer having three hydrolyzable groups); when u=2, the silane monomer is a bifunctional silane monomer (i.e., a silane monomer having two hydrolyzable groups); and when u=3, the silane monomer is a monofunctional silane monomer (i.e., a silane monomer having one hydrolyzable group). It should be mentioned that, the hydrolyzable group refers to a group that can be reacted in a hydrolysis reaction and bonded to silicon. For instance, the hydrolyzable group is, for instance, an alkoxy group, an acyloxy group, or a phenoxy group.

Specific examples of the silane monomer represented by formula (9-2) include, but are not limited to:

(1) a tetrafunctional silane monomer: tetramethoxysilane, tetraethoxysilane, tetraacetoxysilane, or tetraphenoxy silane;

(2) a trifunctional silane monomer: methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxyl-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-mercaptopropyltrimethoxysilane, 3-acryloyloxypropyltrimethoxysilane, 3-methacryloyloxypropyltrimethoxysilane, or 3-methylacryloyloxypropyltriethoxysilane;

(3) a bifunctional silane monomer: dimethyldimethoxysilane, dimethyldiethoxysilane, dimethyldiacetyloxysilane, di-n-butyldimethoxysilane, or diphenyldimethoxysilane; or (4) a monofunctional silane monomer: trimethylmethoxysilane or tri-n-butylethoxysilane . . . etc.

The various silane monomers can be used alone or in multiple combinations.

Siloxane Prepolymer (a-S3)

The siloxane prepolymer (a-S3) is a compound represented by formula (9-3).

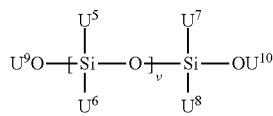

formula (9-3)

In formula (9-3), $U^5$, $U^6$, $U^7$, and $U^8$ each independently represent a hydrogen atom, a $C_1$ to $C_{10}$ alkyl group, a $C_2$ to $C_6$ alkenyl group, or a $C_6$ to $C_{15}$ aromatic group, wherein any one of the alkyl group, the alkenyl group, and the aromatic group can optionally contain a substituent; $U^9$ and $U^{10}$ each independently represent a hydrogen atom, a $C_1$ to $C_6$ alkyl group, a $C_1$ to $C_{10}$ acyl group, or a $C_6$ to $C_{15}$ aromatic group, wherein any one of the alkyl group, the acyl group, and the aromatic group can optionally contain a substituent; and v represents an integer of 1 to 1000.

More specifically, when $U^5$, $U^6$, $U^7$, and $U^8$ in formula (9-3) each independently represent a $C_1$ to $C_{10}$ alkyl group, specifically, $U^5$, $U^6$, $U^7$, and $U^8$ are, for instance, each independently a methyl group, an ethyl group, or an n-propyl group. When $U^5$, $U^6$, $U^7$, and $U^8$ in formula (9-3) each independently represent a $C_2$ to $C_{10}$ alkenyl group, specifically, $U^5$, $U^6$, $U^7$, and $U^8$ are, for instance, each independently a vinyl group, an acryloyloxypropyl group, or a methacryloxypropyl group. When $U^5$, $U^6$, $U^7$, and $U^8$ in formula (9-3) each independently represent a $C_6$ to $C_{15}$ aromatic group, specifically, $U^5$, $U^6$, $U^7$, and $U^8$ are, for instance, each independently a phenyl group, a tolyl group, or a naphthyl group. Moreover, any one of the alkyl group, alkenyl group, and aromatic group can have other substituents.

Moreover, when $U^9$ and $U^{10}$ of formula (9-3) each independently represent a $C_1$ to $C_6$ alkyl group, specifically, $U^9$ and $U^{10}$ are, for instance, each independently a methyl group, an ethyl group, an n-propyl group, an isopropyl group, or an n-butyl group. When $U^9$ and $U^{10}$ of formula (9-3) each independently represent a $C_1$ to $C_6$ acyl group, specifically, $U^9$ and $U^{10}$ are, for instance, acetyl groups. When $U^9$ and $U^{10}$ in formula (9-3) each independently represent a $C_6$ to $C_{15}$ aromatic group, specifically, $U^9$ and $U^{10}$ are, for instance, phenyl groups. In particular, any one of the alkyl group, acyl group, and aromatic group can optionally have a substituent.

In formula (9-3), v can be an integer of 1 to 1000, preferably an integer of 3 to 300, and more preferably an integer of 5 to 200. When v is an integer of 2 to 1000, each $U^5$ is the same or a different group, and each $U^6$ is the same or a different group.

Specific examples of the siloxane prepolymer (a-S3) include, but are not limited to, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, or a commercial product (such as DMS-S12 (molecular weight: 400 to 700), DMS-S15 (molecular weight: 1500 to 2000), DMS-S21 (molecular weight: 4200), DMS-S27 (molecular weight: 18000), DMS-S31 (molecular weight: 26000), DMS-S32 (molecular weight: 36000), DMS-S33 (molecular weight: 43500), DMS-S35 (molecular weight: 49000), DMS-S38 (molecular weight: 58000), DMS-S42 (molecular weight: 77000), or PDS-9931 (molecular weight: 1000 to 1400)) of silanol-terminated polydimethylsiloxane made by Gelest Inc.

The siloxane prepolymer (a-S3) can be used alone or in multiple combinations.

Silica Particle (a-S4)

The average particle size of the silica particle (a-S4) is not particularly limited. The average particle size ranges from 2 nm to 250 nm, preferably 5 nm to 200 nm, and more preferably 10 nm to 100 nm.

Specific examples of the silica particle include, but are not limited to, a commercial product made by JGC Catalysts &

Chemicals Co., Ltd. (such as OSCAR 1132 (particle size: 12 nm; dispersant: methanol), OSCAR 1332 (particle size: 12 nm; dispersant: n-propanol), OSCAR 105 (particle size: 60 nm; dispersant: γ-butyrolactone), or OSCAR 106 (particle size: 120 nm; dispersant: diacetone alcohol) . . . etc.); a commercial product made by Fuso Chemical Co. (such as Quartron PL-1-IPA (particle size: 13 nm; dispersant: isopropyl alcohol), Quartron PL-1-TOL (particle size: 13 nm; dispersant: toluene), Quartron PL-2L-PGME (particle size: 18 nm; dispersant: propylene glycol monomethyl ether), or Quartron PL-2L-MEK (particle size: 18 nm; dispersant: methyl ethyl ketone)); or a commercial product made by Nissan Chemical Company (such as IPA-ST (particle size: 12 nm; dispersant: isopropyl alcohol), EG-ST (particle size: 12 nm; dispersant: ethylene glycol), IPA-ST-L (particle size: 45 nm; dispersant: isopropyl alcohol), or IPA-ST-ZL (particle size: 100 nm; dispersant: isopropyl alcohol)). The silica particle can be used alone or in multiple combinations.

In general, the polymerization reaction (i.e., hydrolysis and partial condensation) of the silane monomer, polysiloxane prepolymer, and/or silica particle is performed via the following steps: a solvent and water are added in a silane monomer, and a catalyst can be optionally added; and the mixture is heated at 50° C. to 150° C. and stirred for 0.5 hours to 120 hours, and the byproducts (such as alcohol and water) can be further removed via distillation.

The solvent used in the polycondensation reaction is not particularly limited, and the solvent can be the same or different from the solvent (D) included in the photosensitive resin composition of the invention. Based on a total amount of 100 parts by weight of the silane monomer, the usage amount of the solvent is preferably 15 parts by weight to 1200 parts by weight, more preferably 20 parts by weight to 1100 parts by weight, and still more preferably 30 parts by weight to 1000 parts by weight.

Based on 1 mole of the hydrolyzable group of the silane monomer, the water used in the polycondensation reaction (i.e., water used for hydrolysis) is preferably 0.5 moles to 2 moles.

The catalyst used in the polycondensation reaction is not particularly limited, and is preferably selected from an acidic catalyst or a basic catalyst. Specific examples of the acidic catalyst include, but are not limited to, for instance, hydrochloric acid, nitric acid, sulfuric acid, hydrofluoric acid, oxalic acid, phosphoric acid, acetic acid, trifluoroacetic acid, formic acid, polybasic carboxylic acid or an acid anhydride thereof, or an ion exchange resin. Specific examples of the basic catalyst include, but are not limited to, for instance, diethylamine, triethylamine, tripropylamine, tributylamine, tripentylamine, trihexylamine, triheptylamine, trioctylamine, diethanolamine, triethanolamine, sodium hydroxide, potassium hydroxide, silane containing an amine group and having an alkoxy group, or an ion exchange resin.

Based on a total amount of 100 parts by weight of the silane monomer, the usage amount of the catalyst is preferably 0.005 parts by weight to 15 parts by weight, more preferably 0.01 parts by weight to 12 parts by weight, and still more preferably 0.05 parts by weight to 10 parts by weight.

From the point of view of stability, the polysiloxane preferably does not contain a byproduct (such as alcohol or water) and a catalyst. Therefore, purification can optionally be performed on the reaction mixture after the polycondensation reaction to obtain the polysiloxane. The method of purification is not particularly limited, and can preferably dilute the reaction mixture with a hydrophobic solvent. Then, the hydrophobic solvent and the reaction mixture are transferred to a separation funnel. Next, the organic layer is washed with water several times, and the organic layer is concentrated with a rotary evaporator to remove the alcohol or water. Moreover, an ion exchange resin can be used to remove the catalyst.

Based on 100 parts by weight of the alkali-soluble resin (A), the usage amount of the alkali-soluble resin (A-2) is 0 parts by weight to 50 parts by weight, preferably 0 parts by weight to 40 parts by weight, and more preferably 0 parts by weight to 30 parts by weight. When the alkali-soluble resin (A) contains the alkali-soluble resin (A-2), the reliability of the resulting photosensitive resin composition under high temperature and high humidity can be further improved.

Other Alkali-Soluble Resins (A-3)

The alkali-soluble resin (A) can further optionally include other alkali-soluble resins (A-3). The other alkali-soluble resins (A-3) are resins other than the alkali-soluble resin (A-1) and the alkali-soluble resin (A-2). The other alkali-soluble resins (A-3) are, for instance, resins having a carboxylic acid group or a hydroxyl group, but are not limited to resins having a carboxylic acid group or a hydroxyl group. Specific examples of the other alkali-soluble resins (A-3) include a resin such as acrylic resin, urethane resin, or novolac resin.

Compound (B) Having an Ethylenically Unsaturated Group

The compound (B) having an ethylenically unsaturated group includes a compound (B-1) having an acidic group and at least three ethylenically unsaturated groups and other compounds (B-2) having an ethylenically unsaturated group.

Compound (B-1) Having an Acidic Group and at Least Three Ethylenically Unsaturated Groups The compound (B) having an ethylenically unsaturated group of the invention can contain a compound (B-1) having an acidic group and at least three ethylenically unsaturated groups.

The acidic group in the compound (B-1) having an acidic group and at least three ethylenically unsaturated groups can generate an effect with an alkaline developing agent. Specific examples of the acidic group include, for instance: a carboxyl group, a sulfonic acid group, or a phosphate group. In particular, the acidic group is preferably a carboxyl group that can generate good effect with an alkaline developing agent.

The compound (B-1) having an acidic group and at least three ethylenically unsaturated groups can relate to (1) performing a modification reaction on a polyfunctional (meth)acrylate having a carboxyl group and a dicarboxylic acid anhydride or a dicarboxylic acid to synthesize a polyfunctional (meth)acrylate containing a carboxyl group, or (2) performing a modification reaction on an aromatic polyfunctional (meth)acrylate and concentrated sulfuric acid or oleum to synthesize polyfunctional (meth)acrylate containing a sulfo group.

Preferably, the compound (B-1) having an acidic group and at least three ethylenically unsaturated groups has the structure shown in formula (IV) or (V) below;

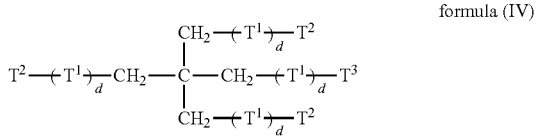

formula (IV)

in formula (IV), $T^1$ represents —$CH_2$—, —$OCH_2$—, —$OCH_2CH_2$—, —$OCH_2CH_2CH_2$—, or —$OCH_2CH_2CH_2CH_2$—; $T^2$ represents the structure shown in formula (IV-1) or formula (IV-2) below; and $T^3$ represents the structure shown in formula (IV-3), formula (IV-4), or formula (IV-5) below, wherein the benzene ring in the structure shown in formula (IV-5) can also be tetrahydro or hexahydro, and e represents an integer of 1 to 8; and d represents an integer of 0 to 14;

formula (IV-1)

formula (IV-2)

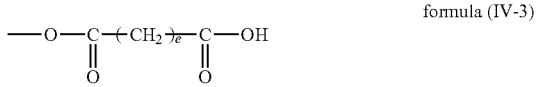

formula (IV-3)

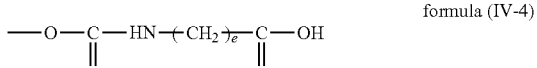

formula (IV-4)

formula (IV-5)

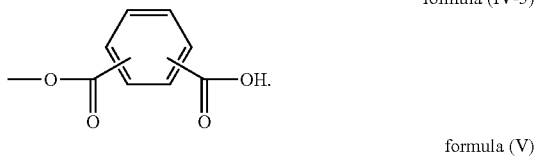

formula (V)

in formula (V), $T^1$, $T^2$, and $T^3$ are as described above; $T^4$ represents —O— or the structure shown in formula (V-1) below; and e and d are as described above and c represents an integer of 1 to 8;

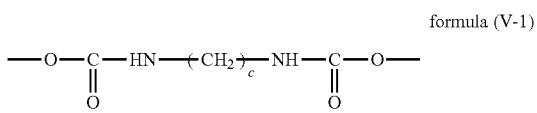

formula (V-1)

in formula (IV) or formula (V), when a plurality of $T^1$ and $T^2$ is present, $T^1$ and $T^2$ can respectively be the same or different.

In the specific examples of the compound (B-1) having an acidic group and at least three ethylenically unsaturated groups shown in formula (IV) or formula (V), specific examples of the compound (B-1) having three ethylenically unsaturated groups can be monohydroxyl oligopolyacrylate or monohydroxyl oligopolymethacrylate such as pentaerythritol triacrylate, pentaerythritol trimethacrylate, dipentaerythritol pentaacrylate, or dipentaerythritol pentamethacrylate, and a monoester compound containing a carboxyl group formed by a diacid such as malonic acid, succinic acid, glutaric acid, isophthalic acid, terephthalic acid, or phthalic acid.

The compound having an acidic group and at least three ethylenically unsaturated groups preferably includes pentaerythritol triacrylate, pentaerythritol trimethacrylate, dipentaerythritol pentaacrylate, or dipentaerythritol pentamethacrylate, and a monoester compound containing a carboxyl group formed by succinic acid, phthalic acid, or glutaric acid.

Based on a total usage amount of 100 parts by weight of the alkali-soluble resin (A), the usage amount of the compound (B-1) having an acidic group and at least three ethylenically unsaturated groups is 15 parts by weight to 150 parts by weight, preferably 20 parts by weight to 120 parts by weight, and more preferably 25 parts by weight to 100 parts by weight. When the compound (B) having an ethylenically unsaturated group does not contain the compound (B-1) having an acidic group and at least three ethylenically unsaturated groups, the resolution of the resulting photosensitive resin composition is poor.

Other Compounds (B-2) Having Ethylenically Unsaturated Group

The compound (B) having an ethylenically unsaturated group can further contain other compounds (B-2) having an ethylenically unsaturated group.

The other compounds (B-2) having an ethylenically unsaturated group can be selected from a compound having one ethylenically unsaturated group or a compound having two or more ethylenically unsaturated groups.

The compound having one ethylenically unsaturated group can contain, but is not limited to, a compound such as (meth)acrylamide, (meth)acryloylmorpholine, 7-amino-3,7-dimethyloctyl(meth)acrylate, isobutoxymethyl(meth)acrylamide, isobomyloxyethyl(meth)acrylate, isobornyl(meth)acrylate, 2-ethylhexyl(meth)acrylate, ethyl diethylene glycol(meth)acrylate, t-octyl(meth)acrylamide, diacetone (meth)acrylamide, dimethylaminoethyl(meth)acrylate, dodecyl (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl (meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, or bornyl (meth)acrylate. The compound having one ethylenically unsaturated group can be used alone or in multiple combinations.

The compound having two or more ethylenically unsaturated groups can contain, but is not limited to, a compound such as ethylene glycol di(meth)acrylate, dicyclopentenyl di(meth)acrylate, triethylene glycol di(meth)acrylate, tetraethylene glycol di(meth)acrylate, tri(2-hydroxyethyl)isocyanate di(meth)acrylate, tri(2-hydroxyethyl)isocyanate tri (meth)acrylate, caprolactone-modified tri(2-hydroxyethyl) isocyanate tri(meth)acrylate, trimethylolpropyl tri(meth)

acrylate, ethylene oxide (hereinafter EO)-modified trimethylolpropyl tri(meth)acrylate, propylene oxide (hereinafter PO)-modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, di(trimethylolpropane) tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, or novolac polyglycidyl ether (meth)acrylate. The compound having two or more ethylenically-unsaturated groups can be used alone or in multiple combinations.

Specific examples of the other compounds (B-2) having an ethylenically unsaturated group include, for instance: trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, or PO-modified glycerol triacrylate, or any combination of the compounds.

Based on a total usage amount of 100 parts by weight of the alkali-soluble resin (A), the usage amount of the compound (B) having an ethylenically unsaturated group is 15 parts by weight to 200 parts by weight, preferably 20 parts by weight to 170 parts by weight, and more preferably 25 parts by weight to 150 parts by weight.

Photoinitiator (C)

The photoinitiator (C) includes a photoinitiator (C-1) and other photoinitiators (C-2).

Photoinitiator (C-1)

The photoinitiator (C) includes the photoinitiator (C-1) represented by formula (1).

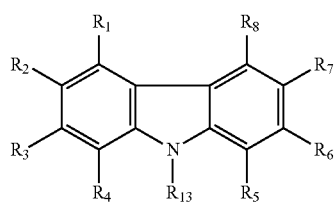

formula (1)

wherein $R_1$, $R_2$, $R_3$, $R_4$, $R_5$, $R_6$, $R_7$, and $R_8$ are each independently hydrogen, a $C_1$ to $C_{20}$ alkyl group, $COR_{16}$, $OR_{17}$, halogen, $NO_2$, the group represented by formula (2), or the group represented by formula (3),

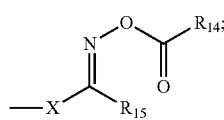

formula (2)

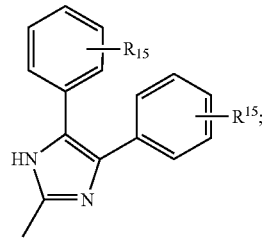

formula (3)

or $R_1$ and $R_2$, $R_2$ and $R_3$, $R_3$ and $R_4$, $R_5$ and $R_6$, $R_6$ and $R_7$, or $R_7$ and $R_8$ are each independently $C_2$ to $C_{10}$ alkenyl groups substituted by the group represented by formula (4),

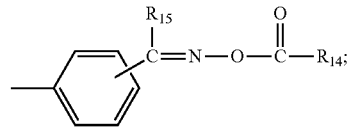

formula (4)

or $R_1$ and $R_2$, $R_2$ and $R_3$, $R_3$ and $R_4$, $R_5$ and $R_6$, $R_6$ and $R_7$, or $R_7$ and $R_8$ are each independently —$(CH_2)_p$—Y—$(CH_2)_q$— at the same time;

or $R_1$ and $R_2$, $R_2$ and $R_3$, $R_3$ and $R_4$, $R_5$ and $R_6$, $R_6$ and $R_7$, or $R_7$ and $R_8$ are each independently the group represented by formula (5) at the same time;

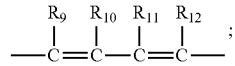

formula (5)

however, the condition is that at least one pair in $R_1$ and $R_2$, $R_2$ and $R_3$, $R_3$ and $R_4$, $R_5$ and $R_6$, $R_6$ and $R_7$, or $R_7$ and $R_8$ is the group represented by formula (5), $R_9$, $R_{10}$, $R_{11}$, and $R_{12}$ are each independently hydrogen or a $C_1$ to $C_{20}$ alkyl group, and the $C_1$ to $C_{20}$ alkyl group is unsubstituted or substituted by one or a plurality of the following groups: halogen, a phenyl group, CN, OH, SH, $C_1$ to $C_4$-alkoxy, —(CO)OH, or —(CO)O—($C_1$ to $C_4$ alkyl);

or $R_9$, $R_{10}$, $R_{11}$, and $R_{12}$ are each independently an unsubstituted phenyl group or a phenyl group substituted by one or a plurality of the following groups: a $C_1$ to $C_6$ alkyl group, halogen, CN, $OR_{17}$, $SR_{18}$, or $NR_{19}R_{20}$;

or $R_9$, $R_{10}$, $R_{11}$, and $R_{12}$ are each independently halogen, CN, $OR_{17}$, $SR_{18}$, $SOR_{18}$, $SO_2R_{18}$, or $NR_{19}R_{20}$, wherein the substituent $OR_{17}$, $SR_{18}$, or $NR_{19}R_{20}$ forms a 5-membered or 6-membered ring with one carbon atom in a naphthyl ring via the groups $R_{17}$, $R_{18}$, $R_{19}$, and/or $R_{20}$ as needed;

or $R_9$, $R_{10}$, $R_{11}$, and $R_{12}$ are each independently $COR_{16}$, $NO_2$, or the group represented by formula (2),

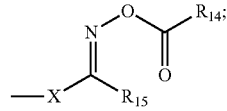

formula (2)

Y represents O, S, $NR_{26}$, or a direct bond;
p represents an integer of 0, 1, 2, or 3;

q represents an integer of 1, 2, or 3;

X represents CO or a direct bond;

$R_{13}$ represents a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, $NR_{19}R_{20}$, $PO(OC_kH_{2k+1})_2$, or the group represented by formula (6);

$$\overset{R_{24}}{\underset{|}{-N}}-X_1R_{25}; \quad \text{formula (6)}$$

or $R_{13}$ represents a $C_2$ to $C_{20}$ alkyl group interrupted with one or a plurality of O, S, SO, $SO_2$, $NR_{26}$, or CO, or a $C_2$ to $C_{12}$ alkenyl group uninterrupted or is interrupted with one or a plurality of O, CO, or $NR_{26}$, wherein the interrupted $C_2$ to $C_{20}$ alkyl group and the uninterrupted or is interrupted $C_2$ to $C_{12}$ alkenyl group is unsubstituted or substituted by one or a plurality of a halogen;

or $R_{13}$ represents a $C_4$ to $C_8$ cycloalkenyl group, a $C_2$ to $C_{12}$ alkynyl group, or a $C_3$ to $C_{10}$ cycloalkyl group uninterrupted or is interrupted with one or a plurality of O, S, CO, or $NR_{26}$;

or $R_{13}$ represents a phenyl group or a naphthyl group that is unsubstituted or substituted by one or a plurality of the following groups: $OR_{17}$, $SR_{18}$, $NR_{19}R_{20}$, $COR_{16}$, CN, $NO_2$, halogen, a $C_1$ to $C_{20}$ alkyl group, a $C_1$ to $C_4$ haloalkyl group, a $C_2$ to $C_{20}$ alkyl group interrupted with one or a plurality of O, S, CO, or $NR_{26}$, or the group represented by formula (7), $$\overset{R'_{15}}{\underset{|}{-C}}=N-O-\overset{O}{\underset{\|}{C}}-R'_{14}; \quad \text{formula (7)}$$

or the phenyl group or naphthyl group is substituted by a $C_3$ to $C_{10}$ cycloalkyl group or a $C_3$ to $C_{10}$ cycloalkyl group interrupted with one or a plurality of O, S, CO, or $NR_{26}$;

k represents an integer of 1 to 10;

$R_{14}$ represents hydrogen, a $C_3$ to $C_8$ cycloalkyl group, a $C_2$ to $C_5$ alkenyl group, a $C_1$ to $C_{20}$ alkoxy group, or a $C_1$ to $C_{20}$ alkyl group that is unsubstituted or substituted by one or a plurality of the following groups: halogen, a phenyl group, a $C_1$ to $C_{20}$ alkylphenyl group, or CN;

or $R_{14}$ represents a phenyl group or a naphthyl group that is unsubstituted or substituted by one or a plurality of the following groups: a $C_1$ to $C_6$ alkyl group, a $C_1$ to $C_4$ haloalkyl group, halogen, CN, $OR_{17}$, $SR_{18}$, and/or $NR_{19}R_{20}$;

or $R_{14}$ represents a $C_3$ to $C_{20}$ heteroaryl group, a $C_1$ to $C_8$ alkoxy group, a benzyloxy group, or a phenoxy group, and the benzyloxy group and the phenoxy group are unsubstituted or substituted by one or a plurality of the following groups: a $C_1$ to $C_6$ alkyl group, a $C_1$ to $C_4$ haloalkyl group, and/or halogen;

$R_{15}$ is a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, $PO(OC_kH_{2k+1})_2$, $SO$—$C_1$ to $C_{10}$ alkyl, $SO_2$—$C_1$ to $C_{10}$ alkyl, or a $C_2$ to $C_{20}$ alkyl group interrupted with one or a plurality of O, S, or $NR_{26}$; or the $C_6$ to $C_{20}$ aryl group or the $C_3$ to $C_{20}$ heteroaryl group is substituted by a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{15}$ represents hydrogen, a $C_2$ to $C_{12}$ alkenyl group, a $C_3$ to $C_8$ cycloalkyl group uninterrupted or is interrupted with one or a plurality of O, CO, or $NR_{26}$; or $R_{15}$ is a $C_1$ to $C_{20}$ alkyl group that is unsubstituted or substituted by one or a plurality of the following groups: halogen, $OR_{17}$, $SR_{18}$, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $NR_{19}R_{20}$, $COOR_{17}$, $CONR_{19}R_{20}$, $PO(OC_kH_{2k+1})_2$, a phenyl group, the group represented by formula (6), or the group represented by formula (8), $$\overset{R_{24}}{\underset{|}{-N}}-X_1R_{25} \quad \text{formula (6)}$$

$$\overset{R_{15}}{\underset{|}{-X_2-C}}=N-O-\overset{O}{\underset{\|}{C}}-R_{14}; \quad \text{formula (8)}$$

or the $C_1$ to $C_{20}$ alkyl group is substituted by a phenyl group, and the phenyl group is substituted by halogen, a $C_1$ to $C_{20}$ alkyl group, a $C_1$ to $C_4$ haloalkyl group, $OR_{17}$, $SR_{18}$, or $NR_{19}R_{20}$;

or $R_{15}$ represents a $C_2$ to $C_{20}$ alkyl group interrupted with one or a plurality of O, S, or $SO_2$, and the interrupted $C_2$ to $C_{20}$ alkyl group is unsubstituted or substituted by one or a plurality of the following groups: halogen, $OR_{17}$, $COOR_{17}$, $CONR_{19}R_{20}$, a phenyl group, or a phenyl group substituted by $OR_{17}$, $SR_{18}$, or $NR_{19}R_{20}$;

or $R_{15}$ represents a $C_2$ to $C_{20}$ alkanoyl group or a benzoyl group that is unsubstituted or substituted by one or a plurality of the following groups: a $C_1$ to $C_6$ alkyl group, halogen, a phenyl group, $OR_{17}$, $SR_{18}$, or $NR_{19}R_{20}$; or $R_{15}$ is a naphthoyl group that is unsubstituted or substituted by one or a plurality of $OR_{17}$, or a $C_3$ to $C_{14}$ heteroarylcarbonyl group;

or $R_{15}$ represents a $C_2$ to $C_{12}$ alkoxycarbonyl group that is uninterrupted or is interrupted with one or a plurality of O and the interrupted or uninterrupted $C_2$ to $C_{12}$ alkoxycarbonyl group is unsubstituted or substituted by one or a plurality of hydroxyl groups;

or $R_{15}$ represents a phenoxycarbonyl group that is unsubstituted or substituted by one or a plurality of the following groups: a $C_1$ to $C_6$ alkyl group, halogen, a $C_1$ to $C_4$ haloalkyl group, a phenyl group, $OR_{17}$, $SR_{18}$, or $NR_{19}R_{20}$;

or $R_{15}$ represents CN, $CONR_{19}R_{20}$, $NO_2$, a $C_1$ to $C_4$ haloalkyl group, $S(O)_m$—$C_1$ to $C_6$ alkyl, or $S(O)_m$-phenyl that is unsubstituted or substituted by a $C_1$ to $C_{12}$ alkyl group or $SO_2$—$C_1$-$C_6$ alkyl;

or $R_{15}$ represents $SO_2O$-phenyl that is unsubstituted or substituted by a $C_1$ to $C_{12}$ alkyl group; or $R_{15}$ represents a diphenylphosphinoyl group or di-($C_1$ to $C_4$ alkoxy)-phosphinoyl;

m represents 1 or 2;

$R'_{14}$ is defined the same as one of the $R_{14}$'s;

$R'_{15}$ is defined the same as one of the $R_{15}$'s;

$X_1$ represents O, S, SO, or $SO_2$;

$X_2$ represents O, CO, S, or a direct bond;

$R_{16}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{16}$ represents hydrogen or a $C_1$ to $C_{20}$ alkyl group, and the $C_1$ to $C_{20}$ alkyl group is unsubstituted or substituted by one or a plurality of the following groups: halogen, a phenyl group, OH, SH, CN, a $C_3$ to $C_6$ alkenyloxy group, $OCH_2CH_2CN$, $OCH_2CH_2(CO)O(C_1$ to $C_4$ alkyl), O(CO)—$(C_1$ to $C_4$ alkyl), O(CO)-phenyl, (CO)OH, or (CO)O($C_1$ to $C_4$ alkyl);

or $R_{16}$ represents a $C_2$ to $C_{12}$ alkyl group interrupted with one or a plurality of O, S, or $NR_{26}$; or $R_{16}$ represents $(CH_2CH_2O)_{n+1}H$, $(CH_2CH_2O)_n(CO)$—$(C_1$ to $C_8$ alkyl), a $C_2$ to $C_{12}$ alkenyl group, or a $C_3$ to $C_8$ cycloalkyl group;

or $R_{16}$ represents a phenyl group substituted by $SR_{18}$, wherein the group $R_{18}$ represents a direct bond bonded to the phenyl group or naphthyl ring of the carbazole portion to which the $COR_{16}$ group is attached;

n represents 1 to 20;

$R_{17}$ represents hydrogen, phenyl-$C_1$ to $C_3$ alkyl, or a $C_1$ to $C_{20}$ alkyl group that is unsubstituted or substituted by one or a plurality of the following groups: halogen, OH, SH, CN, a $C_3$ to $C_6$ alkenyloxy group, $OCH_2CH_2CN$, $OCH_2CH_2(CO)O(C_1$ to $C_4$ alkyl), O(CO)—$(C_1$ to $C_4$ alkyl), O(CO)—$(C_2$ to $C_4$)alkenyl, O(CO)-phenyl, (CO)OH, (CO)O($C_1$ to $C_4$ alkyl), a $C_3$ to $C_{20}$ cycloalkyl group, $SO_2$—$(C_1$ to $C_4$ haloalkyl), O($C_1$ to $C_4$ haloalkyl), or a $C_3$ to $C_{20}$ cycloalkyl group interrupted with one or a plurality of O;

or $R_{17}$ represents a $C_2$ to $C_{20}$ alkyl group interrupted with one or a plurality of O, S, or $NR_{26}$;

or $R_{17}$ represents $(CH_2CH_2O)_{n+1}H$, $(CH_2CH_2O)_n(CO)$—$(C_1$ to $C_8$ alkyl), a $C_1$ to $C_8$ alkanoyl group, a $C_2$ to $C_{12}$ alkenyl group, a $C_3$ to $C_6$ alkenoyl group, or a $C_3$ to $C_{20}$ cycloalkyl group interrupted or uninterrupted with one or a plurality of O, S, CO, or $NR_{26}$;

or $R_{17}$ represents $C_1$ to $C_8$ alkyl-$C_3$ to $C_{10}$ cycloalkyl that is interrupted or uninterrupted with one or a plurality of O;

or $R_{17}$ represents a benzoyl group that is unsubstituted or substituted by one or a plurality of a $C_1$ to $C_6$ alkyl group, halogen, OH, or a $C_1$ to $C_3$ alkoxy group;

or $R_{17}$ represents a phenyl group, a naphthyl group, or a $C_3$ to $C_{20}$ heteroaryl group that is unsubstituted or substituted by one or a plurality of the following groups: halogen, OH, a $C_1$ to $C_{12}$ alkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, diphenyl-amine, or the group represented by formula (7);

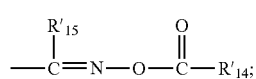

formula (7)

or $R_{17}$ forms a direct bond bonded to one of the carbon atoms of the phenyl group or naphthyl ring having the group represented by formula (2) or the group represented by formula (7),

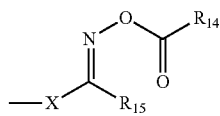

formula (2)

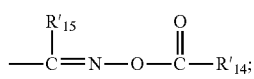

formula (7)

$R_{18}$ represents hydrogen, a $C_2$ to $C_{12}$ alkenyl group, a $C_3$ to $C_{20}$ cycloalkyl group, or phenyl-$C_1$ to $C_3$ alkyl, wherein the $C_2$ to $C_{12}$ alkenyl group, $C_3$ to $C_{20}$ cycloalkyl group, or phenyl-$C_1$ to $C_3$ alkyl is uninterrupted or is interrupted with one or a plurality of O, S, CO, $NR_{26}$, or $COOR_{17}$; or $R_{18}$ is a $C_1$ to $C_{20}$ alkyl group that is unsubstituted or substituted by one or a plurality of the following groups: OH, SH, CN, $C_3$ to $C_6$ alkenyloxy, $OCH_2CH_2CN$, $OCH_2CH_2(CO)O(C_1$ to $C_4$ alkyl), O(CO)—$(C_2$ to $C_4)$ alkenyl, O(CO)—$(C_1$ to $C_4$ alkyl), O(CO)-phenyl, or (CO)$OR_{17}$;

or $R_{18}$ represents a $C_2$ to $C_{20}$ alkyl group interrupted with one or a plurality of O, S, CO, $NR_{26}$, or $COOR_{17}$;

or $R_{18}$ represents $(CH_2CH_2O)_nH$, $(CH_2CH_2O)_n(CO)$—$(C_1$ to $C_8$ alkyl), a $C_2$ to $C_8$ alkanoyl group, or a $C_3$ to $C_6$ alkenoyl group;

or $R_{18}$ represents a benzoyl group that is unsubstituted or substituted by one or a plurality of the following groups: a $C_1$ to $C_6$ alkyl group, halogen, OH, a $C_1$ to $C_4$ alkoxy group, or a $C_1$ to $C_4$ alkylthio group;

or $R_{18}$ represents a phenyl group, a naphthyl group, or a $C_3$ to $C_{20}$ heteroaryl group that is unsubstituted or substituted by one or a plurality of the following groups: halogen, a $C_1$ to $C_{12}$ alkyl group, a $C_1$ to $C_4$ haloalkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, a diphenylamino group, (CO)O $(C_1$ to $C_8$ alkyl), (CO)—$C_1$ to $C_8$ alkyl, (CO)N($C_1$ to $C_8$ alkyl)$_2$, or the group represented by formula (7),

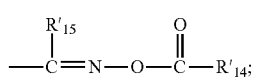

formula (7)

$R_{19}$ and $R_{20}$ are each independently hydrogen, a $C_1$ to $C_{20}$ alkyl group, a $C_2$ to $C_4$ hydroxyalkyl group, a $C_2$ to $C_{10}$ alkoxyalkyl group, a $C_2$ to $C_5$ alkenyl group, a $C_3$ to $C_{20}$ cycloalkyl group, phenyl-$C_1$ to $C_3$ alkyl, a $C_1$ to $C_8$ alkanoyl group, a $C_1$ to $C_8$ alkanoyloxy group, a $C_3$ to $C_{12}$ alkenoyl group, $SO_2$—$(C_1$ to $C_4$ haloalkyl), or a benzoyl group;

or $R_{19}$ and $R_{20}$ each independently represent a phenyl group, a naphthyl group, or a $C_3$ to $C_{20}$ heteroaryl group that is unsubstituted or substituted by one or a plurality of the following groups: halogen, a $C_1$ to $C_4$ haloalkyl group, a $C_1$ to $C_{20}$ alkoxy group, a $C_1$ to $C_{12}$ alkyl group, a benzoyl group, or a $C_1$ to $C_{12}$ alkoxy group;

or $R_{19}$ and $R_{20}$ form a 5-membered or 6-membered saturated or unsaturated ring that is uninterrupted or is interrupted with O, S, or $NR_{17}$ with a nitrogen atom attached thereto, and the 5-membered or 6-membered saturated or unsaturated ring is unsubstituted or substituted by one or a plurality of the following groups: a $C_1$ to $C_{20}$ alkyl group, a $C_1$ to $C_{20}$ alkoxy group, =O, $OR_{17}$, $SR_{18}$, $NR_{21}R_{22}$, (CO) $R_{23}$, $NO_2$, halogen, $C_1$ to $C_4$-haloalkyl, CN, a phenyl group, a $C_3$ to $C_{20}$ cycloalkyl group that is uninterrupted or is interrupted with one or a plurality of O, S, CO, or NR$_{17}$, or the group represented by formula (7),

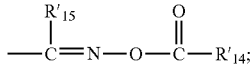

formula (7)

or R$_{19}$ and R$_{20}$ form a heteroaromatic ring system with a nitrogen atom attached thereto, and the ring system is unsubstituted or substituted by one or a plurality of the following groups: a C$_1$ to C$_{20}$ alkyl group, a C$_1$ to C$_4$ haloalkyl group, a C$_1$ to C$_{20}$ alkoxy group, =O, OR$_{17}$, SR$_{18}$, NR$_{21}$R$_{22}$, (CO)R$_{23}$, halogen, NO$_2$, CN, a phenyl group, or a C$_3$ to C$_{20}$ cycloalkyl group that is uninterrupted or is interrupted with one or a plurality of O, S, CO, or NR$_{17}$, or the group represented by formula (7),

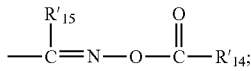

formula (7)

R$_{21}$ and R$_{22}$ are each independently hydrogen, a C$_1$ to C$_{20}$ alkyl group, a C$_1$ to C$_4$ haloalkyl group, a C$_3$ to C$_{10}$ cycloalkyl group, or a phenyl group;

or R$_{21}$ and R$_{22}$ form a 5-membered or 6-membered saturated or unsaturated ring that is uninterrupted or is interrupted with O, S, or NR$_{26}$ with a nitrogen atom attached thereto, and the 5-membered or 6-membered saturated or unsaturated ring is not fused or the 5-membered or 6-membered saturated or unsaturated ring is fused with a benzene ring;

R$_{23}$ represents hydrogen, OH, a C$_1$ to C$_{20}$ alkyl group, a C$_1$ to C$_4$ haloalkyl group, a C$_2$ to C$_{20}$ alkyl group interrupted with one or a plurality of O, CO, or NR$_{26}$, a C$_3$ to C$_{20}$ cycloalkyl group that is uninterrupted or is interrupted with O, S, CO, or NR$_{26}$, or R$_{23}$ represents a phenyl group, a naphthyl group, phenyl-C$_1$ to C$_4$ alkyl, OR$_{17}$, SR$_{18}$, or NR$_{21}$R$_{22}$;

R$_{24}$ represents (CO)OR$_{17}$, CONR$_{19}$R$_{20}$, or (CO)R$_{17}$; or R$_{24}$ is defined the same as one of the R$_{19}$'s and R$_{20}$'s;

R$_{25}$ represents COOR$_{17}$, CONR$_{19}$R$_{20}$, or (CO)R$_{17}$; or R$_{25}$ is defined the same as one of the R$_{17}$'s;

R$_{26}$ represents hydrogen, a C$_1$ to C$_{20}$ alkyl group, a C$_1$ to C$_4$ haloalkyl group, or a C$_2$ to C$_{20}$ alkyl group interrupted with one or a plurality of O or CO; or phenyl-C$_1$ to C$_4$ alkyl or a C$_3$ to C$_8$ cycloalkyl group that is uninterrupted or is interrupted with one or a plurality of O or CO; or (CO)R$_{19}$; or a phenyl group that is unsubstituted or substituted by one or a plurality of the following groups: a C$_1$ to C$_{20}$ alkyl group, halogen, a C$_1$ to C$_4$ haloalkyl group, OR$_{17}$, SR$_{18}$, NR$_{19}$R$_{20}$, or the group represented by formula (7);

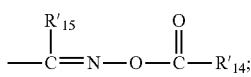

formula (7)

however, the condition is that, at least one group represented by formula (2) or formula (7) is present in the molecule

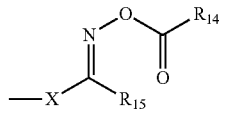

formula (2)

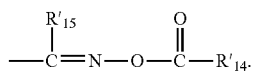

formula (7)

The formula (1) compound contains one or a plurality of annealed unsaturated rings on the carbazole portion. In other words, at least one pair in R$_1$ and R$_2$, R$_2$ and R$_3$, R$_3$ and R$_4$, R$_5$ and R$_6$, R$_6$ and R$_7$, or R$_7$ and R$_8$ is the group represented by formula (5),

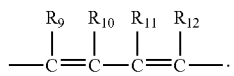

formula (5)

The C$_1$ to C$_{20}$ alkyl group is a straight or branched chain, and is (for instance) a C$_1$ to C$_{18}$, C$_1$ to C$_4$, C$_1$ to C$_{12}$, C$_1$ to C$_8$, C$_1$ to C$_8$, or C$_1$ C$_4$ to alkyl group or a C$_4$ to C$_{12}$ or C$_4$ to C$_8$ alkyl group. Examples include a methyl group, an ethyl group, a propyl group, an isopropyl group, an n-butyl group, a sec-butyl group, an isobutyl group, a tert-butyl group, a pentyl group, a hexyl group, a heptyl group, 2,4,4-trimethylpentyl, 2-ethylhexyl, an octyl group, a nonyl group, a decyl group, a dodecyl group, a tetradecyl group, a pentadecyl group, a cetyl group, an octadecyl group, and an eicosyl group. The C$_1$ to C$_6$ alkyl group is as defined for the C$_1$ to C$_{20}$ alkyl group above and has the highest corresponding number of carbon atoms.

The C$_1$ to C$_{20}$ alkyl group containing one or a plurality of a C—C multi-bond that is unsubstituted or substituted refers to the alkenyl group described below.

The C$_1$ to C$_4$ haloalkyl group is the C$_1$ to C$_4$ alkyl group substituted by halogen defined above. The alkyl group is (for instance) mono- or polyhalogenated until all of the hydrogen atoms are replaced by halogen. The alkyl group is (for instance) C$_z$H$_x$Hal$_y$, wherein x+y=2z+1 and Hal is halogen, preferably F. Specific examples include a chloromethyl group, a trichloromethyl group, a trifluoromethyl group, or 2-bromopropyl, in particular a trifluoromethyl group or a trichloromethyl group. The C$_2$ to C$_4$ hydroxyalkyl group refers to a C$_2$ to C$_4$ alkyl group substituted by one or two oxygen atoms. The alkyl group is a straight chain or branched chain. Examples are 2-hydroxyethyl, 1-hydroxyethyl, 1-hydroxypropyl, 2-hydroxypropyl, 3-hydroxypropyl, 1-hydroxybutyl, 4-hydroxybutyl, 2-hydroxybutyl, 3-hydroxybutyl, 2,3-dihydroxypropyl, and 2,4-dihydroxybutyl. The C$_2$ to C$_{10}$ alkoxyalkyl group is a C$_2$ to C$_{10}$ alkyl group interrupted with one oxygen atom. The C$_2$ to C$_{10}$ alkyl group is as defined for the C$_1$ to C$_{20}$ alkyl group above and has the highest corresponding number of carbon atoms. Examples include a methoxymethyl group, a methoxyethyl group, a methoxypropyl group, an ethoxymethyl group, an ethoxyethyl group, an ethoxypropyl group, a propoxymethyl group, a propoxyethyl group, and a propoxypropyl group.

The C$_2$ to C$_{20}$ alkyl group interrupted with one or a plurality of O, S, NR$_{26}$, or CO is interrupted with O, S, NR$_{26}$, or CO (for instance) 1 to 9 times, 1 to 5 times, 1 to 3 times, or 1 or 2 times. If one or more interrupted groups are present, then the interrupted groups are of the same type or different types. Two oxygen atoms are separated by at least one methylene group, preferably at least two methylene groups (i.e., an ethylene group). The alkyl groups are straight chains or branched. For instance, the following structural units exist: —CH₂—CH₂—O—CH₂CH₃, —[CH₂CH₂O]ᵧ—CH₃ (y=1 to 9), —(CH₂—CH₂O)₇—CH₂CH₃, —CH₂—CH(CH₃)—O—CH₂—CH₂CH₃, —CH₂—CH(CH₃)—O—CH₂—CH₃, —CH₂—CH₂—S—CH₂CH₃, —CH₂—CH(CH₃)—NW²⁶—CH₂—CH₃, —CH₂—CH₂—COO—CH₂CH₃, or —CH₂—CH(CH₃)—OCO—CH₂—CH₂CH₃.

The C₃ to C₁₀ cycloalkyl group, and the C₃ to C₈ cycloalkyl group should be interpreted as alkyl groups containing at least one ring in the present specification. Examples are (for instance) a cyclopropyl group, a cyclobutyl group, a cyclopentyl group, a cyclohexyl group, a cyclooctyl group, a pentylcyclopentyl group, and a cyclohexyl group. The C₃ to C₁₀ cycloalkyl group is also intended to include a double ring in the specification of the invention, i.e., a bridged ring, such as

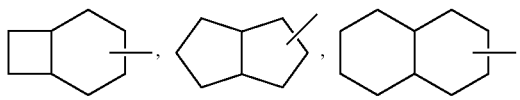

and corresponding rings. Other examples include, for instance, structures such as

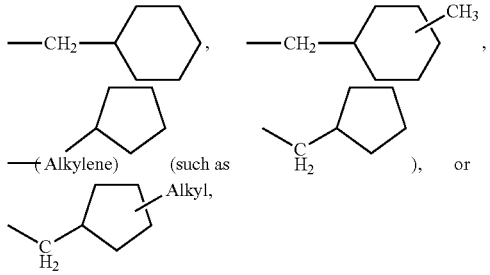

and a bridge or a fused ring system. For instance, the term is also intended to cover: structures such as

etc.

The C₃ to C₂₀ cycloalkyl group interrupted with O, S, CO, NR₂₆ is as defined above, wherein at least one CH₂ group in the alkyl group is replaced by O, S, CO, or NR₂₆. Examples include, for instance, structures such as,

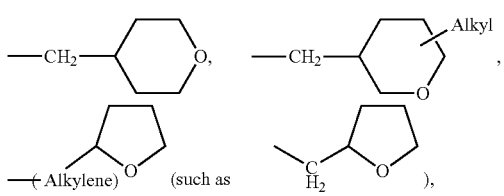

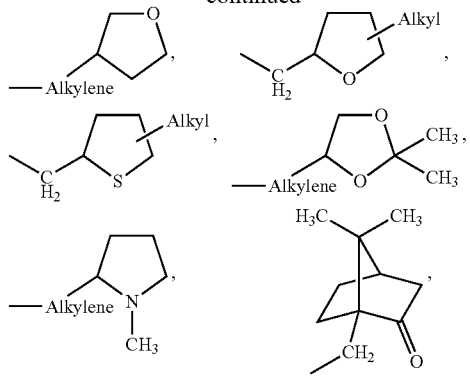

The C₁ to C₈ alkyl-C₃ to C₁₀ cycloalkyl is a C₃ to C₁₀ cycloalkyl group substituted by one or a plurality of an alkyl group having at most 8 carbon atoms defined above. Examples include:

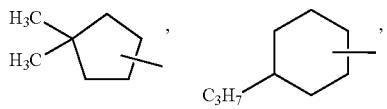

etc.

The C₁ to C₈ alkyl-C₃ to C₁₀ cycloalkyl interrupted with one or a plurality of O is a C₃ to C₁₀ cycloalkyl group interrupted with oxygen and substituted by one or a plurality of an alkyl group having at most 8 carbon atoms defined above. Examples include:

etc.

The C₁ to C₁₂ alkoxy group is a C₁ to C₁₂ alkyl group substituted by one oxygen atom. The C₁ to C₁₂ alkyl group is as defined for the C₁ to C₂₀ alkyl group above and has the highest corresponding number of carbon atoms. The C₁ to C₄ alkoxy group is a straight chain or branched chain, such as a methoxy group, an ethoxy group, a propoxy group, an isopropoxy group, an n-butoxy group, a sec-butoxy group, an isobutoxy group, or a tert-butoxy group. The C₁ to C₈ alkoxy group and the C₁ to C₄ alkoxy group are defined the same as above and have the highest corresponding number of carbon atoms.

The C₁ to C₁₂ alkylthio group is a C₁ to C₁₂ alkyl group substituted by one sulfur atom. The C₁ to C₂₀ alkyl group is as defined for the C₁ to C₂₀ alkyl group above and has the highest corresponding number of carbon atoms. The C₁ to C₄ alkylthio group is a straight chain or branched chain, such as a methylthio group, an ethylthio group, a propylthio group, an isopropylthio group, an n-butylthio group, a sec-butylthio group, an isobutylthio group, or a tert-butylthio group.

The phenyl-C₁ to C₃ alkyl is (for instance) a benzyl group, a phenylethyl group, α-methylbenzyl, or α,α-dimethyl-benzyl, in particular a benzyl group.

The phenyl-$C_1$ to $C_3$ alkoxy is (for instance) a benzyloxy group, a phenylethoxy group, α-methylbenzyloxy, or α,α-dimethylbenzyloxy, in particular a benzyloxy group.

The $C_2$ to $C_{12}$ alkenyl group is mono- or polyunsaturated and is (for instance) a $C_2$ to $C_{10}$, $C_2$ to $C_8$, or $C_2$ to $C_5$ alkenyl group, such as a vinyl group, an allyl group, a methylallyl group, 1,1-dimethylallyl, 1-butenyl, 3-butenyl, 2-butenyl, 1,3-pentadienyl, 5-hexenyl, 7-octenyl, or a dodecenyl group, in particular an allyl group. The $C_2$ to $C_5$ alkenyl group is as defined for the $C_2$ to $C_{12}$ alkenyl group above and has the highest corresponding number of carbon atoms.

The $C_2$ to $C_{12}$ alkenyl group interrupted with one or a plurality of O, CO, or $NR_{26}$ is interrupted with O, S, $NR_{26}$, or CO (for instance) 1 to 9 times, 1 to 5 times, 1 to 3 times, or 1 or 2 times. If one or more interrupted groups are present, then the interrupted groups are of the same type or different types. Two oxygen atoms are separated by at least one methylene group, preferably at least two methylene groups (i.e., an ethylene group). The alkenyl group is a straight chain or branched chain and is as defined above. For instance, the following structural units can be formed: —CH═CH—O—CH$_2$CH$_3$, —CH═CH—O—CH═CH$_2$.

The $C_4$ to $C_8$ cycloalkenyl group has one or a plurality of double bonds and is (for instance) a $C_4$ to $C_6$ cycloalkenyl group or a $C_6$ to $C_8$ cycloalkenyl group. Examples include a cyclobutenyl group, a cyclopentenyl group, a cyclohexenyl group, and a cyclooctenyl group, in particular a cyclopentenyl group and a cyclohexenyl group, preferably a cyclohexenyl group.

The $C_3$ to $C_6$ alkenyloxy group is mono- or polyunsaturated and is as defined as one of the alkenyl groups above, and the attached oxygen group has the highest corresponding number of carbon atoms. Examples include an allyloxy group, a methyl allyloxy group, a butenyloxy group, a pentenyloxy group, 1,3-pentadienyloxy, and 5-hexenyloxy.

The $C_2$ to $C_{12}$ alkynyl group is a mono- or polyunsaturated straight or branched chain, and is (for instance) a $C_2$ to $C_8$, $C_2$ to $C_6$, or $C_2$ to $C_4$ alkynyl group. Examples include, for instance, an ethynyl group, a propynyl group, a butynyl group, 1-butynyl, 3-butynyl, 2-butynyl, a pentynylhexynyl group, 2-hexynyl, 5-hexynyl, and an octynyl group.

The $C_2$ to $C_{20}$ alkanoyl group is a straight or branched chain, and is (for instance) a $C_2$ to $C_{18}$, $C_2$ to $C_{14}$, $C_2$ to $C_{12}$, $C_2$ to $C_8$, $C_2$ to $C_6$, or $C_2$ to $C_4$ alkanoyl group or a $C_4$ to $C_{12}$ or $C_4$ to $C_8$ alkanoyl group. Examples are an acetyl group, a propionyl group, a butyryl group, an isobutyryl group, a pentanoyl group, a hexanoyl group, a heptanoyl group, an octanoyl group, a nonyl group, a decanoyl group, a dodecanoyl group, a tetraacyl group, a pentacosyl group, a hexadecyl group, an octadecyl group, and an eicosanoyl group, preferably an acetyl group. The $C_1$ to $C_8$ alkanoyl group is as defined for the $C_2$ to $C_{20}$ alkanoyl group above and has the highest corresponding number of carbon atoms.

The $C_2$ to $C_{12}$ alkoxycarbonyl group is a straight chain or branched chain and is (for instance) a methoxycarbonyl group, an ethoxycarbonyl group, a propoxycarbonyl group, an n-butoxycarbonyl group, an isobutoxycarbonyl group, 1,1-dimethylpropyloxycarbonyl, a pentyloxycarbonyl group, a hexyloxycarbonyl group, a heptloxycarbonyl group, an octyloxycarbonyl group, a nonoxycarbonyl group, a decyloxycarbonyl group, or a dodecyloxycarbonyl group, in particular a methoxycarbonyl group, an ethoxycarbonyl group, a propoxycarbonyl group, an n-butoxycarbonyl group, or an isobutoxycarbonyl group, preferably a methoxycarbonyl group.

The $C_2$ to $C_{12}$ alkoxycarbonyl group interrupted with one or a plurality of oxygen is a straight chain or branched chain. The two oxygen atoms are isolated by at least two methylene groups (i.e., an ethylene group). The interrupted alkoxycarbonyl group is unsubstituted or substituted by one or a plurality of hydroxyl groups. The $C_6$ to $C_{20}$ aryloxycarbonyl group is (for instance) a phenyloxycarbonyl group [═phenyl-O—(CO)—], a naphthyloxycarbonyl group, or an anthracene-butoxycarbonyl group. The $C_5$ to $C_{20}$ heteroaryloxycarbonyl group is $C_5$ to $C_{20}$ heteroaryl-O—CO—.

The $C_3$ to $C_{10}$ cycloalkylcarbonyl group is $C_3$ to $C_{10}$ cycloalkyl-CO—, wherein the cycloalkyl group is as defined as one of the above and has the highest corresponding number of carbon atoms. The $C_3$ to $C_{10}$ cycloalkylcarbonyl group interrupted with one or a plurality of O, S, CO, and $NR_{26}$ refers to interrupted cycloalkyl-CO—, wherein the interrupted cycloalkyl group is as defined above.

The $C_3$ to $C_{10}$ cycloalkoxycarbonyl group is $C_3$ to $C_{10}$ cycloalkyl-O—(CO)—, wherein the cycloalkyl group is as defined as one of the above and has the highest corresponding number of carbon atoms. The $C_3$ to $C_{10}$ cycloalkoxycarbonyl group interrupted with one or a plurality of O, S, CO, or $NR_{26}$ refers to interrupted cycloalkyl-O—(CO)—, wherein the interrupted cycloalkyl group is as defined above.

The $C_1$ to $C_{20}$ alkylphenyl group refers to a phenyl group substituted by one or a plurality of alkyl groups, wherein the sum of carbon atoms is at most 20.

The $C_6$ to $C_{20}$ aryl group is (for instance) a phenyl group, a naphthyl group, an anthryl group, a phenanthrenyl group, a pyrene group, a chrysenyl group, a tetraphenyl group, or a triphenylenyl group, in particular a phenyl group or a naphthyl group, preferably a phenyl group. The naphthyl group is 1-naphthyl or 2-naphthyl.

In the present specification, the $C_3$ to $C_{20}$ heteroaryl group is intended to contain a mono- or polycyclic system, such as a fused ring system. Examples include, for instance, a thienyl group, benzo[b]thienyl, naphtho[2,3-b]thienyl, a thianthrenyl group, a furanyl group, a dibenzofuranyl group, a xanthene group, a thioxanthene group, a phenoxathiinyl group, a pyrrolyl group, an imidazolyl group, a pyrazolyl group, a pyrazinyl group, a pyrimidinyl group, a pyridazinyl group, an indolizinyl group, an isoindolyl group, an indolyl group, an indazolyl group, a purine group, a quinolizinyl group, an isoquinolinyl group, a quinolinyl group, a phthalazinyl group, a naphthyridinyl group, a quinoxalinyl group, a quinazolinyl group, a cinnoline group, a pteridyl group, a carbazolyl group, a β-carbazolyl group, a phenanthridinyl group, an acridinyl group, a naphthyridinium diazide group, a phenanthrolinyl group, a phenothiazine group, an isothiazolyl group, a phenothiazinyl group, an isoxazolyl group, a furazanyl group, a phenoxy group, 7-phenanthrenyl, anthraquinone-2-yl(═9,10-dioxo-9,10-dihydroanthracen-2-yl), 3-benzo[b]thienyl, 5-benzo[b]thienyl, 2-benzo[b]thienyl, 4-dibenzofuranyl, 4,7-dibenzofuranyl, 4-methyl-7-dibenzofuryl, 2-xanthene, 8-methyl-2-xanthene, 3-xanthene, 2-oxovinyl, 2,7-oxovinyl, 2-pyrrolyl, 3-pyrrolyl, 5-methyl-3-pyrrolyl, 2-imidazolyl, 4-imidazolyl, 5-imidazolyl, 2-methyl-4-imidazolyl, 2-ethyl-4-imidazolyl, 2-ethyl-5-imidazolyl, 1H-tetrazol-5-yl, 3-pyrazolyl, 1-methyl-3-pyrazolyl, 1-propyl-4-pyrazolyl, 2-pyrazinyl, 5,6-dimethyl-2-pyrazinyl, 2-indolizinyl, 2-methyl-3-isoindolyl, 2-methyl-1-isoindolyl, 1-methyl-2-indolyl, 1-methyl-3-indolyl, 1,5-dimethyl-2-indolyl, 1-methyl-3-indazolyl, 2,7-dimethyl-8-purinyl, 2-methoxy-7-methyl-8-purinyl, 2-quinolizinyl, 3-isoquinolinyl, 6-isoquinolinyl, 7-isoquinolinyl, 3-methoxy-6-isoquinolinyl, 2-quinolyl, 3-quinolyl, 7-quinolyl, 2-methoxy-3-quinolinyl, 2-methoxy-6-quinolinyl, 6-phthalazinyl, 7-phthalazinyl, 1-methoxy-6-phthalazinyl, 1,4-dimethoxy-6-phthalazinyl, 1,8-naphthyridin-2-yl, 2-quinoxalinyl, 6-quinoxalinyl, 2,3-dimethyl-6-quinoxalinyl, 2,3-dimethoxy-6-quinoxalinyl, 2-quinazolinyl, 7-quinazolinyl, 2-dimethylamino-6-quinazolinyl, 3-cinnolinyl, 6-cinnolinyl, 7-cinnolinyl, 3-methoxy-7-cinnolinyl, 2-piperidinyl, 6-piperidinyl, 7-piperidinyl, 6,7-dimethoxy-2-pteridinyl, 2-carbazolyl, 3-carbazolyl, 9-methyl-2-carbazolyl, 9-methyl-3-carbazolyl, β-morpholino-3-yl, 1-methyl-β-morpholino-3-yl, 1-methyl-β-morpholino-6-yl, 3-phenanthridinyl, 2-acridinyl, 3-acridinyl, 2-naphthoquinodiazepine, 1-methyl-5-naphthidene diazide, 5-phenanthrolinyl, 6-phenanthrolinyl, 1-phenazinyl, 2-phenazinyl, 3-isothiazolyl, 4-isothiazolyl, 5-isothiazolyl, 2-phenothiazinyl, 3-phenothiazinyl, 10-methyl-3-phenothiazinyl, 3-isoxazolyl, 4-isoxazolyl, 5-isoxazolyl, 4-methyl-3-furoxanyl, 2-phenyloxy, and 10-methyl-2-phenyloxy.

The $C_3$ to $C_{20}$ heteroaryl group is in particular a thienyl group, benzo[b]thienyl, a thianthrenyl group, a thioxanthene group, 1-methyl-2-indolyl, or 1-methyl-3-indolyl; in particular a thienyl group.

The $C_4$ to $C_{20}$ heteroarylcarbonyl group is a $C_3$ to $C_{20}$ heteroaryl group for which a CO group is connected to other portions of the molecule as defined above.

The substituted aryl group (phenyl group, naphthyl group, $C_6$ to $C_{20}$ aryl group, or $C_5$ to $C_{20}$ heteroaryl group) is respectively substituted 1 to 7 times, 1 to 6 times, or 1 to 4 times, in particular 1 time, 2 times, or 3 times. Obviously, the defined aryl group cannot have a substituent more than the free position at the aryl ring.

The substituent on the phenyl ring is preferably in position 4 on the phenyl ring or has a 3,4-, 3,4,5-, 2,6-, 2,4-, or 2,4,6-configuration.

The interrupted group interrupted once or more is interrupted (for instance) 1 to 19 times, 1 to 15 times, 1 to 12 times, 1 to 9 times, 1 to 7 times, 1 to 5 times, 1 to 4 times, 1 to 3 times, or 1 or 2 times (obviously, the number of interrupted atoms is decided based on the number of interrupted carbon atoms). The substituted group substituted 1 time or more has (for instance) 1 to 7, 1 to 5, 1 to 4, 1 to 3, or 1 or 2 of the same or different substituents.

The group substituted by one or more of the defined substituent is intended to have one substituent or a plurality of the substituents having the same or different definitions. The halogen is fluorine, chlorine, bromine, or iodine, in particular fluorine, chlorine, or bromine, and preferably fluorine or chlorine. If $R_1$ and $R_2$, $R_2$ and $R_3$, and $R_3$ and $R_4$, or $R_5$ and $R_6$, $R_6$ and $R_7$, and $R_7$ and $R_8$ are each independently the group represented by formula (5) at the same time, formula (5)

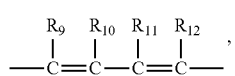

then the structures of (Ia) to (Ii) below are formed:

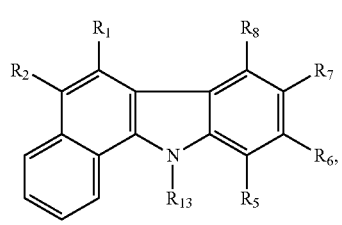
(Ia)

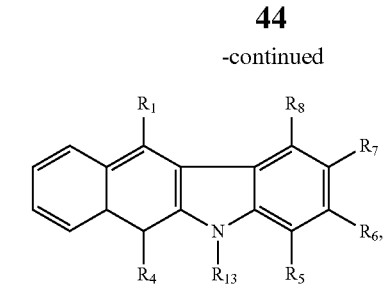
(Ib)

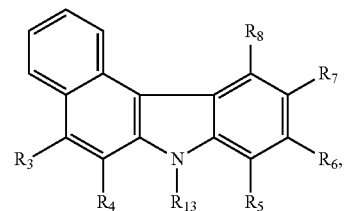
(Ic)

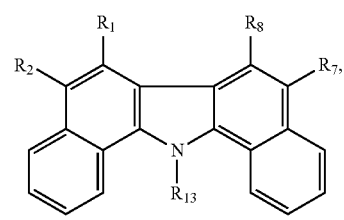
(Id)

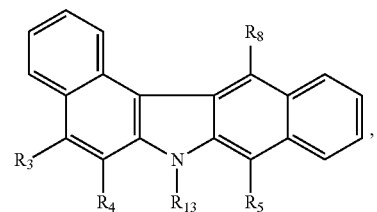
(Ie)

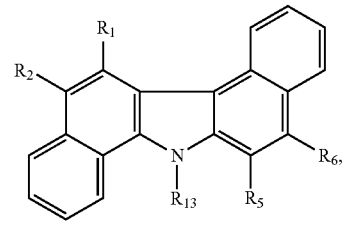
(If)

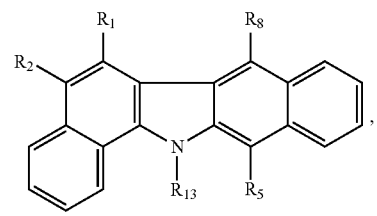
(Ig)

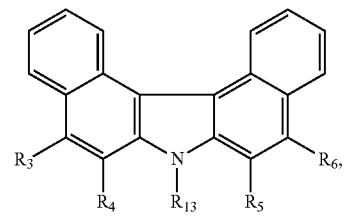
(Ih)

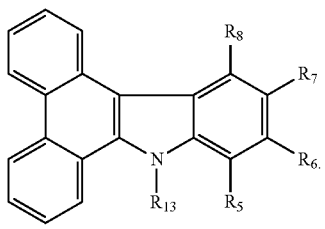

(Ii)

Structure (Ia) is preferred.

In the formula (1) compound, at least one phenyl ring thereof forms a "naphthyl ring" with a carbazole portion by fusing. That is, one of the structures is provided by formula (1).

If $R_1$ and $R_2$, $R_2$ and $R_3$, $R_3$ and $R_4$, $R_5$ and $R_6$, $R_6$ and $R_7$, or $R_7$ and $R_8$ are each independently —$(CH_2)_p$—Y—$(CH_2)_q$— at the same time, then the following is (for

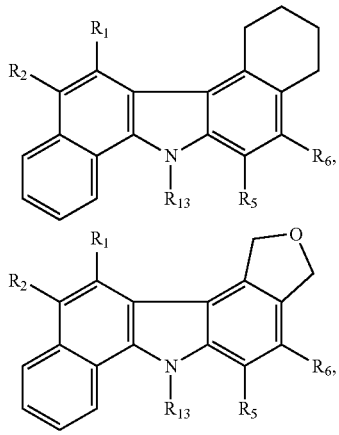

etc.

If the substituent $OR_{17}$, $SR_{18}$, $SOR_{18}$, $SO_2R_{18}$, or $NR_{19}R_{20}$ on the phenyl group or naphthyl ring forms a 5-membered or 6-membered ring with one carbon atom of the naphthyl ring via the groups $R_{17}$, $R_{18}$, $R_{19}$, and/or $R_{20}$, then a structure containing 3 or more rings (including a naphthyl ring) is obtained. Examples include:

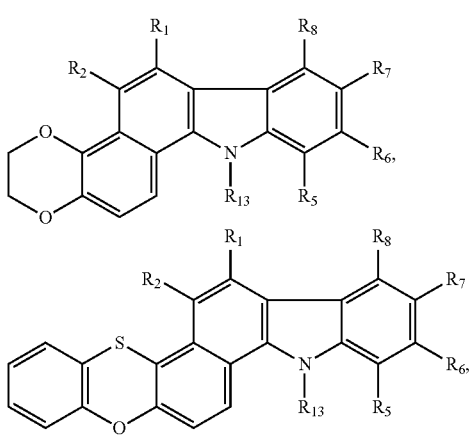

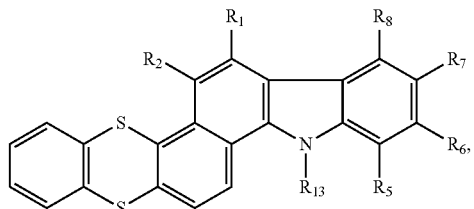

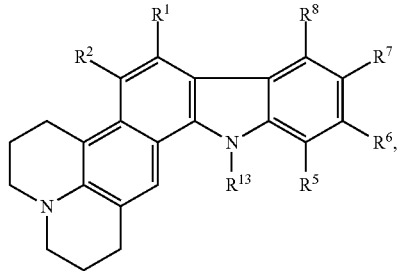

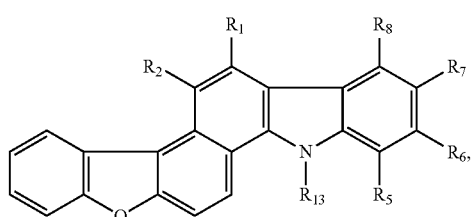

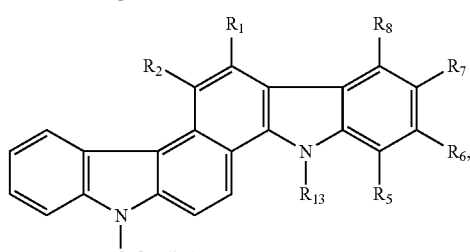

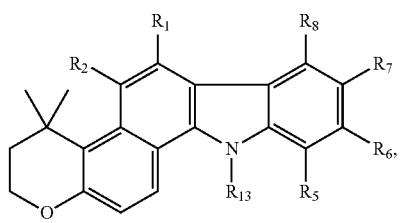

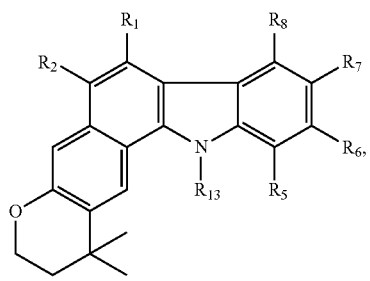

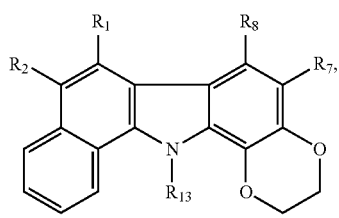

-continued

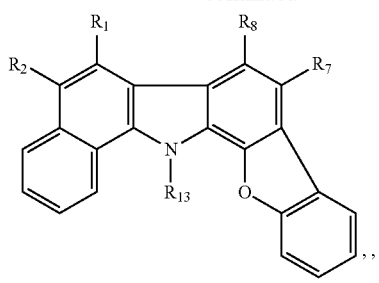

etc.

If $R_{17}$ forms a direct bond bonded to one carbon atom of a phenyl group or a naphthyl ring having the group

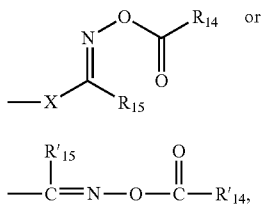

then the following structures

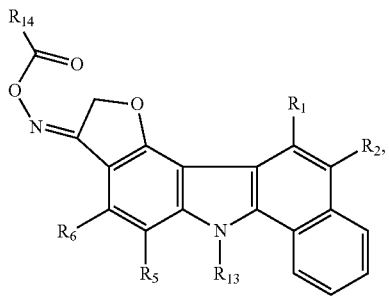

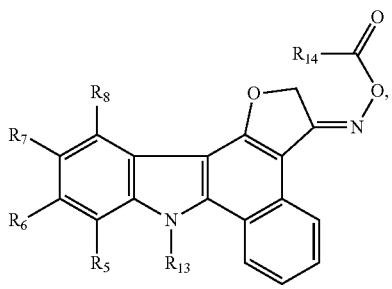

etc. are formed, for example.

If $R_{16}$ represents a phenyl group substituted by $SR_{18}$, wherein the group $R_{19}$ represents a direct bond bonded to a phenyl group or a naphthyl ring to which the carbazole portion of a $COR_{16}$ group is attached, then the following are (for instance) formed

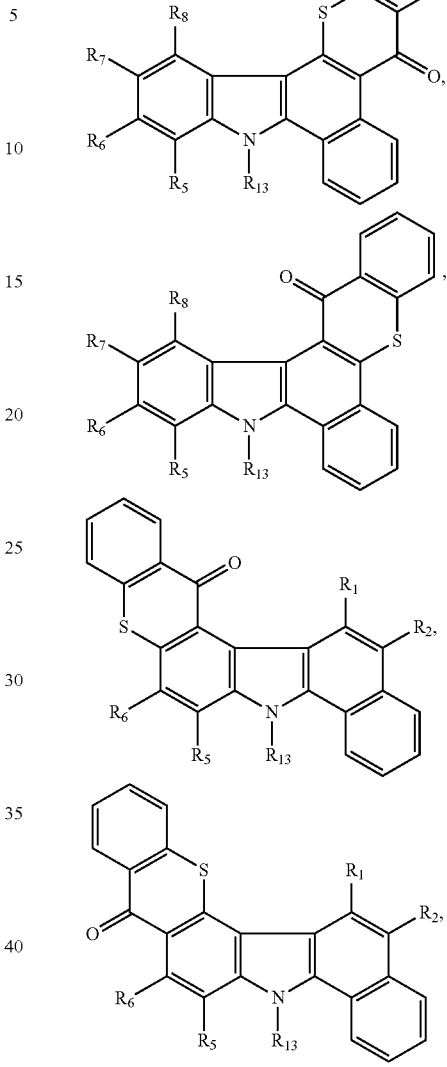

etc. That is, if $R_{16}$ is a phenyl group substituted by $SR_{18}$, wherein the group $R_{18}$ represents a direct bond bonded to a phenyl group or a naphthyl ring to which the carbazole portion of a $COR_{16}$ group is attached, then the thioxanthene portion is formed together with one phenyl group or naphthyl ring of the carbazole portion.

If $R_{19}$ and $R_{20}$ forms a 5-membered or 6-membered saturated or unsaturated ring interrupted with O, S, or $NR_{17}$ as needed with a nitrogen atom attached thereto, then a saturated or unsaturated ring is formed, such as aziridine, pyrrole, thiazole, pyrrolidine, oxazole, pyridine, 1,3-diazine, 1,2-diazine, hexahydropyridine, or morpholine. Preferably, if $R_{19}$ and $R_{20}$ form a 5-membered or 6-membered saturated or unsaturated ring interrupted with O, S, or $NR_{17}$ as needed with a nitrogen atom attached thereto, then a 5-membered or 6-membered saturated ring that is uninterrupted or is interrupted with O or $NR_{17}$, in particular O, is formed.

If $R_{21}$ and $R_{22}$ form a 5-membered or 6-membered saturated or unsaturated ring interrupted with O, S, or $NR_{26}$ as needed with a nitrogen atom attached thereto, and the phenyl ring is fused with the saturated or unsaturated ring as needed, then a saturated or unsaturated ring is formed, such as aziridine, pyrrole, thiazole, pyrrolidine, oxazole, pyridine, 1,3-diazine, 1,2-diazine, hexahydropyridine, or morpholine, or a corresponding ring, such as

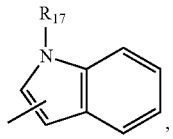

etc.

If $R_{19}$ and $R_{20}$ form a heteroaromatic ring system with a nitrogen atom attached thereto, then the ring system is intended to contain one or more rings (such as 2 or 3 rings) and one or more than one heteroatoms of the same type or different types. A suitable heteroatom is (for instance) N, S, O, or P, in particular N, S, or O. Examples include, for instance, carbazole, indole, isoindole, indazole, purine, isoquinoline, quinoline, morpholino, and phenothiazine.

The term "and/or" or "or/and" in the present specification of the invention is intended to mean that not only one of the defined alternative (substituent) can be present, but a plurality of the defined alternative (substituent) can be present, i.e., a mixture of different alternatives (substituents).

The term "at least" refers to one or more than one, such as one or two or three, preferably one or two.

The term "substituted as needed" means the mentioned group is unsubstituted or substituted.

The term "interrupted as needed" means the mentioned group is uninterrupted or is interrupted.

In the entire specification and the claims below, unless otherwise stated, the term "comprise" or a variation thereof (such as "comprises" or "comprising") should be interpreted to include the integer or step or the group of integers or group of steps, but does not exclude other integers or steps or groups of integers or groups of steps. The term "(meth) acrylate" refers to acrylate and the corresponding methacrylate in the present specification.

The formula (1) oxime ester is prepared by the method in a literature, such as via the reaction of the corresponding oxime and acyl halide, in particular chloride or an acid anhydride, under the following conditions: in an inert solvent (such as tert-butyl methyl ether, tetrahydrofuran (THF), or dimethylformamide), in the presence of a base (such as triethylamine or pyridine), or in an alkaline solvent (such as pyridine). In the examples below, the preparation of the formula (Ia) compound is described, wherein $R_7$ represents an oxime ester group and X represents a direct bond [the reaction of compounds (Ib) to (Ih) is implemented from a suitable oxime]:

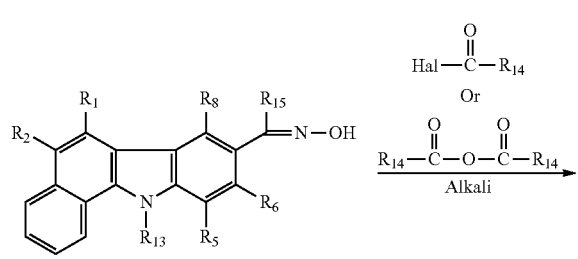

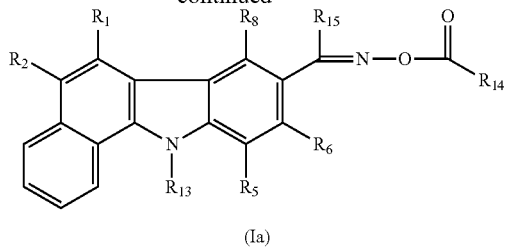

(Ia)

$R_1$, $R_2$, $R_5$, $R_6$, $R_8$, $R_{13}$, $R_{14}$, and $R_{15}$ are as defined above, and Hal refers to a halogen atom, in particular Cl.

$R_{14}$ is preferably a methyl group.

Such reaction is known to those skilled in the art, and is generally performed at a temperature of −15° C. to +50° C., preferably 0° C. to 25° C.

When X represents CO, the corresponding oxime is synthesized via the nitrification of methylene using alkyl nitrite (such as methyl nitrite, ethyl nitrite, propyl nitrite, butyl nitrite, or isoamyl nitrite). Next, esterification is performed with the same conditions as above:

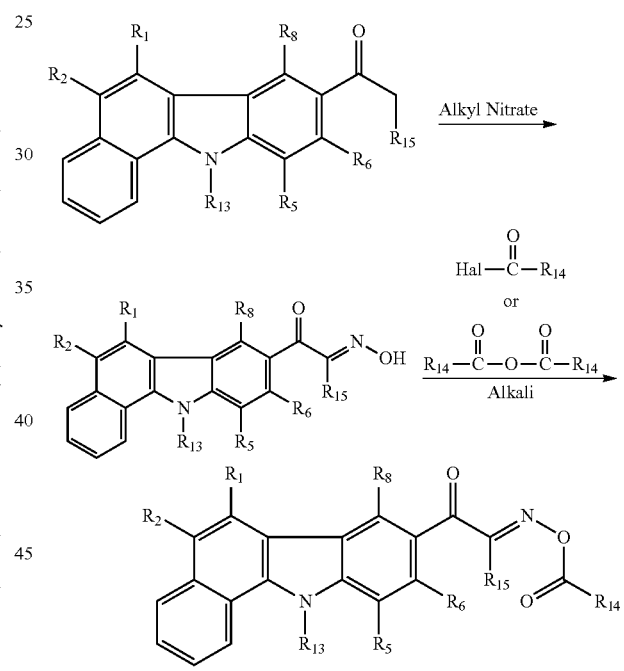

Therefore, an object of the invention is a method of preparing the formula (1) compound defined above by reacting a corresponding oxime compound and acyl halide of formula (VI) or the acid anhydride of formula (VII) in the presence of a base or a mixture of a base.

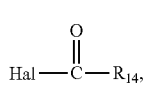

(VI)

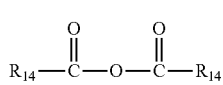

(VII)

Hal is halogen, in particular Cl, and $R_{14}$ is defined above.

The oxime used as a starting material can be obtained by a plurality of methods in a standard chemistry textbook (such as J. March, Advanced Organic Chemistry, vol. 4, Wiley Interscience, 1992) or monograph (such as S. R. Sandler & W. Karo, Organic functional group preparations, vol. 3, Academic Press).

The most convenient method is (for instance) reacting aldehyde or ketone with hydroxylamine or a salt thereof in a polar solvent (such as dimethylacetamide (DMA), a DMA aqueous solution, ethanol, or an ethanol aqueous solution). In this circumstance, a base such as sodium acetate or pyridine is added to control the pH of the reaction mixture. As is well known, reaction speed is dependent on pH, and a base can be continuously added at the beginning or during the reaction. An alkaline solvent such as pyridine can also be used as a base and/or solvent or cosolvent. The reaction temperature is generally room temperature to the reflux temperature of the mixture, and is generally about 20° C. to 120° C.

The corresponding ketone intermediate product is (for instance) prepared by the method in a literature (such as a standard chemistry textbook such as J. March, Advanced Organic Chemistry, vol. 4, Wiley Interscience, 1992). Moreover, a continuous Friedel-Crafts reaction can be effectively used in the synthesis of the intermediate product. Such a reaction is known to those skilled in the art.

Another convenient way of synthesizing oxime includes the nitrosation of "active" methylene using nitrous acid or alkyl nitrite. Alkaline conditions (as described in Organic Syntheses coll., vol. VI (J. Wiley & Sons, New York, 1988), pages 199 and 840) and acidic conditions (as described in Organic Synthesis coll., vol. V, pages 32 and 373, coll. vol. III, pages 191 and 513, coll. vol. II, pages 202, 204, and 363) are suitable for the preparation of the oxime used as the starting material in the invention. Nitrous acid is generally produced from sodium nitrite. The alkyl nitrite can be (for instance) methyl nitrite, ethyl nitrite, propyl nitrite, butyl nitrite, or isoamyl nitrite.

Another example of the invention is a free form formula (1A) oxime compound

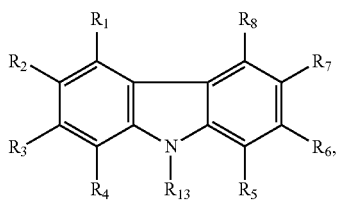

formula (1A)

wherein $R_1$, $R_2$, $R_3$, $R_4$, $R_5$, $R_6$, $R_7$, and $R_8$ are each independently hydrogen, a $C_1$ to $C_{20}$ alkyl group,

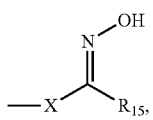

$COR_{16}$, $OR_{17}$, halogen, $NO_2$, or the group represented by formula (3),

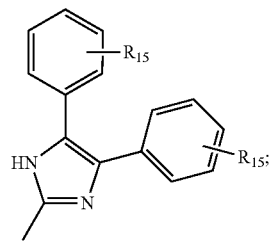

formula (3)

or $R_1$ and $R_2$, $R_2$ and $R_3$, $R_3$ and $R_4$, $R_5$ and $R_6$, $R_6$ and $R_7$, or $R_7$ and $R_8$ are each independently a $C_2$ to $C_{10}$ alkenyl group substituted by

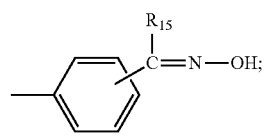

or $R_1$ and $R_2$, $R_2$ and $R_3$, $R_3$ and $R_4$, $R_5$ and $R_6$, $R_6$ and $R_7$, or $R_7$ and $R_8$ are each independently $—(CH_2)_p—Y—(CH_2)_q—$ at the same time;

or $R_1$ and $R_2$, $R_2$ and $R_3$, $R_3$ and $R_4$, $R_5$ and $R_6$, $R_6$ and $R_7$, or $R_7$ and $R_8$ are each independently the group represented by formula (5) at the same time

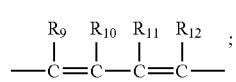

formula (5)

however, the condition is that at least one pair in $R_1$ and $R_2$, $R_2$ and $R_3$, $R_3$ and $R_4$, $R_5$ and $R_6$, $R_6$ and $R_7$, or $R_7$ and $R_8$ is the group represented by formula (5),

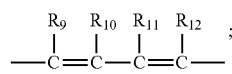

formula (5)

$R_9$, $R_{10}$, $R_{11}$, and $R_{12}$ are each independently hydrogen or a $C_1$ to $C_{20}$ alkyl group, and the $C_1$ to $C_{20}$ alkyl group is unsubstituted or substituted by one or a plurality of the following groups: halogen, a phenyl group, CN, OH, SH, $C_1$ to $C_4$-alkoxy, $—(CO)OH$, or $—(CO)O—(C_1$ to $C_4$ alkyl);

or $R_9$, $R_{10}$, $R_{11}$, and $R_{12}$ are each independently an unsubstituted phenyl group or a phenyl group substituted by one or a plurality of the following groups: a $C_1$ to $C_6$ alkyl group, halogen, CN, $OR_{17}$, $SR_{18}$, or $NR_{19}R_{20}$;

or $R_9$, $R_{10}$, $R_{11}$, and $R_{12}$ are each independently halogen, CN, $OR_{17}$, $SR_{18}$, $SOR_{18}$, $SO_2R_{18}$, or $NR_{19}R_{20}$, wherein the substituent $OR_{17}$, $SR_{18}$, or $NR_{19}R_{20}$ forms a 5-membered or 6-membered ring with one carbon atom in a naphthyl ring via the groups $R_{17}$, $R_{18}$, $R_{19}$, and/or $R_{20}$ as needed;

or $R_9$, $R_{10}$, $R_{11}$, and $R_{12}$ are each independently

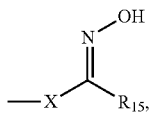

$COR_{16}$, or $NO_2$;

Y represents O, S, $NR_{26}$, or a direct bond;

p represents an integer of 0, 1, 2, or 3;

q represents an integer of 1, 2, or 3;

X represents CO or a direct bond;

$R_{13}$ represents a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, $NR_{19}R_{20}$, $PO(OC_kH_{2k+1})_2$, or the group represented by formula (6),

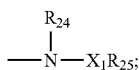

formula (6)

or $R_{13}$ represents a $C_2$ to $C_{20}$ alkyl group interrupted with one or a plurality of O, S, SO, $SO_2$, $NR_{26}$, or CO, or a $C_2$ to $C_{12}$ alkenyl group uninterrupted or is interrupted with one or a plurality of O, CO, or $NR_{26}$, wherein the interrupted $C_2$ to $C_{20}$ alkyl group and the uninterrupted or is interrupted $C_2$ to $C_{12}$ alkenyl group is unsubstituted or substituted by one or a plurality of a halogen;

or $R_{13}$ represents a $C_4$ to $C_8$ cycloalkenyl group, a $C_2$ to $C_{12}$ alkynyl group, or a $C_3$ to $C_{10}$ cycloalkyl group uninterrupted or is interrupted with one or a plurality of O, S, CO, or $NR_{26}$;

or $R_{13}$ represents a phenyl group or a naphthyl group that is unsubstituted or substituted by one or a plurality of the following groups: $OR_{17}$, $SR_{18}$, $NR_{19}R_{20}$,

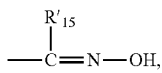

$COR_{16}$, CN, $NO_2$, halogen, a $C_1$ to $C_{20}$ alkyl group, a $C_1$ to $C_4$ haloalkyl group, a $C_2$ to $C_{20}$ alkyl group interrupted with one or a plurality of O, S, CO, or $NR_{26}$; or are each substituted by a $C_3$ to $C_{10}$ cycloalkyl group or a $C_3$ to $C_{10}$ cycloalkyl group interrupted with one or a plurality of O, S, CO, or $NR_{26}$;

k represents an integer of 1 to 10;

$R_{15}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, $PO(OC_kH_{2k+1})_2$, $SO-C_1$ to $C_{10}$ alkyl, $SO_2-C_1$ to $C_{10}$ alkyl, or a $C_2$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{15}$ represents hydrogen, a $C_2$ to $C_{12}$ alkenyl group, or a $C_3$ to $C_8$ cycloalkyl group that is uninterrupted or is interrupted with one or a plurality of O, CO, or $NR_{26}$;

or $R_{15}$ represents a $C_1$ to $C_{20}$ alkyl group that is unsubstituted or substituted by one or a plurality of the following groups: halogen, $OR_{17}$, $SR_{18}$, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $NR_{19}R_{20}$, $COOR_{17}$, $CONR_{19}R_{20}$, $PO(OC_kH_{2k+1})_2$, a phenyl group,

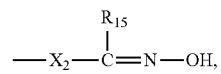

or the group represented by formula (6)

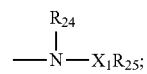

formula (6)

or the $C_1$ to $C_{20}$ alkyl group is substituted by a phenyl group, and the phenyl group is substituted by halogen, a $C_1$ to $C_{20}$ alkyl group, a $C_1$ to $C_4$ haloalkyl group, $OR_{17}$, $SR_{18}$, or $NR_{19}R_{20}$;

or $R_{15}$ represents a $C_2$ to $C_{20}$ alkyl group interrupted with one or a plurality of O, S, or $SO_2$, and the interrupted $C_2$ to $C_{20}$ alkyl group is unsubstituted or substituted by one or a plurality of the following groups: halogen, $OR_{17}$, $COOR_{17}$, $CONR_{19}R_{20}$, a phenyl group, or a phenyl group substituted by $OR_{17}$, $SR_{18}$, or $NR_{19}R_{20}$;

or $R_{15}$ represents a $C_2$ to $C_{20}$ alkanoyl group or a benzoyl group that is unsubstituted or substituted by one or a plurality of the following groups: a $C_1$ to $C_6$ alkyl group, halogen, a phenyl group, $OR_{17}$, $SR_{18}$, or $NR_{19}R_{20}$;

or $R_{15}$ represents a naphthoyl group that is unsubstituted or substituted by one or a plurality of $OR_{17}$ or a $C_3$ to $C_{14}$ heteroarylcarbonyl group;

or $R_{15}$ represents a $C_2$ to $C_{12}$ alkoxycarbonyl group that is uninterrupted or is interrupted with one or a plurality of O and the interrupted or uninterrupted $C_2$ to $C_{12}$ alkoxycarbonyl group is unsubstituted or substituted by one or a plurality of hydroxyl groups;

or $R_{15}$ represents a phenoxycarbonyl group that is unsubstituted or substituted by one or a plurality of the following groups: a $C_1$ to $C_6$ alkyl group, halogen, a $C_1$ to $C_4$ haloalkyl group, a phenyl group, $OR_{17}$, $SR_{18}$, or $NR_{19}R_{20}$;

or $R_{15}$ represents CN, $CONR_{19}R_{20}$, $NO_2$, a $C_1$ to $C_4$ haloalkyl group, $S(O)_m-C_1$ to $C_6$ alkyl, or $S(O)_m$-phenyl that is unsubstituted or substituted by a $C_1$ to $C_{12}$ alkyl group or $SO_2-C_1-C_6$ alkyl;

or $R_{15}$ represents $SO_2O$-phenyl that is unsubstituted or substituted by a $C_1$ to $C_{12}$ alkyl group; or $R_{15}$ represents a diphenylphosphinoyl group or di-($C_1$ to $C_4$ alkoxy)-phosphinoyl;

m represents 1 or 2;

$R'_{15}$ is defined the same as one of the $R_{15}$'s;

$X_1$ represents O, S, SO, or $SO_2$;

$X_2$ represents O, CO, S, or a direct bond;

$R_{16}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{16}$ represents hydrogen or a $C_1$ to $C_{20}$ alkyl group, and the $C_1$ to $C_{20}$ alkyl group is unsubstituted or substituted by one or a plurality of the following groups: halogen, a phenyl group, OH, SH, CN, a $C_3$ to $C_6$ alkenyloxy group, $OCH_2CH_2CN$, $OCH_2CH_2(CO)O(C_1$ to $C_4$ alkyl), $O(CO)$—$(C_1$ to $C_4$ alkyl), $O(CO)$-phenyl, $(CO)OH$, or $(CO)O(C_1$ to $C_4$ alkyl);

or $R_{16}$ represents a $C_2$ to $C_{12}$ alkyl group interrupted with one or a plurality of O, S, or $NR_{26}$; or $R_{16}$ represents $(CH_2CH_2O)_{n+1}H$, $(CH_2CH_2O)_n(CO)$—$(C_1$ to $C_8$ alkyl), a $C_2$ to $C_{12}$ alkenyl group, or a $C_3$ to $C_8$ cycloalkyl group;

or $R_{16}$ represents a phenyl group substituted by $SR_{18}$, wherein the group $R_{18}$ represents a direct bond bonded to the phenyl group or naphthyl ring of the carbazole portion to which a $COR_{16}$ group is attached;

n represents 1 to 20;

$R_{17}$ represents hydrogen, phenyl-$C_1$ to $C_3$ alkyl, or a $C_1$ to $C_{20}$ alkyl group that is unsubstituted or substituted by one or a plurality of the following groups: halogen, OH, SH, CN, a $C_3$ to $C_6$ alkenyloxy group, $OCH_2CH_2CN$, $OCH_2CH_2(CO)O(C_1$ to $C_4$ alkyl), $O(CO)$—$(C_1$ to $C_4$ alkyl), $O(CO)$—$(C_2$ to $C_4)$alkenyl, $O(CO)$-phenyl, $(CO)OH$, $(CO)O(C_1$ to $C_4$ alkyl), a $C_3$ to $C_{20}$ cycloalkyl group, $SO_2$—$(C_1$ to $C_4$ haloalkyl), $O(C_1$ to $C_4$ haloalkyl), or a $C_3$ to $C_{20}$ cycloalkyl group interrupted with one or a plurality of O;

or $R_{17}$ represents a $C_2$ to $C_{20}$ alkyl group interrupted with one or a plurality of O, S, or $NR_{26}$;

or $R_{17}$ represents $(CH_2CH_2O)_{n+1}H$, $(CH_2CH_2O)_n(CO)$—$(C_1$ to $C_8$ alkyl), a $C_1$ to $C_8$ alkanoyl group, a $C_2$ to $C_{12}$ alkenyl group, a $C_3$ to $C_6$ alkenoyl group, or a $C_3$ to $C_{20}$ cycloalkyl group interrupted or uninterrupted with one or a plurality of O, S, CO, or $NR_{26}$;

or $R_{17}$ represents $C_1$ to $C_8$ alkyl-$C_3$ to $C_{10}$ cycloalkyl that is interrupted or uninterrupted with one or a plurality of O;

or $R_{17}$ represents a benzoyl group that is unsubstituted or substituted by one or a plurality of a $C_1$ to $C_6$ alkyl group, halogen, OH, or a $C_1$ to $C_3$ alkoxy group;

or $R_{17}$ represents a phenyl group, a naphthyl group, or a $C_3$ to $C_{20}$ heteroaryl group that is unsubstituted or substituted by one or a plurality of the following groups: halogen, OH, a $C_1$ to $C_{12}$ alkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, diphenyl-amine, or

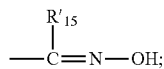;

or $R_{17}$ forms a direct bond bonded to one of the carbon atoms of a phenyl group or a naphthyl ring having

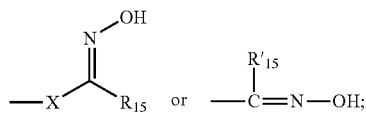

$R_{18}$ represents hydrogen, a $C_2$ to $C_{12}$ alkenyl group, a $C_3$ to $C_{20}$ cycloalkyl group, or phenyl-$C_1$ to $C_3$ alkyl, wherein the $C_2$ to $C_{12}$ alkenyl group, $C_3$ to $C_{20}$ cycloalkyl group, or phenyl-$C_1$ to $C_3$ alkyl is uninterrupted or is interrupted with one or a plurality of O, S, CO, $NR_{26}$, or $COOR_{17}$; or $R_{18}$ is a $C_1$ to $C_{20}$ alkyl group that is unsubstituted or substituted by one or a plurality of the following groups: OH, SH, CN, $C_3$ to $C_6$ alkenyloxy, $OCH_2CH_2CN$, $OCH_2CH_2(CO)O(C_1$ to $C_4$ alkyl), $O(CO)$—$(C_2$ to $C_4)$ alkenyl, $O(CO)$—$(C_1$ to $C_4$ alkyl), $O(CO)$-phenyl, or $(CO)OR_{17}$;

or $R_{18}$ represents a $C_2$ to $C_{20}$ alkyl group interrupted with one or a plurality of O, S, CO, $NR_{26}$, or $COOR_{17}$;

or $R_{18}$ represents $(CH_2CH_2O)_nH$, $(CH_2CH_2O)_n(CO)$—$(C_1$ to $C_8$ alkyl), a $C_2$ to $C_8$ alkanoyl group, or a $C_3$ to $C_6$ alkenoyl group;

or $R_{18}$ represents a benzoyl group that is unsubstituted or substituted by one or a plurality of the following groups: a $C_1$ to $C_6$ alkyl group, halogen, OH, a $C_1$ to $C_4$ alkoxy group, or a $C_1$ to $C_4$ alkylthio group;

or $R_{18}$ represents a phenyl group, a naphthyl group, or a $C_3$ to $C_{20}$ heteroaryl group that is unsubstituted or substituted by one or a plurality of the following groups: halogen, a $C_1$ to $C_{12}$ alkyl group, a $C_1$ to $C_4$ haloalkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, a diphenylamino group, $(CO)O(C_1$ to $C_8$ alkyl), $(CO)$—$C_1$ to $C_8$ alkyl, $(CO)N(C_1$ to $C_8$ alkyl)$_2$, or

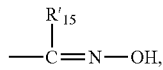

$R_{19}$ and $R_{20}$ are each independently hydrogen, a $C_1$ to $C_{20}$ alkyl group, a $C_2$ to $C_4$ hydroxyalkyl group, a $C_2$ to $C_{10}$ alkoxyalkyl group, a $C_2$ to $C_5$ alkenyl group, a $C_3$ to $C_{20}$ cycloalkyl group, phenyl-$C_1$ to $C_3$ alkyl, a $C_1$ to $C_8$ alkanoyl group, a $C_1$ to $C_8$ alkanoyloxy group, a $C_3$ to $C_{12}$ alkenoyl group, $SO_2$—$(C_1$ to $C_4$ haloalkyl), or a benzoyl group;

or $R_{19}$ and $R_{20}$ each independently represent a phenyl group, a naphthyl group, or a $C_3$ to $C_{20}$ heteroaryl group that is unsubstituted or substituted by one or a plurality of the following groups: halogen, a $C_1$ to $C_4$ haloalkyl group, a $C_1$ to $C_{20}$ alkoxy group, a $C_1$ to $C_{12}$ alkyl group, a benzoyl group, or a $C_1$ to $C_{12}$ alkoxy group;

or $R_{19}$ and $R_{20}$ form a 5-membered or 6-membered saturated or unsaturated ring that is uninterrupted or is interrupted with O, S, or $NR_{17}$ with a nitrogen atom attached thereto, and the 5-membered or 6-membered saturated or unsaturated ring is unsubstituted or substituted by one or a plurality of the following groups: a $C_1$ to $C_{20}$ alkyl group, a $C_1$ to $C_{20}$ alkoxy group, =O, $OR_{17}$, $SR_{18}$, $NR_{21}R_{22}$, $(CO)R_{23}$, $NO_2$, halogen, a $C_1$ to $C_4$ haloalkyl group, CN, a phenyl group,

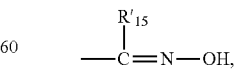

or a $C_3$ to $C_{20}$ cycloalkyl group that is uninterrupted or is interrupted with one or a plurality of O, S, CO, or $NR_{17}$;

or $R_{19}$ and $R_{20}$ form a heteroaromatic ring system with a nitrogen atom attached thereto, and the ring system is unsubstituted or substituted by one or a plurality of the following groups: a $C_1$ to $C_{20}$ alkyl group, a $C_1$ to $C_4$ haloalkyl group, a $C_1$ to $C_{20}$ alkoxy group, =O, $OR_{17}$, $SR_{18}$, $NR_{21}R_{22}$, $(CO)R_{23}$,

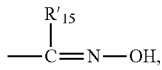

halogen, $NO_2$, CN, a phenyl group, or a $C_3$ to $C_{20}$ cycloalkyl group that is uninterrupted or is interrupted with one or a plurality of O, S, CO, or $NR_{17}$;

$R_{21}$ and $R_{22}$ are each independently hydrogen, a $C_1$ to $C_{20}$ alkyl group, a $C_1$ to $C_4$ haloalkyl group, a $C_3$ to $C_{10}$ cycloalkyl group, or a phenyl group;

or $R_{21}$ and $R_{22}$ form a 5-membered or 6-membered saturated or unsaturated ring that is uninterrupted or is interrupted with O, S, or $NR_{26}$ with a nitrogen atom attached thereto, and the 5-membered or 6-membered saturated or unsaturated ring is not fused or the 5-membered or 6-membered saturated or unsaturated ring is fused with a benzene ring;

$R_{23}$ represents hydrogen, OH, a $C_1$ to $C_{20}$ alkyl group, a $C_1$ to $C_4$ haloalkyl group, a $C_2$ to $C_{20}$ alkyl group interrupted with one or a plurality of O, CO, or $NR_{26}$, a $C_3$ to $C_{20}$ cycloalkyl group that is uninterrupted or is interrupted with O, S, CO, or $NR_{26}$, or $R_{23}$ represents a phenyl group, a naphthyl group, phenyl-$C_1$ to $C_4$ alkyl, $OR_{17}$, $SR_{18}$, or $NR_{21}R_{22}$;

$R_{24}$ represents $(CO)OR_{17}$, $CONR_{19}R_{20}$, or $(CO)R_{17}$; or $R_{24}$ is defined the same as one of the $R_{19}$'s and $R_{20}$'s;

$R_{25}$ represents $COOR_{17}$, $CONR_{19}R_{20}$, or $(CO)R_{17}$; or $R_{25}$ is defined the same as one of the $R_{17}$'s;

$R_{26}$ represents hydrogen, a $C_1$ to $C_{20}$ alkyl group, a $C_1$ to $C_4$ haloalkyl group, or a $C_2$ to $C_{20}$ alkyl group interrupted with one or a plurality of O or CO; or phenyl-$C_1$ to $C_4$ alkyl or a $C_3$ to $C_8$ cycloalkyl group that is uninterrupted or is interrupted with one or a plurality of O or CO; or $(CO)R_{19}$; or a phenyl group that is unsubstituted or substituted by one or a plurality of the following groups: a $C_1$ to $C_{20}$ alkyl group, halogen, a $C_1$ to $C_4$ haloalkyl group, $OR_{17}$, $SR_{18}$, $NR_{19}R_{20}$,

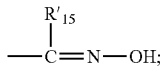

however, the condition is that, at least one group from the following is present in the molecule

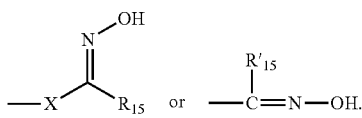

The formula (1A) compound preferably corresponds to the formula (1) compound, and every defined oxime ester group

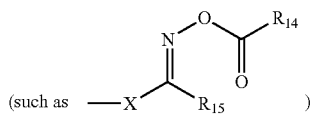

is replaced by the corresponding free oxime group

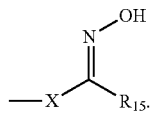

Each oxime ester group can exist in configuration (Z) or (E). The isomer can be isolated by an existing method, but an isomer mixture can also be used as (for instance) a light starting material. Therefore, the invention is also related to a mixture of a configuration isomer of the formula (1) compound.

The formula (1) compound defined above is preferred, wherein $R_1$, $R_2$, $R_3$, $R_4$, $R_5$, $R_6$, $R_7$, and $R_8$ are each independently hydrogen, a $C_1$ to $C_{20}$ alkyl group, $COR_{16}$, $NO_2$, or the group represented by formula (2)

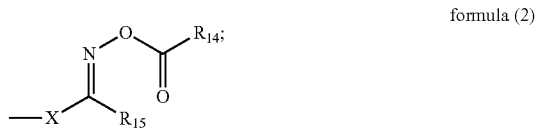

formula (2)

or $R_1$ and $R_2$, $R_2$ and $R_3$, $R_3$ and $R_4$, $R_5$ and $R_6$, $R_6$ and $R_7$, or $R_7$ and $R_8$ are each independently the group represented by formula (5) at the same time

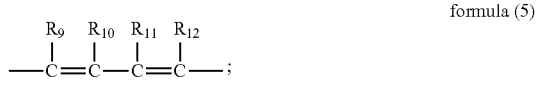

formula (5)

however, the condition is that at least one pair in $R_1$ and $R_2$, $R_2$ and $R_3$, $R_3$ and $R_4$, $R_5$ and $R_6$, $R_6$ and $R_7$, or $R_7$ and $R_8$ is the group represented by formula (5)

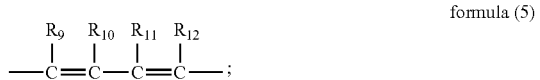

formula (5)

X represents CO or a direct bond;

$R_{13}$ represents a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, $NR_{19}R_{20}$, $PO(OC_kH_{2k+1})_2$;

or $R_{13}$ represents a $C_2$ to $C_{20}$ alkyl group interrupted with one or a plurality of O, S, SO, $SO_2$, $NR_{26}$, or CO;

or $R_{13}$ represents a phenyl group or a naphthyl group that is unsubstituted or substituted by one or a plurality of $COR_{16}$ or

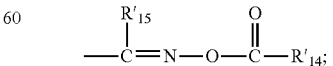

$R_{14}$ represents a $C_1$ to $C_{20}$ alkyl group, a phenyl group, or a $C_1$ to $C_8$ alkoxy group;

$R_{15}$ represents a phenyl group, a naphthyl group, or a $C_3$ to $C_{20}$ heteroaryl group that is unsubstituted or substituted by one or a plurality of the following groups: a phenyl group, halogen, a $C_1$ to $C_4$ haloalkyl group, $OR_{17}$, $SR_{18}$, or a $C_2$ to $C_{20}$ alkyl group interrupted with one or a plurality of O or S; or the phenyl group, naphthyl group, or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, $NR_{19}R_{20}$, or $PO(OC_kH_{2k+1})_2$;

or $R_{15}$ represents a $C_1$ to $C_{20}$ alkyl group that is unsubstituted or substituted by one or a plurality of the following groups: $OR_{17}$, $SR_{18}$, a $C_3$ to $C_8$ cycloalkyl group, a $C_3$ to $C_{20}$ heteroaryl group, $NR_{19}R_{20}$, $COOR_{17}$, $CONR_{19}R_{20}$, or $PO(OC_kH_{2k+1})_2$;

$R'_{14}$ is defined the same as one of the $R_{14}$'s;

$R'_{15}$ is defined the same as one of the $R_{15}$'s;

$R_{16}$ represents a phenyl group that is unsubstituted or substituted by one or a plurality of the following groups: $OR_{17}$, $SR_{18}$, $NR_{19}R_{20}$, or a $C_2$ to $C_{20}$ alkyl group interrupted with one or a plurality of O, S, or $NR_{26}$, or $R_{16}$ represents a phenyl group substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, or $NR_{19}R_{20}$;

or $R_{16}$ represents a $C_1$ to $C_{20}$ alkyl group that is unsubstituted or substituted by the following groups: halogen, a phenyl group, OH, SH, CN, a $C_3$ to $C_6$ alkenyloxy group, $OCH_2CH_2(CO)O(C_1$ to $C_4$ alkyl), $O(CO)$—($C_1$ to $C_4$ alkyl), or $(CO)O(C_1$ to $C_4$ alkyl);

$R_{17}$ represents a $C_1$ to $C_{20}$ alkyl group that is unsubstituted or substituted by one or a plurality of the following groups: halogen, $OCH_2CH_2(CO)O(C_1$ to $C_4$ alkyl), $O(C_1$ to $C_4$ alkyl), $(CO)O(C_1$ to $C_4$ alkyl), a $C_3$ to $C_{20}$ cycloalkyl group, or a $C_3$ to $C_{20}$ cycloalkyl group interrupted with one or a plurality of O;

or $R_{17}$ represents a $C_2$ to $C_{20}$ alkyl group interrupted with one or a plurality of O;

$R_{18}$ represents a methyl group substituted by $(CO)OR_{17}$;

$R_{19}$ and $R_{20}$ are each independently hydrogen, a phenyl group, a $C_1$ to $C_{20}$ alkyl group, a $C_1$ to $C_8$ alkanoyl group, or a $C_1$ to $C_8$ alkanoyloxy group;

or $R_{19}$ and $R_{20}$ form a heteroaromatic ring system with a nitrogen atom attached thereto, and the ring system is unsubstituted or substituted by

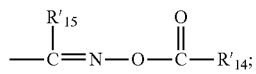

but the condition is that at least one group represented by formula (2) or formula (7) is present in the molecule,

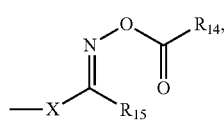

formula (2)

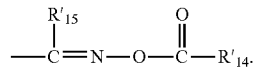

formula (7)

The formula (1) compound defined above is of particular concern, wherein $R_1$, $R_2$, $R_5$, $R_6$, $R_7$, and $R_8$ are each independently hydrogen, $COR_{16}NO_2$, or the group represented by formula (2),

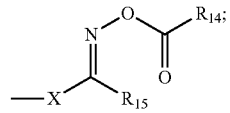

formula (2)

$R_3$ and $R_4$ are groups represented by formula (5) at the same time

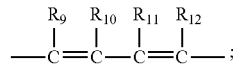

formula (5)

$R_9$, $R_{10}$, $R_{11}$, and $R_{12}$ represent hydrogen

X represents a direct bond;

$R_{13}$ represents a $C_1$ to $C_{20}$ alkyl group;

$R_{14}$ represents a $C_1$ to $C_{20}$ alkyl group;

$R_{15}$ represents a $C_1$ to $C_{20}$ alkyl group or phenyl group substituted by one or a plurality of $OR_{17}$ or a $C_1$ to $C_{20}$ alkyl group;

$R_{16}$ represents a phenyl group substituted by one or a plurality of a $C_1$ to $C_{20}$ alkyl group or $OR_{17}$; and $R_{17}$ represents a $C_1$ to $C_{20}$ alkyl group that is unsubstituted or substituted by one or a plurality of a halogen or a $C_2$ to $C_{20}$ alkyl group interrupted with one or a plurality of O.

However, the condition is that, at least one group represented by formula (2) is present in the molecule.

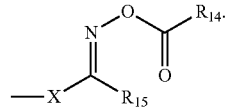

formula (2)

Another subject of the invention is the formula (1) compound defined above, wherein $R_1$, $R_2$, $R_3$, $R_4$, $R_5$, $R_6$, $R_7$, and $R_8$ are each independently hydrogen, or $R_1$ and $R_2$, $R_3$ and $R_4$, or $R_5$ and $R_6$ are each independently the group represented by formula (5) at the same time,

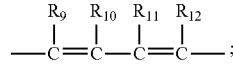

formula (5)

however, the condition is that at least one pair in $R_1$ and $R_2$, $R_3$ and $R_4$, and $R_5$ and $R_6$ is the group represented by formula (5),

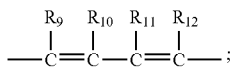

formula (5)

or $R_2$ is the group represented by formula (2), $COR_{16}$, $NO_2$, or the group represented by formula (3),

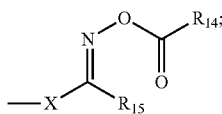

formula (2)

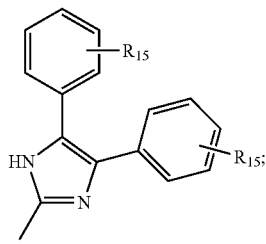

formula (3)

or $R_7$ is $COR_{16}$ or the group represented by formula (2),

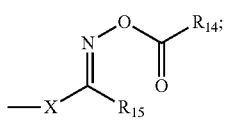

formula (2)

$R_9$, $R_{11}$, and $R_{12}$ represent hydrogen;
$R_{10}$ represents hydrogen, $OR_{17}$, or $COR_{16}$;
X represents CO or a direct bond;
$R_{13}$ represents a $C_1$ to $C_{20}$ alkyl group that is unsubstituted or substituted by one or a plurality of the following groups: halogen, $R_{17}$, $OR_{17}$, $SR_{18}$, or $PO(OC_kH_{2k+1})_2$;
or $R_{13}$ represents a $C_2$ to $C_{20}$ alkyl group interrupted with one or a plurality of O;
or $R_{13}$ represents a phenyl group;
k represents an integer of 2;
$R_{14}$ represents a $C_1$ to $C_{20}$ alkyl group or a thienyl group;
$R_{15}$ represents a phenyl group or a naphthyl group that is unsubstituted or substituted by one or a plurality of $OR_{17}$ or a $C_1$ to $C_{20}$ alkyl group;
or $R_{15}$ represents a thienyl group, hydrogen, or a $C_1$ to $C_{20}$ alkyl group, and the $C_1$ to $C_{20}$ alkyl group is unsubstituted or substituted by one or a plurality of the following groups: $OR_{17}$, $SR_{18}$, a $C_3$ to $C_8$ cycloalkyl group, $NR_{19}R_{20}$, or $COOR_{17}$;
or $R_{15}$ represents a $C_2$ to $C_{20}$ alkyl group interrupted with $SO_2$;
$R_{16}$ represents a phenyl group or a naphthyl group that is unsubstituted or substituted by one or a plurality of the following groups: $OR_{17}$, $SR_{18}$, $NR_{19}R_{20}$, or a $C_1$ to $C_{20}$ alkyl group; or $R_{16}$ represents a thienyl group;
$R_{17}$ represents hydrogen, a $C_1$ to $C_8$ alkanoyl group, or a $C_1$ to $C_{20}$ alkyl group that is unsubstituted or substituted by one or a plurality of the following groups: halogen, $O(CO)$—($C_1$ to $C_4$ alkyl), $O(CO)$—($C_2$ to $C_4$)alkenyl, or a $C_3$ to $C_{20}$ cycloalkyl group interrupted with one or a plurality of O;

or $R_{17}$ represents a $C_2$ to $C_{20}$ alkyl group interrupted with one or a plurality of O;
$R_{18}$ represents a $C_3$ to $C_{20}$ cycloalkyl group or a $C_1$ to $C_{20}$ alkyl group that is unsubstituted or substituted by one or a plurality of OH, $O(CO)$—($C_2$ to $C_4$)alkenyl, or $(CO)OR_{17}$;
or $R_{18}$ represents a phenyl group that is unsubstituted or substituted by one or a plurality of a halogen;
$R_{19}$ and $R_{20}$ are each independently a $C_1$ to $C_8$ alkanoyl group or a $C_1$ to $C_8$ alkanoyloxy group;
or $R_{19}$ and $R_{20}$ form a 5-membered or 6-membered saturated ring interrupted with O with a nitrogen atom attached thereto;
however, the condition is that, at least one group

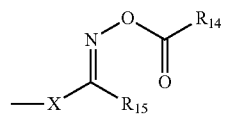

represented by formula (2) is present in the molecule.

Examples of the compound of the invention include the formula (Ia) to (Ig) compounds defined above. Formulas (Ia), (Ib), and (Ic), in particular formula (Ia) and (Ic), or formula (Ia), (Ic), and (Id), in particular the compound of formula (Ia), is of particular concern.

For instance, $R_1$, $R_2$, $R_3$, $R_4$, $R_5$, $R_6$, $R_7$, and $R_8$ are each independently hydrogen, $COR_{16}$, the group represented by formula (2), or $R_1$ and $R_2$, $R_2$ and $R_3$, and $R_3$ and $R_4$ or $R_5$ and $R_6$, $R_6$ and $R_7$, and $R_7$ and $R_8$ are each independently the group represented by formula (5) at the same time,

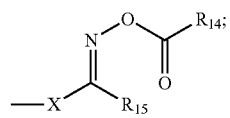

formula (2)

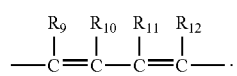

formula (5)

For instance, $R_3$ and $R_4$ or $R_1$ and $R_2$ are the group represented by formula (5) at the same time,

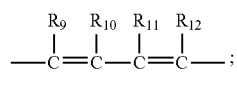

formula (5)

or $R_3$ and $R_4$ and $R_5$ and $R_6$ are the group represented by formula (5) at the same time,

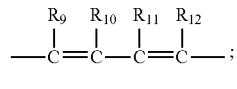

formula (5)

$R_3$ and $R_4$ in particular are the group represented by formula (5) at the same time,

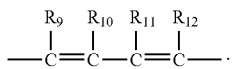

formula (5)

For instance, $R_1$, $R_5$, $R_6$, and $R_8$ represent hydrogen.

$R_7$ is in particular hydrogen, $COR_{16}$, or the group represented by formula (2),

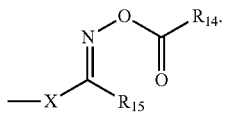

formula (2)

Alternatively, $R_7$ is $COR_{16}$ or the group represented by formula (2), in particular the group represented by formula (2),

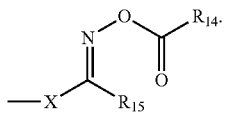

formula (2)

$R_2$ is in particular $COR_{16}$, the group represented by formula (2), or the group represented by formula (3),

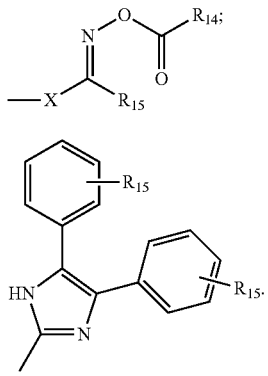

formula (2);

formula (3)

Alternatively, $R_2$ and $R_1$ are the group represented by formula (5) at the same time

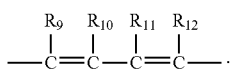

formula (5)

X is preferably a direct bond.

For instance, $R_9$, $R_{10}$, $R_{11}$, and $R_{12}$ are each independently hydrogen, a $C_1$ to $C_{20}$ alkyl group, or a phenyl group that is unsubstituted or substituted by one or a plurality of the following groups: a $C_1$ to $C_6$ alkyl group, halogen, $OR_{17}$, or $SR_{18}$; or $R_9$, $R_{10}$, $R_{11}$, and $R_{12}$ are each independently halogen, $OR_{17}$, $SR_{18}$, or $NR_{19}R_{20}$, wherein the substituent $OR_{17}$, $SR_{18}$, or $NR_{19}R_{20}$ forms a 5-membered or 6-membered ring with one carbon atom of a naphthyl ring via the groups $R_{17}$, $R_{18}$, $R_{19}$, and/or $R_{20}$ as needed; or $R_9$, $R_{10}$, $R_{11}$, and $R_{12}$ are each independently $COR_{16}$ or the group represented by formula (2),

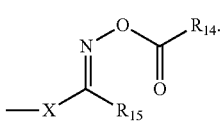

formula (2)

Specifically, $R_9$, $R_{10}$, $R_{11}$, and $R_{12}$ are each independently hydrogen, a $C_1$ to $C_{20}$ alkyl group, or a phenyl group that is unsubstituted or substituted by one or a plurality of the following groups: a $C_1$ to $C_6$ alkyl group, halogen, $OR_{17}$, or $SR_{18}$; or $R_9$, $R_{10}$, $R_{11}$, and $R_{12}$ are each independently halogen, $OR_{17}$, $SR_{18}$, or $NR_{19}R_{20}$; or $R_9$, $R_{10}$, $R_{11}$, and $R_{12}$ are each independently $COR_{16}$ or the group represented by formula (2),

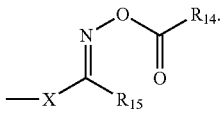

formula (2)

For instance, $R_9$, $R_{10}$, $R_{11}$, and $R_{12}$ are each independently hydrogen, a $C_1$ to $C_{20}$ alkyl group, a phenyl group that is unsubstituted, or a phenyl group substituted by one or a plurality of a $C_1$ to $C_6$ alkyl group; or $R_9$, $R_{10}$, $R_{11}$, and $R_{12}$ are each independently $COR_{16}$ or the group represented by formula (2),

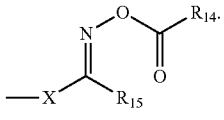

formula (2)

In another example, for instance, $R_9$, $R_{10}$, $R_{11}$, and $R_{12}$ are each independently hydrogen, a $C_1$ to $C_{20}$ alkyl group, or a phenyl group that is unsubstituted or substituted by one or a plurality of the following groups: a $C_1$ to $C_6$ alkyl group, halogen, $OR_{17}$, or $SR_{18}$; or $R_9$, $R_{10}$, $R_{11}$, and $R_{12}$ are each independently halogen, $OR_{17}$, $SR_{18}$, or $NR_{19}R_{20}$, wherein the substituent $OR_{17}$, $SR_{18}$, or $NR_{19}R_{20}$ forms a 5-membered or 6-membered ring with one carbon atom of a naphthyl ring via the groups $R_{17}$, $R_{18}$, $R_{19}$, and/or $R_{20}$ as needed.

Moreover, for instance, $R_9$, $R_{10}$, $R_{11}$, and $R_{12}$ are each independently hydrogen, a $C_1$ to $C_{20}$ alkyl group, or a phenyl group that is unsubstituted or substituted by one or a plurality of the following groups: a $C_1$ to $C_6$ alkyl group, halogen, $OR_{17}$, or $SR_{18}$, or $R_9$, $R_{10}$, $R_{11}$, and $R_{12}$ are each independently halogen, $OR_{17}$, $SR_{18}$, $NR_{19}R_{20}$, or $COR_{16}$.

Alternatively, for instance, $R_9$, $R_{10}$, $R_{11}$, and $R_{12}$ are each independently hydrogen, a $C_1$ to $C_{20}$ alkyl group, or a phenyl group that is unsubstituted or substituted by one or a plurality of the following groups: a $C_1$ to $C_6$ alkyl group, halogen, $OR_{17}$, or $SR_{18}$, or $R_9$, $R_{10}$, $R_{11}$, and $R_{12}$ are each independently halogen, $OR_{17}$, $COR_{16}$, or $NR_{19}R_{20}$.

Preferably, $R_9$, $R_{11}$, and $R_{12}$ represent hydrogen and $R_{10}$ represents hydrogen, $OR_{17}$, or $COR_{16}$.

$R_{13}$ represents (for instance) a $C_1$ to $C_{20}$ alkyl group that is unsubstituted or substituted by one or a plurality of the following groups: halogen, $COOR_{17}$, or $CONR_{19}R_{20}$; or $R_{13}$ represents a $C_2$ to $C_{20}$ alkyl group interrupted with one or a plurality of O, S, SO, $SO_2$, $NR_{26}$, or CO, or a $C_2$ to $C_{12}$ alkenyl group interrupted with one or a plurality of O, CO, or $NR_{26}$ as needed, or $R_{13}$ represents a $C_3$ to $C_{10}$ cycloalkyl group interrupted with one or a plurality of O, S, CO, or $NR_{26}$ as needed, or $R_{13}$ represents a phenyl group or a naphthyl group that is unsubstituted or substituted by one or a plurality of the following groups: $OR_{17}$, $SR_{18}$, $NR_{19}R_{20}$, $COR_{16}$, $NO_2$, halogen, a $C_1$ to $C_{20}$ alkyl group, a $C_1$ to $C_4$ haloalkyl group, or a $C_2$ to $C_{20}$ alkyl group interrupted with one or a plurality of O or the group represented by formula (7),

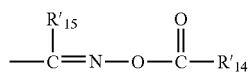

formula (7)

or a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, or $PO(OC_kH_{2k+1})_2$; or a $C_2$ to $C_{20}$ alkyl group interrupted with one or a plurality of O.

Moreover, $R_{13}$ represents (for instance) a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, or $PO(OC_kH_{2k+1})_2$; or a $C_2$ to $C_{20}$ alkyl group interrupted with one or a plurality of O; or a $C_2$ to $C_{12}$ alkenyl group or a $C_3$ to $C_{10}$ cycloalkyl group; or $R_{13}$ represents a phenyl group or a naphthyl group that is unsubstituted or substituted by one or a plurality of the following groups: $OR_{17}$, $SR_{18}$, $NR_{19}R_{20}$, $COR_{16}$, $NO_2$, halogen, a $C_1$ to $C_{20}$ alkyl group, a $C_1$ to $C_4$ haloalkyl group, or a $C_2$ to $C_{20}$ alkyl group interrupted with one or a plurality of O or the group represented by formula (7),

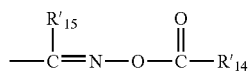

formula (7)

In another example, $R_{13}$ represents (for instance) a $C_1$ to $C_{20}$ alkyl group that is unsubstituted or substituted by one or a plurality of the following groups: halogen, $R_{17}$, $OR_{17}$, $SR_{18}$, or $PO(OC_kH_{2k+1})_2$; or a $C_2$ to $C_{20}$ alkyl group interrupted with one or a plurality of O; or a $C_2$ to $C_{12}$ alkenyl group, a $C_3$ to $C_{10}$ cycloalkyl group, a phenyl group, or a naphthyl group.

Alternatively, $R_{13}$ represents (for instance) a $C_1$ to $C_{20}$ alkyl group that is unsubstituted or substituted by one or a plurality of the following groups: halogen, $R_{17}$, $OR_{17}$, $SR_{18}$, or $PO(OC_kH_{2k+1})_2$; or a $C_2$ to $C_{20}$ alkyl group interrupted with one or a plurality of O; or a phenyl group, a $C_2$ to $C_{12}$ alkenyl group, or a $C_3$ to $C_{10}$ cycloalkyl group.

Alternatively, $R_{13}$ represents (for instance) a $C_1$ to $C_{20}$ alkyl group, a phenyl group, a $C_2$ to $C_{12}$ alkenyl group, or a $C_3$ to $C_{10}$ cycloalkyl group.

Alternatively, $R_{13}$ represents (for instance) a $C_1$ to $C_{20}$ alkyl group, a $C_2$ to $C_{12}$ alkenyl group, or a $C_3$ to $C_{10}$ cycloalkyl group.

Preferably, $R_{13}$ represents a $C_1$ to $C_{12}$ alkyl group, in particular a $C_1$ to $C_8$ alkyl group, such as 2-ethylhexyl.

$R_{14}$ represents (for instance) hydrogen, a $C_3$ to $C_8$ cycloalkyl group, a $C_2$ to $C_5$ alkenyl group, a $C_1$ to $C_{20}$ alkoxy group, or a $C_1$ to $C_{20}$ alkyl group that is unsubstituted or substituted by one or a plurality of a halogen or a phenyl group; or $R_{14}$ represents a phenyl group or a naphthyl group that is unsubstituted or substituted by one or a plurality of the following groups: a $C_1$ to $C_6$ alkyl group, a $C_1$ to $C_4$ haloalkyl group, halogen, $OR_{17}$, $SR_{18}$, and/or $NR_{19}R_{20}$; or $R_{14}$ represents a $C_3$ to $C_5$ heteroaryl group, such as a thienyl group, a $C_1$ to $C_8$ alkoxy group, a benzyloxy group, or a phenoxy group.

Alternatively, $R_{14}$ represents (for instance) a $C_1$ to $C_{20}$ alkyl group that is unsubstituted or substituted by one or a plurality of a halogen or a phenyl group; or $R_{14}$ represents a $C_3$ to $C_5$ heteroaryl group (such as a thienyl group) or a phenyl group that is unsubstituted or substituted by one or a plurality of the following groups: a $C_1$ to $C_6$ alkyl group, a $C_1$ to $C_4$ haloalkyl group, halogen, $OR_{17}$, $SR_{18}$, and/or $NR_{19}R_{20}$; or $R_{14}$ represents a $C_1$ to $C_8$ alkoxy group, a benzyloxy group, or a phenoxy group.

In another example, $R_{14}$ represents a $C_1$ to $C_{20}$ alkyl group that is unsubstituted or substituted by a phenyl group; or $R_{14}$ represents a phenyl group that is unsubstituted or substituted by one or a plurality of a $C_1$ to $C_6$ alkyl group.

Preferably, $R_{14}$ represents a $C_1$ to $C_{20}$ alkyl group, a $C_3$ to $C_5$ heteroaryl group (such as a thienyl group), or a phenyl group, in particular a $C_1$ to $C_{20}$ alkyl group or a thienyl group, in particular a $C_1$ to $C_8$ alkyl group.

$R_{15}$ represents (for instance) a $C_6$ to $C_{20}$ aryl group or a $C_5$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group; or $R_{15}$ represents hydrogen or a $C_3$ to $C_8$ cycloalkyl group, and the $C_3$ to $C_8$ cycloalkyl group is interrupted with one or a plurality of 0, CO, or $NR_{26}$ as needed; or $R_{15}$ represents a $C_1$ to $C_{20}$ alkyl group that is unsubstituted or substituted by one or a plurality of the following groups: halogen, $OR_{17}$, a $C_3$ to $C_8$ cycloalkyl group, a $C_5$ to $C_{20}$ heteroaryl group, a $C_8$ to $C_{20}$ phenoxycarbonyl group, $C_5$ to $C_{20}$ heteroaryloxy-carbonyl, $NR_{19}R_{20}$, $COOR_{17}$, $CONR_{19}R_{20}$, $PO(OC_kH_{2k+1})_2$, the group represented by fo rmula (6), a phenyl group, or a phenyl group substituted by the following groups: halogen, a $C_1$ to $C_{20}$ alkyl group, a $C_1$ to $C_4$ haloalkyl group, $OR_{17}$, or $NR_{19}R_{20}$;

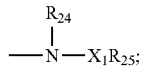

formula (6)

or $R_{15}$ represents a $C_2$ to $C_{20}$ alkyl group interrupted with one or a plurality of O, S, or $SO_2$, or $R_{15}$ represents a $C_2$ to $C_{20}$ alkanoyl group, a benzoyl group, a $C_2$ to $C_{12}$ alkoxycarbonyl group, a phenoxycarbonyl group, $CONR_{19}R_{20}$, $NO_2$, or a $C_1$ to $C_4$ haloalkyl group.

Moreover, $R_{15}$ represents (for instance) hydrogen, a $C_6$ to $C_{20}$ aryl group, in particular a phenyl group or a naphthyl group that is unsubstituted or substituted by a $C_1$ to $C_{12}$ alkyl group; or a $C_3$ to $C_5$ heteroaryl group such as a thienyl group; or a $C_3$ to $C_8$ cycloalkyl group or a $C_1$ to $C_{20}$ alkyl group that is unsubstituted or substituted by one or a plurality of the following groups: $OR_{17}$, $SR_{17}$, a $C_3$ to $C_8$ cycloalkyl group, $NR_{19}R_{20}$, or $COOR_{17}$; or $R_{15}$ represents a $C_2$ to $C_{20}$ alkyl group interrupted with one or a plurality of O or $SO_2$.

The formula (1) compound is of particular concern, wherein $R_{15}$ represents (for instance) hydrogen, a phenyl group, or a naphthyl group that is unsubstituted or substituted by a $C_1$ to $C_8$ alkyl group; or $R_{15}$ represents a thienyl group or a $C_1$ to $C_{20}$ alkyl group that is unsubstituted or substituted by one or a plurality of the following groups: $OR_{17}$, $SR_{17}$, a $C_3$ to $C_8$ cycloalkyl group, $NR_{19}R_{20}$, or $COOR_{17}$; or $R_{15}$ represents a $C_2$ to $C_{20}$ alkyl group interrupted with one or a plurality of O or $SO_2$.

$R_{15}$ is in particular (for instance) a $C_3$ to $C_8$ cycloalkyl group or a $C_1$ to $C_{20}$ alkyl group, in particular a $C_1$ to $C_{20}$ alkyl group, in particular a $C_1$ to $C_{12}$ alkyl group.

$R'_{14}$ and $R'_{15}$ are preferably respectively as defined for $R_{14}$ and $R_{15}$ above.

$X_1$ represents (for instance) O, S, or SO, such as O or S, in particular O.

$R_{16}$ represents (for instance) a $C_6$ to $C_{20}$ aryl group (in particular a phenyl group or a naphthyl group, in particular a phenyl group) or a $C_5$ to $C_{20}$ heteroaryl group (in particular a thienyl group) that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group interrupted with one or a plurality of O; or substituted by one or a plurality of a $C_1$ to $C_{20}$ alkyl group, wherein the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_5$ to $C_{20}$ heteroaryl group, a $C_6$ to $C_{20}$ aryloxycarbonyl group, a $C_5$ to $C_{20}$ heteroaryloxycarbonyl group, $OR_{17}$, $SR_{18}$, or $NR_{19}R_{20}$; or $R_{16}$ represents hydrogen or a $C_1$ to $C_{20}$ alkyl group, wherein the $C_1$ to $C_{20}$ alkyl group is unsubstituted or substituted by one or a plurality of the following groups: halogen, a phenyl group, OH, SH, a $C_3$ to $C_6$ alkenyloxy group, $OCH_2CH_2(CO)O(C_1$ to $C_4$ alkyl), $O(CO)$—($C_1$ to $C_4$ alkyl), $O(CO)$-phenyl, $(CO)OH$, or $(CO)O(C_1$ to $C_4$ alkyl); or $R_{16}$ represents a $C_2$ to $C_{12}$ alkyl group interrupted with one or a plurality of O; or represents $(CH_2CH_2O)_{n+1}H$, $(CH_2CH_2O)_n(CO)$—(C to $C_8$ alkyl), a $C_2$ to $C_{12}$ alkenyl group, or a $C_3$ to $C_8$ cycloalkyl group, and n is 1 to 20, such as 1 to 12 or 1 to 8, in particular 1 or 2.

Moreover, $R_{16}$ represents (for instance) a phenyl group or a naphthyl group, in particular a phenyl group, a thienyl group, or a carbazole group that is unsubstituted or substituted by one or a plurality of the following groups: a phenyl group, halogen, a $C_1$ to $C_4$ haloalkyl group, $OR_{17}$, $SR_{18}$, $NR_{19}R_{20}$, or a $C_1$ to $C_{20}$ alkyl group; or $R_{16}$ represents a $C_1$ to $C_{20}$ alkyl group that is unsubstituted or substituted by one or a plurality of the following groups: halogen, a phenyl group, OH, SH, a $C_3$ to $C_6$ alkenyloxy group, $OCH_2CH_2(CO)O(C_1$ to $C_4$ alkyl), $O(CO)$—($C_1$ to $C_4$ alkyl), $O(CO)$-phenyl, $(CO)OH$, or $(CO)O(C_1$ to $C_4$ alkyl); or $R_{16}$ represents a $C_2$ to $C_{12}$ alkyl group interrupted with one or a plurality of O; or $(CH_2CH_2O)_{n+1}H$, $(CH_2CH_2O)_n(CO)$—($C_1$ to $C_8$ alkyl), a $C_2$ to $C_{12}$ alkenyl group, or a $C_3$ to $C_8$ cycloalkyl group, and n is 1 to 20, such as 1 to 12 or 1 to 8, in particular 1 or 2.

Moreover, $R_{16}$ represents (for instance) a phenyl group or a naphthyl group, in particular a phenyl group that is unsubstituted or substituted by one or a plurality of the following groups: a phenyl group, halogen, a $C_1$ to $C_4$ haloalkyl group, $OR_{17}$, $SR_{18}$, $NR_{19}R_{20}$, or a $C_1$ to $C_{20}$ alkyl group; or $R_{16}$ represents a $C_3$ to $C_5$ heteroaryl group, in particular a thienyl group.

$R_{16}$ is in particular a phenyl group that is unsubstituted or substituted by one or a plurality of the following groups: $OR_{17}$, $SR_{18}$, $NR_{19}R_{20}$, or a $C_1$ to $C_{20}$ alkyl group, or $R_{16}$ represents a thienyl group.

Preferably, $R_{16}$ represents (for instance) a phenyl group or a naphthyl group that is unsubstituted or substituted by one or a plurality of a $C_1$ to $C_{20}$ alkyl group.

$R_{16}$ is in particular a phenyl group substituted by one or a plurality of a $C_1$ to $C_{20}$ alkyl group.

$R_{17}$ represents (for instance) hydrogen, phenyl-$C_1$ to $C_3$ alkyl, or a $C_1$ to $C_{20}$ alkyl group that is unsubstituted or substituted by one or a plurality of the following groups: halogen, OH, $OCH_2CH_2(CO)O(C_1$ to $C_4$ alkyl), $O(CO)$—($C_1$ to $C_4$ alkyl), $O(CO)$—($C_2$ to $C_4$)alkenyl, $O(CO)$-phenyl, $(CO)OH$, $(CO)O(C_1$ to $C_4$ alkyl), a $C_3$ to $C_{20}$ cycloalkyl group, or a $C_3$ to $C_{20}$ cycloalkyl group interrupted with one or a plurality of O; or $R_{17}$ represents a $C_2$ to $C_{20}$ alkyl group interrupted with one or a plurality of O; $(CH_2CH_2O)_{n+1}H$, $(CH_2CH_2O)_n(CO)$—($C_1$ to $C_8$ alkyl), a $C_1$ to $C_8$ alkanoyl group, a $C_2$ to $C_{12}$ alkenyl group, a $C_3$ to $C_6$ alkenoyl group, or a $C_3$ to $C_{20}$ cycloalkyl group interrupted with one or a plurality of O; or $R_{17}$ represents a benzoyl group that is unsubstituted or substituted by one or a plurality of a $C_1$ to $C_6$ alkyl group, halogen, OH, or a $C_1$ to $C_3$ alkoxy group; or $R_{17}$ represents a phenyl group, a naphthyl group, or a $C_5$ to $C_{20}$ heteroaryl group that is unsubstituted or substituted by one or a plurality of the following groups: halogen, OH, a $C_1$ to $C_{12}$ alkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl$)_2$, diphenyl-amine, or the group represented by formula (7)

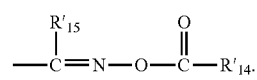

formula (7)

In another example, $R_{17}$ represents (for instance) hydrogen, phenyl-$C_1$ to $C_3$ alkyl, or a $C_1$ to $C_{20}$ alkyl group that is unsubstituted or substituted by one or a plurality of the following groups: halogen, $O(CO)$—($C_1$ to $C_4$ alkyl), $O(CO)$—($C_2$ to $C_4$ alkenyl), a $C_2$ to $C_{20}$ alkyl group interrupted with one or a plurality of O; or a $C_1$ to $C_8$ alkanoyl group, a $C_2$ to $C_{12}$ alkenyl group, a $C_3$ to $C_6$ alkenoyl group, a $C_2$ to $C_{20}$ alkyl group interrupted with one or a plurality of O, or a $C_3$ to $C_{20}$ cycloalkyl group interrupted with one or a plurality of O as needed; or a benzoyl group that is unsubstituted or substituted by one or a plurality of the following groups: a $C_1$ to $C_6$ alkyl group, halogen, OH, or a $C_1$ to $C_3$ alkoxy group; or a phenyl group or a naphthyl group that is unsubstituted or substituted by one or a plurality of the following groups: halogen, a $C_1$ to $C_{12}$ alkyl group, or a $C_1$ to $C_{12}$ alkoxy group.

$R_{17}$ is (for instance) hydrogen, phenyl-$C_1$ to $C_3$ alkyl, a $C_1$ to $C_8$ alkanoyl group, or a $C_1$ to $C_{20}$ alkyl group that is unsubstituted or substituted by one or a plurality of the following groups: halogen, a $C_3$ to $C_{20}$ cycloalkyl group, $O(CO)$—($C_1$ to $C_4$ alkyl), $O(CO)$—($C_2$ to $C_4$ alkenyl), or a $C_2$ to $C_{20}$ alkyl group interrupted with one or a plurality of O, or $R_{17}$ represents a $C_2$ to $C_{20}$ alkyl group interrupted with one or a plurality of O.

$R_{17}$ is in particular hydrogen, a $C_1$ to $C_8$ alkanoyl group, or a $C_1$ to $C_{20}$ alkyl group that is unsubstituted or substituted by one or a plurality of the following groups: $O(CO)$—($C_1$ to $C_4$ alkyl), $O(CO)$—($C_2$ to $C_4$ alkenyl), or a $C_2$ to $C_{20}$ alkyl group interrupted with one or a plurality of O, or $R_{17}$ represents a $C_2$ to $C_{20}$ alkyl group interrupted with one or a plurality of O.

$R_{18}$ represents (for instance) a $C_3$ to $C_{20}$ cycloalkyl group that in uninterrupted or is interrupted with one or a plurality of O; or $R_{18}$ represents a $C_1$ to $C_{20}$ alkyl group that is unsubstituted or substituted by one or a plurality of the following groups: OH, O(CO)—($C_2$ to $C_4$)alkenyl, O(CO)—($C_1$ to $C_4$ alkyl), or (CO)$OR_{17}$; or $R_{18}$ represents a $C_2$ to $C_{20}$ alkyl group interrupted with one or a plurality of O, S, CO, $NR_{26}$, or $COOR_{17}$; or $R_{18}$ represents a $C_2$ to $C_8$ alkanoyl group, a $C_3$ to $C_6$ alkenoyl group, or a benzoyl group; or $R_{18}$ represents a phenyl group, a naphthyl group, or a $C_3$ to $C_{20}$ heteroaryl group that is unsubstituted or substituted by one or a plurality of the following groups: halogen, a $C_1$ to $C_{12}$ alkyl group, a $C_1$ to $C_4$ haloalkyl group, a $C_1$ to $C_{12}$ alkoxy group, or $NO_2$.

In another example, $R_{18}$ represents (for instance) a $C_3$ to $C_{20}$ cycloalkyl group or a $C_1$ to $C_{20}$ alkyl group that is unsubstituted or substituted by one or a plurality of the following groups: OH, O(CO)—($C_2$ to $C_4$)alkenyl, O(CO)—($C_1$ to $C_4$ alkyl), or (CO)$OR_{17}$; or $R_{18}$ represents a phenyl group or a naphthyl group that is unsubstituted or substituted by one or a plurality of a halogen or a $C_1$ to $C_{12}$ alkyl group, in particular halogen.

$R_{18}$ represents (for instance) a $C_1$ to $C_{20}$ alkyl group, a $C_2$ to $C_{12}$ alkenyl group, a $C_3$ to $C_{20}$ cycloalkyl group, phenyl-$C_1$ to $C_3$ alkyl, a $C_2$ to $C_8$ alkanoyl group, a benzoyl group, a phenyl group, or a naphthyl group.

For instance, $R_{18}$ represents a $C_1$ to $C_{20}$ alkyl group substituted by one or a plurality of the following groups: OH, O(CO)—($C_2$ to $C_4$)alkenyl, O(CO)—($C_1$ to $C_4$ alkyl), or (CO)$OR_{17}$, or $R_{18}$ represents a phenyl group substituted by one or a plurality of a halogen.

Preferably, $R_{18}$ represents a substituted $C_1$ to $C_8$ alkyl group as defined above.

For instance, $R_{19}$ and $R_{20}$ are each independently hydrogen, a $C_1$ to $C_{20}$ alkyl group, a $C_2$ to $C_4$ hydroxyalkyl group, a $C_3$ to $C_{20}$ cycloalkyl group, phenyl-$C_1$ to $C_3$ alkyl, a phenyl group or a naphthyl group, a $C_1$ to $C_8$ alkanoyl group, a $C_1$ to $C_8$ alkanoyloxy group, a $C_3$ to $C_{12}$ alkenoyl group, or a benzoyl group; or $R_{19}$ and $R_{20}$ form a 5-membered or 6-membered saturated or unsaturated ring interrupted with O, S, or $NR_{17}$ as needed with a nitrogen atom attached thereto; or $R_{19}$ and $R_{20}$ form a heteroaromatic ring system with a nitrogen atom attached thereto, wherein the ring system is unsubstituted or substituted by one or a plurality of the following groups: a $C_1$ to $C_{20}$ alkyl group, a $C_1$ to $C_4$ haloalkyl group, or the group represented by formula (7),

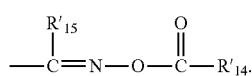

formula (7)

Moreover, for instance, $R_{19}$ and $R_{20}$ are each independently hydrogen, a $C_1$ to $C_{20}$ alkyl group, a $C_2$ to $C_4$ hydroxyalkyl group, a $C_3$ to $C_{20}$ cycloalkyl group, phenyl-$C_1$ to $C_3$ alkyl, a $C_1$ to $C_8$ alkanoyl group, a $C_1$ to $C_8$ alkanoyloxy group, a $C_3$ to $C_{12}$ alkenoyl group, or a benzoyl group; or $R_{19}$ and $R_{20}$ form a 5-membered or 6-membered saturated ring interrupted with O or $NR_{17}$ as needed with a nitrogen atom attached thereto; or $R_{19}$ and $R_{20}$ form an azole ring with a nitrogen atom attached thereto.

For instance, $R_{19}$ and $R_{20}$ are each independently hydrogen, a $C_1$ to $C_{20}$ alkyl group, a $C_2$ to $C_4$ hydroxyalkyl group, a $C_3$ to $C_{20}$ cycloalkyl group, phenyl-$C_1$ to $C_3$ alkyl, a $C_1$ to $C_8$ alkanoyl group, a $C_1$ to $C_8$ alkanoyloxy group, a $C_3$ to $C_{12}$ alkenoyl group, or a benzoyl group; or $R_{19}$ and $R_{20}$ form a 5-membered or 6-membered saturated ring interrupted with O or $NR_{17}$ as needed with a nitrogen atom attached thereto.

Preferably, $R_{19}$ and $R_{20}$ are each independently a $C_1$ to $C_8$ alkanoyl group or a $C_1$ to $C_8$ alkanoyloxy group; or $R_{19}$ and $R_{20}$ form a morpholine ring with a nitrogen atom attached thereto.

For instance, $R_{21}$ and $R_{22}$ are each independently hydrogen, a $C_1$ to $C_{20}$ alkyl group, a $C_1$ to $C_4$ haloalkyl group, a $C_3$ to $C_{10}$ cycloalkyl group, or a phenyl group; or $R_{21}$ and $R_{22}$ form a morpholine ring with a nitrogen atom attached thereto. $R_{21}$ and $R_{22}$ are in particular each independently hydrogen or a $C_1$ to $C_{20}$ alkyl group.

$R_{23}$ represents (for instance) hydrogen, OH, a phenyl group, or a $C_1$ to $C_{20}$ alkyl group. $R_{23}$ is in particular hydrogen, OH, or a $C_1$ to $C_4$ alkyl group.

$R_{24}$ is preferably defined the same as $R_{19}$ and $R_{20}$. $R_{25}$ is preferably defined the same as $R_{17}$.

$R_{26}$ represents (for instance) hydrogen, a $C_1$ to $C_{20}$ alkyl group, a $C_1$ to $C_4$ haloalkyl group, or a $C_2$ to $C_{20}$ alkyl group interrupted with one or a plurality of O or CO; or phenyl-$C_1$ to $C_4$ alkyl or a $C_3$ to $C_8$ cycloalkyl group interrupted with one or a plurality of O or CO as needed; or (CO)$R_{19}$ or a phenyl group that is unsubstituted or substituted by one or a plurality of the following groups: a $C_1$ to $C_{20}$ alkyl group, halogen, a $C_1$ to $C_4$ haloalkyl group, $OR_{17}$, $SR_{18}$, $NR_{19}R_{20}$.

Alternatively, $R_{26}$ represents (for instance) hydrogen, a $C_1$ to $C_{20}$ alkyl group, or a $C_1$ to $C_4$ haloalkyl group; phenyl-$C_1$ to $C_4$ alkyl, a $C_3$ to $C_8$ cycloalkyl group, (CO)$R_{19}$, or a phenyl group that is unsubstituted or substituted by one or a plurality of a $C_1$ to $C_{20}$ alkyl group. Moreover, $R_{26}$ represents (for instance) hydrogen or a $C_1$ to $C_{20}$ alkyl group, in particular a $C_1$ to $C_4$ alkyl group.

Examples of the formula (1) compound include the compounds represented by formula (1-1) to formula (1-84):

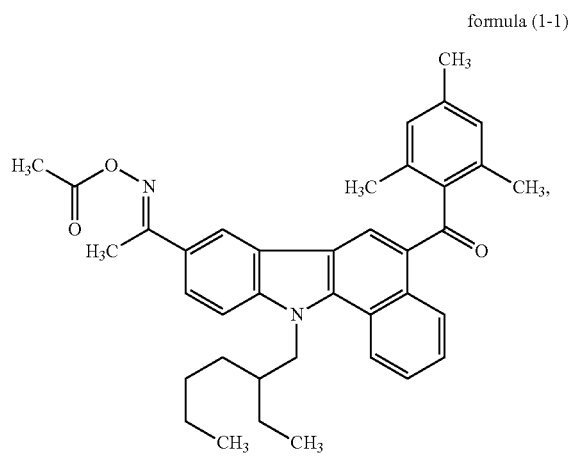

formula (1-1)

formula (1-2)
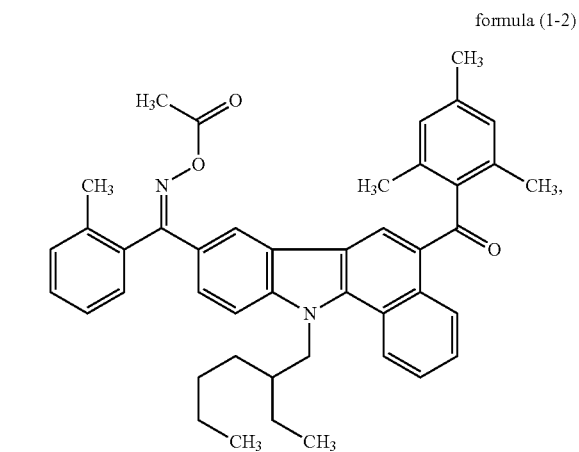
formula (1-3)
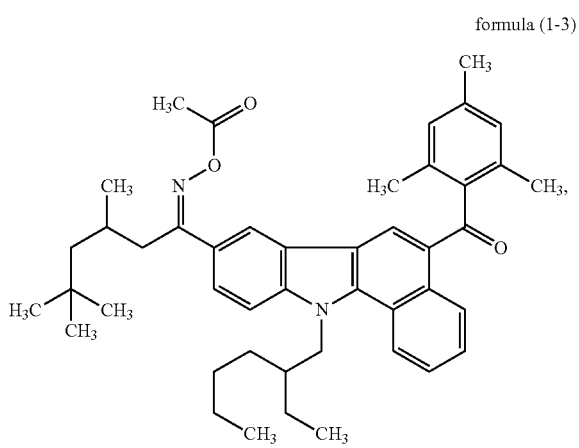
formula (1-4)
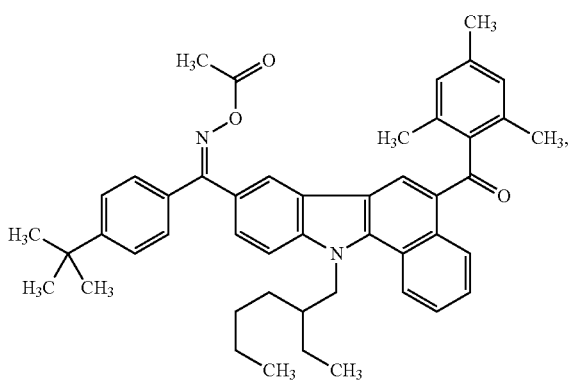
formula (1-5)
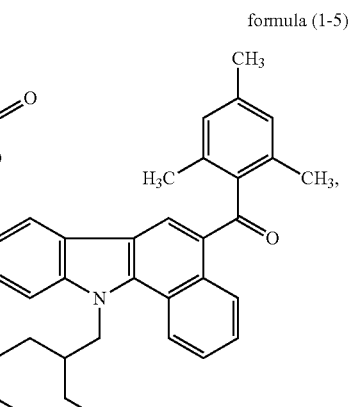
formula (1-6)
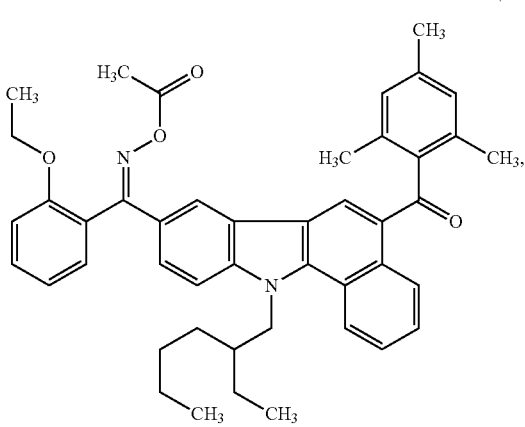
formula (1-7)
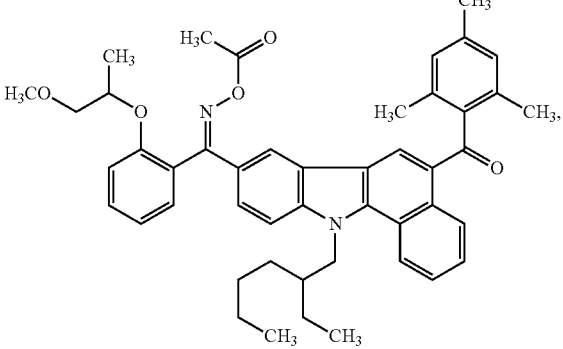
formula (1-8)
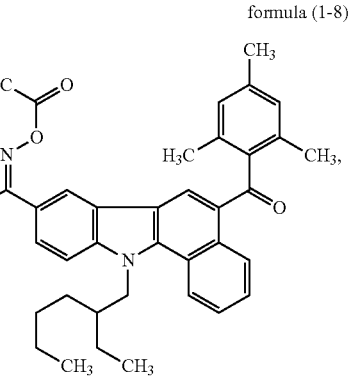

formula (1-9)
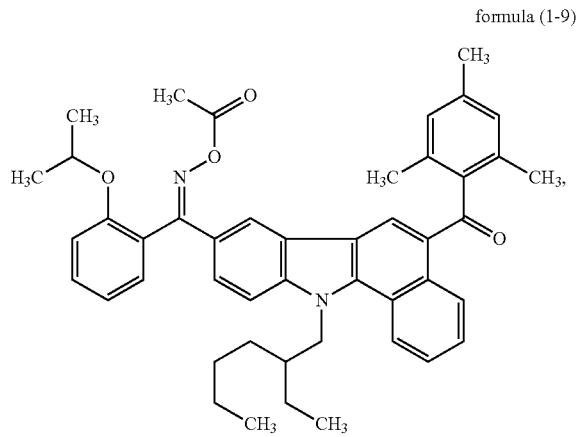
formula (1-10)
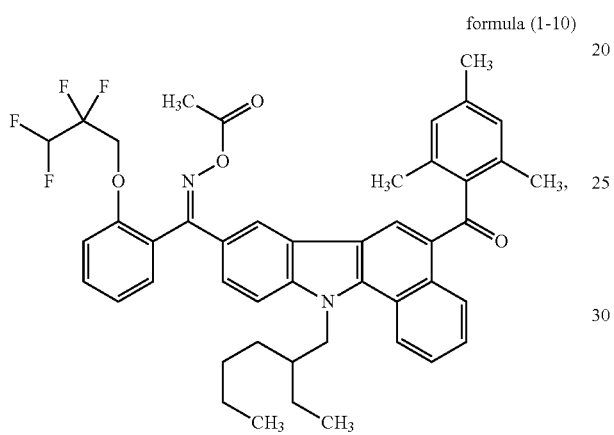
formula (1-11)
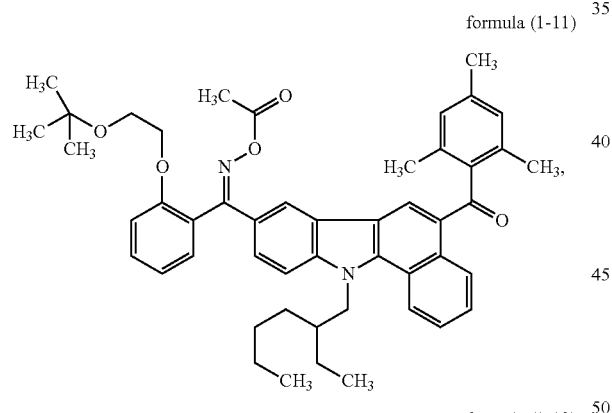
formula (1-12)
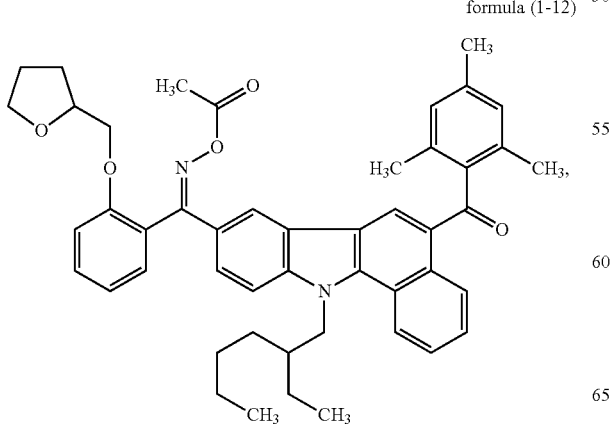
formula (1-13)
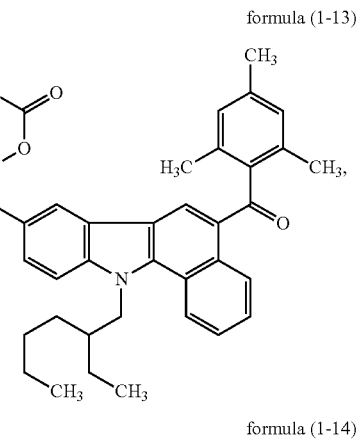
formula (1-14)
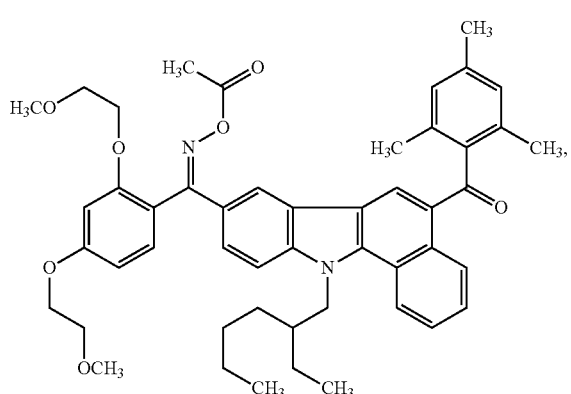
formula (1-15)
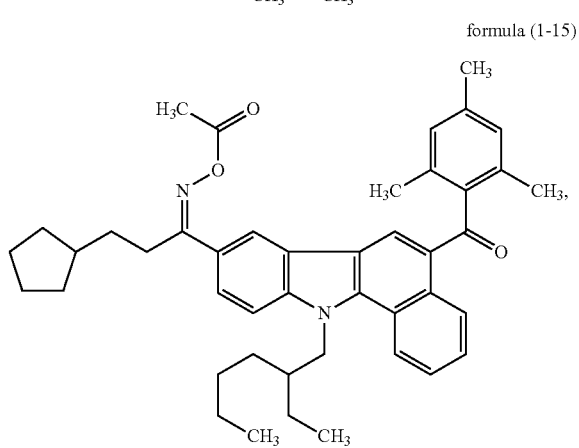
formula (1-16)
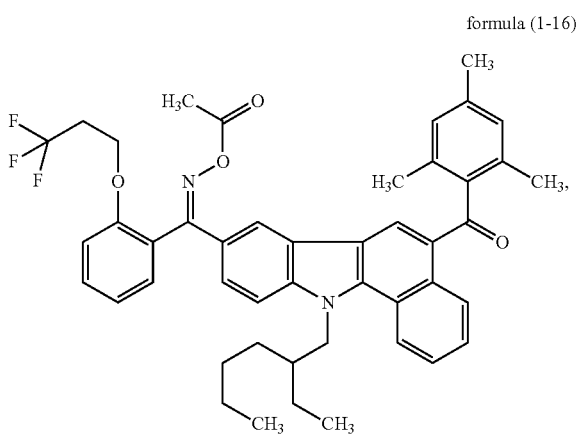

-continued
formula (1-17)
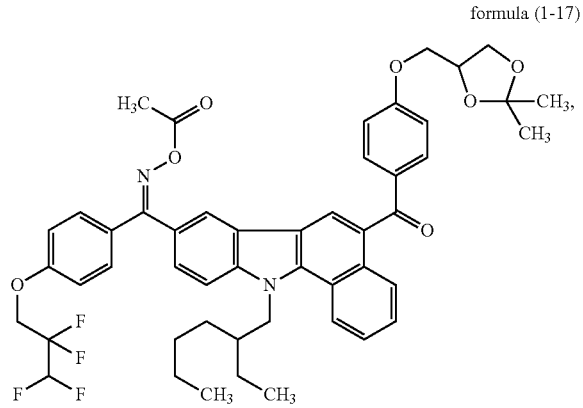
formula (1-18)
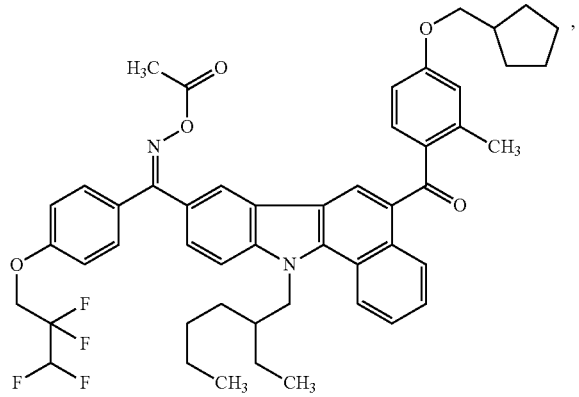
formula (1-19)
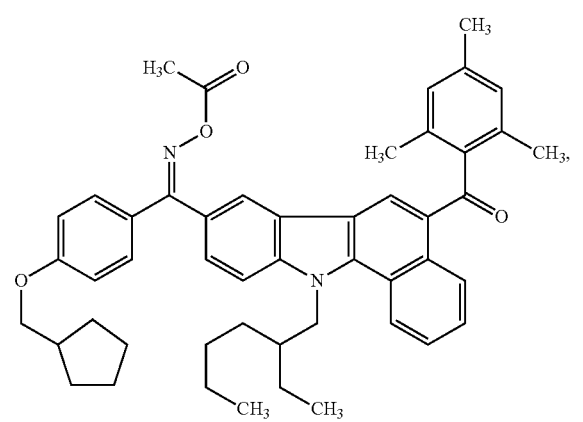
formula (1-20)
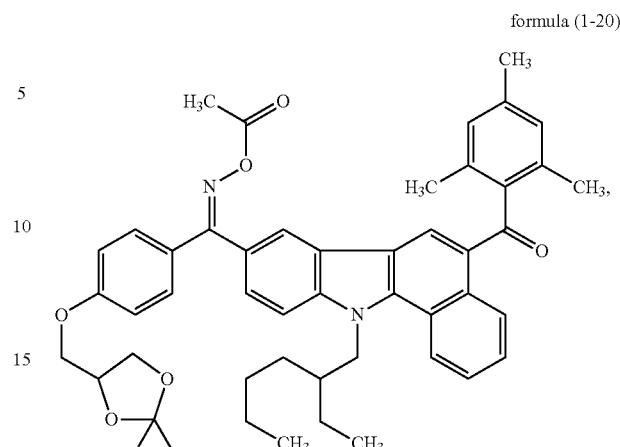
formula (1-21)
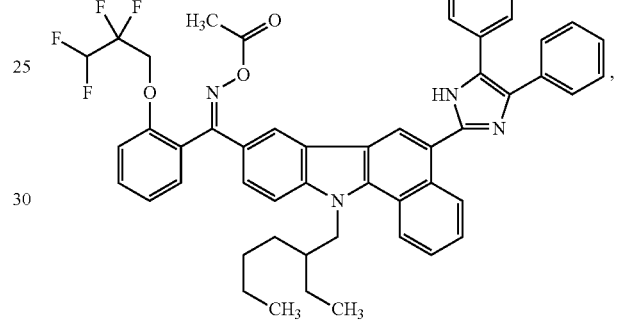
formula (1-22)
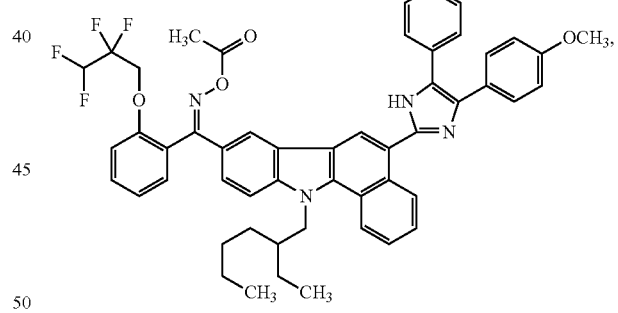
formula (1-23)
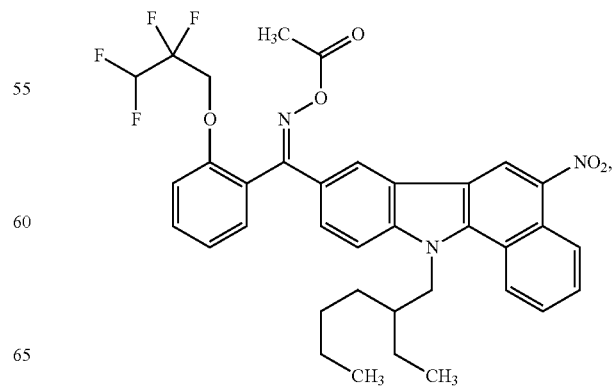

formula (1-24)
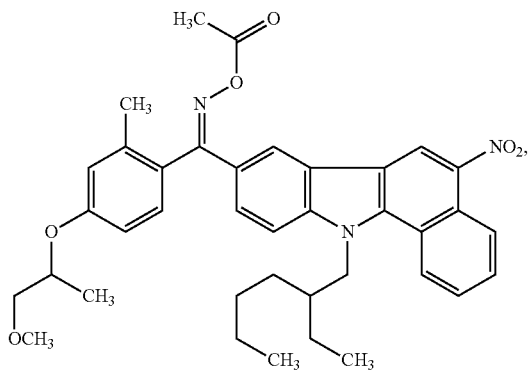
formula (1-25)
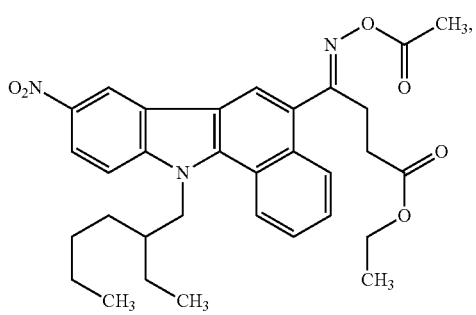
formula (1-26)
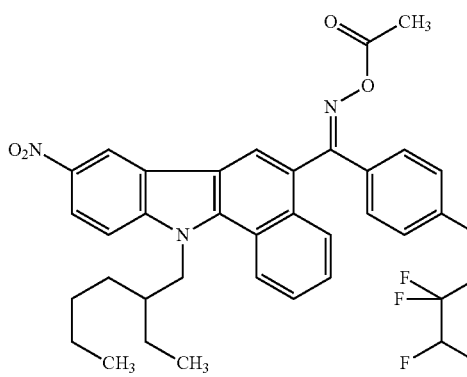
formula (1-27)
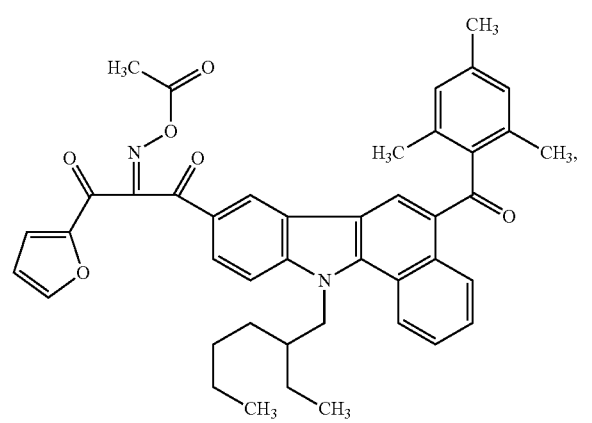
formula (1-28)
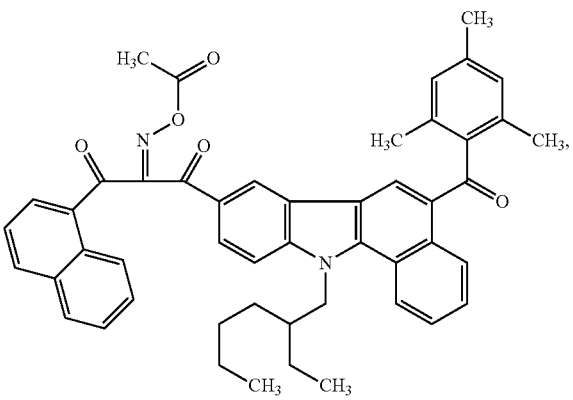
formula (1-29)
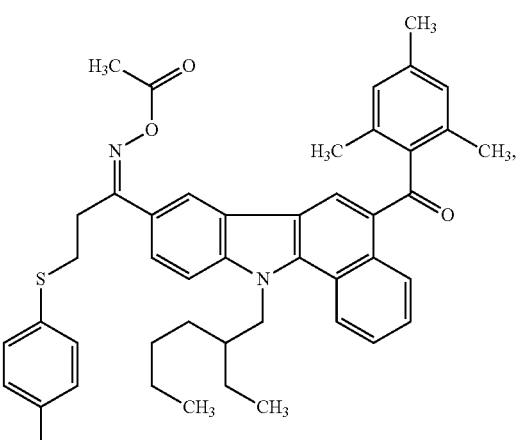
formula (1-30)
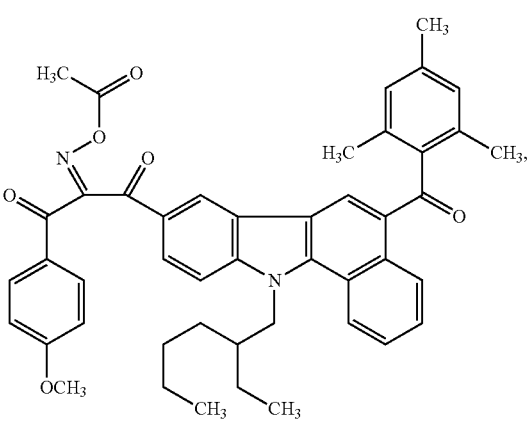

formula (1-31)
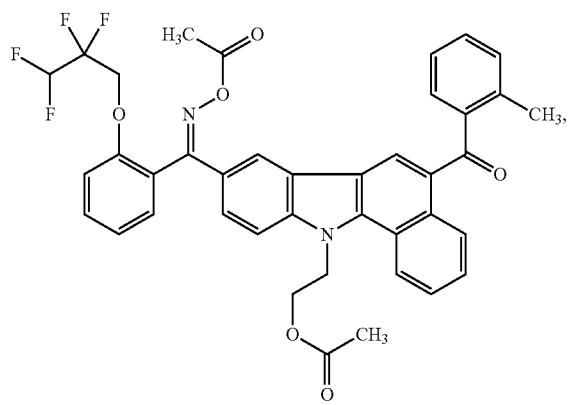
formula (1-32)
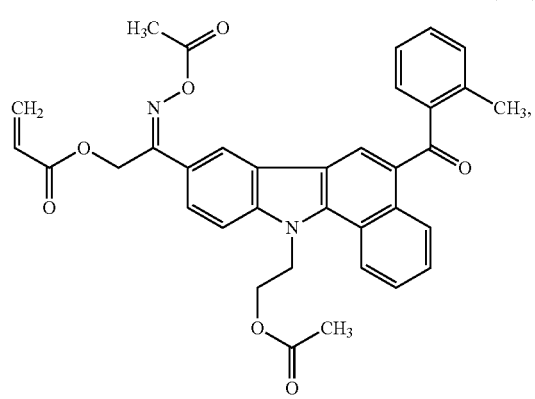
formula (1-33)
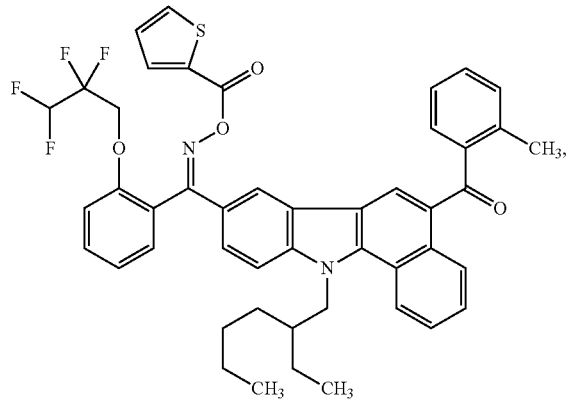
formula (1-34)
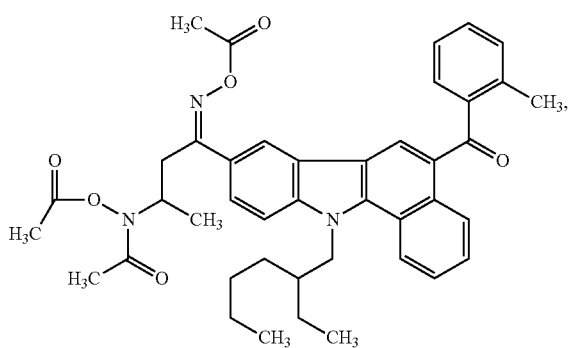
formula (1-35)
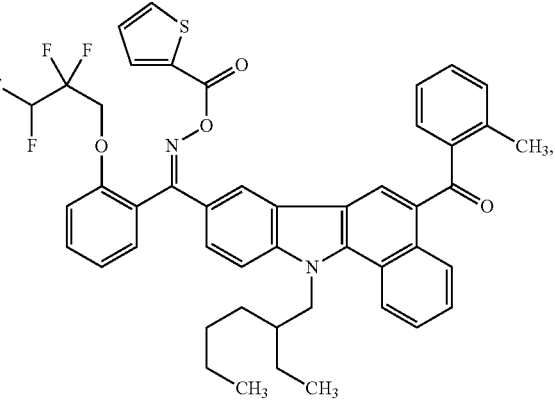
formula (1-36)
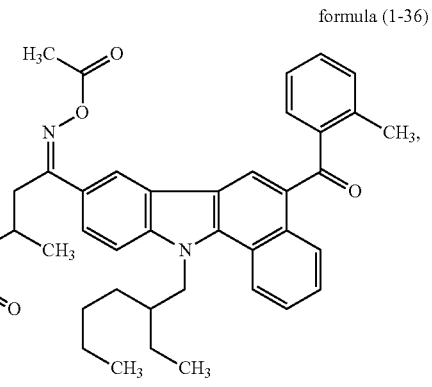
formula (1-37)
formula (1-38)
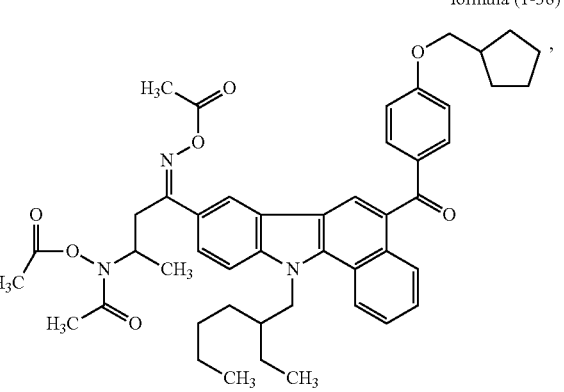

81
-continued
formula (1-39)
formula (1-40)
formula (1-41)
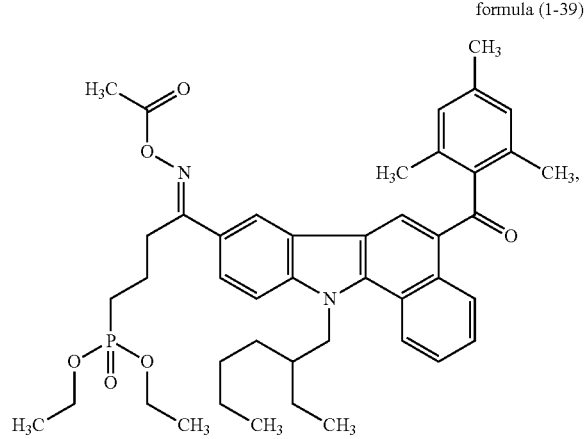
82
-continued
formula (1-42)
formula (1-43)
formula (1-44)
formula (1-45)
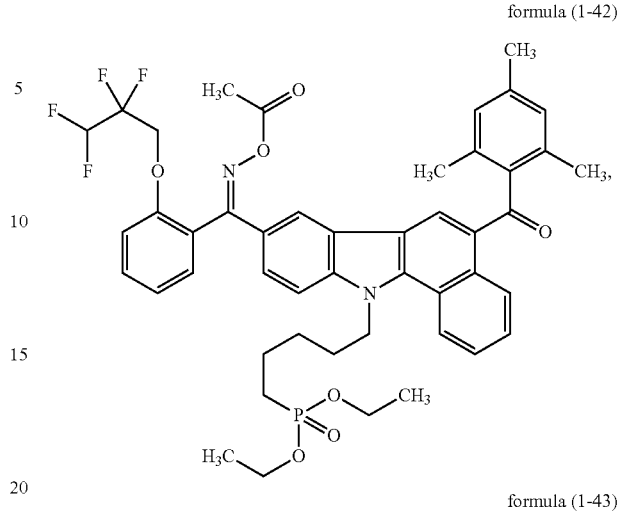

formula (1-46)
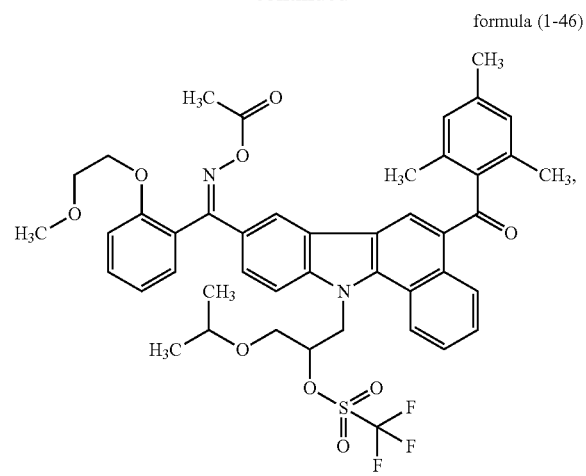
formula (1-47)
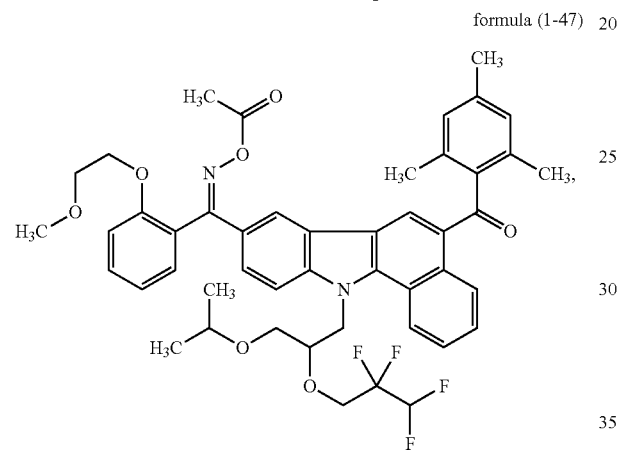
formula (1-48)
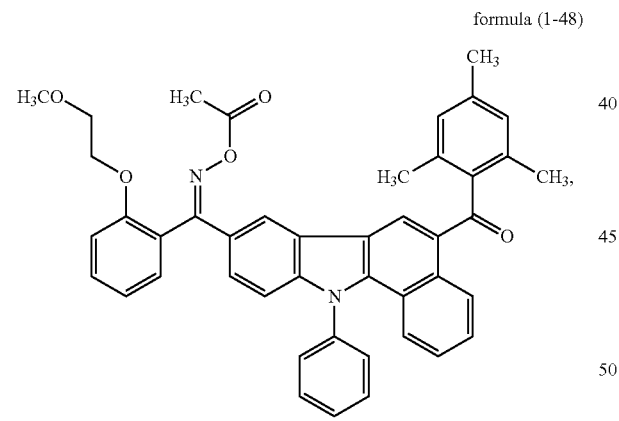
formula (1-49)
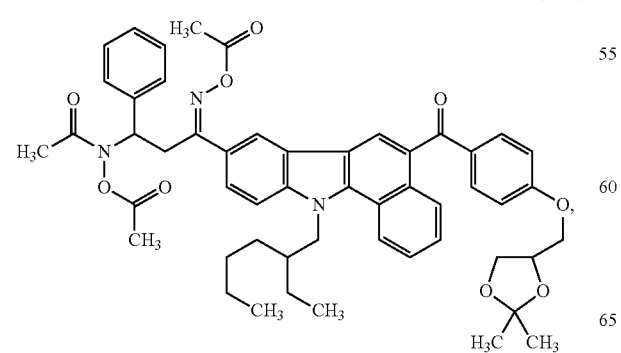
formula (1-50)
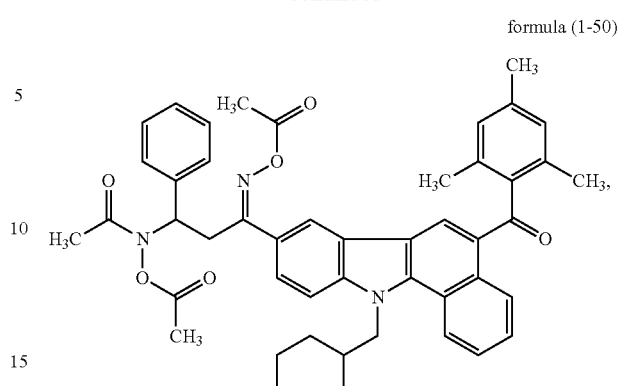
formula (1-51)
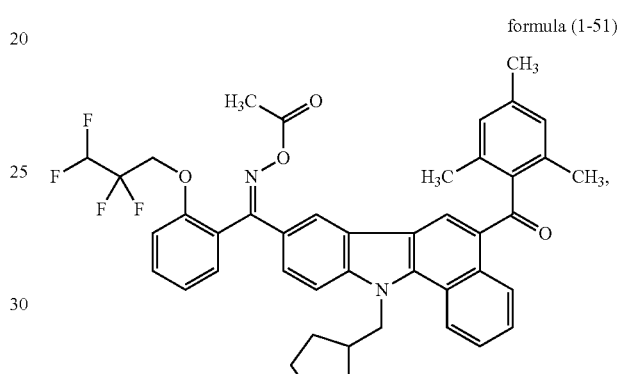
formula (1-52)
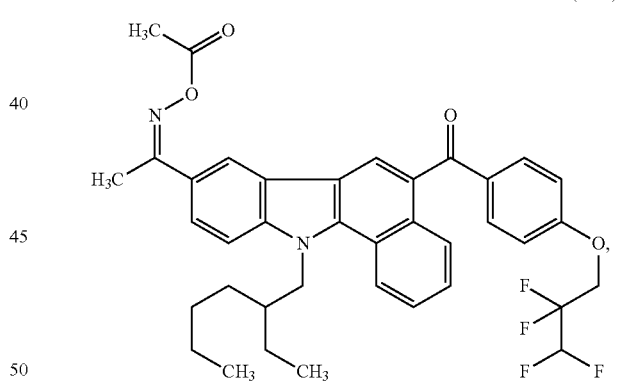
formula (1-53)
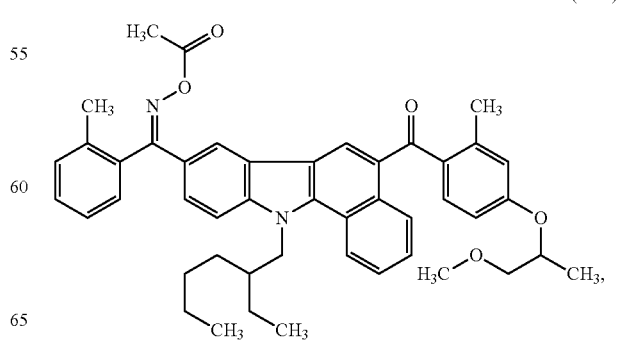

-continued
formula (1-54)
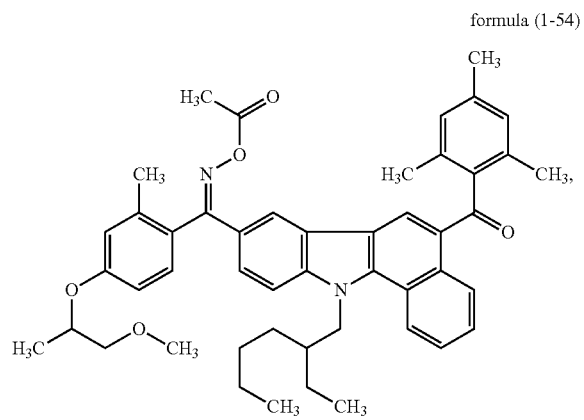
formula (1-55)
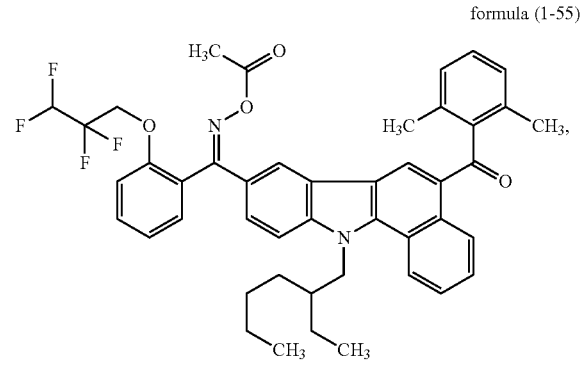
formula (1-56)
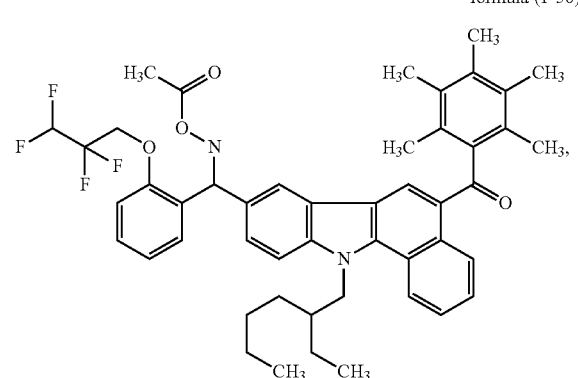
formula (1-57)
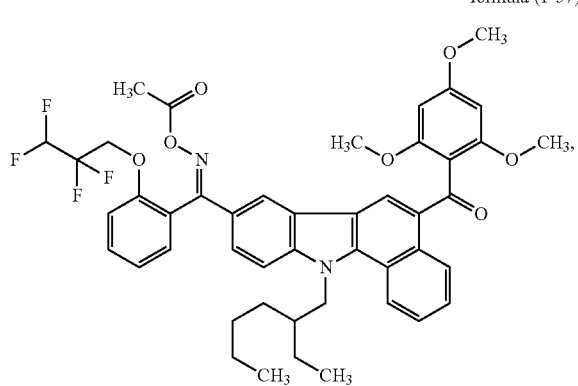
formula (1-58)
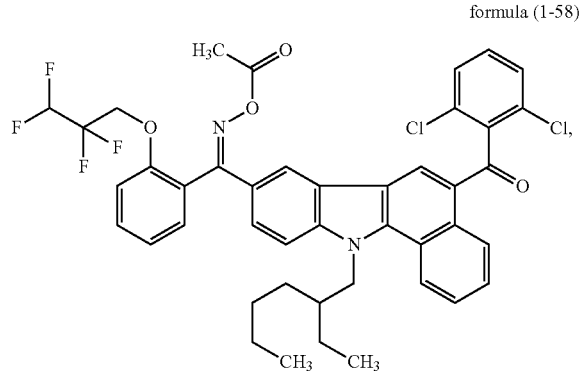
formula (1-59)
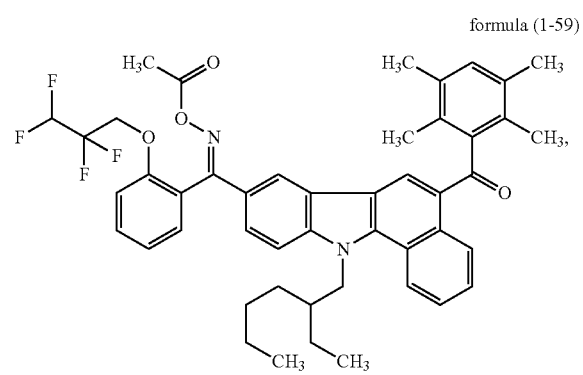
formula (1-60)
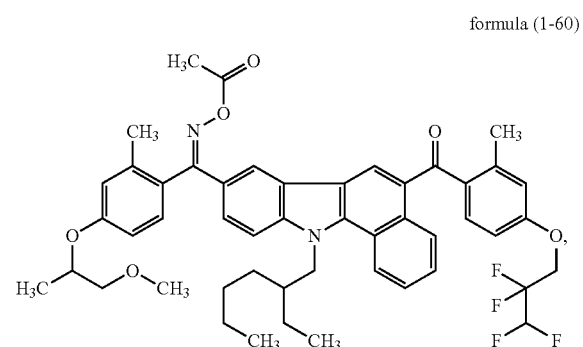
formula (1-61)
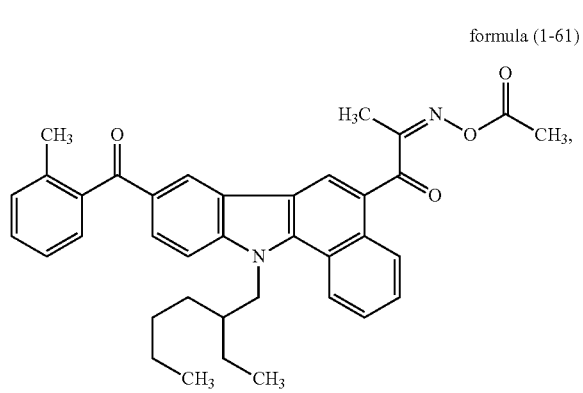

formula (1-62)
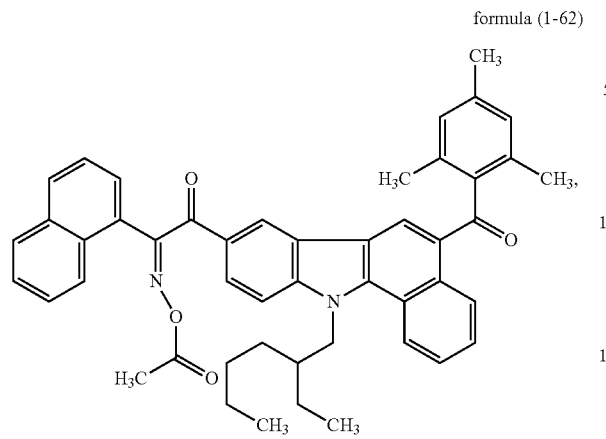
formula (1-63)
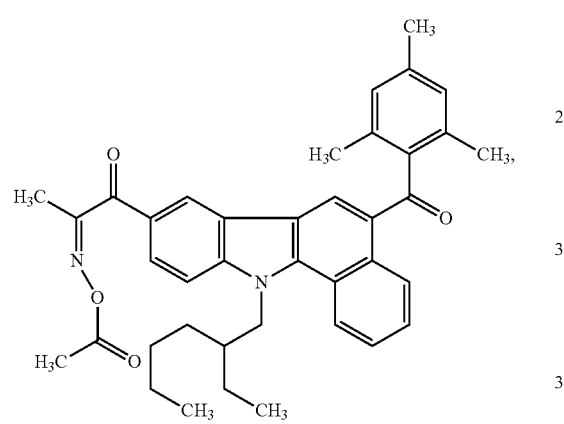
formula (1-64)
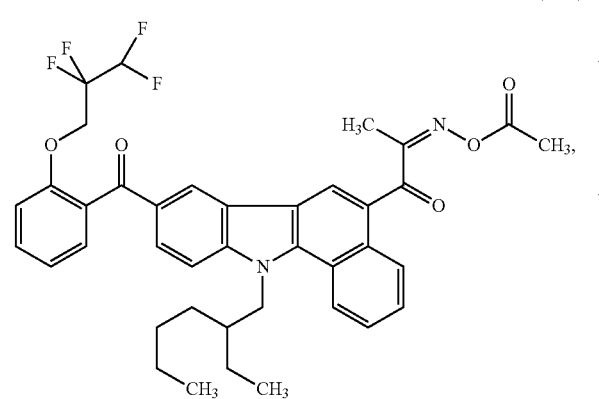
formula (1-65)
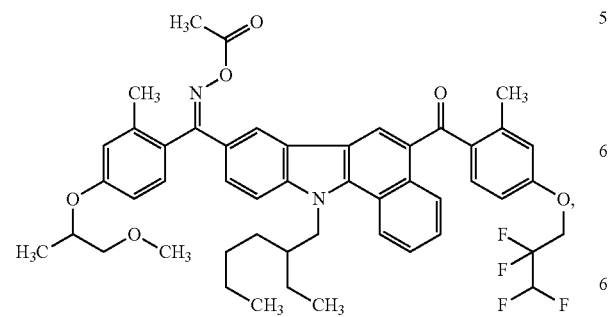
formula (1-66)
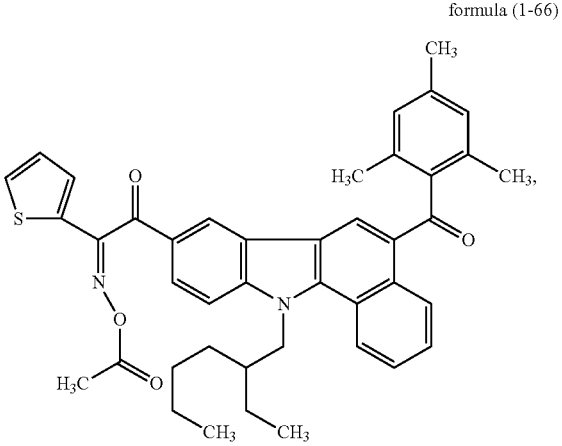
formula (1-67)
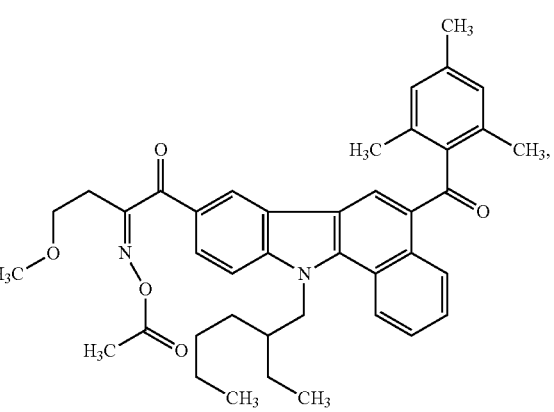
formula (1-68)
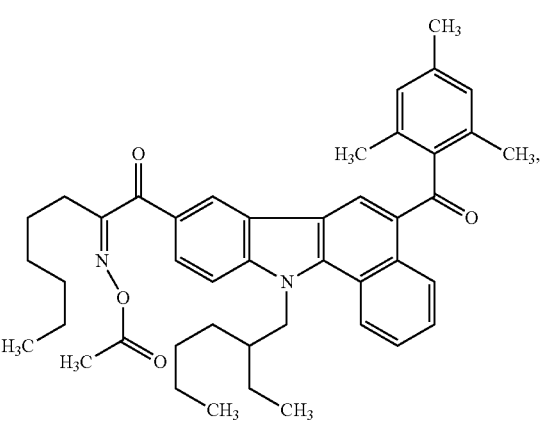

-continued
formula (1-69)
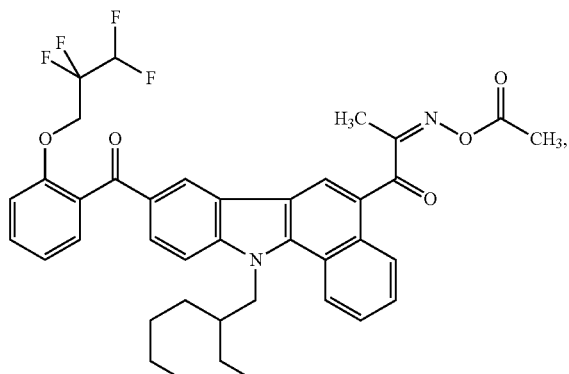
formula (1-70)
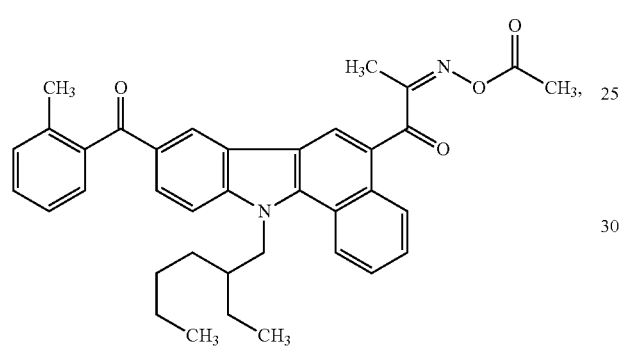
formula (1-71)
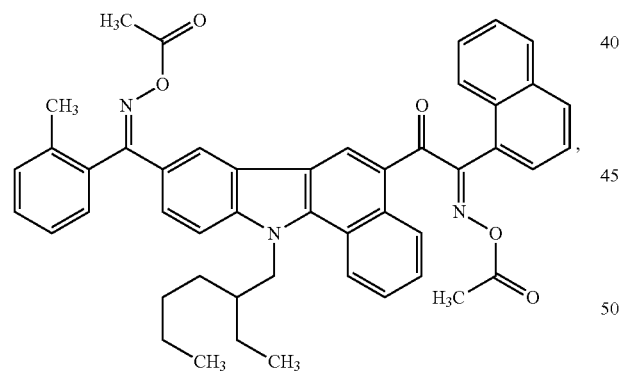
formula (1-72)
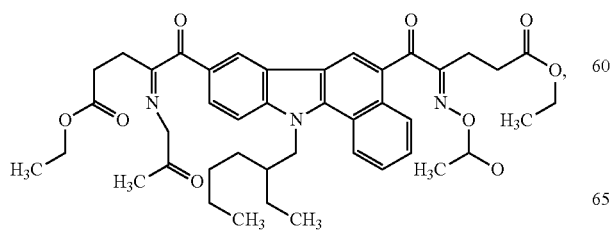
-continued
formula (1-73)
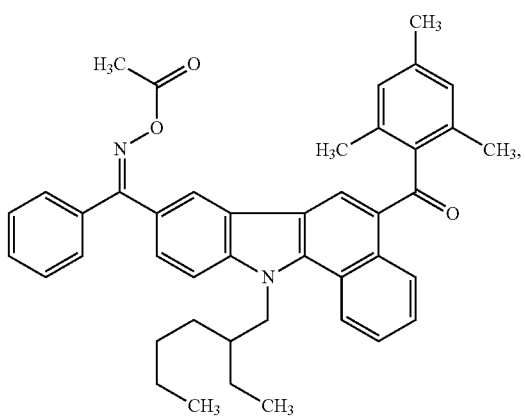
formula (1-74)
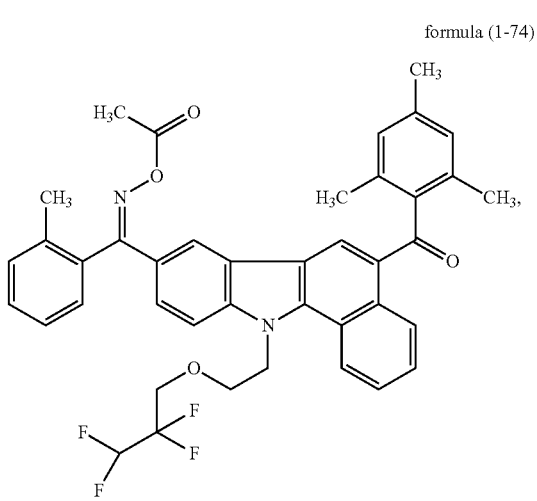
formula (1-75)
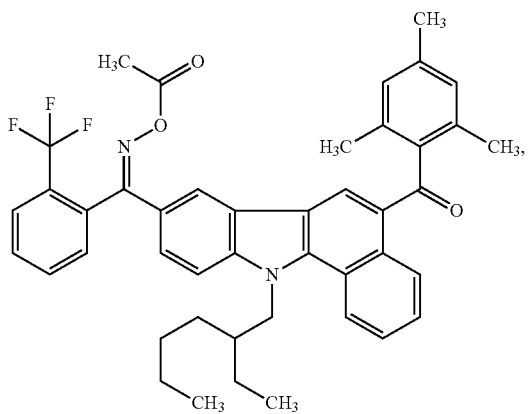

formula (1-76)
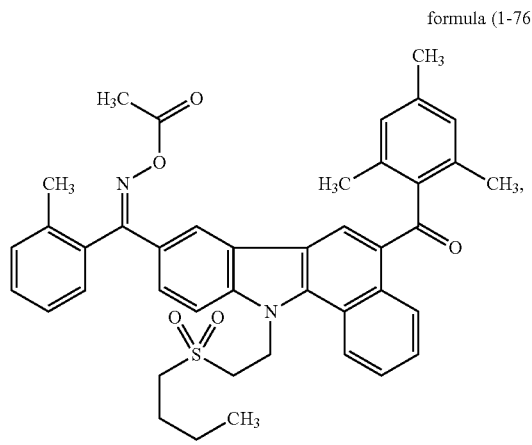
formula (1-77)
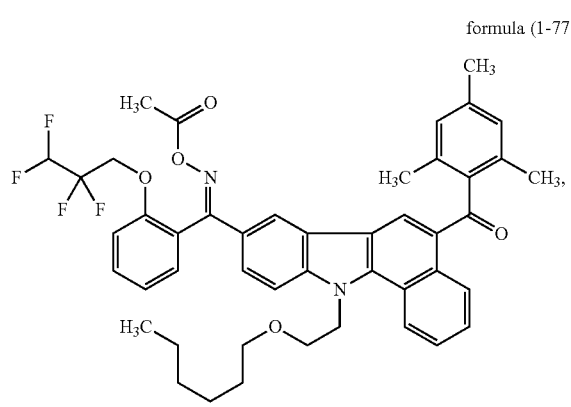
formula (1-78)
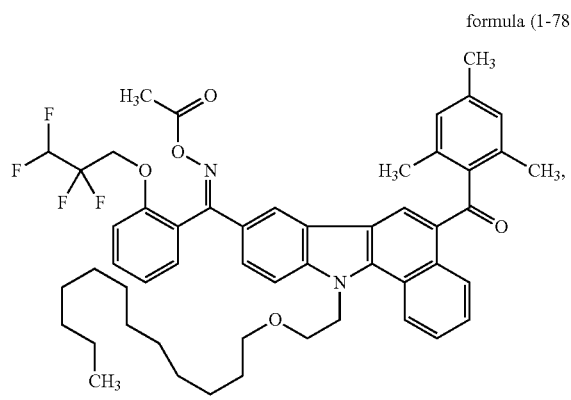
formula (1-79)
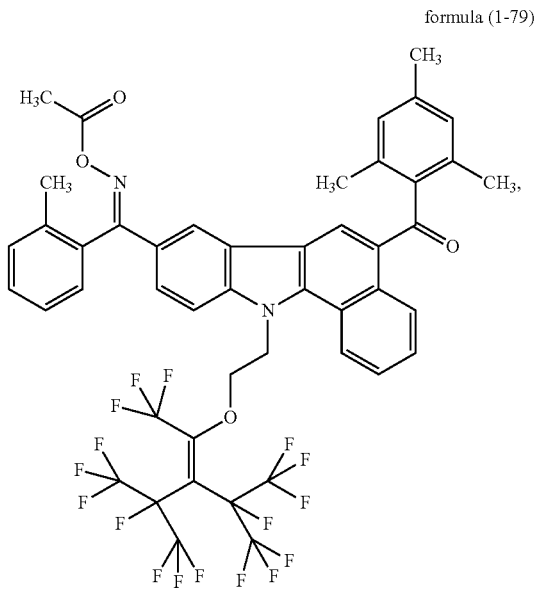
formula (1-80)
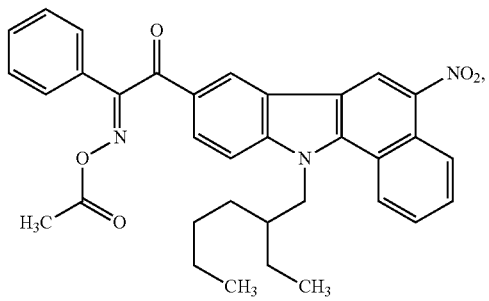
formula (1-81)
formula (1-82)
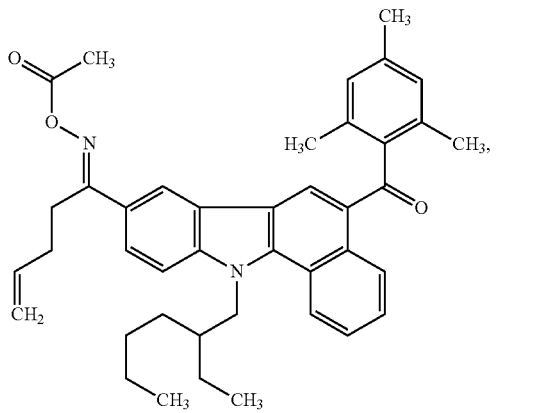

formula (1-83)

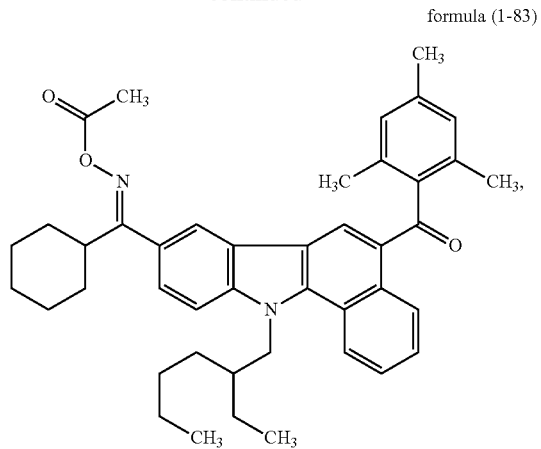

formula (1-84)

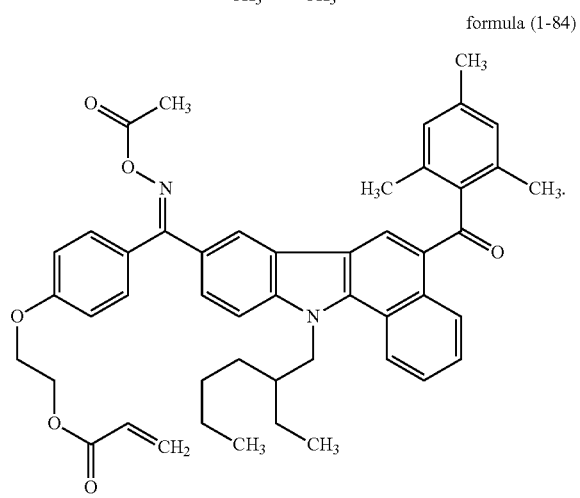

Based on 100 parts by weight of the alkali-soluble resin (A), the usage amount of the photoinitiator (C-1) represented by formula (1) is 10 parts by weight to 70 parts by weight, preferably 12 parts by weight to 60 parts by weight, and more preferably 15 parts by weight to 50 parts by weight.

When the photosensitive resin composition does not include the photoinitiator (C-1), the photosensitive resin composition has poor reliability under high temperature and high humidity, poor resolution, and poor heat resistance.

Photoinitiator (C-2)

Specific examples of the photoinitiator (C-2) include other O-acyloxime compounds or non-O-acyloxime photoinitiators.

Other O-Oxime Compounds

Specific examples of the other O-oxime compounds include 1-[4-(phenylthio)phenyl]-propane-3-cyclopentane-1,2-dione 2-(O-benzoyl oxime), 1-[4-(phenylthio)phenyl]-heptane-1,2-dione 2-(O-benzoyl oxime), 1-[4-(phenylthio)phenyl]-octane-1,2-dione-2-(O-benzoyl oxime), or a combination of the compounds. 1-[4-(phenylthio)phenyl]-octane-1,2-dione-2-(O-benzoyloxime) can be a product with the model number IRGACURE OXE-01 made by Ciba Specialty Chemicals Limited.

Moreover, specific examples of the other O-oxime compounds include 1-[4-(benzoyl)phenyl]-octane-1,2-dione-2-(O-benzoyloxime), 1-[9-ethyl-6-(2-methylbenzoyl)-9H-carbazol-3-yl]-ethanone-1-(O-acetyloxime), 1-[9-ethyl-6-(3-methylbenzoyl)-9H-carbazol-3-yl]-ethanone-1-(O-acetyloxime), 1-[9-ethyl-6-benzoyl-9H-carbazol-3-yl]-ethanone-1-(O-acetyloxime), ethanone-1-[9-ethyl-6-(2-methyl-4-tetrahydrofuranbenzoyl)-9H-carbazol-3-yl]-1-(O-acetyloxime), ethanone-1-[9-ethyl-6-(2-methyl-5-tetrahydropyranylbenzoyl)-9H-carbazol-3-yl]-1-(O-acetyloxime), ethanone-1-[9-ethyl-6-(2-methyl-5-tetrahydrofuranbenzoyl)-9H-carbazol-3-yl]-1-(O-acetyloxime), ethanone-1-[9-ethyl-6-(2-methyl-5-tetrahydropyranylbenzoyl)-9H-carbazol-3-yl]-1-(O-acetyloxime), ethanone-1-[9-ethyl-6-(2-methyl-4-tetrahydrofuranmethoxybenzoyl)-9H-carbazol-3-yl]-1-(O-acetyloxime), ethanone-1-[9-ethyl-6-(2-methyl-4-tetrahydropyranylmethoxybenzoyl)-9H-carbazol-3-yl]-1-(O-acetyloxime), ethanone-1-[9-ethyl-6-(2-methyl-5-tetrahydrofuranmethoxybenzoyl)-9H-carbazol-3-yl]-1-(O-acetyloxime), ethanone-1-[9-ethyl-6-(2-methyl-5-tetrahydropyranylmethoxybenzoyl)-9H-carbazol-3-yl]-1-(O-acetyloxime), ethanone-1-[9-ethyl-6-{2-methyl-4-(2,2-dimethyl-1,3-dioxolan)benzoyl}-9H-carbazol-3-yl]-1-(O-acetyloxime), ethanone-1-[9-ethyl-6-{2-methyl-4-(2,2-dimethyl-1,3-dioxolan)methoxybenzoyl}-9H-carbazol-3-yl]-1-(O-acetyloxime), or a combination of the compounds. 1-[9-ethyl-6-(2-methylbenzoyl)-9H-carbazol-3-yl]-ethanone-1-(O-acetyloxime) can be a product with the model number IRGACURE OXE-02 made by Ciba Specialty Chemicals Limited.

The other O-oxime compounds can be used alone or in multiple combinations.

Non-O-Oxime Photoinitiator

Specific examples of the non-O-oxime photoinitiator include a triazine compound, a phenyl oxazolidinone compound, a biimidazole compound, a benzophenone compound, an α-diketone compound, an alcohol ketone compound, an alcohol ketone ether compound, an acylphosphine oxide compound, a quinone compound, a halogen-containing compound, peroxide, or a combination of the compounds.

Specific examples of the triazine compound include a vinyl-halogenated methyl-s-triazine compound, a 2-(naphtho-1-yl)-4,6-bis(halogenated methyl)-s-triazine compound, a 4-(p-aminophenyl)-2,6-bis(halomethyl)-s-triazine compound, or a combination of the compounds.

Specific examples of the vinyl-halogenated methyl-s-triazine compound include 2,4-bis(trichloromethyl)-6-p-methoxystyryl-s-triazine, 2,4-bis(trichloromethyl)-3-(1-p-dimethylaminophenyl-1,3-butadienyl)-s-triazine, 2-trichloromethyl-3-amino-6-p-methoxystyryl-s-triazine, or a combination of the compounds.

Specific examples of the 2-(naphtho-1-yl)-4,6-bis(halogenated methyl)-s-triazine compound include 2-(naphtho-1-yl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-butoxy-naphtho-1-yl)-4,6-bis(trichloromethyl)-s-triazine, 2-[4-(2-methoxyethyl)-naphtho-1-yl]-4,6-bis(trichloromethyl)-s-triazine, 2-[4-(2-ethoxyethyl)-naphtho-1-yl]-4,6-bis(trichloromethyl)-s-triazine, 2-[4-(2-butoxyethyl)-naphtho-1-yl]-4,6-bis(trichloromethyl)-s-triazine, 2-(2-methoxy-naphtho-1-yl)-4,6-bis(trichloromethyl)-s-triazine, 2-(6-methoxy-5-methyl-naphtho-2-yl)-4,6-bis(trichloromethyl)-s-triazine, 2-(6-methoxynaphtho-2-yl)-4,6(bis-trichloromethyl)-s-triazine, 2-(5-methoxy-naphto-1-yl)-4,6- bis(trichloromethyl)-s-triazine, 2-(4,7-dimethoxy-naphtho-1-yl)-4,6-bis(trichloromethyl)-s-triazine, 2-(6-ethoxy-naphtho-2-yl)-4,6-bis(trichloromethyl)-s-triazine, 2-(4,5-dimethoxy-naphtho-1-yl)-4,6-bis(trichloromethyl)-s-triazine, or a combination of the compounds.

Specific examples of the 4-(p-aminophenyl)-2,6-di(halomethyl)-s-triazine compound include 4-[p-N,N-bis(ethoxycarbonylmethyl)aminophenyl]-2,6-bis(trichloromethyl)-s-triazine, 4-[o-methyl-p-N,N-bis(ethoxycarbonylmethyl)aminophenyl]-2,6-bis(trichloromethyl)-s-triazine, 4-[p-N,N-bis(chloroethyl)aminophenyl]-2,6-bis(trichloromethyl)-s-triazine, 4-[o-methyl-p-N,N-bis(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-bis(phenyl)aminophenyl]-2,6-bis(trichloromethyl)-s-triazine, 4-(p-N-chloroethylcarbonylaminophenyl)-2,6-bis(trichloromethyl)-s-triazine, 4-[p-N-(p-methoxyphenyl)carbonylaminophenyl]-2,6-bis(trichloromethyl)-s-triazine, 4-[m-N,N-bis(ethoxycarbonylmethyl)aminophenyl]-2,6-bis(trichloromethyl)-s-triazine, 4-[m-bromo-p-N,N-bis(ethoxycarbonylmethyl)aminophenyl]-2,6-bis(trichloromethyl)-s-triazine, 4-[m-chloro-p-N,N-bis(ethoxycarbonylmethyl)aminophenyl]-2,6-bis(trichloromethyl)-s-triazine, 4-[m-fluoro-p-N,N-bis(ethoxycarbonylmethyl)aminophenyl]-2,6-bis(trichloromethyl)-s-triazine, 4-[o-bromo-p-N,N-bis(ethoxycarbonylmethyl)aminophenyl]-2,6-bis(trichloromethyl)-s-triazine, 4-o-chloro-p-N,N-bis(ethoxycarbonylmethyl)aminophenyl-2,6-bis(trichloromethyl)-s-tri azine, 4-[o-fluoro-p-N,N-bis(ethoxycarbonylmethyl)aminophenyl]-2,6-bis(trichloromethyl)-s-triazine, 4-[o-bromo-p-N,N-bis(chloroethyl)aminophenyl]-2,6-bis(trichloromethyl)-s-triazine, 4-[o-chloro-p-N,N-bis(chloroethyl)aminophenyl]-2,6-bis(trichloromethyl)-s-triazine, 4-[o-fluoro-p-N,N-bis(chloroethyl)aminophenyl]-2,6-bis(trichloromethyl)-s-triazine, 4-[m-bromo-p-N,N-bis(chloroethyl)aminophenyl]-2,6-bis(trichloromethyl)-s-triazine, 4-[m-chloro-p-N,N-bis(chloroethyl)aminophenyl]-2,6-bis(trichloromethyl)-s-triazine, 4-[m-fluoro-p-N,N-bis(chloroethyl)aminophenyl]-2,6-bis(trichloromethyl)-s-triazine, 4-(m-bromo-p-N-ethoxycarbonylmethylaminophenyl)-2,6-bis(trichloromethyl)-s-triazine, 4-(m-chloro-p-N-ethoxycarbonylmethylaminophenyl)-2,6-bis(trichloromethyl)-s-triazine, 4-(m-fluoro-p-N-ethoxycarbonylmethylaminophenyl)-2,6-bis(trichloromethyl)-s-triazine, 4-(o-bromo-p-N-ethoxycarbonylmethylaminophenyl)-2,6-bis(trichloromethyl)-s-triazine, 4-(o-chloro-p-N-ethoxycarbonylmethylaminophenyl)-2,6-bis(trichloromethyl)-s-triazine, 4-(o-fluoro-p-N-ethoxycarbonylmethylaminophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, 4-(o-fluoro-p-N-chloroethylaminophenyl)-2,6-bis(trichloromethyl)-s-triazine, 2,4-bis(trichloromethyl)-6-[3-bromo-4-[N,N-bis(ethoxycarbonylmethyl)amino]phenyl]-1,3,5-triazine, or a combination of the compounds. The triazine compound can be used alone or in multiple combinations.

The triazine compound preferably includes 4-(m-bromo-p-N,N-bis(ethoxycarbonylmethyl)aminophenyl)-2,6-bis(trichloromethyl)-s-triazine, 2,4-bis(trichloromethyl)-6-p-methoxystyryl-s-triazine, or a combination of the compounds.

Specific examples of the acetophenone compound include p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthiophenyl)-2-morpholino-1-propanone, 2-benzyl-2-N,N-dimethylamino-1-(4-morpholinophenyl)-1-butanone, or a combination of the compounds.

The acetophenone compound can be used alone or in multiple combinations.

2-methyl-1-(4-(methylthiophenyl)-2-morpholino-1-propanone can be a product with the model number IRGACURE 907 made by Ciba Specialty Chemicals Limited. 2-benzyl-2-N, N-dimethylamino-1-(4-morpholinophenyl)-1-butanone can be a product with the model number IRGACURE 369 made by Ciba Specialty Chemicals Limited.

The phenyl oxazolidinone compound preferably includes 2-methyl-1-(4-(methylthiophenyl)-2-morpholinyl-1-propanone or 2-benzyl-2-N,N-dimethylamino-1-(4-morpholinophenyl)-1-butanone, or a combination of the compounds.

Specific examples of the biimidazole compound include 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methylphenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, 2,2'-bis(2,4-dichlorophenyl)-4,4',5,5'-tetraphenyl-biimidazole, or a combination of the compounds.

The biimidazole compound can be used alone or in multiple combinations.

The biimidazole compound is preferably 2,2'-bis(2,4-dichlorophenyl)-4,4',5,5'-tetraphenylbiimidazole.

Specific examples of the benzophenone compound include thioxanthone, 2,4-diethylthioxanthone, thioxanthone-4-sulfone, benzophenone, 4,4'-bis(dimethylamino)benzophenone, 4,4'-bis(diethylamino)benzophenone, or a combination of the compounds. The benzophenone compound can be used alone or in combination. The benzophenone compound is preferably 4,4'-bis(diethylamino)benzophenone.

Specific examples of the α-diketone compound include benzil, diacetyl, or a combination of the compounds. The α-dione compound can be used alone or in multiple combinations.

Specific examples of the ketone alcohol compound include benzoin. The ketone alcohol compound can be used alone or in multiple combinations.

Specific examples of the acyloin ether compound include benzoin methyl ether, benzoin ethyl ether, benzoin isopropyl ether, or a combination of the compounds. The acyloin ether compound can be used alone or in multiple combinations.

Specific examples of the acylphosphine oxide compound include (2,4,6-trimethylbenzoyl)diphenylphosphine oxide, bis(2,6-dimethoxybenzoyl)-2,4,4-trimethylphenylphosphine oxide, or a combination of the compounds. The phosphine oxide compound can be used alone or in multiple combinations.

Specific examples of the quinone compound include anthraquinone, 1,4-naphthoquinone, or a combination of the compounds. The quinone compound can be used alone or in multiple combinations.

Specific examples of the halogen-containing compound include phenacyl chloride, tribromomethyl phenyl sulfone, tris(trichloromethyl)-s-triazine, or a combination of the compounds. The halogen-containing compound can be used alone or in multiple combinations.

Specific examples of the peroxide include, for instance, di-tert-butyl peroxide. The peroxide can be used alone or in multiple combinations.

Based on 100 parts by weight of the alkali-soluble resin (A), the usage amount of the photoinitiator (C) is 10 parts by weight to 80 parts by weight, preferably 12 parts by weight to 70 parts by weight, and more preferably 15 parts by weight to 60 parts by weight.

Solvent (D)

The solvent (D) refers to a solvent that can dissolve the alkali-soluble resin (A), the compound (B) having an ethylenically unsaturated group, and the photoinitiator (C) and the black pigment (E), the branched polymer (F), the thermal initiator (G), and the compound (H) without reacting with the components, and preferably has suitable volatility.

Specific examples of the solvent (D) include: an alkyl glycol monoalkyl ether compound, an alkyl glycol monoalkyl ether acetate compound, diethylene glycol alkyl ether, other ether compounds, a ketone compound, a lactic acid alkyl ester compound, other ester compounds, an aromatic hydrocarbon compound, a carboxylic acid amine compound, or a combination of the compounds.

Specific examples of the alkyl glycol monoalkyl ether compound include: ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monomethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono n-butyl ether, tripropylene glycol monomethyl ether, tripropylene glycol monoethyl ether, a similar compound thereof, or a combination of the compounds.

Specific examples of the alkyl glycol monoalkyl ether acetate compound include: ethylene glycol monomethyl ether acetate, ethylene glycol monoethyl ether acetate, propylene glycol monomethyl ether acetate, propylene glycol ethyl ether acetate, a similar compound thereof, or a combination of the compounds.

Specific examples of the diethylene glycol alkyl ether include diethylene glycol dimethyl ether, diethylene glycol methyl ether, diethylene glycol diethyl ether, a similar compound thereof, or a combination of the compounds.

Specific examples of the other ether compounds include tetrahydrofuran or a similar compound thereof.

Specific examples of the ketone compound include methyl ethyl ketone, cyclohexanone, 2-heptanone, 3-heptanone, diacetone alcohol, a similar compound thereof, or a combination of the compounds.

Specific examples of the lactic acid alkyl ester compound include methyl lactate, ethyl lactate, a similar compound thereof, or a combination of the compounds.

Specific examples of the other ester compounds include methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate, ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxybutyrate, a similar compound thereof, or a combination of the compounds.

Specific examples of the aromatic hydrocarbon compound include toluene, xylene, a similar compound thereof, or a combination of the compounds.

Specific examples of the carboxylic acid amine compound include N-methylpyrrolidone, N,N-dimethyl formamide, N,N-dimethyl acetamide, a similar compound thereof, or a combination of the compounds. The solvent (D) can be used alone or in combination.

The solvent (D) is preferably propylene glycol methyl ether acetate, cyclohexanone, or ethyl 3-ethoxypropionate.

Based on a usage amount of 100 parts by weight of the alkali-soluble resin (A), the usage amount of the solvent (D) is 1000 parts by weight to 8000 parts by weight, preferably 1200 parts by weight to 7000 parts by weight, and more preferably 1500 parts by weight to 6000 parts by weight.

Black Pigment (E)

The black pigment (E) is preferably a black pigment having heat resistance, light resistance, and solvent resistance.

Specific examples of the black pigment (E) include: a black organic pigment such as perylene black, cyanine black, or aniline black; a near-black mixture of organic pigments obtained by mixing two or more pigments selected from the pigments of, for instance, red, blue, green, purple, yellow, cyanine, or magenta; and a shading material such as carbon black, chromium oxide, ferric oxide, titanium black, or graphite, wherein specific examples of the carbon black include C.I. pigment black 7 or a commercial product made by Mitsubishi Chemical Corporation (product name MA100, MA230, MA8, #970, #1000, #2350, or #2650). The black pigment (E) can be used alone or in multiple combinations.

The black pigment (E) is preferably carbon black, and the carbon black is, for instance, the commercial product MA100 or MA230 made by Mitsubishi Chemical.

Based on a usage amount of 100 parts by weight of the alkali-soluble resin (A), the usage amount of the black pigment (E) is 150 parts by weight to 1200 parts by weight, preferably 200 parts by weight to 1000 parts by weight, and more preferably 250 parts by weight to 800 parts by weight.

Hyperbranched Polymer (F)

The hyperbranched polymer (F) can be a polymer formed by performing a Michael Addition reaction on the multi-mercapto compound represented by formula (F2) and the polyfunctional (meth)acrylate represented by formula (F1).

Specifically, the polyfunctional (meth)acrylate represented by formula (F1) is as shown below.

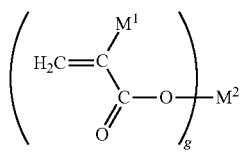 formula (F1)

In formula (F1), $M^1$ represents a hydrogen atom or a $C_1$ to $C_4$ alkyl group; $M^2$ represents a residual group after the esterification of a g number of hydroxyl groups in a compound containing a hydroxyl group having an h number of hydroxyl groups, wherein h≥g, and g represents an integer of 2 to 20.

The compound containing a hydroxyl group is $M^3(OH)_h$ or a modified compound of the $M^3(OH)_h$ by propylene oxide, epichlorohydrin, an alkyl group, an alkoxy group, or hydroxypropyl acrylate.

$M^3(OH)_h$ is $C_2$ to $C_{18}$ polyalcohol, polyhydric alcohol ether formed by the polyalcohol, an ester formed by reacting the polyalcohol and an acid, or silicone.

Moreover, the multi-mercapto compound represented by formula (F2) is as shown below.

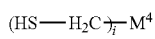 formula (F2)

In formula (F2), $M^4$ represents a single bond, a $C_1$ hydrocarbon group, or a $C_2$ to $C_{22}$ straight-chain or branched hydrocarbon group, the skeleton of $M^4$ can further include a sulfur atom or an oxygen atom formed in an ester group (i.e., $M^4$ is a single bond, a $C_1$ hydrocarbon group, a $C_2$ to $C_{22}$ straight-chain or branched hydrocarbon group containing a sulfur atom or an oxygen atom, or a $C_2$ to $C_{22}$ straight-chain or branched hydrocarbon group without a sulfur atom or an oxygen atom); i represents an integer of 2 to 6, wherein when $M^4$ represents a single bond, i represents 2; when $M^4$ represents a $C_1$ hydrocarbon group, i represents an integer of 2 to 4; when $M^4$ represents a $C_2$ to $C_{22}$ straight-chain or branched hydrocarbon group, i represents an integer of 2 to 6.

Moreover, the hyperbranched polymer (F) of the invention is preferably a polymer formed by reacting a remaining (meth)acrylate group from a reaction of the multi-mercapto compound represented by formula (F2) and the polyfunctional (meth)acrylate represented by formula (F1) with a mercapto compound having a carboxyl group represented by formula (F3).

The mercapto compound having a carboxyl group represented by formula (F3) is as shown below.

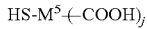 formula (F3)

In formula (F3), $M^5$ represents a $C_1$ to $C_{12}$ alkylene group and j represents an integer of 1 to 3.

Specifically, the multi-mercapto compound represented by formula (F2) and the mercapto group contained in the mercapto compound having a carboxyl group represented by formula (F3) are added to a carbon-carbon double bond of the polyfunctional (meth)acrylate represented by formula (F1) via photoreaction. In general, in the carbon-carbon double bond of the polyfunctional (meth)acrylate represented by formula (F1), the carbon-carbon double bond in the photoreaction is preferably 0.1% to 50% with respect to all of the carbon-carbon double bonds.

More specifically, the addition molar ratio of the mercapto group of the multi-mercapto compound represented by formula (F2) or the mercapto groups of the multi-mercapto compound represented by formula (F2) and the mercapto compound having a carboxyl group represented by formula (F3) with respect to the carbon-carbon double bond of the polyfunctional (meth)acrylate represented by formula (F1) can be 1/200 to 1/2, preferably 1/100 to 1/3, more preferably 1/50 to 1/5, and still more preferably 1/20 to 1/8.

The hyperbranched polymer (F) preferably has a sufficient number of photopolymerizable functional groups such as a carbon-carbon double bond. Specifically, the molecular weight of the hyperbranched polymer (F) corresponding to every 1 mole of the carbon-carbon double bond is preferably 100 to 100,000. The molecular weight of the hyperbranched polymer (F) is preferably 1,000 to 50,000, more preferably 1,500 to 40,000, and still more preferably 2,000 to 30,000.

Moreover, to manufacture a photosensitive resin composition capable of alkali development, the hyperbranched polymer (F) preferably has a sufficient number of carboxyl groups. Specifically, the molecular weight of the hyperbranched polymer (F) corresponding to every 1 mole of the carboxyl group is preferably 200 to 20,000, more preferably 250 to 6,000.

The number (g) of the acrylate group contained in the polyfunctional (meth)acrylate represented by formula (F1) is preferably 2 to 20, more preferably 2 to 10, and still more preferably 2 to 6. When $M^1$ in formula (F1) represents a $C_1$ to $C_4$ alkyl group, $M^1$ can be a methyl group, an ethyl group, a propyl group, or a butyl group, preferably a methyl group. Moreover, the number of carbons in $M^3(OH)_h$ is preferably 2 to 18, more preferably 2 to 14, and still more preferably 4 to 12.

Specific examples of the polyfunctional (meth)acrylate represented by formula (F1) include (meth)acrylate such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, ethylene oxide (EO)-modified trimethylolpropane tri(meth)acrylate, propylene oxide (PO)-modified trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta(meth)acrylate, caprolactone-modified pentaerythritol tri(meth)acrylate, caprolactone-modified pentaerythritol tetra(meth)acrylate, caprolactone-modified dipentaerythritol hexa(meth)acrylate, epichlorohydrin-modified hexahydrophthalic acid di(meth)acrylate, hydroxypivalic acid neopentyl glycol di(meth)acrylate, neopentyl glycol di(meth)acrylate, EO-modified neopentyl glycol di(meth)acrylate, PO-modified neopentyl glycol di(meth)acrylate, caprolactone-modified hydroxypivalate neopentyl glycol di(meth)acrylate, stearic acid-modified pentaerythritol di(meth)acrylate, epichlorohydrin-modified phthalate di(meth)acrylate, poly(ethylene glycol tetramethylene glycol)di(meth)acrylate, poly(propylene glycol tetramethylene glycol)di(meth)acrylate, polyester (meth)acrylate, polyethylene glycol di(meth)acrylate, polyethylene glycol polypropylene glycol polyethylene glycol di(meth)acrylate, polypropylene glycol di(meth)acrylate, epichlorohydrin-modified propylene glycol di(meth)acrylate, PO-modified bisphenol A diglycidyl ether di(meth)acrylate, silicone di(meth)acrylate, triethylene glycol di(meth)acrylate, tetraethylene glycol di(meth)acrylate, tricyclodecane dimethanol di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, epichlorohydrin-modified glycerol tri(meth)acrylate, EO-modified glycerol tri(meth)acrylate, PO-modified glycerol tri(meth)acrylate, EO-modified phosphate tri(meth)acrylate, caprolactone-modified trimethylolpropane tri(meth)acrylate, hydroxypropyl acrylate-modified trimethylolpropane tri(meth)acrylate, EO-modified trimethylolpropane tri(meth)acrylate, PO-modified trimethylolpropane tri(meth)acrylate, trimethylolpropane benzoate (meth)acrylate, tris((meth)acryloyloxyethyl)isocyanurate, alkoxy-modified trimethylolpropane tri(meth)acrylate, dipentaerythritol poly(meth)acrylate, alkyl-modified dipentaerythritol tri(meth)acrylate, ditrimethylolpropane tetra(meth)acrylate, or a combination of the above compounds.

The $M^4$ in the multi-mercapto compound represented by formula (F2) is preferably $C_0$ to $C_{22}$ (in the case of Co, $M^3$ is a single bond, and formula (F2) represents HS—CH$_2$—CH$_2$—SH), more preferably $C_1$ to $C_{16}$, and still more preferably $C_2$ to $C_{12}$. Specific examples of the multi-mercapto compound represented by formula (F2) include 1,2-dimercaptoethane, 1,3-dimercaptopropane, 1,4-dimercaptobutane, bisdimercaptoethanethiol (HS—CH$_2$CH$_2$—S—CH$_2$CH$_2$—SH), dimercapto triethylene glycol, trimethylolpropane tri(mercaptoacetate), trimethylolpropane tri(mercaptopropionate), pentaerythritol tetra(mercaptoacetate), pentaerythritol tri(mercaptoacetate), pentaerythritol tetra(mercaptopropionate), dipentaerythritol hexa (mercaptoacetate), dipentaerythritol hexa (mercaptopropionate), or a combination of the compounds.

The $C_1$ to $C_{12}$ alkylene group of $M^5$ in the mercapto compound having a carboxyl group represented by formula (F3) can be a straight-chain or branched alkylene group. Specifically, the alkylene group is, for instance, a group such as a methylene group, an ethylene group, a propylene group, a butylene group, an amylene group, a hexylene group, a heptylene group, an octylene group, a nonylene group, a decylene group, an undecylene group, or a dodecylene group. The mercapto compound having a carboxyl group represented by formula (F3) can include, for instance, thioglycolic acid.

In the invention, the addition reaction can be performed by first mixing the polyfunctional (meth)acrylate (monomer) represented by formula (F3) and the multi-mercapto compound represented by formula (F2) at room temperature to 100° C. and adding a basic catalyst. The reaction time is generally 30 minutes to about 6 hours. As a result, a hyperbranched polymer can be obtained.

Next, the mercapto compound having a carboxyl group represented by formula (F3) can also be added to the hyperbranched polymer, and then another addition reaction is performed. As a result, a hyperbranched polymer having a carboxyl group can be obtained.

Moreover, a general analytical instrument of, for instance, liquid chromatography or gel filtration chromatography can be used to confirm the end of the synthesis of the hyperbranched polymer (F).

Moreover, when the hyperbranched polymer (F) is synthesized, an inhibitor can be added as needed. The inhibitor can include a general hydroquinone compound, phenolic compound, or a combination thereof used to inhibit the polymerization of a (meth)acrylate compound. Specific examples of the inhibitor include, but are not limited to, hydroquinone, methoxyhydroquinone, catechol, p-tert-butylcatechol, cresol, butylated hydroxytoluene, 2,4,6-tris-tert-butyl phenol (BHT), or a combination of the compounds.

Based on a usage amount of 100 parts by weight of the alkali-soluble resin (A), the usage amount of the hyperbranched polymer (D) can be 3 parts by weight to 35 parts by weight, preferably 4 parts by weight to 30 parts by weight, and more preferably 5 parts by weight to 25 parts by weight. When the hyperbranched polymer (F) is used, the heat resistance of the photosensitive resin composition can be further improved.

Thermal Initiator (G)

The thermal initiator (G) of the invention is not particularly limited, and in an example of the invention, the thermal initiator (G) can contain, but is not limited to, for instance, an azo compound, organic peroxide, and a hydrogen peroxide compound.

Specific examples of the azo compound are, for instance: 2,2'-azobisisobutyronitrile, 2,2'-azobis(2-methylbutyronitrile), 1,1'-azobis(cyclohexane-2-carbonitrile), 2,2'-azobis(2,4-dimethylvaleronitrile), 1-[(1-cyano-1-methylethyl)azo] formamide, 2,2-azobis {2-methyl-N-[1,1-bis(hydroxymethyl)-2-hydroxyethyl]propanamide, 2,2'-azobis [N-(2-propenyl)-2-methylpropanamide], 2,2'-azobis[N-(2-propenyl)-2-ethylpropanamide], 2,2'-azobis(N-butyl-2-methylpropionamide), 2,2'-azobis(N-cyclohexyl-2-methylpropanamide), 2,2'-azobis(dimethyl-2-methylpropanamide), 2,2'-azobis(dimethyl-2-methylpropionate), and 2,2'-azobis(2,4,4-trimethylpentene).

Specific examples of the organic peroxide are, for instance: benzoyl peroxide, di-tert-butylperoxy, diisobutyl peroxide, cumyl peroxyneodecanoate, dipropyl peroxydicarbonate, diisopropyl peroxydicarbonate, dibutyl peroxydicarbonate, 1,1,3,3-tetramethylbutylperoxy neodecanoate, bis (4-tributylcyclohexyl)peroxydicarbonate, 1-cyclohexyl-1-methylethyl peroxydicarbonate, bis(2-ethoxyethyl) peroxydicarbonate, bis(2-ethylhexyl)peroxydicarbonate, tert-hexyl peroxyneodecanoate, dimethoxybutyl peroxydicarbonate, tert-butyl peroxyneodecanoate, tert-hexyl peroxypivalate, tert-butyl peroxypivalate, bis(3,5,5-trimethylhexanoyl)peroxide, dioctyl peroxide, dilauryl peroxide, peroxydicarbonate, 1,1,3,3-tetramethylbutyl 2-ethylperoxyhexanoate, 2,5-dimethyl-2,5-di(2-ethylhexanoate peroxide) hexane, tert-2-ethylhexyl peroxyhexanoate, di(4-methylbenzoyl)peroxide, tert-butyl 2-ethyl peroxyhexanoate, benzoyl peroxide, tert-butyl peroxyisobutyrate, 1,1-bis(tert-butylperoxy)-2-methylcyclohexane, 1,1-bis(tert-butylperoxy)-3,3,5-trimethylcyclohexane, 1,1-bis(tert-hexylperoxy)cyclohexane, 1,1-bis(tert-butylperoxy)cyclohexane, 2,2-bis[4,4-bis(tert-butylperoxy)cyclohexyl]propane, tert-hexyl peroxy isopropyl carbonate, tert-butyl peroxy maleate, tert-butyl peroxy-3,5,5-trimethylhexanoate, tert-butyl peroxylaurate, 2,5-dimethyl-2,5-di(3-methylbenzoylperoxy)hexane, tert-butylperoxyisopropyl carbonate, tert-butyl peroxy-2-ethylhexyl carbonate, tert-hexylperoxy benzoate, 2,5-dimethyl-2,5-di(benzoylperoxy)hexane, tert-butyl peroxyacetate, 2,2-bis(tert-butylperoxy)butane, tert-butyl peroxy benzoate, butyl-4,4-bis(tert-butylperoxy valerate), bis(2-tert-butylperoxyisopropyl)benzene, cumene peroxide, di-tert-hexyl peroxide, 2,5-dimethyl-2,5-di(tert-butylperoxy)hexane, di-tert-butyl peroxide, 2,5-dimethyl-2,5-di(tert-butylperoxy) hexyne, tert-butyl trimethyl peroxysilane, and a mixture of bis(3-methylbenzoyl)peroxide, benzoyl(3-methylpropanoyl)peroxide, and benzoyl peroxide.

Specific examples of the hydrogen peroxide compound are, for instance: terpane hydroperoxide, diisopropylbenzene hydroperoxide, 1,1,3,3-tetramethylbutylhydroperoxide, cumene hydroperoxide, and tert-butyl hydroperoxide.

The thermal initiator (G) is preferably, for instance, 2,2'-azobisisobutyronitrile, 2,2'-azobis(2-methylbutyronitrile), 2,2'-azobis(2,4-dimethylvaleronitrile), diisobutyl peroxide, benzoyl peroxide, tert-butyl peroxyisobutyrate, terpane hydroperoxide, cumene hydroperoxide, or cumyl peroxyneodecanoate. The thermal initiator (G) can be used alone or in multiple combinations, which is decided based on actual need.

In a specific example of the invention, based on a usage amount of 100 parts by weight of the alkali-soluble resin (A), the usage amount of the thermal initiator (G) is 4 parts by weight to 40 parts by weight; preferably 5 parts by weight to 35 parts by weight; and more preferably 6 parts by weight to 30 parts by weight. If the thermal initiator (G) is used, then the resolution of the photosensitive resin composition can be further improved.

Compound (H) Represented by Formula (10)

The photosensitive resin composition for a black matrix of the invention contains the compound (H) represented by formula (10);

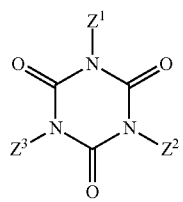

formula (10)

wherein in formula (10), $Z^1$, $Z^2$, and $Z^3$ each independently represent a trialkoxysilane group bonded by an alkylene group or an arylene group. In particular, the alkylene group or arylene group can have a substituent, and the substituent can be an amino group, a hydroxyl group, an alkoxy group, or a halogen atom. Specific examples of the alkylene group of the invention are $C_1$ to $C_{10}$ alkylene groups such as a methylene group, an ethylene group, a propylene group, a butylene group, a pentylene group, a hexylene group, a heptylene group, an octylene group, a nonylene group, or a decylene group. Specific examples of the arylene group of the invention are a phenylene group and a naphthylene group.

Specific examples of the compound (H) shown in formula (10) of the invention are the compounds shown in formula (10-1) to (10-9) below:

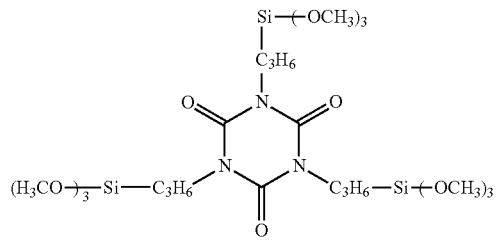

formula (10-1)

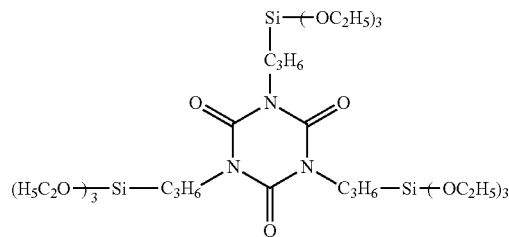

formula (10-2)

No. 3

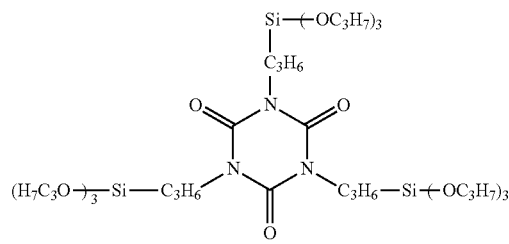

formula (10-3)

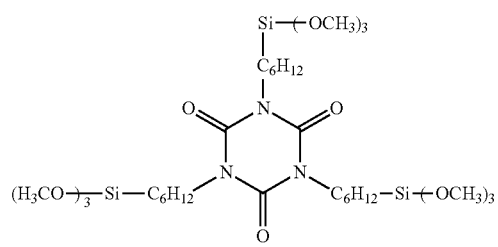

formula (10-4)

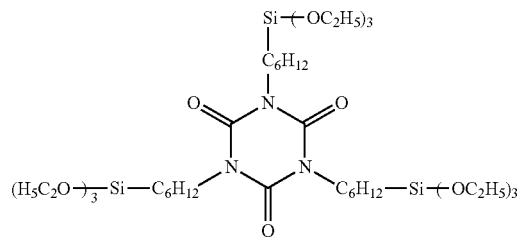

formula (10-5)

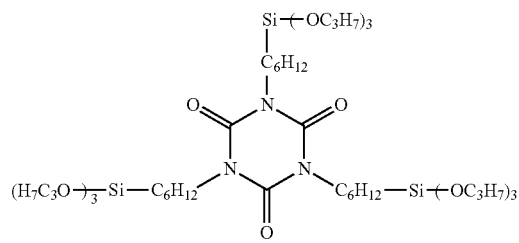

formula (10-6)

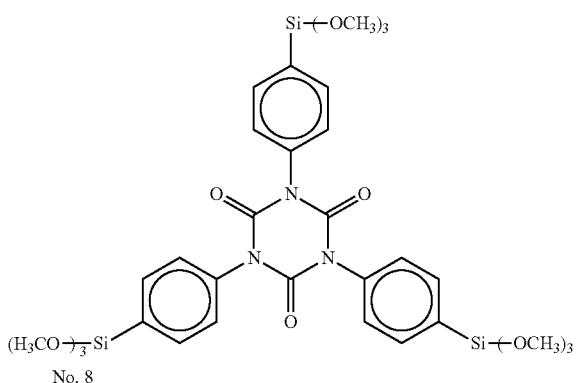

formula (10-7)

No. 8

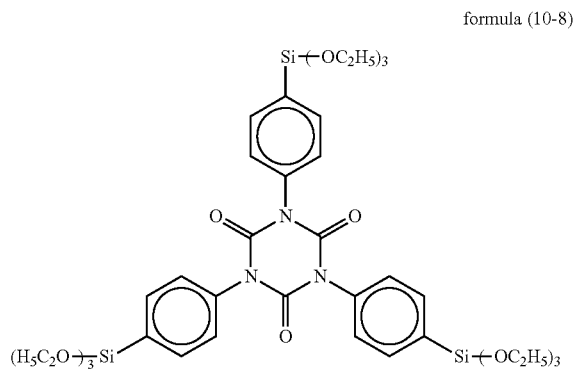

formula (10-8)

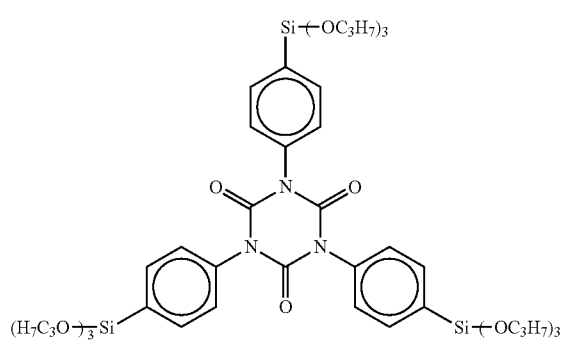

formula (10-9)

wherein the structural compound shown in formula (10-1) is 1,3,5-N-tris(trimethoxysilylpropyl)isocyanurate purchasable from Nippon Unicar Company Limited.

Based on a usage amount of 100 parts by weight of the alkali-soluble resin (A), the usage amount of the compound (H) represented by formula (10) is preferably 1 part by weight to 10 parts by weight, more preferably 1.2 parts by weight to 9 parts by weight, and still more preferably 1.5 parts by weight to 8 parts by weight. If the compound (H) represented by formula (10) is used, then the reliability of the photosensitive resin composition under high temperature and high humidity can be further improved.

Preparation Method of Photosensitive Resin Composition

The method of preparing the photosensitive resin composition includes, for instance: the alkali-soluble resin (A), the compound (B) having an ethylenically unsaturated group, the photoinitiator (C), the solvent (D), and the black pigment (E) are placed in a stirrer to stir to uniformly mix the components into a solution state, and the hyperbranched polymer (F), the thermal initiator (G), and the compound (H) can be added as needed. After the components are uniformly mixed, the photosensitive resin composition in solution state is obtained.

In addition, the preparation method of the photosensitive resin composition is not particularly limited. The preparation method of the photosensitive resin composition includes, for instance, first dispersing a portion of the alkali-soluble resin (A) and the compound (B) having an ethylenically unsaturated group in a portion of the solvent (D) to form a dispersion, and then mixing the rest of the alkali-soluble resin (A), the compound (B) having an ethylenically unsaturated group, the photoinitiator (C), the solvent (D), and the black pigment (E).

Alternatively, the photosensitive resin composition can also be prepared by first dispersing a portion of the black pigment (E) in a mixture composed of a portion of the alkali-soluble resin (A) and a portion of the solvent (D) to form a black pigment dispersion, and then adding the alkali-soluble resin (A), the compound (B) having an ethylenically unsaturated group, the photoinitiator (C), the solvent (D), and the black pigment (E). Moreover, the dispersion steps of the black pigment (E) can be performed by mixing with a mixer such as a beads mill or a roll mill.

Manufacturing Method of Black Matrix

The black matrix is prepared by applying the treatments of pre-bake, exposure, development, and post-bake on a substrate with the photosensitive resin composition in sequence. Moreover, when the film thickness of the resulting black matrix is 1 μm, the range of the optical density can be greater than 3.0, preferably 3.2 to 5.5, and more preferably 3.5 to 5.5. The preparation method of the black matrix is described below.

First, the photosensitive resin composition for a black matrix in liquid state is uniformly coated on a substrate by a coating method such as spin coating or cast coating to form a coating film. Specific examples of the substrate include alkali-free glass, soda-lime glass, hard glass (Pyrex glass), silica glass, and glasses with a transparent conductive film attached thereto used for a liquid crystal display apparatus. Alternatively, the substrate can be a substrate (such as a silicon substrate) used for a photoelectric conversion apparatus such as a solid imaging device.

After the coating film is formed, most of the solvent is removed by drying under reduced pressure. Next, the remaining solvent is completely removed by a pre-bake method to form a pre-baked coating film. It should be mentioned that, the conditions for drying under reduced pressure and pre-bake vary according to the type and the ratio of each component. In general, drying under reduced pressure is performed at a pressure less than 200 mmHg for 1 second to 20 seconds, and the pre-bake is a heat treatment performed on the coating film at a temperature of 70° C. to 110° C. for 1 minute to 15 minutes.

Then, the pre-baked coating film is exposed with a photomask having a specific pattern. The light used in the exposure process is preferably an ultraviolet light such as a g-ray, an h-ray, or an i-ray. In addition, the ultraviolet light irradiation apparatus can be a(n) (ultra-)high pressure mercury vapor lamp or a metal halide lamp.

Then, the exposed pre-baked coating film is immersed in a developing solution at a temperature of 23±2° C. to remove the unexposed portion of the pre-baked coating film and to form a specific pattern on the substrate.

The developing solution is, for instance, an alkali compound such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, or 1,8-diazabicyclo-[5,4,0]-7-undecene. The concentration of the developing solution is generally 0.001 wt % to 10 wt %, preferably 0.005 wt % to 5 wt %, and more preferably 0.01 wt % to 1 wt %.

After the pre-baked coating film is developed, the substrate having a specific pattern is rinsed with water, and then the specific pattern is air dried with compressed air or compressed nitrogen. Then, a post-bake treatment is performed with a heating device such as a hot plate or an oven. The post-bake temperature is generally 150° C. to 250° C., wherein when a hot plate is used, the heating time is 5 minutes to 60 minutes, and when an oven is used, the heating time 15 minutes to 150 minutes. After the treatment steps, a black matrix can be formed on the substrate.

Preparation Method of Pixel Layer and Color Filter

The manufacturing method of the pixel layer is similar to the manufacturing method of the black matrix. Specifically, the pixel layer is obtained by coating the photosensitive composition for a color filter on the substrate on which a black matrix is formed, and then applying the treatments of pre-bake, exposure, development, and post-bake in order. However, drying under reduced pressure is performed at a pressure of 0 mmHg to 200 mmHg for 1 second to 60 seconds. After the treatment steps, a specific pattern can be fixed, thereby forming the pixel layer. Moreover, the steps are repeated to form pixel layers of, for instance, red, green, and blue on the substrate in order so as to obtain a substrate (i.e., color filter having pixel layers) on which a black matrix and pixel layers are formed.

Preparation Method of Liquid Crystal Display Element

First, the color filter formed by the manufacturing method of a color filter and a substrate provided with a thin film transistor (TFT) are disposed opposite to each other, and a gap (cell gap) is left between the two. Then, the color filter and the peripheral portion of the substrate are adhered with an adhesive and an injection hole is left. Then, liquid crystal is injected into the gap separated by the substrate surface and the adhesive through the injection hole. Lastly, the injection hole is sealed to form a liquid crystal layer. Then, a polarizer is provided to the other side of the color filter in contact with the liquid crystal layer and the other side of the substrate in contact with the liquid crystal layer to manufacture a liquid crystal display apparatus. The liquid crystal used, i.e., a liquid crystal compound or a liquid crystal composition, is not particularly limited. Any liquid crystal compound or liquid crystal composition can be used.

Moreover, the liquid crystal alignment film used in the manufacture of the color filter is used to limit the alignment of the liquid crystal molecules and is not particularly limited. Both inorganic matter and organic matter can be used, and the invention is not limited thereto.

Preparation Examples of Diol Compound (A-1-1) Containing Polymeric Unsaturated Group Preparation example 1 to preparation example 3 of the diol compound (a-1-1) containing a polymeric unsaturated group are described below:

Preparation Example 1

First, 100 parts by weight of a fluorene epoxy compound (model number: ESF-300, made by Nippon Steel Chemical, epoxy equivalent: 231), 30 parts by weight of acrylic acid, 0.3 parts by weight of benzyltriethylammonium chloride, 0.1 parts by weight of 2,6-di-tert-butyl-p-cresol, and 130 parts by weight of propylene glycol monomethyl ether acetate were added in a 500-mL four-neck flask with a method of continuous addition. The feeding speed was controlled at 25 parts by weight/minute, the temperature of the reaction process was maintained at 100° C. to 110° C., and the mixture was reacted for 15 hours to obtain a light yellow transparent mixture solution having a solid content concentration of 50 wt %. Then, steps of extraction, filtration, and heating and drying were performed on the light yellow transparent mixture solution to obtain a diol compound (a-1-1-a) containing a polymeric unsaturated group of preparation example 1 having a solid content of 99.9 wt %.

Preparation Example 2

First, 100 parts by weight of a fluorene epoxy compound (model number: PG-100, made by Osaka Gas, epoxy equivalent: 259), 35 parts by weight of methacrylic acid, 0.3 parts by weight of benzyltriethylammonium chloride, 0.1 parts by weight of 2,6-di-tert-butyl-p-cresol, and 135 parts by weight of propylene glycol monomethyl ether acetate were added in a 500-mL four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps of extraction, filtration, and heating and drying were performed on the light yellow transparent mixture solution to obtain a diol compound (a-1-1-b) containing a polymeric unsaturated group of preparation example 2 having a solid content of 99.9 wt %.

Preparation Example 3

100 parts by weight of a fluorene epoxy compound (model number: ESF-300, made by Nippon Steel Chemical, epoxy equivalent: 231), 100 parts by weight of 2-methacryloyl oxyethyl succinate, 0.3 parts by weight of benzyltriethylammonium chloride, 0.1 parts by weight of 2,6-di-tert-butyl-p-cresol, and 200 parts by weight of propylene glycol monomethyl ether acetate were added in a 500-mL four-neck flask in a continuous manner. The feeding speed was controlled at 25 parts by weight/minute, the temperature of the reaction process was maintained at 100° C. to 110° C., and the mixture was reacted for 15 hours to obtain a light yellow transparent mixture solution having a solid content of 50 wt %. Steps of extraction, filtration, and heating and drying were performed on the light yellow transparent mixture solution to obtain a diol compound (a-1-1-c) containing a polymeric unsaturated group of preparation example 3 having a solid content of 99.9 wt %.

Synthesis Examples of Alkali-Soluble Resin (A-1)

In the following, synthesis example A-1-1 to synthesis example A-1-6 of the alkali-soluble resin (A-1) are described:

Synthesis Example A-1-1

First, 1.0 mol of the diol compound (a-1-1-a) having a polymeric unsaturated group of preparation example 1, 0.3 moles of the biphenyltetracarboxylic acid (a-1-2-d), 1.4 moles of the maleic acid (a-1-3-d), 1.9 g of benzyltriethylammonium chloride, 0.6 g of 2,6-di-tert-butyl-p-cresol, 700 g of propylene glycol monomethyl ether acetate, and 100 g of ethyl 3-ethoxypropionate were added in a 500-mL four-neck flask at the same time to form a reaction solution. Here, "simultaneous addition" refers to adding the tetracarboxylic acid or an acid dianhydride thereof (a-1-2) and the dicarboxylic acid or an acid anhydride thereof (a-1-3) at the same reaction time. Then, the reaction solution was heated to 110° C. and reacted for 2 hours to obtain the alkali-soluble resin A-1-1 having an acid value of 125 mgKOH/g and a number-average molecular weight of 2455.

Synthesis Example A-1-2

1.0 mole of the diol compound (a-1-1-b) having a polymeric unsaturated group of preparation example 2, 2.9 grams of benzyltriethylammonium chloride, and 950 grams of propylene glycol monomethyl ether acetate were added to a 500-mL four-neck flask to form a reaction solution. Then, 0.6 moles of benzophenone tetracarboxylic dianhydride (a-1-2-e) was added, and the mixture was reacted at 90° C. for 2 hours. Then, 0.8 moles of tetrahydrophthalic anhydride (a-1-3-e) was added and the mixture was reacted at 90° C. for 4 hours. Here, "successive addition" refers to respectively adding the tetracarboxylic acid or an acid dianhydride thereof (a-1-2) and the dicarboxylic acid or an acid anhydride thereof (a-1-3) at different reaction times. That is, the tetracarboxylic acid or an acid dianhydride thereof (a-1-2) is added first, and the dicarboxylic acid or an acid anhydride thereof (a-1-3) is added afterward. After the synthesis steps, the alkali-soluble resin A-1-2 having an acid value of 92 mgKOH/g and a number-average molecular weight of 5130 was obtained.

Synthesis Example A-1-3, Synthesis Example A-1-5, and Synthesis Example A-1-6

The alkali-soluble resins of synthesis example A-1-3, synthesis example A-1-5, and synthesis example A-1-6 were prepared with the same steps as synthesis example A-1-2, and the difference thereof is: the type and usage amount of the components of the first alkali-soluble resin, the reaction time, the reaction temperature, and the addition time of the reactants were changed (as shown in Table 1).

Synthesis Example A-1-4

The alkali-soluble resin of synthesis example A-1-4 was prepared with the same steps as synthesis example A-1-1, and the difference thereof is: the type and usage amount of the components of the first alkali-soluble resin, the reaction time, the reaction temperature, and the addition time of the reactants were changed (as shown in Table 1).

The compounds corresponding to the abbreviations in Table 1 are as shown below.

| Abbreviation | Component |
| --- | --- |
| a-1-1-a | Diol compound (a-1-1-a) containing a polymeric unsaturated group of preparation example 1 |
| a-1-1-b | Diol compound (a-1-1-b) containing a polymeric unsaturated group of preparation example 2 |
| a-1-1-c | Diol compound (a-1-1-c) containing a polymeric unsaturated group of preparation example 3 |
| a-1-2-a | 4,4'-hexafluoro isopropylidene diphthalic dianhydride (6FDA) |
| a-1-2-b | 1,4-difluoropyromellitic dianhydride |
| a-1-2-c | 1,4-bis (trifluoromemyl) pyromellitic dianhydride |
| a-1-2-d | Biphenyl tetracarboxylic acid |
| a-1-2-e | Benzophenone tetracarboxylic dianhydride |
| a-1-2-f | Pyromellitic dianhydride |
| a-1-3-a | 3-fluorophthalic anhydride |
| a-1-3-b | 3,6-difluorophthalic anhydride |
| a-1-3-c | 4-fluorophthalic anhydride |
| a-1-3-d | Maleic acid |
| a-1-3-e | Tetrahydrophthalic anhydride |
| PGMEA | Propylene glycol monomethyl ether acetate (PGMEA) |
| EEP | Ethyl 3-ethoxypropionate (EEP) |
| — | Benzyltriethylammonium chloride |
| — | 2,6-di-tert-butyl-p-cresol |

TABLE 1

| Component | | | | Synthesis example | | |
| --- | --- | --- | --- | --- | --- | --- |
| | | | | A-1-1 | A-1-2 | A-1-3 |
| Polymeric component | Diol compound (a-1-1) containing polymeric unsaturated group (moles) | | a-1-1-a | 1.0 | — | — |
| | | | a-1-1-b | — | 1.0 | 0.5 |
| | | | a-1-1-c | — | — | 0.5 |
| | Tetracarboxylic acid or acid dianhydride thereof (a-1-2) | Tetracarboxylic acid containing fluorine atom or acid dianhydride thereof | a-1-2-a | — | — | — |
| | | | a-1-2-b | — | — | — |
| | | | a-1-2-c | — | — | — |
| | | Other tetracarboxylic acids or acid dianhydride thereof | a-1-2-d | 0.3 | — | — |
| | | | a-1-2-e | — | 0.6 | — |
| | | | a-1-2-f | — | — | 0.5 |
| | Dicarboxylic acid or acid anhydride | Dicarboxylic acid containing fluorine atom or acid | a-1-3-a | — | — | — |
| | | | a-1-3-b | — | — | — |
| | | | a-1-3-c | — | — | — |

TABLE 1-continued

| | | | | | |
|---|---|---|---|---|---|
| | thereof (a-1-3) | anhydride thereof | | | |
| | | Other dicarboxylic acids or acid anhydride thereof | a-1-3-d<br>a-1-3-e | 1.4<br>— | —<br>0.8 | 1.0<br>— |
| | Monomer feeding method | | | Simultaneous addition | Successive addition | Successive addition |
| Catalyst | Benzyltriethylammonium chloride (g) | | | 1.9 | 2.9 | 2.5 |
| Inhibitor | 2,6-di-tert-butyl-p-cresol (g) | | | 0.6 | — | — |
| Solvent | PGMEA (g) | | | 700 | 950 | 900 |
| | EEP (g) | | | 100 | — | — |
| | Reaction temperature (° C.) | | | 110 | 90 | 90 |
| | Reaction time (hours) | | | 2 | 2<br>4 | 2<br>4 |
| | Acid value (mgKOH/g) | | | 125 | 92 | 102 |
| | Number-average molecular weight (Mn) | | | 2455 | 5130 | 4280 |

| | | | Synthesis example | | |
|---|---|---|---|---|---|
| Component | | | A-1-4 | A-1-5 | A-1-6 |
| Polymeric component | Diol compound (a-1-1) containing polymeric unsaturated group (moles) | a-1-1-a<br>a-1-1-b<br>a-1-1-c | 1.0<br>—<br>— | —<br>1.0<br>— | —<br>—<br>1.0 |
| | Tetracarboxylic acid or acid dianhydride thereof (a-1-2) | Tetracarboxylic acid containing fluorine atom or acid dianhydride thereof | a-1-2-a<br>a-1-2-b<br>a-1-2-c | 0.1<br>0.1<br>— | —<br>—<br>— | —<br>—<br>0.3 |
| | | Other tetracarboxylic acids or acid dianhydride thereof | a-1-2-d<br>a-1-2-e<br>a-1-2-f | —<br>—<br>0.1 | —<br>0.1<br>— | 0.5<br>—<br>— |
| | Dicarboxylic acid or acid anhydride thereof (a-1-3) | Dicarboxylic acid containing fluorine atom or acid anhydride thereof | a-1-3-a<br>a-1-3-b<br>a-1-3-c | —<br>—<br>— | 0.6<br>1.0<br>— | —<br>—<br>0.2 |
| | | Other dicarboxylic acids or acid anhydride thereof | a-1-3-d<br>a-1-3-e | 0.4<br>1.0 | —<br>0.2 | 0.2<br>— |
| | Monomer feeding method | | | Simultaneous addition | Successive addition | Successive addition |
| Catalyst | Benzyltriethylammonium chloride (g) | | | 1.9 | 1.1 | 2.4 |
| Inhibitor | 2,6-di-tert-butyl-p-cresol (g) | | | 0.6 | 0.4 | 0.8 |
| Solvent | PGMEA (g) | | | 750 | 600 | 100 |
| | EEP (g) | | | — | — | 900 |
| | Reaction temperature (° C.) | | | 110 | 90 | 90 |
| | Reaction time (hours) | | | 2 | 2<br>3.5 | 2<br>4 |
| | Acid value (mgKOH/g) | | | 129 | 159 | 93 |
| | Number-average molecular weight (Mn) | | | 3368 | 2885 | 6802 |

Synthesis Examples of Alkali-Soluble Resin (A-2)

In the following, synthesis example A-2-1 to synthesis example A-2-4 of the alkali-soluble resin (A-2) are described:

Synthesis Example A-2-1

In a 500-mL three-neck flask, 0.40 moles of dimethyldimethoxysilane (hereinafter DMDMS), 0.55 moles of phenyltriethoxysilane (hereinafter PTES), 0.05 moles of silanol-terminal polysiloxane (hereinafter DMS-S27), and 180 g of 4-hydroxyl-4-methyl-2-pentanone (hereinafter DAA) were added, and the mixture was stirred at room temperature while an aqueous oxalic acid solution (0.40 g oxalic acid/75 g water) was added within 30 minutes. Then, the flask was immersed in an oil bath at 30° C. and stirred for 30 minutes. Next, the temperature of the oil bath was raised to 120° C. within 30 minutes. When the temperature of the solution was reduced to 110° C. (i.e., reaction temperature), the solution was continuously heated and stirred to perform polymerization for 6 hours (i.e., polycondensation time). Then, the solvent was removed by a distillation method to obtain an alkali-soluble resin (A-2-1). The type and usage amount of the components of the alkali-soluble resin (A-2-1) are as shown in Table 2.

Synthesis Example A-2-2 to Synthesis Example A-2-4

The alkali-soluble resins (A-2) of synthesis example A-2-2 to synthesis example A-2-4 were prepared with the same steps as synthesis example A-2-1, and the difference thereof is: the type and usage amount of the components of the alkali-soluble resin (A-2), and the reaction temperature and polycondensation time were changed (as shown in Table 2), wherein the compounds corresponding to the labels in Table 2 are as shown below.

| Abbreviation | Compound |
| --- | --- |
| GF-20 | 3-(triethoxysilyl)propylsuccinic anhydride |
| TMSG | 3-(trimethoxysilyl)propylglutaric anhydride |
| TMSOX | 3-ethyl-3-((3-(trimethoxysilyl)propoxy)methyl)epoxypropane |
| TMS-GAA | 3-(glycidoxypropyl trimethoxysilane) |
| MTMS | Methyltrimethoxysilane |
| DMDMS | Dimethyldimethoxysilane |
| PTMS | Phenyltrimethoxysilane |
| PTES | Phenyltriethoxysilane |
| DMS-S27 | Silanol terminal polysiloxane, product name: DMS-S27 made by Gelest Corporation. |
| OSCAR 1132 | Silica particle made by Catalysts & Chemicals Company |
| PGEE | Propylene glycol monoethyl ether |
| DAA | Diacetone alcohol (i.e., 4-hydroxy-4-methyl-2-pentanone) |
| — | DI water |
| — | Oxalic acid |

TABLE 2

| | | | Synthesis example | | | |
| --- | --- | --- | --- | --- | --- | --- |
| | | | A-2-1 | A-2-2 | A-2-3 | A-2-4 |
| Silane monomer/ poly- siloxane (mol) | Silane monomer (a-S1) | GF-20 | — | 0.05 | — | — |
| | | TMSG | — | — | 0.03 | — |
| | | TMSOX | — | — | 0.02 | — |
| | | TMS-GAA | — | — | — | 0.05 |
| | Silane monomer (a-52) | MTMS | — | 0.50 | — | 0.40 |
| | | DMDMS | 0.40 | — | 0.25 | 0.10 |
| | | PTMS | — | 0.45 | 0.25 | 0.40 |
| | | PTES | 0.55 | — | 0.45 | — |
| | Siloxane pre-polymer (a-S3) | DMS-S27 | 0.05 | — | — | — |
| | Silica particle (a-S4) | OSCAR-1132 | — | — | — | 0.05 |
| Solvent (g) | | PGEE | — | 100 | 160 | 160 |
| | | DAA | 180 | 100 | — | — |
| Catalyst (g) | | Water | 75 | 75 | 75 | 75 |
| | | Oxalic acid | 0.40 | 0.35 | 0.50 | 0.50 |
| Reaction temperature (° C.) | | | 110 | 105 | 120 | 120 |
| Polycondensation time (hours) | | | 6 | 6 | 6 | 6 |

Synthesis Examples of Hyperbranched Polymer (F)

In the following, synthesis example F-1 to synthesis example F-3 of the hyperbranched polymer (F) are described:

Synthesis Example F-1

In a four-neck flask having a volume of 1 L, 25 g of trimethylolpropane tri(mercaptoacetate) (mercapto group: 0.28 moles), 177 g of pentaerythritol tetraacrylate (carbon-carbon double bond: 2.01 moles), 0.1 g of hydroquinone, and 0.01 g of benzyl dimethyl amine (used as photoinitiator) were added, and the mixture was reacted at 60° C. for 12 hours. For each reaction product, the disappearance of the mercapto group was confirmed via an iodine titration method to obtain the hyperbranched polymer F-1. The molecular weight of the hyperbranched polymer F-1 measured via gel filtration chromatography was 4,400.

Synthesis Example F-2

In a four-neck flask having a volume of 1 L, 20 g of pentaerythritol tetra(mercaptoacetate) (mercapto group: 0.19 moles), 212 g of a mixture (carbon-carbon double bond: 2.12 moles) of dipentaerythritol hexacrylate and dipentaerythritol pentaacrylate, 0.1 g of hydroquinone, and 0.01 g of benzyl dimethyl amine were added, and the mixture was reacted at 60° C. for 12 hours. For each reaction product, the disappearance of the mercapto group was confirmed via an iodine titration method to obtain the hyperbranched polymer F-2. The molecular weight of the hyperbranched polymer F-2 measured via gel filtration chromatography was 11,000.

Synthesis Example F-3

In a four-neck flask having a volume of 1 L, 20 g of pentaerythritol tetra(mercaptoacetate) (mercapto group: 0.19 moles), 212 g of a mixture (carbon-carbon double bond: 2.12 moles) of dipentaerythritol hexacrylate and dipentaerythritol pentaacrylate, 58 g of propylene glycol monomethyl ether acetate (used as solvent), 0.1 g of hydroquinone, and 0.01 g of benzyl dimethyl amine were added, and the mixture was reacted at 60° C. for 12 hours. For each reaction product, the disappearance of the mercapto group was confirmed via an iodine titration method to obtain an intermediate product. The molecular weight of the intermediate product measured via gel filtration chromatography was 11,000.

Next, in the four-neck flask, 20 g (0.22 moles) of thioglycolic acid was added, and the mixture was reacted at 60° C. for 12 hours. For each reaction product, the disappearance of the mercapto group was confirmed via an iodine titration method to obtain the hyperbranched polymer F-3. The molecular weight of the hyperbranched polymer F-3 measured via gel filtration chromatography was 12,000.

Examples and Comparative Examples of Photosensitive Resin Composition and Film Example 1 to example 15 and comparative example 1 to comparative example 3 of the photosensitive resin composition and the film are described below:

Example 1 a. Photosensitive Resin Composition 100 parts by weight of the alkali-soluble resin A-1-1, 20 parts by weight of pentaerythritol triacrylate and ester of phthalic acid (hereinafter B-1-1), 10 parts by weight of the photoinitiator (C-1-1) represented by formula (1-1), 350 parts by weight of black pigment MA100 (hereinafter E-1), and 4 parts by weight of 2,2'-azobis(2,4-dimethylvaleronitrile) (hereinafter G-1) were added in 1000 parts by weight of propylene glycol monomethyl ether acetate (hereinafter D-1), and after the mixture was evenly stirred with a shaking stirrer, the photosensitive resin composition of example 1 was obtained.

B. Forming of Film

The photosensitive resin composition of example 1 was coated on a plain glass substrate (dimension: 100 mm×100 mm×0.7 mm) via a spin coating method to form a coating film having a thickness of about 6 μm. Next, the coating film was pre-baked at 90° C. for 2 minutes to 3 minutes. Then, a photomask was disposed between an exposure machine and the coating film, and patterning exposure was performed on the pre-baked coating film via 100 mJ/cm² of ultraviolet light (model of exposure machine: AG500-4N, made by M&R Nanotechnology). The exposed coating film was immersed in a 0.05% aqueous potassium hydroxide solution for 45 seconds to 90 seconds to remove the undesired portion of the exposed coating film. Next, the plain glass substrate was rinsed with water. Lastly, post-bake was performed on the coating film at 235° C. in an oven for 30 minutes to obtain a glass substrate on which the film of example 1 was formed. The film of example 1 was evaluated by each of the following evaluation methods, and the results thereof are as shown in Table 3.

Example 2 to Example 15

The photosensitive resin compositions of example 2 to example 15 were prepared using the same steps as example 1, and the difference thereof is: the type and usage amount of the components of the photosensitive resin compositions were changed (as shown in Table 3). The obtained films were evaluated by each of the following evaluation methods, and the results thereof are as shown in Table 3.

Comparative Example 1 to Comparative Example 3

The photosensitive resin compositions and films of comparative example 1 to comparative example 3 were prepared using the same steps as example 1, and the difference thereof is: the type and usage amount of the components of the photosensitive resin compositions were changed (as shown in Table 4). The obtained films were evaluated by each of the following evaluation methods, and the results thereof are as shown in Table 4.

The compounds corresponding to the labels in Table 3 and Table 4 are as shown below.

| Abbreviation | Compound |
|---|---|
| A-1-1 | Alkali-soluble resin (A-1) of synthesis example A-1-1 |
| A-1-2 | Alkali-soluble resin (A-1) of synthesis example A-1-2 |
| A-1-3 | Alkali-soluble resin (A-1) of synthesis example A-1-3 |
| A-1-4 | Alkali-soluble resin (A-1) of synthesis example A-1-4 |
| A-1-5 | Alkali-soluble resin (A-1) of synthesis example A-1-5 |
| A-1-6 | Alkali-soluble resin (A-1) of synthesis example A-1-6 |
| A-2-1 | Alkali-soluble resin (A-2) of synthesis example A-2-1 |
| A-2-2 | Alkali-soluble resin (A-2) of synthesis example A-2-2 |
| A-2-3 | Alkali-soluble resin (A-2) of synthesis example A-2-3 |
| A-2-4 | Alkali-soluble resin (A-2) of synthesis example A-2-4 |
| B-1-1 | Ester of pentaerythritol triacrylate and phthalic acid |
| B-1-2 | Ester of dipentaerythritol pentamethyl methacrylate and succinic acid |
| B-1-3 | Ester of dipentaerythritol pentamethyl methacrylate and phthalic acid |
| B-1-4 | Ester of dipentaerythritol pentamethacrylate and glutaric acid |
| B-2-1 | Trimethylolpropane triacrylate |
| B-2-2 | Dipentaerythritol hexacrylate |

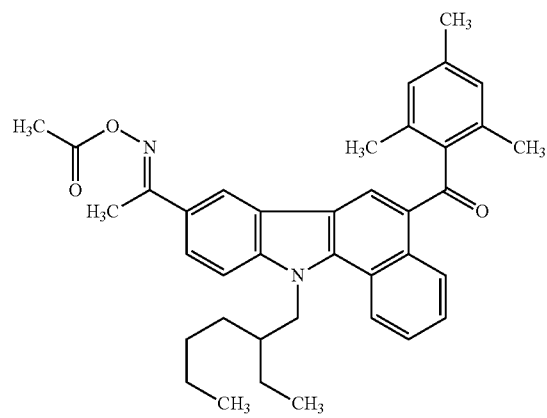 [SMILES: CCCCC(CC)Cn1c2ccc(/C(C)=N/OC(C)=O)cc2c2cc(C(=O)c3c(C)cc(C)cc3C)c3ccccc3c21]

-continued

| Abbreviation | Compound |
|---|---|
| C-1-1 | Photoinitiator represented by formula (1-1) |

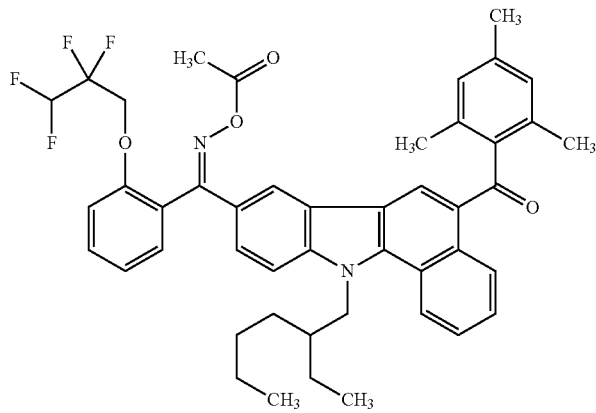 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

| | |
|---|---|
| C-1-2 | Photoinitiator represented by formula (1-10) |

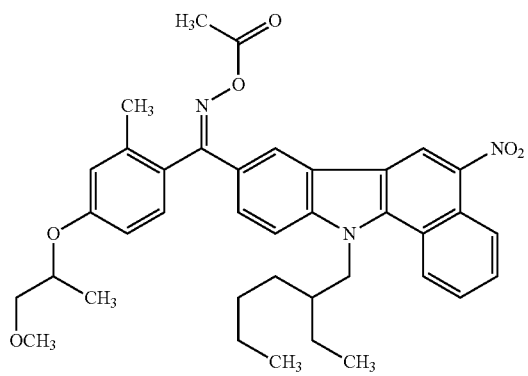 [SMILES: CCCCC(CC)Cn1c2ccc(/C(=N\OC(C)=O)c3ccc(OC(C)COC)cc3C)cc2c2cc([N+](=O)[O-])c3ccccc3c21]

| | |
|---|---|
| C-1-3 | Photoinitiator represented by formula (1-24) |

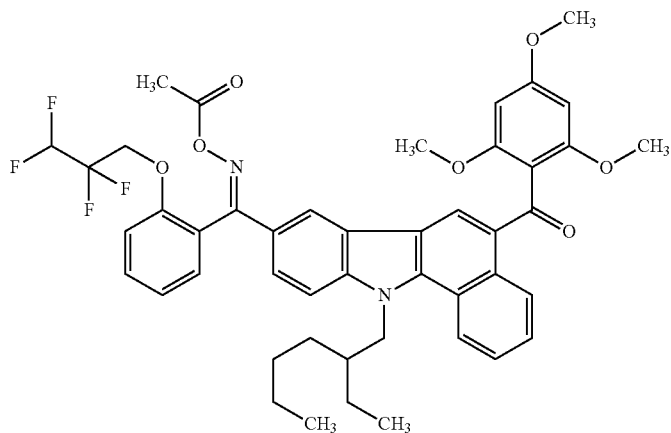 [SMILES: CCCCC(CC)Cn1c2ccc(/C(=N/OC(C)=O)c3ccccc3OCC(F)(F)C(F)F)cc2c2cc(C(=O)c3c(OC)cc(OC)cc3OC)c3ccccc3c21]

| | |
|---|---|
| C-1-4 | Photoinitiator represented by formula (1-57) |
| C-2-1 | Ethanone,1-[9-ethyl-6-(2-methylbenzoyl)-9H-carbazole-3-yl]-, 1-(O-acetyl oxime) (product name: OXE-02, made by Ciba Specialty Chemicals Co., Ltd.) |
| C-2-2 | 2-methyl-1-(4-(methylthiophenyl)-2-morpholino-1-propanone (product name: IRGACURE 907; made by Ciba Specialty Chemicals Co., Ltd.) |
| D-1 | Propylene glycol monomethyl ether acetate |
| D-2 | Cyclohexanone |
| E-1 | MA100 (made by Mitsubishi Chemical) |
| E-2 | MA230 (made by Mitsubishi Chemical) |

-continued

| Abbreviation | Compound |
|---|---|
| F-1 | Hyperbranched polymer F-1 of synthesis example F-1 |
| F-2 | Hyperbranched polymer F-2 of synthesis example F-2 |
| F-3 | Hyperbranched polymer F-3 of synthesis example F-3 |
| G-1 | 2,2'-azobis(2,4-dimethylvaleronitrile) |
| G-2 | Cumyl peroxyneodecanoate |
| G-3 | Terpane hydroperoxide |

H-1

No. 1

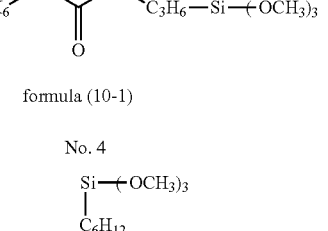

formula (10-1)

H-2

No. 4

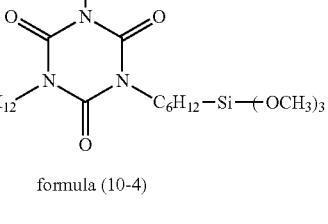

formula (10-4)

H-3

No. 7

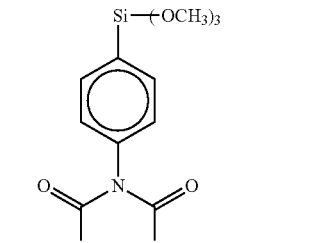

formula (10-7)

Evaluation Methods a. Reliability Under High Temperature and High Humidity

The photosensitive resin composition of each example and comparative example was coated on a glass substrate having a length and a width of 100 mm using a coating machine (model: MS-A150, purchased from Sunlight Trading, Co.) via a spin-coating method. Then, the glass substrate was dried at a reduced pressure of about 100 mmHg for about 5 seconds. Next, the glass substrate was prebaked at 100° C. for 2 minutes to form a pre-baked coating film having a film thickness of 1.2 μm.

Next, the pre-baked coating film was irradiated by UV using an exposure machine (made by M&R Nano Technology, model: AG500-4N) at 100 mJ/cm². After the UV irradiation, the pre-baked coating film was immersed in a developing solution (potassium hydroxide, concentration: 0.04%) at 23° C. After 2 minutes, washing was performed using pure water, and the pre-baked coating film was placed at 230° C. and post-baked for 60 minutes to form a light-shielding film having a thickness of 1.0 μm on the glass substrate.

Next, the light-shielding film was placed in an oven at a temperature of 121° C., a pressure greater than 2 atm, and a relative humidity of 100%. After 8 hours, the reliability of the light-shielding film under high temperature and high humidity was measured according to 8.5.2 base plate mesh method in JIS.5400(1900)8.5 adhesion test method. First, the light-shielding film was cut into 100 base plate meshes using a small knife. Next, an adhesive tape was applied and peeled off, and the residue of the base plate mesh was observed, and evaluation was performed according to the following criteria:

⊚: 5B.
◯: 4B.
Δ: 2B to 3B.
X: 0B to 1B.

In particular, 5B means no base plate mesh fell off.
4B means 0%<number of fallen base plate mesh≤5%.
3B means 5%<number of fallen base plate mesh≤15%.
2B means 15%<number of fallen base plate mesh≤35%.
1B means 35%<number of fallen base plate mesh≤65%.
0B means 65%<number of fallen base plate mesh≤100%.

b. Resolution

The photosensitive resin composition obtained in each example and comparative example was coated on a glass substrate with a spin coating method. Then, the glass substrate was pre-baked at 100° C. for 2 minutes to obtain a pre-baked coating film of about 1.2 μm. Then, the pre-baked coating film was placed under a line and space photomask (made by Nibbon Filcon, Japan) and exposed with UV (model of exposure machine: AG500-4N, made by M&R Nano Technology) at 50 mJ/cm². Then, the pre-baked coating film was developed with a 0.045% aqueous solution of potassium hydroxide at 23° C. for 1 minute to remove the unexposed portion of the coating film on the substrate. Then, the glass substrate having a specific pattern was rinsed with water. Lastly, the minimum value of the line width magnitude of the pattern formed on the glass substrate was defined as the resolution. The line width magnitude was evaluated with the following methods. It should be mentioned that, a smaller minimum pattern line width represents better resolution of the photosensitive resin composition.

⊚: minimum pattern line width≤4 μm
◯: 4 μm<minimum pattern line width≤6 μm
Δ: 6 μm<minimum pattern line width≤8 μm
X: 8 μm<minimum pattern line width c. Heat Resistance Stability Each of the post-baked coating films having a film thickness of 1.2 μm was measured using a high resistance meter (model number MCP-HT450, model Hiresta-UP, made by Mitsubishi Chemical Corporation). Three random measurement points were selected on the post-baked coating film and the average value ($\Omega_1$) of surface resistance was measured.

Next, the pre-baked coating films were respectively irradiated with UV at 100 mJ/cm² using the specified photomask, and then immersed in a developing solution (0.04% potassium hydroxide) at 23° C. After washing with pure water, post-bake was performed in an oven at 280° C. for 60 minutes to form a black matrix having a thickness of 1.0 μm on the glass substrate. The average value ($\Omega_2$) of the surface resistance was measured on the same three measurement points using a high impedance meter, and lastly calculation was performed by the following formula (IX), and evaluation was performed based on the following criteria:

Surface impedance stability $(R_H)=[(\Omega_2)/(\Omega_1)]\times 100\%$ (IX)

⊚: $R_H>97\%$
◯: $97\%\geq R_H>95\%$
Δ: $95\%\geq R_H>90\%$
X: $R_H\leq 90\%$

TABLE 3

| Component (parts by weight) | | | Example 1 | 2 | 3 | 4 | 5 | 6 | 7 | 8 |
|---|---|---|---|---|---|---|---|---|---|---|
| Alkali-soluble resin (A) | A-1 | A-1-1 | 100 | — | — | 100 | — | — | 100 | — |
| | | A-1-2 | — | 100 | — | — | 100 | — | — | — |
| | | A-1-3 | — | — | 100 | — | — | 100 | — | — |
| | | A-1-4 | — | — | — | — | — | — | — | 100 |
| | | A-1-5 | — | — | — | — | — | — | — | — |
| | | A-1-6 | — | — | — | — | — | — | — | — |
| | A-2 | A-2-1 | — | — | — | — | — | — | — | — |
| | | A-2-2 | — | — | — | — | — | — | — | — |
| | | A-2-3 | — | — | — | — | — | — | — | — |
| | | A-2-4 | — | — | — | — | — | — | — | — |
| Compound (B) containing ethylenically unsaturated group | B-1 | B-1-1 | 20 | — | 35 | 20 | — | — | 45 | — |
| | | B-1-2 | — | — | — | — | 30 | — | — | 60 |
| | | B-1-3 | — | 15 | — | 20 | — | 50 | — | — |
| | | B-1-4 | | | | | | | | |
| | B-2 | B-2-1 | — | — | — | — | — | — | — | — |
| | | B-2-2 | — | — | — | — | — | — | — | 30 |
| Photoinitiator (C) | C-1 | C-1-1 | 10 | — | — | — | 21 | — | — | — |
| | | C-1-2 | — | 12 | — | — | — | 24 | — | — |
| | | C-1-3 | — | — | 15 | — | — | — | 30 | — |
| | | C-1-4 | — | — | — | 18 | — | — | — | 33 |
| | C-2 | C-2-1 | — | 5 | — | — | — | 3 | — | — |
| | | C-2-2 | — | — | — | — | 3 | — | — | — |
| Solvent (D) | | D-1 | 1000 | — | 1500 | — | 2600 | — | 3700 | 3500 |
| | | D-2 | — | 1200 | — | 1900 | — | 3200 | — | 5000 |
| Black pigment (E) | | E-1 | 350 | 200 | — | 400 | — | 700 | 150 | — |
| | | E-2 | — | — | 150 | — | 600 | — | 700 | 450 |
| Hyper branched polymer (F) | | F-1 | — | — | — | — | — | 11 | — | — |
| | | F-2 | — | 3 | — | — | — | — | — | — |
| | | F-3 | — | — | — | 7 | — | — | — | 35 |
| Thermal initiator | | G-1 | 4 | — | — | — | 8 | — | — | — |
| | | G-2 | — | 13 | — | — | — | 15 | — | — |

TABLE 3-continued

| Component (parts by weight) | | | | | | | | | | |
|---|---|---|---|---|---|---|---|---|---|---|
| (G) | | G-3 | — | — | — | — | — | 12 | — | — |
| Compound (H) represented by formula (10) | | H-1 | — | 1 | — | — | — | — | — | 6 |
| | | H-2 | — | — | 2 | — | — | — | — | — |
| | | H-3 | — | — | — | — | 4 | — | — | — |
| Evaluation results | Resolution | | ◎ | ◎ | ○ | ○ | ◎ | ◎ | ○ | ○ |
| | Heat resistance | | ○ | ◎ | ○ | ◎ | ○ | ◎ | ○ | ◎ |
| | Reliability under high temperature and high humidity | | ○ | ◎ | ◎ | ○ | ◎ | ○ | ○ | ◎ |

| | | | Example | | | | | | |
|---|---|---|---|---|---|---|---|---|---|
| Component (parts by weight) | | | 9 | 10 | 11 | 12 | 13 | 14 | 15 |
| Alkali-soluble resin (A) | A-1 | A-1-1 | 90 | — | — | 90 | — | — | — |
| | | A-1-2 | — | 70 | — | — | 70 | — | 80 |
| | | A-1-3 | — | — | 50 | — | — | 50 | — |
| | | A-1-4 | 10 | — | — | — | — | — | — |
| | | A-1-5 | — | 30 | — | — | — | — | — |
| | | A-1-6 | — | — | 50 | — | — | — | — |
| | A-2 | A-2-1 | — | — | — | 10 | — | — | — |
| | | A-2-2 | — | — | — | — | 30 | — | — |
| | | A-2-3 | — | — | — | — | — | 50 | — |
| | | A-2-4 | — | — | — | — | — | — | 20 |
| Compound (B) containing ethylenically unsaturated group | B-1 | B-1-1 | — | 115 | — | — | — | 100 | 40 |
| | | B-1-2 | — | — | 130 | — | 100 | — | — |
| | | B-1-3 | 80 | — | — | — | — | — | 30 |
| | | B-1-4 | — | — | — | 150 | 20 | — | — |
| | B-2 | B-2-1 | — | — | — | — | — | 100 | — |
| | | B-2-2 | — | — | — | — | — | — | — |
| Photoinitiator (C) | C-1 | C-1-1 | 36 | — | — | — | 58 | — | — |
| | | C-1-2 | — | 40 | — | — | — | 65 | — |
| | | C-1-3 | — | — | 45 | — | — | — | 60 |
| | | C-1-4 | — | — | — | 52 | — | — | 10 |
| | C-2 | C-2-1 | — | — | — | — | — | — | — |
| | | C-2-2 | 6 | — | — | — | — | — | 10 |
| Solvent (D) | | D-1 | 4800 | — | 5700 | — | 6800 | — | 2000 |
| | | D-2 | — | 5300 | — | 6200 | — | 7200 | 6000 |
| Black pigment (E) | | E-1 | 900 | — | 1000 | — | — | 800 | — |
| | | E-2 | — | 1050 | 100 | 1000 | 1200 | — | 750 |
| Hyper branched polymer (F) | | F-1 | — | 22 | — | — | — | 20 | — |
| | | F-2 | — | — | 9 | — | — | 7 | — |
| | | F-3 | — | — | — | — | 16 | — | — |
| Thermal initiator (G) | | G-1 | — | 25 | — | — | 40 | — | — |
| | | G-2 | — | — | — | — | — | 21 | — |
| | | G-3 | — | — | — | 32 | — | — | — |
| Compound (H) represented by formula (10) | | H-1 | — | — | 4 | — | 10 | — | — |
| | | H-2 | — | 8 | — | — | — | — | — |
| | | H-3 | — | — | 1 | — | — | — | 3 |
| Evaluation results | Resolution | | ○ | ○ | ○ | ◎ | ◎ | ◎ | ○ |
| | Heat resistance | | ○ | ◎ | ◎ | ○ | ◎ | ◎ | ○ |
| | Reliability under high temperature and high humidity | | ◎ | ◎ | ◎ | ◎ | ◎ | ◎ | ◎ |

TABLE 4

| | | | Comparative example | | |
|---|---|---|---|---|---|
| Component (parts by weight) | | | 1 | 2 | 3 |
| Alkali-soluble resin (A) | A-1 | A-1-1 | 100 | — | — |
| | | A-1-2 | — | 100 | — |
| | | A-1-3 | — | — | 100 |
| | | A-1-4 | — | — | — |
| | | A-1-5 | — | — | — |
| | | A-1-6 | — | — | — |
| | A-2 | A-2-1 | — | — | — |
| | | A-2-2 | — | — | — |
| | | A-2-3 | — | — | — |
| | | A-2-4 | — | — | — |
| Compound (B) containing ethylenically unsaturated group | B-1 | B-1-1 | — | 60 | — |
| | | B-1-2 | — | — | — |
| | | B-1-3 | — | — | — |
| | | B-1-4 | — | — | — |
| | B-2 | B-2-1 | 60 | — | — |
| | | B-2-2 | — | — | 60 |

TABLE 4-continued

| Component (parts by weight) | | | Comparative example 1 | Comparative example 2 | Comparative example 3 |
|---|---|---|---|---|---|
| Photoinitiator (C) | C-1 | C-1-1 | 30 | — | — |
| | | C-1-2 | — | — | — |
| | | C-1-3 | — | — | — |
| | | C-1-4 | — | — | — |
| | C-2 | C-2-1 | — | 30 | — |
| | | C-2-2 | — | — | 30 |
| Solvent (D) | | D-1 | 4000 | — | 3500 |
| | | D-2 | — | 4000 | — |
| Black pigment (E) | | E-1 | 350 | 500 | — |
| | | E-2 | — | — | 350 |
| Hyperbranched polymer (F) | | F-1 | — | — | — |
| | | F-2 | — | — | — |
| | | F-3 | — | — | — |
| Thermal initiator (G) | | G-1 | — | — | — |
| | | G-2 | — | — | — |
| | | G-3 | — | — | — |
| Compound (H) represented by formula (10) | | H-1 | — | — | — |
| | | H-2 | — | — | — |
| | | H-3 | — | — | — |
| Evaluation results | | Resolution | X | X | X |
| | | Heat resistance | ○ | X | X |
| | | Reliability under high temperature and high humidity | ○ | X | X |

Evaluation Results

It can be known from Table 3 and Table 4 that, in comparison to the films formed by the photosensitive resin composition including the compound (B-1) containing an ethylenically unsaturated group (example 1 to example 15), the resolution of the films formed by the photosensitive resin composition without the compound (B-1) containing an ethylenically unsaturated group (comparative examples 1 and 3) is poor.

Moreover, in comparison to the films formed by the photosensitive resin composition containing the photoinitiator (C-1) (example 1 to example 15), the resolution, heat resistance, and reliability under high temperature and high humidity of the films formed by the photosensitive resin composition without the photoinitiator (C-1) are poor.

Based on the above, the photosensitive resin composition of the invention includes the compound (B) having an ethylenically unsaturated group and the photoinitiator (C-1) having a specific structure, and therefore the issues of poor resolution, heat resistance, and reliability under high temperature and high humidity of the black matrix can be alleviated, such that the photosensitive resin composition of the invention is suitable for a color filter and a liquid crystal display element.

Lastly, it should be mentioned that: each of the above examples is only used to describe the technical solutions of the invention and is not intended to limit the invention; and although the invention is described in detail via each of the above examples, those having ordinary skill in the art should understand that: modifications can still be made to the technical solutions recited in each of the above examples, or portions or all of the technical features thereof can be replaced to achieve the same or similar results; and the modifications or replacements do not make the nature of corresponding technical solutions depart from the scope of the technical solutions of each of the examples of the invention.

What is claimed is:

1. A photosensitive resin composition, comprising:
   an alkali-soluble resin (A);
   a compound (B) having an ethylenically unsaturated group;
   a photoinitiator (C);
   a solvent (D);
   a black pigment (E); and
   a compound (H) represented by formula (10);

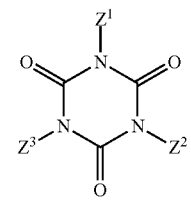

formula (10)

wherein in formula (10), $Z^1$, $Z^2$, and $Z^3$ each independently represent a trialkoxysilane group bonded by an alkylene group or an arylene group,
wherein the compound (B) having an ethylenically unsaturated group contains a compound (B-1) having an acidic group and at least three ethylenically unsaturated groups;
the photoinitiator (C) comprises a photoinitiator (C-1) represented by formula (1);

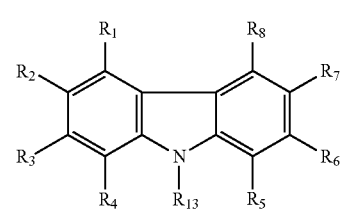

formula (1)

wherein $R_1$, $R_2$, $R_3$, $R_4$, $R_5$, $R_6$, $R_7$, and $R_8$ are each independently hydrogen, a $C_1$ to $C_{20}$ alkyl group, $COR_{16}$, $OR_{17}$, halogen, $NO_2$, a group represented by formula (2), or a group represented by formula (3),

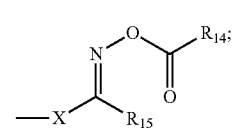

formula (2)

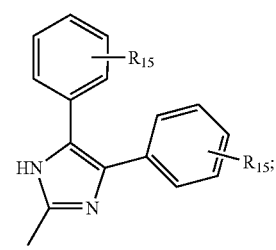

formula (3)

or $R_1$ and $R_2$, $R_2$ and $R_3$, $R_3$ and $R_4$, $R_5$ and $R_6$, $R_6$ and $R_7$, or $R_7$ and $R_8$ are each independently $C_2$ to $C_{10}$ alkenyl groups substituted by a group represented by formula (4)

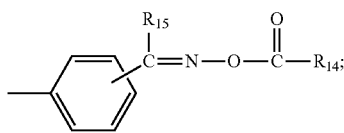

formula (4)

or $R_1$ and $R_2$, $R_2$ and $R_3$, $R_3$ and $R_4$, $R_5$ and $R_6$, $R_6$ and $R_7$, or $R_7$ and $R_8$ are each independently —$(CH_2)_p$—Y—$(CH_2)_q$— at the same time;

or $R_1$ and $R_2$, $R_2$ and $R_3$, $R_3$ and $R_4$, $R_5$ and $R_6$, $R_6$ and $R_7$, or $R_7$ and $R_8$ are each independently a group represented by formula (5) at the same time;

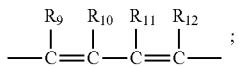

formula (5)

provided that at least one pair in $R_1$ and $R_2$, $R_2$ and $R_3$, $R_3$ and $R_4$, $R_5$ and $R_6$, $R_6$ and $R_7$, or $R_7$ and $R_8$ is a group represented by formula (5), $R_9$, $R_{10}$, $R_{11}$, and $R_{12}$ are each independently hydrogen or a $C_1$ to $C_{20}$ alkyl group, and the $C_1$ to $C_{20}$ alkyl group is unsubstituted or substituted by one or a plurality of the following groups: halogen, a phenyl group, CN, OH, SH, a $C_1$ to $C_4$ alkoxy group, —(CO)OH, or —(CO)O—($C_1$ to $C_4$ alkyl);

or $R_9$, $R_{10}$, $R_{11}$, and $R_{12}$ are each independently an unsubstituted phenyl group or a phenyl group substituted by one or a plurality of the following groups: a $C_1$ to $C_6$ alkyl group, halogen, CN, $OR_{17}$, $SR_{18}$, or $NR_{19}R_{20}$;

or $R_9$, $R_{10}$, $R_{11}$, and $R_{12}$ are each independently halogen, CN, $OR_{17}$, $SR_{18}$, $SOR_{18}$, $SO_2R_{18}$, or $NR_{19}R_{20}$, wherein the substituent $OR_{17}$, $SR_{18}$, or $NR_{19}R_{20}$ forms a 5-membered or 6-membered ring with one carbon atom in a naphthyl ring via groups $R_{17}$, $R_{18}$, $R_{19}$, and/or $R_{20}$ as needed;

or $R_9$, $R_{10}$, $R_{11}$, and $R_{12}$ are each independently $COR_{16}$, $NO_2$, or a group represented by formula (2),

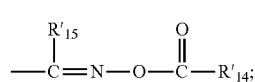

formula (2)

Y represents O, S, $NR_{26}$, or a direct bond;
p represents an integer of 0, 1, 2, or 3;
q represents an integer of 1, 2, or 3;
X represents CO or a direct bond;
$R_{13}$ represents a $C_1$ to $C_{20}$ alkyl group that is unsubstituted or substituted by one or a plurality of the following groups: halogen, $R_{17}$, $COOR_{17}$, $OR_{17}$, $SR_{18}$, $CONR_{19}R_{20}$, $NR_{19}R_{20}$, $PO(OC_kH_{2k+1})_2$, or a group represented by formula (6);

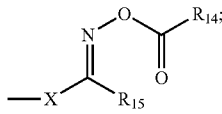

formula (6)

or $R_{13}$ represents a $C_2$ to $C_{20}$ alkyl group interrupted with one or a plurality of O, S, SO, $SO_2$, $NR_{26}$, or CO, or a $C_2$ to $C_{12}$ alkenyl group interrupted or uninterrupted with one or a plurality of O, CO, or $NR_{26}$, wherein the interrupted $C_2$ to $C_{20}$ alkyl group and the uninterrupted or is interrupted $C_2$ to $C_{12}$ alkenyl group is unsubstituted or substituted by one or a plurality of halogens;

or $R_{13}$ represents a $C_4$ to $C_8$ cycloalkenyl group, a $C_2$ to $C_{12}$ alkynyl group, or a $C_3$ to $C_{10}$ cycloalkyl group uninterrupted or is interrupted with one or a plurality of O, S, CO, or $NR_{26}$;

or $R_{13}$ represents a phenyl group or a naphthyl group that is unsubstituted or substituted by one or a plurality of the following groups: $OR_{17}$, $SR_{18}$, $NR_{19}R_{20}$, $COR_{16}$, CN, $NO_2$, halogen, a $C_1$ to $C_{20}$ alkyl group, a $C_1$ to $C_4$ haloalkyl group, a $C_2$ to $C_{20}$ alkyl group, which is interrupted with one or a plurality of O, S, CO, or $NR_{26}$, or a group represented by formula (7),

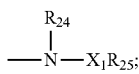

formula (7)

or the phenyl group or naphthyl group is substituted by a $C_3$ to $C_{10}$ cycloalkyl group or a $C_3$ to $C_{10}$ cycloalkyl group interrupted with one or a plurality of O, S, CO, or $NR_{26}$;

k represents an integer of 1 to 10;

$R_{14}$ represents hydrogen, a $C_3$ to $C_8$ cycloalkyl group, a $C_2$ to $C_5$ alkenyl group, a $C_1$ to $C_{20}$ alkoxy group, or a $C_1$ to $C_{20}$ alkyl group that is unsubstituted or substituted by one or a plurality of the following groups: halogen, a phenyl group, a $C_1$ to $C_{20}$ alkylphenyl group, or CN;

or $R_{14}$ represents a phenyl group or a naphthyl group that is unsubstituted or substituted by one or a plurality of the following groups: a $C_1$ to $C_6$ alkyl group, a $C_1$ to $C_4$ haloalkyl group, halogen, CN, $OR_{17}$, $SR_{18}$, and/or $NR_{19}R_{20}$;

or $R_{14}$ represents a $C_3$ to $C_{20}$ heteroaryl group, a $C_1$ to $C_8$ alkoxy group, a benzyloxy group, or a phenoxy group, and the benzyloxy group and the phenoxy group are unsubstituted or substituted by one or a plurality of the following groups: a $C_1$ to $C_6$ alkyl group, a $C_1$ to $C_4$ haloalkyl group, and/or halogen;

$R_{15}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, $PO(OC_kH_{2k+1})_2$, SO—$C_1$ to $C_{10}$ alkyl, $SO_2$—$C_1$ to $C_{10}$ alkyl, or a $C_2$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{15}$ represents hydrogen, a $C_2$ to $C_{12}$ alkenyl group, a $C_3$ to $C_8$ cycloalkyl group uninterrupted or is interrupted with one or a plurality of O, CO, or $NR_{26}$;

or $R_{15}$ represents a $C_1$ to $C_{20}$ alkyl group that is unsubstituted or substituted by one or a plurality of the following groups: halogen, $OR_{17}$, $SR_{18}$, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $NR_{19}R_{20}$, $COOR_{17}$, $CONR_{19}R_{20}$, $PO(OC_kH_{2k+1})_2$, a phenyl group, a group represented by formula (6), or a group represented by formula (8),

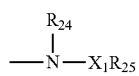

formula (6)

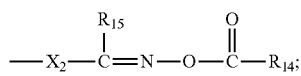

formula (8)

or the $C_1$ to $C_{20}$ alkyl group is substituted by a phenyl group, and the phenyl group is substituted by halogen, a $C_1$ to $C_{20}$ alkyl group, a $C_1$ to $C_4$ haloalkyl group, $OR_{17}$, $SR_{18}$, or $NR_{19}R_{20}$;

or $R_{15}$ represents a $C_2$ to $C_{20}$ alkyl group interrupted with one or a plurality of O, S, or $SO_2$, and the interrupted $C_2$ to $C_{20}$ alkyl group is unsubstituted or substituted by one or a plurality of the following groups: halogen, $OR_{17}$, $COOR_{17}$, $CONR_{19}R_{20}$, a phenyl group, or a phenyl group substituted by $OR_{17}$, $SR_{18}$, or $NR_{19}R_{20}$;

or $R_{15}$ represents a $C_2$ to $C_{20}$ alkanoyl group or a benzoyl group that is unsubstituted or substituted by one or a plurality of the following groups: a $C_1$ to $C_6$ alkyl group, halogen, a phenyl group, $OR_{17}$, $SR_{18}$, or $NR_{19}R_{20}$; or $R_{15}$ represents a naphthoyl group that is unsubstituted or substituted by one or a plurality of $OR_{17}$, or a $C_3$ to $C_{14}$ heteroarylcarbonyl group;

or $R_{15}$ represents a $C_2$ to $C_{12}$ alkoxycarbonyl group that is uninterrupted or is interrupted with one or a plurality of O and the interrupted or uninterrupted $C_2$ to $C_{12}$ alkoxycarbonyl group is unsubstituted or substituted by one or a plurality of hydroxyl groups;

or $R_{15}$ represents a phenoxycarbonyl group that is unsubstituted or substituted by one or a plurality of the following groups: a $C_1$ to $C_6$ alkyl group, halogen, a $C_1$ to $C_4$ haloalkyl group, a phenyl group, $OR_{17}$, $SR_{18}$, or $NR_{19}R_{20}$;

or $R_{15}$ represents CN, $CONR_{19}R_{20}$, $NO_2$, a $C_1$ to $C_4$ haloalkyl group, $S(O)_m$—$C_1$ to $C_6$ alkyl, $S(O)_m$-phenyl that is unsubstituted or substituted by a $C_1$ to $C_{12}$ alkyl group or $SO_2$—$C_1$ to $C_6$ alkyl;

or $R_{15}$ represents $SO_2O$-phenyl that is unsubstituted or substituted by a $C_1$ to $C_{12}$ alkyl group;

or $R_{15}$ represents a diphenylphosphinoyl group or di-($C_1$ to $C_4$ alkoxy)-phosphinoyl;

m represents 1 or 2;

$R'_{14}$ is defined the same as one of the $R_{14}$'s;

$R'_{15}$ is defined the same as one of the $R_{15}$'s;

$X_1$ represents O, S, SO, or $SO_2$;

$X_2$ represents O, CO, S, or a direct bond;

$R_{16}$ represents a $C_6$ to $C_{20}$ aryl group or a $C_3$ to $C_{20}$ heteroaryl group that is unsubstituted or substituted by one or a plurality of the following groups: a phenyl group, halogen, a $C_1$ to $C_4$ haloalkyl group, CN, $NO_2$, $OR_{17}$, $SR_{18}$, $NR_{19}R_{20}$, or a $C_1$ to $C_{20}$ alkyl group interrupted with one or a plurality of O, S, or $NR_{26}$; or the $C_6$ to $C_{20}$ aryl group or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_3$ to $C_{20}$ heteroaryloxycarbonyl group, $OR_{17}$, $SR_{18}$, or $NR_{19}R_{20}$;

or $R_{16}$ represents hydrogen or a $C_1$ to $C_{20}$ alkyl group, and the $C_1$ to $C_{20}$ alkyl group is unsubstituted or substituted by one or a plurality of the following groups: halogen, a phenyl group, OH, SH, CN, a $C_3$ to $C_6$ alkenyloxy group, $OCH_2CH_2CN$, $OCH_2CH_2(CO)O(C_1$ to $C_4$ alkyl), $O(CO)$—($C_1$ to $C_4$ alkyl), $O(CO)$-phenyl, (CO)OH, or $(CO)O(C_1$ to $C_4$ alkyl);

or $R_{16}$ represents a $C_2$ to $C_{12}$ alkyl group interrupted with one or a plurality of O, S, or $NR_{26}$; or $R_{16}$ represents $(CH_2CH_2O)_{n+1}H$, $(CH_2CH_2O)_n(CO)$—($C_1$ to $C_8$ alkyl), a $C_2$ to $C_{12}$ alkenyl group, or a $C_3$ to $C_8$ cycloalkyl group;

or $R_{16}$ represents a phenyl group substituted by $SR_{18}$, wherein the group $R_{18}$ represents a direct bond bonded to the phenyl group or naphthyl ring of a carbazole portion to which the $COR_{16}$, group is attached;

n represents 1 to 20;

$R_{17}$ represents hydrogen, phenyl-$C_1$ to $C_3$ alkyl, or a $C_1$ to $C_{20}$ alkyl group that is unsubstituted or substituted by one or a plurality of the following groups: halogen, OH, SH, CN, a $C_3$ to $C_6$ alkenyloxy group, $OCH_2CH_2CN$, $OCH_2CH_2(CO)O(C_1$ to $C_4$ alkyl), $O(CO)$—($C_1$ to $C_4$ alkyl), $O(CO)$—($C_2$ to $C_4$)alkenyl, $O(CO)$-phenyl, (CO)OH, $(CO)O(C_1$ to $C_4$ alkyl), a $C_3$ to $C_{20}$ cycloalkyl group, $SO_2$—($C_1$ to $C_4$ haloalkyl), $O(C_1$ to $C_4$ haloalkyl), or a $C_3$ to $C_{20}$ cycloalkyl group interrupted with one or a plurality of O;

or $R_{17}$ represents a $C_2$ to $C_{20}$ alkyl group interrupted with one or a plurality of O, S, or $NR_{26}$;

or $R_{17}$ represents $(CH_2CH_2O)_{n+1}H$, $(CH_2CH_2O)_n(CO)$—($C_1$ to $C_8$ alkyl), a $C_1$ to $C_8$ alkanoyl group, a $C_2$ to $C_{12}$ alkenyl group, a $C_3$ to $C_6$ alkenoyl group, or a $C_3$ to $C_{20}$ cycloalkyl group uninterrupted or is interrupted with one or a plurality of O, S, CO, or $NR_{26}$;

or $R_{17}$ represents $C_1$ to $C_8$ alkyl-$C_3$ to $C_{10}$ cycloalkyl that is uninterrupted or is interrupted with one or a plurality of O;

or $R_{17}$ represents a benzoyl group that is unsubstituted or substituted by one or a plurality of a $C_1$ to $C_6$ alkyl group, halogen, OH, or a $C_1$ to $C_3$ alkoxy group;

or $R_{17}$ represents a phenyl group, a naphthyl group, or a $C_3$ to $C_{20}$ heteroaryl group that is unsubstituted or substituted by one or a plurality of the following groups: halogen, OH, a $C_1$ to $C_{12}$ alkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, $N(C_1$ to $C_{12}$ alkyl)$_2$, diphenyl-amine, or a group represented by formula (7);

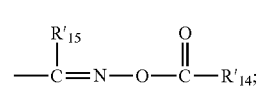

formula (7)

or $R_{17}$ forms a direct bond bonded to one of the carbon atoms of the phenyl group or naphthyl ring having a group represented by formula (2) or a group represented by formula (7),

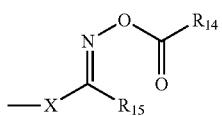

formula (2)

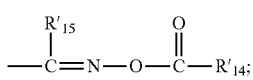

formula (7)

$R_{18}$ represents hydrogen, a $C_2$ to $C_{12}$ alkenyl group, a $C_3$ to $C_{20}$ cycloalkyl group, or phenyl-$C_1$ to $C_3$ alkyl, wherein the $C_2$ to $C_{12}$ alkenyl group, $C_3$ to $C_{20}$ cycloalkyl group, or phenyl-$C_1$ to $C_3$ alkyl is uninterrupted or is interrupted with one or a plurality of O, S, CO, $NR_{26}$, or $COOR_{17}$;

or $R_{18}$ is a $C_1$ to $C_{20}$ alkyl group that is unsubstituted or substituted by one or a plurality of the following groups: OH, SH, CN, $C_3$ to $C_6$ alkenyloxy, $OCH_2CH_2CN$, $OCH_2CH_2(CO)O(C_1$ to $C_4$ alkyl), $O(CO)$—($C_2$ to $C_4$)alkenyl, $O(CO)$—($C_1$ to $C_4$ alkyl), O(CO)-phenyl, or $(CO)OR_{17}$;

or $R_{18}$ represents a $C_2$ to $C_{20}$ alkyl group interrupted with one or a plurality of O, S, CO, $NR_{26}$, or $COOR_{17}$;

or $R_{18}$ represents $(CH_2CH_2O)_nH$, $(CH_2CH_2O)_n(CO)$—($C_1$ to $C_8$ alkyl), a $C_2$ to $C_8$ alkanoyl group, or a $C_3$ to $C_6$ alkenoyl group;

or $R_{18}$ represents a benzoyl group that is unsubstituted or substituted by one or a plurality of the following groups: a $C_1$ to $C_6$ alkyl group, halogen, OH, a $C_1$ to $C_4$ alkoxy group, or a $C_1$ to $C_4$ alkylthio group;

or $R_{18}$ represents a phenyl group, a naphthyl group, or a $C_3$ to $C_{20}$ heteroaryl group that is unsubstituted or substituted by one or a plurality of the following groups: halogen, a $C_1$ to $C_{12}$ alkyl group, a $C_1$ to $C_4$ haloalkyl group, a $C_1$ to $C_{12}$ alkoxy group, CN, $NO_2$, phenyl-$C_1$ to $C_3$ alkoxy, a phenoxy group, a $C_1$ to $C_{12}$ alkylthio group, a phenylthio group, N($C_1$ to $C_{12}$ alkyl)$_2$, a diphenylamino group, (CO)O($C_1$ to $C_8$ alkyl), (CO)—$C_1$ to $C_8$ alkyl, (CO)N($C_1$ to $C_8$ alkyl)$_2$, or a group represented by formula (7)

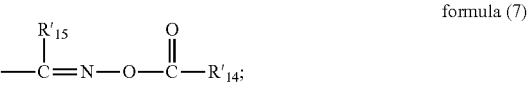

formula (7)

$R_{19}$ and $R_{20}$ are each independently hydrogen, a $C_1$ to $C_{20}$ alkyl group, a $C_2$ to $C_4$ hydroxyalkyl group, a $C_2$ to $C_{10}$ alkoxyalkyl group, a $C_2$ to $C_5$ alkenyl group, a $C_3$ to $C_{20}$ cycloalkyl group, phenyl-$C_1$ to $C_3$ alkyl, a $C_1$ to $C_8$ alkanoyl group, a $C_1$ to $C_8$ alkanoyloxy group, a $C_3$ to $C_{12}$ alkenoyl group, $SO_2$—($C_1$ to $C_4$ haloalkyl), or a benzoyl group;

or $R_{19}$ and $R_{20}$ each independently represent a phenyl group, a naphthyl group, or a $C_3$ to $C_{20}$ heteroaryl group that is unsubstituted or substituted by one or a plurality of the following groups: halogen, a $C_1$ to $C_4$ haloalkyl group, a $C_1$ to $C_{20}$ alkoxy group, a $C_1$ to $C_{12}$ alkyl group, a benzoyl group, or a $C_1$ to $C_{12}$ alkoxy group;

or $R_{19}$ and $R_{20}$ form a 5-membered or 6-membered saturated or unsaturated ring that is uninterrupted or is interrupted with O, S, or $NR_{17}$ with a nitrogen atom attached thereto, and the 5-membered or 6-membered saturated or unsaturated ring is unsubstituted or substituted by one or a plurality of the following groups: a $C_1$ to $C_{20}$ alkyl group, a $C_1$ to $C_{20}$ alkoxy group, =O, $OR_{17}$, $SR_{18}$, $NR_{21}R_{22}$, $(CO)R_{23}$, $NO_2$, halogen, $C_1$ to $C_4$-haloalkyl, CN, a phenyl group, a $C_3$ to $C_{20}$ cycloalkyl group that is uninterrupted or is interrupted with one or a plurality of O, S, CO, or $NR_{17}$, or a group represented by formula (7)

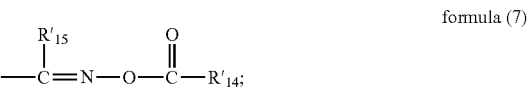

formula (7)

or $R_{19}$ and $R_{20}$ form a heteroaromatic ring system with a nitrogen atom attached thereto, and the ring system is unsubstituted or substituted by one or a plurality of the following groups: a $C_1$ to $C_{20}$ alkyl group, a $C_1$ to $C_4$ haloalkyl group, a $C_1$ to $C_{20}$ alkoxy group, =O, $OR_{17}$, $SR_{18}$, $NR_{21}R_{22}$, $(CO)R_{23}$, halogen, $NO_2$, CN, a phenyl group, or a $C_3$ to $C_{20}$ cycloalkyl group that is uninterrupted or is interrupted with one or a plurality of O, S, CO, or $NR_{17}$, or a group represented by formula (7)

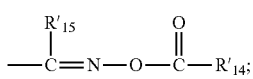

formula (7)

$R_{21}$ and $R_{22}$ are each independently hydrogen, a $C_1$ to $C_{20}$ alkyl group, a $C_1$ to $C_4$ haloalkyl group, a $C_3$ to $C_{10}$ cycloalkyl group, or a phenyl group;

or $R_{21}$ and $R_{22}$ form a 5-membered or 6-membered saturated or unsaturated ring that is uninterrupted or is interrupted with O, S, or $NR_{26}$ with a nitrogen atom attached thereto, and the 5-membered or 6-membered saturated or unsaturated ring is not fused or the 5-membered or 6-membered saturated or unsaturated ring is fused with a benzene ring;

$R_{23}$ represents hydrogen, OH, a $C_1$ to $C_{20}$ alkyl group, a $C_1$ to $C_4$ haloalkyl group, a $C_2$ to $C_{20}$ alkyl group interrupted with one or a plurality of O, CO, or $NR_{26}$, a $C_3$ to $C_{20}$ cycloalkyl group that is uninterrupted or is interrupted with O, S, CO, or $NR_{26}$, or $R_{23}$ represents a phenyl group, a naphthyl group, phenyl-$C_1$ to $C_4$ alkyl, $OR_{17}$, $SR_{18}$, or $NR_{21}R_{22}$;

$R_{24}$ represents $(CO)OR_{17}$, $CONR_{19}R_{20}$, or $(CO)R_{17}$; or $R_{24}$ is defined the same as one of the $R_{19}$'s and $R_{20}$'s;

$R_{25}$ represents $COOR_{17}$, $CONR_{19}R_{20}$, or $(CO)R_{17}$; or $R_{25}$ is defined the same as one of the $R_{17}$'s;

$R_{26}$ represents hydrogen, a $C_1$ to $C_{20}$ alkyl group, a $C_1$ to $C_4$ haloalkyl group, or a $C_2$ to $C_{20}$ alkyl group interrupted with one or a plurality of O or CO; or phenyl-$C_1$ to $C_4$ alkyl or a $C_3$ to $C_8$ cycloalkyl group that is uninterrupted or is interrupted with one or a plurality of O or CO; or $(CO)R_{19}$; or a phenyl group that is unsubstituted or substituted by one or a plurality of the following groups: a $C_1$ to $C_{20}$ alkyl group, halogen, a $C_1$ to $C_4$ haloalkyl group, $OR_{17}$, $SR_{18}$, $NR_{19}R_{20}$, or a group represented by formula (7)

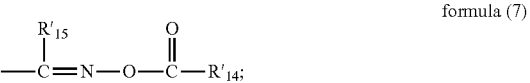

formula (7)

provided that, at least one group represented by formula (2) or formula (7) is present in the molecule

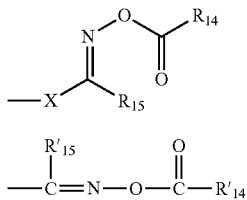

formula (2)

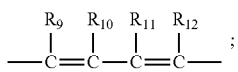

formula (7)

2. The photosensitive resin composition of claim 1, wherein the $R_1$, $R_2$, $R_3$, $R_4$, $R_5$, $R_6$, $R_7$, and $R_8$ are each independently hydrogen, a $C_1$ to $C_{20}$ alkyl group, $COR_{16}$, $NO_2$, or a group represented by formula (2);

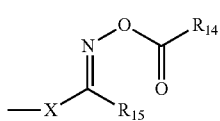

formula (2)

or $R_1$ and $R_2$, $R_2$ and $R_3$, $R_3$ and $R_4$, $R_5$ and $R_6$, $R_6$ and $R_7$, or $R_7$ and $R_8$ are each independently a group represented by formula (5) at the same time;

formula (5)

$$\underset{}{-\overset{R_9}{\underset{|}{C}}=\overset{R_{10}}{\underset{|}{C}}-\overset{R_{11}}{\underset{|}{C}}=\overset{R_{12}}{\underset{|}{C}}-}$$

provided that at least one pair in $R_1$ and $R_2$, $R_2$ and $R_3$, $R_3$ and $R_4$, $R_5$ and $R_6$, $R_6$ and $R_7$, or $R_7$ and $R_8$ is a group represented by formula (5);

X represents CO or a direct bond;

$R_{13}$ represents a $C_1$ to $C_{20}$ alkyl group that is unsubstituted or substituted by one or a plurality of the following groups: halogen, $OR_{17}$, $SR_{18}$, $COOR_{17}$, $CONR_{19}R_{20}$, or $PO(OC_kH_{2k+1})_2$;

or $R_{13}$ represents a $C_2$ to $C_{20}$ alkyl group interrupted with one or a plurality of O, S, $NR_{26}$, or CO;

or $R_{13}$ represents a phenyl group or a naphthyl group that is unsubstituted or substituted by $COR_{16}$ or one or a plurality of a group represented by formula (7);

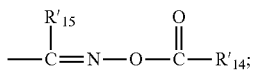

formula (7)

$R_{14}$ represents a $C_1$ to $C_{20}$ alkyl group, a phenyl group, or a $C_1$ to $C_8$ alkoxy group;

$R_{15}$ represents a phenyl group, a naphthyl group, or a $C_3$ to $C_{20}$ heteroaryl group that is unsubstituted or substituted by one or a plurality of the following groups: a phenyl group, halogen, a $C_1$ to $C_4$ haloalkyl group, $OR_{17}$, $SR_{18}$, or a $C_2$ to $C_{20}$ alkyl group interrupted with one or a plurality of O or S; or the phenyl group, naphthyl group, or $C_3$ to $C_{20}$ heteroaryl group is substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, $NR_{19}R_{20}$, or $PO(OC_kH_{2k+1})_2$;

or $R_{15}$ represents a $C_1$ to $C_{20}$ alkyl group that is unsubstituted or substituted by one or a plurality of the following groups: $OR_{17}$, $SR_{18}$, a $C_3$ to $C_8$ cycloalkyl group, a $C_3$ to $C_{20}$ heteroaryl group, $NR_{19}R_{20}$, $COOR_{17}$, $CONR_{19}R_{20}$, or $PO(OC_kH_{2k+1})_2$;

$R'_{14}$ is defined the same as one of the $R_{14}$'s;

$R'_{15}$ is defined the same as one of the $R_{15}$'s;

$R_{16}$ represents a phenyl group that is unsubstituted or substituted by one or a plurality of the following groups: $OR_{17}$, $SR_{18}$, $NR_{19}R_{20}$, or a $C_2$ to $C_{20}$ alkyl group interrupted with one or a plurality of O, S, or $NR_{26}$;

or $R_{16}$ represents a phenyl group substituted by one or a plurality of a $C_1$ to $C_{20}$ alkyl group, and the $C_1$ to $C_{20}$ alkyl group is unsubstituted or substituted by one or a plurality of the following groups: halogen, $COOR_{17}$, $CONR_{19}R_{20}$, a phenyl group, a $C_3$ to $C_8$ cycloalkyl group, a $C_3$ to $C_{20}$ heteroaryl group, a $C_6$ to $C_{20}$ aryloxycarbonyl group, a $C_4$ to $C_{20}$ heteroaryloxycarbonyl group, $OR_{17}$, $SR_{18}$, or $NR_{19}R_{20}$;

or $R_{16}$ represents a $C_1$ to $C_{20}$ alkyl group that is unsubstituted or substituted by the following groups: halogen, a phenyl group, OH, SH, CN, a $C_3$ to $C_6$ alkenyloxy group, $OCH_2CH_2(CO)O(C_1$ to $C_4$ alkyl), $O(CO)-(C_1$ to $C_4$ alkyl), or $(CO)O(C_1$ to $C_4$ alkyl);

$R_{17}$ represents a $C_1$ to $C_{20}$ alkyl group that is unsubstituted or substituted by one or a plurality of the following groups: halogen, $OCH_2CH_2(CO)O(C_1$ to $C_4$ alkyl), $O(C_1$ to $C_4$ alkyl), $(CO)O(C_1$ to $C_4$ alkyl), a $C_3$ to $C_{20}$ cycloalkyl group, or a $C_3$ to $C_{20}$ cycloalkyl group interrupted with one or a plurality of O;

or $R_{17}$ represents a $C_2$ to $C_{20}$ alkyl group interrupted with one or a plurality of O;

$R_{18}$ represents a methyl group substituted by $COOR_{17}$;

$R_{19}$ and $R_{20}$ are each independently hydrogen, a phenyl group, a $C_1$ to $C_{20}$ alkyl group, a $C_1$ to $C_8$ alkanoyl group, or a $C_1$ to $C_8$ alkanoyloxy group;

or $R_{19}$ and $R_{20}$ form a heteroaromatic ring system with a nitrogen atom attached thereto, and the ring system is unsubstituted or substituted by a group represented by formula (7);

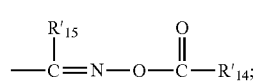

formula (7)

provided that, at least one group represented by formula (2) or formula (7) is present in the molecule

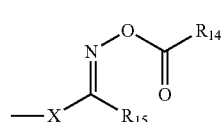

formula (2)

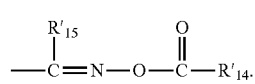

formula (7)

3. The photosensitive resin composition of claim 1, wherein the $R_1$, $R_2$, $R_3$, $R_4$, $R_5$, $R_6$, $R_7$, and $R_8$ are each independently hydrogen, or $R_1$ and $R_2$, $R_3$ and $R_4$, or $R_5$ and $R_6$ are each independently a group represented by formula (5) at the same time;

formula (5)

provided that at least one pair in $R_1$ and $R_2$, $R_3$ and $R_4$, and $R_5$ and $R_6$ is a group represented by formula (5);

or $R_2$ represents $COR_{16}$, $NO_2$, or a group represented by formula (2) or a group represented by formula (3);

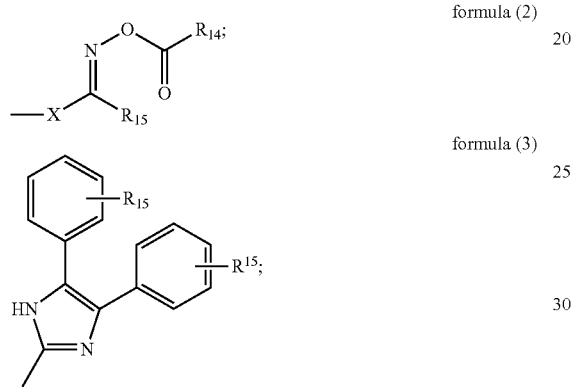

or $R_7$ represents $COR_{16}$ or a group represented by formula (2);

$R_9$, $R_{11}$, and $R_{12}$ represent hydrogen;

$R_{10}$ represents hydrogen, $OR_{17}$, or $COR_{16}$;

X represents CO or a direct bond;

$R_{13}$ represents a $C_1$ to $C_{20}$ alkyl group that is unsubstituted or substituted by one or a plurality of the following groups: halogen, $R_{17}$, $OR_{17}$, $SR_{18}$, or $PO(OC_kH_{2k+1})_2$;

or $R_{13}$ represents a $C_2$ to $C_{20}$ alkyl group interrupted with one or a plurality of O;

or $R_{13}$ represents a phenyl group;

k represents an integer 2;

$R_{14}$ represents a $C_1$ to $C_{20}$ alkyl group or a thienyl group;

$R_{15}$ represents a phenyl group or a naphthyl group that is unsubstituted or substituted by one or a plurality of $OR_{17}$ or a $C_1$ to $C_{20}$ alkyl group;

or $R_{15}$ represents a thienyl group, hydrogen, or a $C_1$ to $C_{20}$ alkyl group, and the $C_1$ to $C_{20}$ alkyl group is unsubstituted or substituted by one or a plurality of the following groups: $OR_{17}$, $SR_{18}$, a $C_3$ to $C_8$ cycloalkyl group, $NR_{19}R_{20}$, or $COOR_{17}$;

or $R_{15}$ represents a $C_2$ to $C_{20}$ alkyl group interrupted with $SO_2$;

$R_{16}$ represents a phenyl group or a naphthyl group that is unsubstituted or substituted by one or a plurality of the following groups: $OR_{17}$, $SR_{18}$, $NR_{19}R_{20}$, or a $C_1$ to $C_{20}$ alkyl group;

or $R_{16}$ represents a thienyl group;

$R_{17}$ represents hydrogen, a $C_1$ to $C_8$ alkanoyl group, or a $C_1$ to $C_{20}$ alkyl group, and the $C_1$ to $C_{20}$ alkyl group is unsubstituted or substituted by one or a plurality of the following groups: halogen, O(CO)—($C_1$ to $C_4$ alkyl), O(CO)—($C_2$ to $C_4$ alkenyl), or a $C_3$ to $C_{20}$ cycloalkyl group interrupted with one or a plurality of O;

or $R_{17}$ represents a $C_2$ to $C_{20}$ alkyl group interrupted with one or a plurality of O;

$R_{18}$ represents a $C_3$ to $C_{20}$ cycloalkyl group or a $C_1$ to $C_{20}$ alkyl group that is unsubstituted or substituted by one or a plurality of OH, O(CO)—($C_2$ to $C_4$ alkenyl), or $(CO)OR_{17}$;

or $R_{18}$ represents a phenyl group that is unsubstituted or substituted by one or a plurality of halogens;

$R_{19}$ and $R_{20}$ are each independently a $C_1$ to $C_8$ alkanoyl group or a $C_1$ to $C_8$ alkanoyloxy group;

or $R_{19}$ and $R_{20}$ form a 5-membered or 6-membered saturated ring interrupted with O with a nitrogen atom attached thereto;

provided that, at least one group represented by formula (2) is present in the molecule;

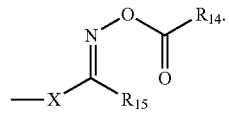

formula (2)

4. The photosensitive resin composition of claim 1, wherein the alkali-soluble resin (A) comprises an alkali-soluble resin (A-1), wherein the alkali-soluble resin (A-1) is obtained by a polymerization of a mixture, and the mixture comprises:

a diol compound (a-1-1) containing a polymeric unsaturated group;

a tetracarboxylic acid or an acid dianhydride thereof (a-1-2); and a dicarboxylic acid or an acid anhydride thereof (a-1-3);

the diol compound (a-1-1) containing a polymerizable unsaturated group is obtained by a reaction of an epoxy compound having at least two epoxy groups and a compound having at least one carboxylic acid group and at least one ethylenically unsaturated group, and the epoxy compound having at least two epoxy groups comprises a structure shown in formula (a-1), a structure shown in formula (a-2), or both of the structures,

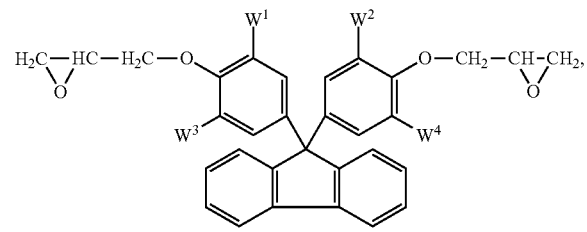

formula (a-1)

in formula (a-1), $W^1$, $W^2$, $W^3$, and $W^4$ each independently represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group,

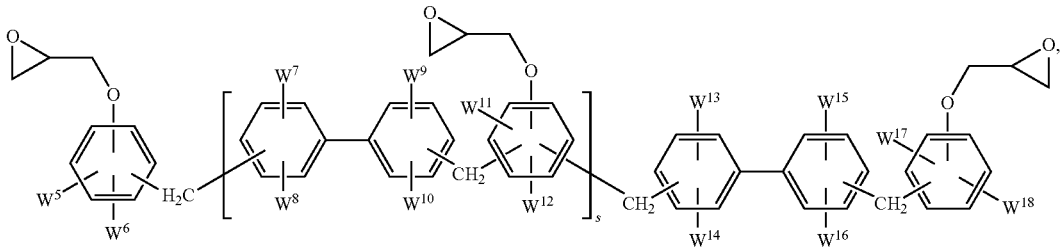

formula (a-2)

in formula (a-2), $W^5$ to $W^{18}$ each independently represent a hydrogen atom, a halogen atom, a $C_1$ to $C_8$ alkyl group, or a $C_6$ to $C_{15}$ aryl group, and s represents an integer of 0 to 10;

and, a number-average molecular weight of the alkali-soluble resin (A-1) is 1000 to 8000.

5. The photosensitive resin composition of claim 4, wherein at least one of the tetracarboxylic acid or an acid dianhydride thereof (a-1-2) and the dicarboxylic acid or an acid anhydride thereof (a-1-3) contains a fluorine atom.

6. The photosensitive resin composition of claim 4, wherein based on 100 parts by weight of the alkali-soluble resin (A), a usage amount of the alkali-soluble resin (A-1) is 50 parts by weight to 100 parts by weight.

7. The photosensitive resin composition of claim 1, wherein the alkali-soluble resin (A) comprises an alkali-soluble resin (A-2), and the alkali-soluble resin (A-2) is synthesized by polycondensation of a silane monomer, or formed by polycondensation using a silane monomer and other polymerizable compounds.

8. The photosensitive resin composition of claim 7, wherein based on 100 parts by weight of the alkali-soluble resin (A), a usage amount of the alkali-soluble resin (A-2) is 0 parts by weight to 50 parts by weight.

9. The photosensitive resin composition of claim 1, further comprising a hyperbranched polymer (F), wherein the hyperbranched polymer (F) is formed by reacting a multi-mercapto compound represented by formula (F2) and a polyfunctional (meth)acrylate represented by formula (F1), formula (F1)

$$\left( H_2C=C\begin{matrix}M^1\\ \\C-O\\\| \\O\end{matrix}\right)_g M^2$$

in formula (F1), $M^1$ represents a hydrogen atom or a $C_1$ to $C_4$ alkyl group;

$M^2$ represents a residual group after an esterification of a g number of hydroxyl groups in a compound containing a hydroxyl group having an h number of hydroxyl groups, wherein h≥g, and g represents an integer of 2 to 20, the compound containing a hydroxyl group is $M^3(OH)_h$, or a modified compound of the $M^3(OH)_h$ by propylene oxide, epichlorohydrin, an alkyl group, an alkoxy group, or hydroxypropyl acrylate, $M^3(OH)_h$ is a $C_2$ to $C_{18}$ polyalcohol, polyhydric alcohol ether formed by the polyalcohol, an ester formed by reacting the polyalcohol and an acid, or silicone,

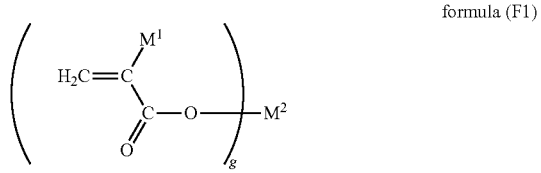

formula (F2)

in formula (F2), $M^4$ represents a single bond, a $C_1$ hydrocarbon group, or a $C_2$ to $C_{22}$ straight-chain or branched hydrocarbon group, and a skeleton of $M^4$ can further comprise a sulfur atom or an oxygen atom formed in an ester group, i represents an integer of 2 to 6, wherein when $M^4$ represents a single bond, i represents 2; when $M^4$ represents a $C_1$ hydrocarbon group, i represents an integer of 2 to 4; and when $M^4$ represents a $C_2$ to $C_{22}$ straight-chain or branched hydrocarbon group, i represents an integer of 2 to 6.

10. The photosensitive resin composition of claim 9, wherein based on 100 parts by weight of the alkali-soluble resin (A), a usage amount of the hyperbranched polymer (F) is 3 parts by weight to 35 parts by weight.

11. The photosensitive resin composition of claim 1, further comprising a thermal initiator (G), wherein the thermal initiator (G) is at least one selected from the group consisting of an azo compound, peroxide, and a hydrogen peroxide compound.

12. The photosensitive resin composition of claim 11, wherein based on 100 parts by weight of the alkali-soluble resin (A), a usage amount of the thermal initiator (G) is 4 parts by weight to 40 parts by weight.

13. The photosensitive resin composition of claim 1, wherein based on 100 parts by weight of the alkali-soluble resin (A), a usage amount of the compound (B) having an ethylenically unsaturated group is 15 parts by weight to 200 parts by weight, a usage amount of the compound (B-1) having an acid group and at least three ethylenically unsaturated groups is 15 parts by weight to 150 parts by weight, a usage amount of the photoinitiator (C) is 10 parts by weight to 80 parts by weight, a usage amount of the photoinitiator (C-1) represented by formula (1) is 10 parts by weight to 70 parts by weight, a usage amount of the solvent (D) is 1000 parts by weight to 8000 parts by weight, and a usage amount of the black pigment (E) is 150 parts by weight to 1200 parts by weight.

14. The photosensitive resin composition of claim 1, wherein based on 100 parts by weight of the alkali-soluble resin (A), a usage amount of the compound (H) represented by formula (10) is 1 part by weight to 10 parts by weight.

15. A black matrix, formed by the photosensitive resin composition of claim 1.

16. A color filter, comprising the black matrix of claim 15.

17. A liquid crystal display, comprising the color filter of claim 16.

* * * * *